(12) United States Patent
Ohmi et al.

(10) Patent No.: US 6,357,385 B1
(45) Date of Patent: Mar. 19, 2002

(54) PLASMA DEVICE

(75) Inventors: Tadahiro Ohmi, 1-17-301, Komegabukuro 2-chome, Aoba-ku, Sendai, Miyagi-ken 980; Takahisa Nitta, Tokyo; Masaki Hirayama, Miyagi-ken; Haruyuki Takano, Miyagi-ken; Ryu Kaiwara, Miyagi-ken, all of (JP)

(73) Assignee: Tadahiro Ohmi, Miyagi-ken (JP)

( * ) Notice: Subject to any disclaimer, the term of this patent is extended or adjusted under 35 U.S.C. 154(b) by 0 days.

(21) Appl. No.: 09/355,229

(22) PCT Filed: Jan. 29, 1998

(86) PCT No.: PCT/JP98/00364

§ 371 Date: Oct. 5, 1998

§ 102(e) Date: Oct. 5, 1998

(87) PCT Pub. No.: WO98/33362

PCT Pub. Date: Jul. 30, 1998

(30) Foreign Application Priority Data

Jan. 29, 1997 (JP) .................................. 9/15790
May 23, 1997 (JP) ............................... 9/133422
Sep. 25, 1997 (JP) ............................... 9/278062

(51) Int. Cl.⁷ .............................................. C23C 16/00

(52) U.S. Cl. ................................ 118/723 AN; 156/345; 118/723 MW

(58) Field of Search .......................... 118/723 MW, 118/723 MR, 723 ME, 723 MA, 723 I, 723 IR, 723 AN; 156/345

(56) References Cited

U.S. PATENT DOCUMENTS 5,525,159 A * 6/1996 Hama et al. ................ 118/723

FOREIGN PATENT DOCUMENTS

| JP | 61-265820 A | 11/1986 | ......... H01L/21/302 |
| JP | 63-50477 A | 3/1988 | ........... C23C/16/50 |
| JP | 1-298183 A | 12/1989 | ............. C23F/4/00 |
| JP | 3-55832 A | 3/1991 | ......... H01L/21/302 |
| JP | 4-221824 A | 8/1992 | ......... H01L/21/302 |
| JP | 5-62913 A | 3/1993 | ......... H01L/21/205 |
| JP | 6-224183 A | 8/1994 | ........... H01L/21/31 |
| JP | 07307326 A | 11/1995 | ....... H01L/21/3065 |
| JP | 0804917 A | 2/1996 | ....... H01L/21/3065 |
| JP | 08111297 A | 4/1996 | ............ H05H/1/46 |
| JP | 09027397 A | 1/1997 | ............ H05H/1/46 |

OTHER PUBLICATIONS

International Preliminary Examination Report, International Application No. PCT/JP98/00364, Filing Date Jan. 29, 1998, Priority Date Jan. 29, 1997.

* cited by examiner

Primary Examiner—Gregory Mills
Assistant Examiner—Luz Alejandro
(74) Attorney, Agent, or Firm—Randall J. Knuth

(57) ABSTRACT

A plasma device which is provided with a container, a gas supply system, and an exhaust system. The container is composed of a first dielectric plate made of a material capable of transmitting microwaves. An antenna for radiating microwaves is located on the outside of the container, and an electrode for holding an object to be treated is located inside the container. The microwave radiating surface of the antenna and the surface of the object to be treated with plasma are positioned in parallel and opposite to each other. A wall section of the container other than that constituting the first dielectric plate is composed of a member of a material having electrical conductivity higher than that of aluminum, or the internal surface of the wall section is covered with the member. The thickness (d) of the member is larger that $(2/\mu_0\sigma)^{1/2}$, where $\sigma$, $\mu_0$ and $\omega$ respectively represent the electrical conductivity of the member, the permeability of vacuum and the angular frequency of the microwaves radiated from the antenna.

33 Claims, 80 Drawing Sheets

| Chamber material and inner surface processing conductivity ($\Omega^{-1} \cdot m^{-1}$) | Microwave power (W) 400 | 800 | 1200 | 1600 |
|---|---|---|---|---|
| SUS (no inner surface processing) $1.4 \times 10^6$ | × | × | × | × |
| Pb (inner surface processing onto SUS) $4.8 \times 10^6$ | × | × | × | △ |
| Ta (inner surface processing onto SUS) $8.0 \times 10^6$ | × | × | ○ | ○ |
| W (inner surface processing onto SUS) $1.7 \times 10^7$ | × | ○ | ○ | ○ |
| Al (inner surface processing onto SUS) $3.7 \times 10^7$ | ○ | ○ | ○ | ○ |
| Au (inner surface processing onto SUS) $4.3 \times 10^7$ | ○ | ○ | ○ | ○ |
| Cu (inner surface processing onto SUS) $6.0 \times 10^7$ | ○ | ○ | ○ | ○ |
| Ag (inner surface processing onto SUS) $6.3 \times 10^7$ | ○ | ○ | ○ | ○ |

Inner surface processing thickness: 10 μm    ○ plasma stable    △ plasma unstable    × no activation of plasma caused

Fig. 3

Mask for X ray lithography

Permeability measurement system

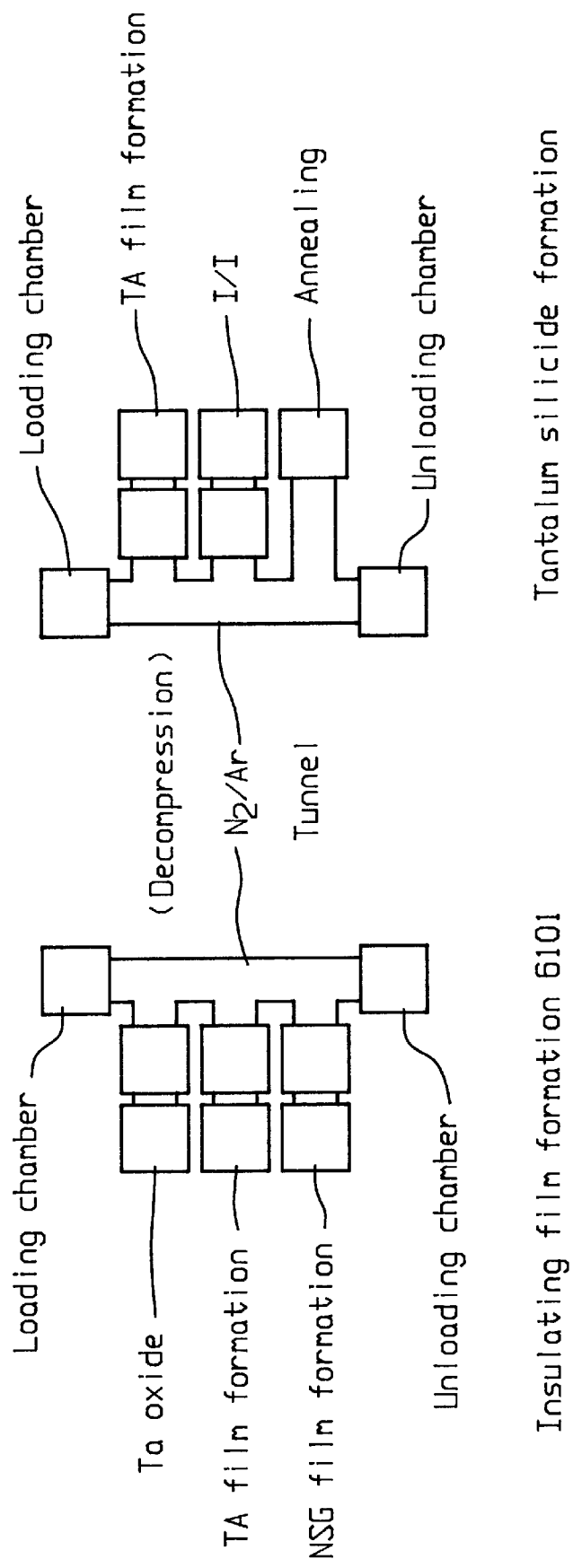

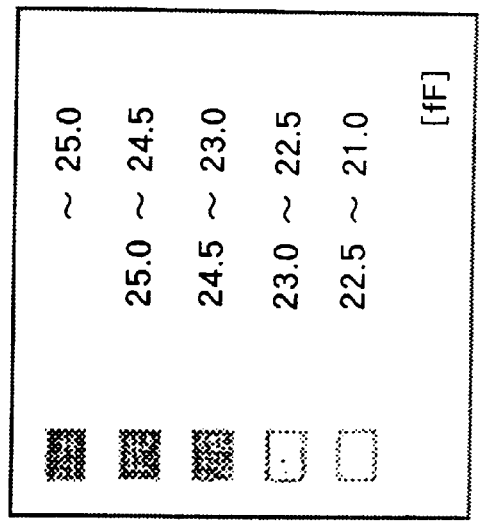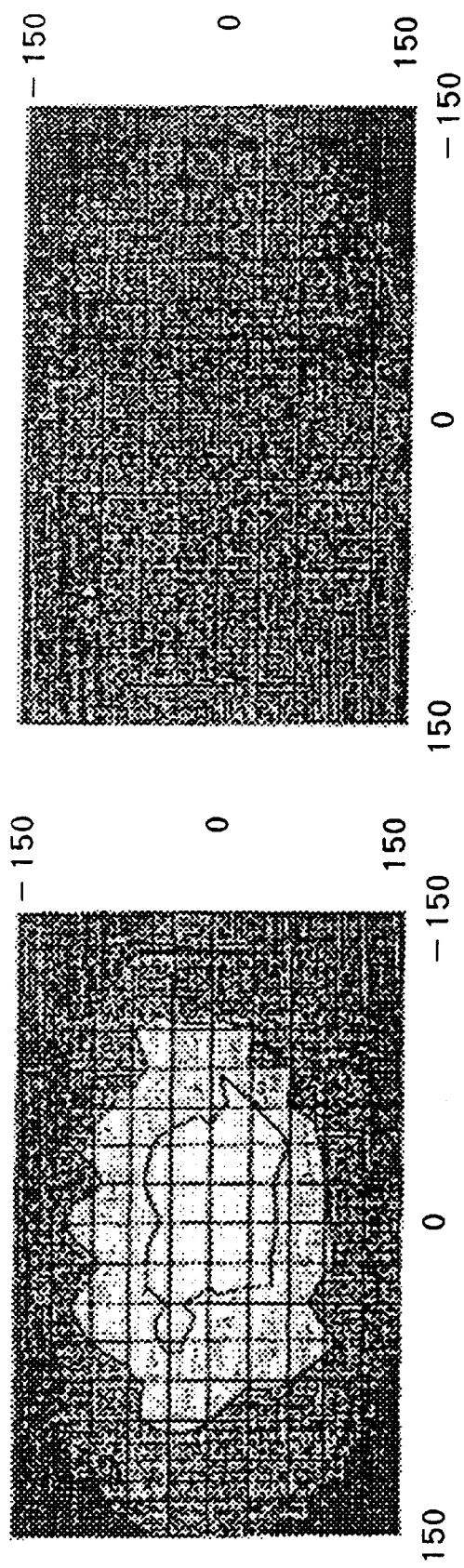
Fig. 88B Present invention
Fig. 88A Related art

Cluster tool comprising assembly of rectangular process chamber (1)

Cluster tool comprising assembly of rectangular process chamber (2)

Cluster tool comprising assembly of triangular process chamber

PLASMA DEVICE

TECHNICAL FIELD

The present invention relates to a plasma device.

BACKGROUND OF THE INVENTION

Recently, accompanying the increase in chip size of ULSI (ultra large scale integrated circuits), there has also been a tendency to increase the diameter of a silicon substrate used as a substrate for the ULSI. Since sheet leaf processing for handling substrates one at a time has become mainstream, if the substrate is increased in diameter there is a need for high speed processing of at least 1 mm per minute in order to maintain high productivity if etching and film forming are carried out. In a plasma device for handling an increased diameter substrate enabling high speed processing, it is essential to be able to generate high density plasma having an electron density in excess of $10^{11}$ cm$^{-3}$ and to obtain the flow of a large quantity of gas in order to efficiently remove a large amount of reaction products discharged from the substrate surface as a result of the high speed processing. In order to enable the generation of high density plasma, a parallel plate type plasma device introducing a magnetic field has been developed. As a conventional plasma device of this type, a magnetron plasma etching device using a dipole ring magnet is disclosed in, for example, Japanese Patent Laid Open No. Hei. 6-37054.

FIG. 43 is a schematic diagram of the conventional magnetron plasma etching device using a dipole ring magnet. FIG. 43(a) shows the state at the time of etching, and FIG. 43(b) shows the state at the time of conveying the substrate. In the drawings, reference numeral 4301 is a vacuum vessel, reference numeral 4302 is an electrode I, reference numeral 4303 is a substrate in a space 4315, reference numeral 4304 is a gas introduction opening, reference numeral 4305 is a shower plate, reference numeral 4306 is a dipole ring magnet, reference numeral 43j07 is a bellows, reference numeral 4308 is a porous plate, reference numeral 4309 is a gate valve, reference numeral 4310 is a substrate conveying port, reference numeral 4311 is a gas outlet, reference numeral 4312 is a vacuum pump, reference numeral 4313 is a matching circuit and reference numeral 4314 is a high frequency power source.

At the time of etching, source material gas that has been introduced from the gas introduction opening 4304 is discharged from a plurality of small holes in the shower plate 4305. This source material gas and reaction product gas discharged from the substrate surface as a result of the etching reaction are discharged to the outside, through a side section of the electrode I 4302, the porous plate 4308 and the gas outlet 4311, by the expel pump 4312. The porous plate 4308 causes a lowering of the gas conductance between a space above the substrate 4303 and the gas outlet 4311, and is provided so as to make the gas flow substantially uniformly in a direction of rotation of the space above the substrate 4303. Since the gas is made to flow uniformly in a direction of rotation of the space above the substrate 4303, the gas conductance between the space above the substrate 4303 and the gas outlet 4311 is inevitably restricted and there is a problem that a large amount of gas can not flow. As a result, in high speed etching on large diameter substrates the etching rate is lowered, and a problem arises that the etching shape degenerates.

At the time of conveying the substrate, the position of the electrode I 4302 is lowered, as in FIG. 43(b), and the substrate is conveyed through the gate valve 4309 and the substrate conveying port 4310 using an external substrate conveyance machine. The bellows 4307 are required in order to cause the electrode I 4302 to move. At the time of plasma generation, power loss occurs due to high frequency current flowing in the bellows 4307, and there is a problem that the high frequency output power of the high frequency power source 4314 can not be efficiently supplied to the plasma. There is also a problem that a complex structure is required because the electrode I 4302 is made to move.

A device using electron cyclotron resonance (ECR) is also known as a plasma device using microwaves. This device enables excitation of high density uniform plasma on a substrate, but since the method involves high density plasma being excited locally, caused to widely diffuse within the container and uniformly supplied onto a object to be treated, installation of a shower plate is difficult, and it is difficult to promptly remove gases that are reaction by-products.

As a high density plasma device using microwaves, a device using a radial line slot antenna is also known (Japanese patent laid-open No. Hei.8-111297). However, if this device is put to practical use, it is not always possible to cause high density plasma to be generated stably over a long period of time. Also, the conditions for causing the generation of plasma are not definite.

The object of the present invention is to provide a plasma processing device, within a narrow space inside a container that enables uniform formation of a high quality thin film on a large substrate at a low temperature and at high speed, by causing excitation of uniform high density plasma having a low plasma potential over a large surface area, making supply of source material gas uniform, and swiftly removing reaction by-product gases by adopting a structure equivalent to a shower plate. The invention is applicable to plasma processing other than an etching plasma process.

SUMMARY OF THE INVENTION

A plasma device of the present invention comprises:

a container, the inside of which can be internally decompressed, and part of the inside being formed of a first dielectric plate made of material capable of passing microwaves with almost no loss, a gas supply system for supplying essential source material gas so as to cause excitation of plasma inside the container, an exhaust system for expelling source material gas supplied into the container and decompressing the inside of the container, an antenna, located facing an outer surface of the first dielectric plate and comprised of a slot plate and a waveguide dielectric, for radiating microwaves, and an electrode for holding a object to be treated located inside the container, a surface of the object to be treated that is to be plasma processed and a microwave radiating surface of the antenna being arranged in parallel substantially opposite to each other, and the plasma device carrying out plasma processing for the object to be treated, wherein, a wall section of the container outside the first dielectric plate is of a material comprising matter having a specific conductivity of $3.7 \times 10^7 \, \Omega^{-1}/m^{-1}$ or more, or the inside of the wall section is covered with this material, and when thickness of the material is d, the specific conductivity of the material is σ, the magnetic permeability of the vacuum is $\mu_0$, and the angular frequency of microwaves radiated from the antenna is ω, the thickness d is larger than $(2/\mu_0\sigma\omega)^{1/2}$.

A plasma processing method of the present invention is a method using a plasma device comprising a container, the inside of which can be internally decompressed, and part of the inside being formed of a first dielectric plate made of material capable of passing microwaves with almost no loss, a gas supply system for supplying essential source material gas so as to cause excitation of plasma inside the container, an exhaust system for expelling source material gas that has been supplied inside the container and decompressing the inside of the container, an antenna, located facing an outer surface of the first dielectric plate and comprised of a slot plate and a waveguide dielectric, for radiating microwaves, and an electrode for holding an object to be treated located inside the container, a surface of the object to be treated that is to be subject to plasma processing and a microwave radiating surface of the antenna being arranged in parallel substantially opposite to each other, and the plasma device carrying out plasma processing for the object to be treated, the power density of microwaves to be input being 1.2 W/cm$^2$ or more. This method assures stable generation of plasma.

A plasma device of the present invention is provided with an electrode I inside a vacuum container, and a substrate to be subjected to processing using plasma is mounted so as to be connected to this electrode I. Magnetic field applying means I and II are provided outside the vacuum container, for the purpose of applying a magnetic field to the inside of the plasma, and at least some of a gas that has been introduced into the vacuum container is expelled through a space between the magnetic field applying means I and II.

A plasma device of the present invention is provided with two parallel plate type electrodes I and II inside a vacuum container, and a substrate to be subjected to processing using plasma is mounted so as to be connected to either the electrode I or the electrode II. Means for applying a magnetic field to the inside of the plasma are provided, and the electrode II comprises a central section, and an outer section connected to a high frequency power source that can be controlled independently of a high frequency power source connected to the electrode I.

A plasma device of the present invention is provided with an exhaust space formed directly communicating with an inlet of a vacuum pump, to the side of a film forming space above the substrate.

A plasma device of the present invention comprises:
   a container, the inside of which can be internally decompressed, and part of the inside being formed of a first dielectric plate made of material capable of passing microwaves with almost no loss,
   a gas supply system for supplying essential source material gas so as to cause excitation of plasma inside the container,
   an exhaust system for expelling source material gas that has been supplied inside the container and decompressing the inside of the container,
   an antenna, located facing an outer surface of the first dielectric plate and comprised of a slot plate and a waveguide dielectric, for radiating microwaves, and
   an electrode for holding a object to be treated located inside the container, a surface of the object to be treated that is to be subject to plasma processing and a microwave radiating surface of the antenna being arranged in parallel substantially opposite to each other, and the plasma device carrying out plasma processing for the object to be treated, wherein,
   an exhaust space formed directly communicating with an inlet of a vacuum pump is provided to the side of a film forming space above the substrate.

BRIEF DESCRIPTION OF THE DRAWINGS

FIG. 3 is the results of a plasma ignition test relating to the first embodiment, showing interdependence between microwave power and chamber material.

FIG. 85 is a drawing showing process cluster tools for formation of an insulating film and formation of tantalum silicide.

FIG. 88 is a drawing showing in-plane uniformity of a tantalum oxide capacitor.

Figure 1:
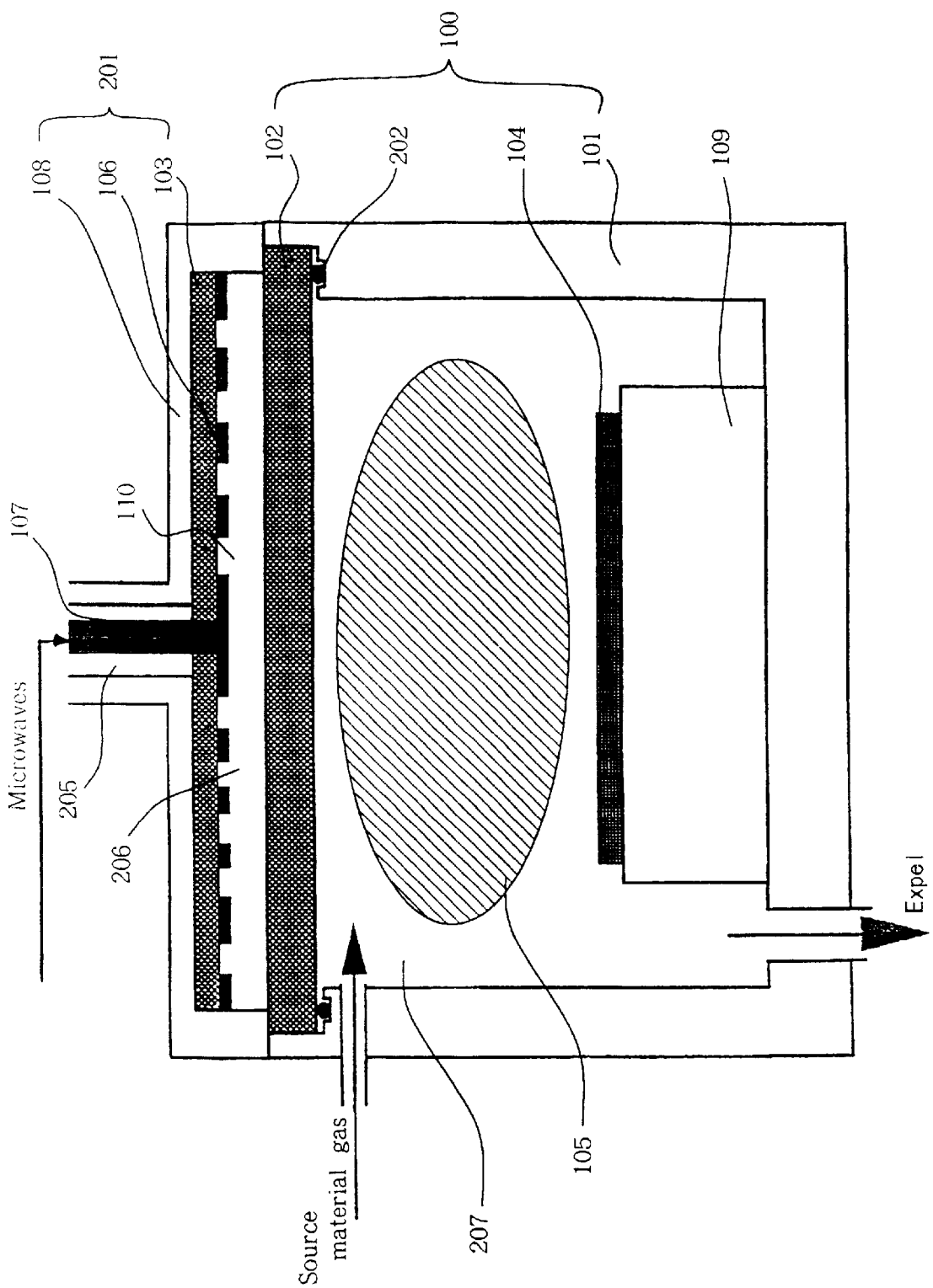
FIG. 1 is a cross section of a device relating to embodiment 1.

DESCRIPTION OF THE NUMERALS 100 container
101 chamber
102 first dielectric plate
103 waveguide dielectric plate
104 object to be treated
105 plasma
106 antenna slot plate
107 coaxial tube
108 antenna guide
109 electrode
110, 110', 110", 111 slot
112 plating layer
113 plate member
114, 115 metallic thin film
116 second dielectric plate
117 gas inlet
118 means 8 for preventing warping of slot plate
119 cover plate
120 means 6 for maintaining antenna at fixed temperature
121 means 7 for maintaining first dielectric plate at fixed temperature
122 means 9 for detecting presence or absence of plasma generated in space 2
123 window formed of material transparent to light
124 light inlet
125 Xe lamp
201 radial line slot antenna
202 first O ring
205 space 3
206 space 4
207 space 5
208 space 1
209 space 2
214 metallic thin film
216 second O ring
301 upper glass plate
302 lower glass plate
303 middle glass plate
304 space 6
305 tungsten wire
306 aluminum wire covered with ceramic
401 disk-shaped electrode
402 pin
403 aluminum wire
404 resistor
405 operational amplifier
406 A-D converter
407 computer
408 stepping motor
409 power supply
501 chamber
502 plasma
503 object to be treated
504 electrode
505 heater
506 laser
507 photodetector
601 probe tip
602 silver wire
603 ceramic tube
604 SUS tube
605 ring seal
606 lobe measurement system
701 object to be treated
702 field oxidation film
703 gate oxidation film
704 gate electrode
705 probe
706 voltmeter
707 voltage applying means
801 object to be treated
802 field oxidation film
803 gate nitride film 804 gate electrode
805 probe
806 voltmeter
807 constant current source
808 ammeter
4301 vacuum container
4302 electrode I
4303 base
4304 gas inlet
4305 shower plate
4306 dipole ring magnetron
4307 bellows
4308 porous plate
4309 gate valve
4310 base conveyance port
4311 gas outlet
4312 vacuum pump
4313 matching circuit
4314 high frequency power supply
4406 vacuum container
4407 electrode I
4408 base
4409 focus ring
4410 shower plate
4411 electrode II
4412 gas inlet
4413 magnetic field applying means
4414 vacuum pump
4415 matching circuit I
4416 high frequency power supply I
4417 matching circuit II
4418 high frequency power supply II
4501 vacuum container
4502 gas inlet
4503 magnetic field applying means
4504 gas outlet
4505 gate valve
4601 vacuum container
4602 gas inlet
4603 magnetic field applying means
4604 gas outlet
4605 gate valve
4701 vacuum container
4702 gas inlet
4703 magnetic field applying means
4704 gas outlet
4705 vacuum pump
4706 gate valve
4801 vacuum container
4802 vacuum pump
4901 vacuum container
4802 vacuum pump
5001 vacuum container
5002, 5003 means for applying magnetic field inside the container
5004 electrode I
5005 electrode II
5006, 5007 means for expelling source material gas and reaction product gas
5004 electrode I
5005 electrode II
5006, 5007 means for expelling source material gas and reaction product gas
5108 means for applying a high frequency
5204 electrode I
5206, 5207 means for expelling source material gas and reaction product gas
5301 vacuum container
5302 source material gas inlet
5303 vacuum pump
5304 dielectric plate I
5305 antenna
5306 electrode I
5307 shower plate
5308 base
5309 reflector
5301 vacuum container
5302 electrode I
5303 electrode II
5404 target
5405 base
5406 matching circuit I
5408 high frequency power source I
5412 matching circuit II
5413 high frequency power supply II
5414 means for applying magnetic field
5410 auxiliary electrode A
5411 auxiliary electrode B
5414a magnetic field applying means
5415 vacuum pump
5501 electrode IIa
5502 electrode IIb
5503 target
5504 high frequency power supply I
5505 matching circuit I
5506 high frequency power supply II
5507 matching circuit
5508 phase control circuit
5601 electrode Ia
5602 electrode Ib
5603 target
5605 matching circuit

DETAILED DESCRIPTION OF THE INVENTION

Best Mode of Practicing the Invention (1) In the plasma device of the present invention, an antenna for irradiating microwaves is provided on the outer side of a container, with a first dielectric plate interposed between the antenna and the container. Because the first dielectric plate is made of a material that can transmit microwaves with almost no loss, it becomes possible to excite plasma inside the container by irradiating microwaves from outside the container, so that the antenna is not directly exposed to the source material gas and the reaction by-product gas. Also, an electrode for holding an object to be treated is provided inside the container, and a microwave emitting surface of the antenna and a surface of the object to be treated that is to be subjected to plasma processing are arranged opposite to each other and substantially in parallel, which means that it is easy to reduce a space between these two surfaces, and it is possible to increase the flow rate of source material gas and reaction by-product gas, and to swiftly remove the reaction by-product gas. Further, a wall section of the container other than the first dielectric plate is either a member comprising a material having specific conductivity higher than that of aluminum, or the outside of this wall section is covered with the member, and if thickness of the material is d, the specific conductivity of the material is $\sigma$, the magnetic permeability of the vacuum is $\mu_0$, and the angular frequency of microwaves radiated from the antenna is $\omega$, the thickness d is larger than a skin depth (invasion length) determined from $(2/\mu_0 \sigma \omega)^{1/2}$. This means that microwaves introduced into the container are subjected to almost no loss, and can be caused to propagate. As a result, plasma can be excited at a low output, and stable plasma excitation becomes possible.

A first O ring having a function of a vacuum seal is located between the inner surface of the first dielectric plate and the wall section of the container, and by providing a member formed of a conductive means as means I for preventing the first O ring from being directly exposed to the microwaves radiated from the antenna at least at a surface of the first dielectric plate coming into contact with the O ring, leakage is prevented, and it is possible to increase the service life of the O ring and reduce microwave loss. In plasma devices using microwaves, leakage occurred easily. The inventor of this application has been painstakingly searching for the reason why leakage occurs easily when microwaves are used, and has discovered that the cause lies with the O ring.

Specifically, the O ring absorbs microwave energy, with the result that the O ring becomes overheated. Also, the surface becomes molten. If the O ring overheats and the surface melts, leakage will occur. The above describes the reason why leakage occurs easily when microwaves are used, and the inventor of this application was the first to discover this. In the case where microwaves were used, it was not foreseen that the O ring would be exposed to such high temperatures. It is possible to prevent overheating of the O ring and melting of the surface due to the provision of a thin film, formed of a conductive material (for example a metallic material), on at least a surface of the first O ring that comes into contact with the first dielectric layer. This thin film formed of a conductive material can be provided by applying a film on the first dielectric plate, and can be provided by coating the dielectric film using painting, vapor deposition or another method. As the conductive material, it is possible to use titanium, for example.

Also, a thin film made of a conductive material is preferably provided on the surface of the O ring. Titanium coating can also be carried out in this case. Material having low dielectric loss is preferably used in the O ring itself constituting a foundation. For example, BAITON (Trade name) can be used.

This thin film is preferably formed of a material having a specific conductivity of at least $3.7 \times 10^7$ $\Omega^{-1} \cdot m^{-1}$, and preferably has a thickness of at least 10 $\mu$m. By providing a thin film having such specific conductivity and thickness, leakage is reduced still further, the service life of the O ring is increased and it is possible to provide a plasma device with low microwave loss.

A first O ring having a function of a vacuum seal is located between the inner surface of the first dielectric plate and the wall section of the container, and by providing means 2 for preventing the first O ring from being directly exposed to the microwaves radiated from the antenna on the surface of the first O ring, it is possible to achieve a proposed leakage amount, prolonged service life of the first O ring, and reduced microwave loss.

By providing a second dielectric plate having a gas inlet for substantially uniform supply of a desired gas between the first dielectric plate and an electrode for holding the object to be treated, it is possible to uniformly supply the source material gas into the container, and to uniformly remove the reaction by-product gas.

This second dielectric plate isolates the vacuum from the atmosphere. Accordingly, the antenna does not reside in the vacuum. If the antenna enters the vacuum, the antenna will be corroded, and cooling is difficult.

A second O ring having a function of a vacuum seal is located between the inner surface of the second dielectric plate and the wall section of the container, and by providing means 3 for preventing the second O ring from being directly exposed to the microwaves radiated from the antenna on an inner surface or an outer surface of the second dielectric plate, it is possible to prevent leakage, prolong the service life of the second O ring, and reduce microwave loss.

A second O ring having a function of a vacuum seal is located between the inner surface of the second dielectric plate and the wall section of the container, and by providing means 4 for preventing the second O ring from being directly exposed to the microwaves radiated from the antenna on the surface of the second O ring, it is possible to prevent leakage, prolong the service life of the second O ring, and reduce microwave loss.

By selecting a material having a dielectric loss angle tan $\delta$ less than $10^{-3}$ as the material of the first dielectric plate or the second dielectric plate, it becomes possible to cause microwaves radiated from the antenna positioned outside the container to be transmitted with virtually no loss, and it is possible to achieve a reduction in microwave loss.

The frequency of the microwaves fed to the antenna is at least 5.0 GHz, and if the distance of a space 1 between the first dielectric plate and the second dielectric plate is less than 7 mm, plasma excitation is not caused in the space 1, and there is no generation of reaction by-products caused by discharge. Accordingly, it becomes possible to avoid a phenomenon where reaction by-products disturb the supply of source material gas. It is also possible to prevent any detrimental affect on processes such as formation of the thin film on the object to be treated, nitriding or oxidation of the object to be treated, or etching of the object to be treated, etc. by the reaction by-products.

By providing means 5 for generating a differential pressure so that a pressure 1 of space 1 between the first dielectric plate and the second dielectric plate is higher than a pressure 2 of space 2 where an electrode for holding the object to be treated is located, and is surrounded by the second dielectric plate and a wall section of the container other than the second dielectric plate, there is no generation of reaction by-products due to discharge. The differential pressure can be easily provided by varying the pressure of the source material gas and the degree of vacuum inside the container.

By making the slots, positioned in a section where the density of plasma generated in the space 2 is locally high, smaller in diameter than the remaining slots, screening the slot, or not providing the slot at all, the output power of the microwaves is partially reduced in the slot plate functioning as a radiating surface of the microwaves and it is possible to make the plasma density more uniform. The position where the plasma density becomes locally high is changed depending on device conditions etc., which means, for example, that it is best to initially carry out trials with the same slot diameter, and to find out the part where plasma density becomes locally high using this test.

In the present invention, a space is formed between an antenna and a first dielectric plate. In a plasma device of the related art using microwaves (for example Japanese Patent laid-open No. Hei. 8-111297) the antenna and the first dielectric plate are stuck together. The antenna usually has a thickness in the region of 0.3 mm, and is formed of a copper plate. However, experimentation carried out by the present inventor indicates that in the case of using microwaves the antenna reaches a high temperature in the region of 150° C., and the thickness of the antenna is locally reduced accompanying expansion in due to the heat. As a result, the radiating characteristics of microwaves from the antenna change and the plasma become non-uniform.

In the present invention the antenna and the first dielectric plate are not stuck together and a space is formed between the two, which means that a spacer formed of an elastic body touching the antenna can be interposed in this space, and localized deflection of the antenna does not occur, even if there is expansion due to heat, and it is possible to obtain a stable plasma It is possible to use, for example, silicon rubber, TEFLON (trade name) etc. as the spacer formed of an elastic member.

Also, if means for supplying a heating medium is connected to this space, a heating medium can be supplied into the space, and it is possible to cool the antenna. By cooling the antenna it becomes possible to prevent deflection of the antenna due to heat without using the spacer. Obviously, it is also possible to cool the antenna using the spacer.

Supply of the heating medium into the space formed by the antenna and the first dielectric plate is one function of the means 6 for cooling the antenna, but besides the means 6 it is possible to form a passage in an antenna guide, and to connect a line for supplying a heating medium to this passage.

By providing means 7 for cooling the first dielectric plate close to the first dielectric plate, source material gas to be supplied can be supplied onto the surface of the object to be treated while being maintained at a fixed temperature. Also, using the means 7 bending of the slot plate is prevented, microwaves can be radiated to the inside of the container with almost no loss and it is possible to cause excitation of stable plasma.

By providing means 8 for preventing bending of the slot plate, a highly efficient parallel beam of microwaves can be radiated to the inside of the container which means that it is possible to cause excitation of stable plasma.

By providing means 9 for detecting the presence or absence of plasma generated in the space 2, it is possible to prevent the inside of the container and the object to be treated etc, being carelessly heated by microwaves radiated from the antenna, and to thus prevent damage.

Since a structure is provided inside the container for respectively raising the temperature of the container wall surface and the outer part of the object to be treated to at least 150° C., emitted gas that hinders the process is reduced, and it is possible to prevent reattachment of reaction by-products.

If a structure (for example a heater) for raising the temperature within units constituting an exhaust system is provided in the exhaust system, the temperature within the exhaust system is raised by this structure and it is possible to prevent reaction byproducts being attached to internal walls of the units.

If a structure is provided for heating the object to be treated, it is possible to compensate for insufficient energy during plasma ion exposure by raising the temperature of the object to be treated.

If a structure for carrying out recovery and recycling of fluorocarbon type gas is provided downstream of the exhaust system, it is possible to carry out recycling by adopting a staged cooling system to gradually cool from a high boiling point gas through liquefaction, distillation and purification to a liquid.

The inside of the container can be cleaned by causing generation of a plasma inside the container having high ion radical density and low plasma potential. The inside of the container at this time can preferably be made of an alloy exhibiting extremely good plasma resistance ($AlF_3/MgF_2$).

By providing an electrode having the function of holding the object to be treated with means for applying a d.c. bias and/or and a.c. bias, it is possible to increase the ion energy radiated to the object to be treated. For example, when adopted plasma etching, it is possible to realize high speed etching with good uniformity.

Using the plasma device of the present invention, it is possible to uniformly carry out etching processing, direct oxidation processing and direct nitriding processing on the surface of an object to be treated having a large surface area, and uniform film formation at low temperature and high speed is possible.

Figure 44A:
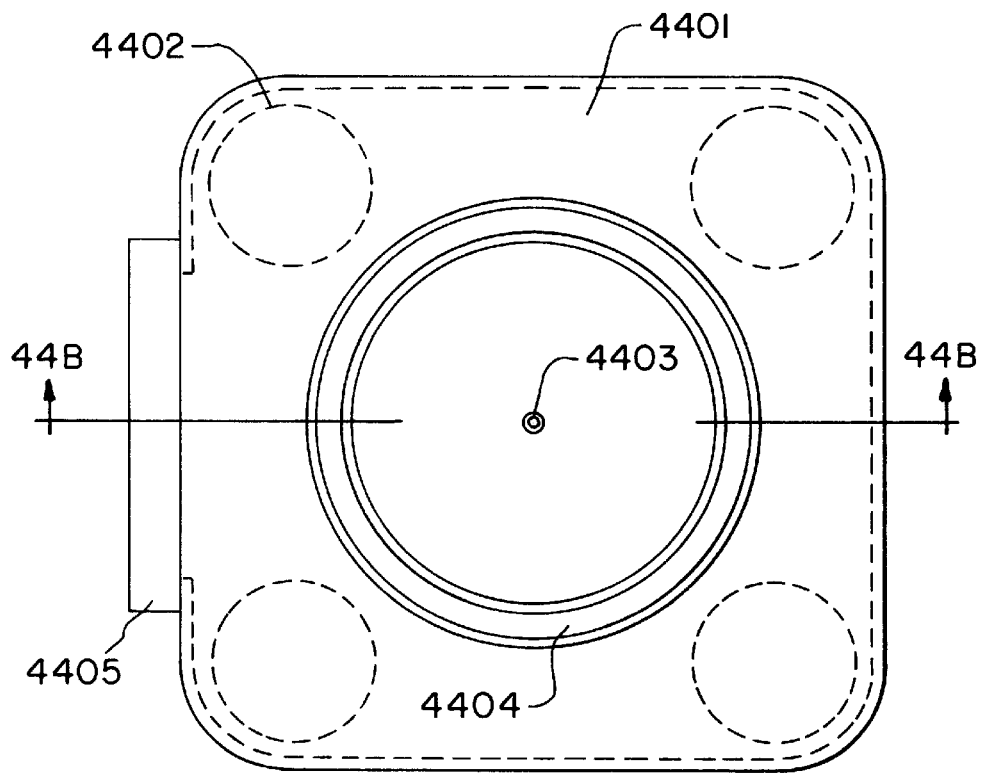
FIG. 44 is a schematic diagram showing an example of a plasma device of the present invention.
Figure 44B:
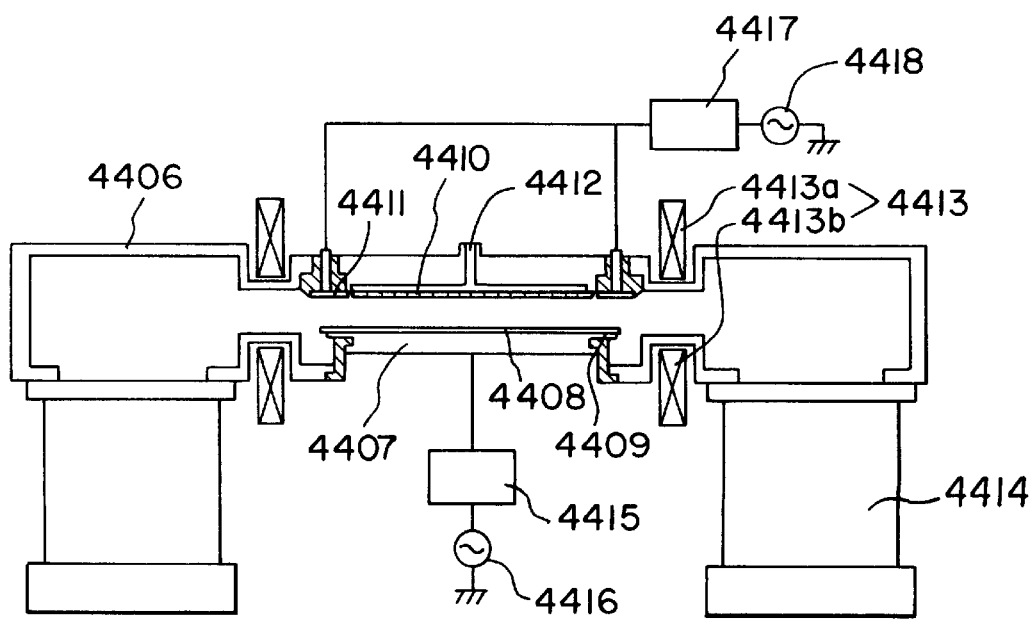

(2) FIG. 44 is a schematic drawing showing an example of a plasma device of the present invention. FIG. 44(*a*) is a plan view looking from above the device, while FIG. 44(*b*) is a cross section through line A—A in FIG. 44(*a*).

In FIG. 44, reference numeral 4406 is a vacuum container, reference numeral 4407 is an electrode I, reference numeral 4408 is a substrate, reference numeral 4409 is focus ring, reference numeral 4410 is a shower plate, reference numeral 4411 is an electrode II, reference numeral 4412 is a gas inlet, reference numeral 4413 is magnetic field applying means, reference numeral 4414 is a magnetic pump, reference numeral 4415 is a matching circuit I, reference numeral 4416 is a high frequency power supply I, reference numeral 4417 is a matching circuit II and reference numeral 4418 is a high frequency power supply II.

In the plasma device of FIG. 44, a dipole ring magnet having a plurality of permanent magnets aligned in an annular shape are used as magnetic field applying means 4413, as shown in the drawing. The permanent magnets constituting the dipole ring magnet are aligned so that a direction of magnetization passes through one rotation as the magnet positions go halfway round.

Gas introduced from the gas inlet 4412 is discharged into a process space from a plurality of small holes of the shower plate 4410. This introduced gas, and reaction product gas discharged from a substrate surface, is expelled from a plurality of vacuum pumps 4414 to the outside via a space interposed between the magnetic field applying means 4413*a* and 4413*b* to the side of the substrate. A comparatively wide space is provided in an upper part of the vacuum pump 4414 so as to cause the gas conductance to be lowered. A projection surface of the upper section of the vacuum container 4406 is shown in FIG. 44(*a*). The vacuum container 4401 has a shape close to a square, and four vacuum pumps 4402 are provided in the corners of this vacuum container 4401. In this way, if exhaust is carried out by a plurality of vacuum pumps aligned around the substrate substantially axisymmetrical to an axis perpendicular to the substrate surface and running through the center of the substrate, uniform gas flow can be realized in a rotational direction above the substrate, without causing hardly any lowering of gas conductance. That is, it becomes possible to cause a large amount of gas to flow up to a value close to the tolerance of the vacuum pump, and it is possible to handle an ultra high speed process for a large diameter substrate.

Here, the electrode II 4411 is a ring shaped metallic plate, and is provided so as to allow improvement of in-plane uniformity of plasma close to the surface of the substrate 4408. High frequency power output from the high frequency power supply II 4418 is applied to the electrode II 4411 through the matching circuit II 4417. If a balance of electron drift on the surface of the electrode II 4411 and the electron drift on the surface of the substrate 4408, caused by a magnetic field applied by application of appropriate high frequency power to the electrode II 4411, is obtained, plasma close to the surface of the substrate 4408 is made almost totally uniform. If uniformity of the plasma surface close to the surface of the substrate 4408 is good with application of high frequency to the electrode II 4411, or if no problem arises even with nonuniformity, it is not particularly necessary to provide the electrode II 4411.

Figure 43A:
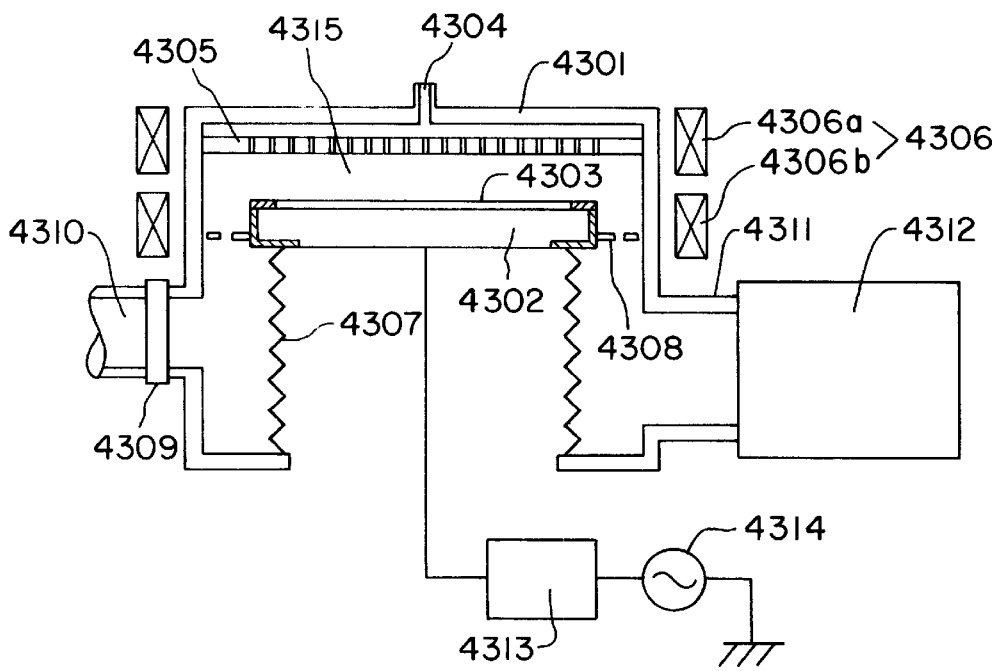
FIG. 43($a$–$b$) is a schematic diagram of a conventional magnetron plasma etching device.
Figure 43B:
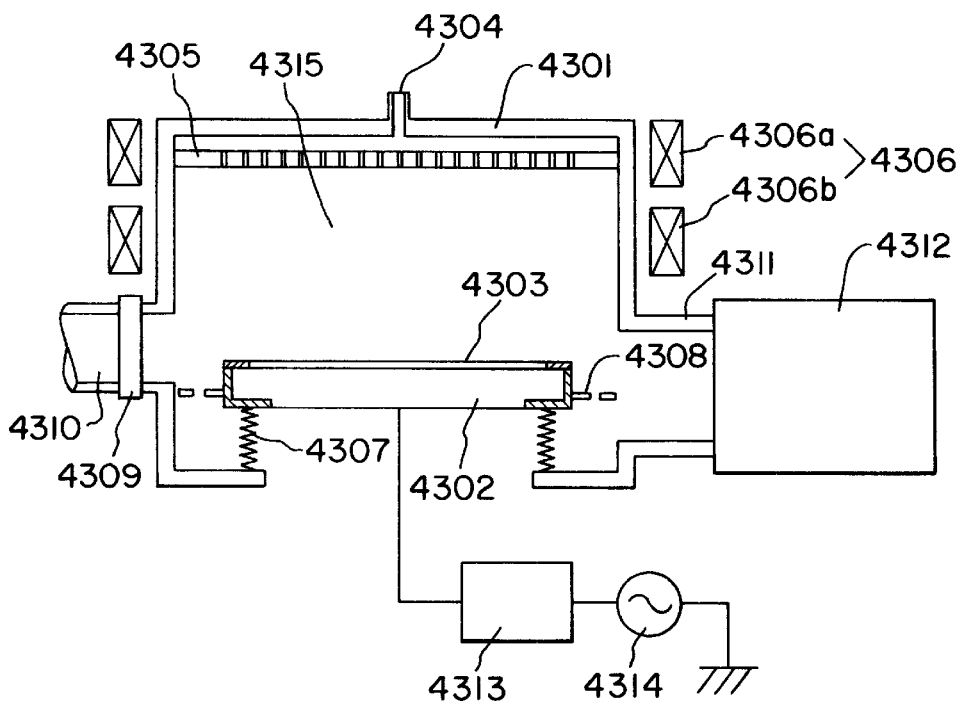

In the plasma device of FIG. 43, the shower plate 4305 is grounded, but it does not necessarily need to be grounded and it does not matter if a high frequency is applied. Also, it does not matter of a shower plate is not used and gas is discharged from another section.

Figure 45:
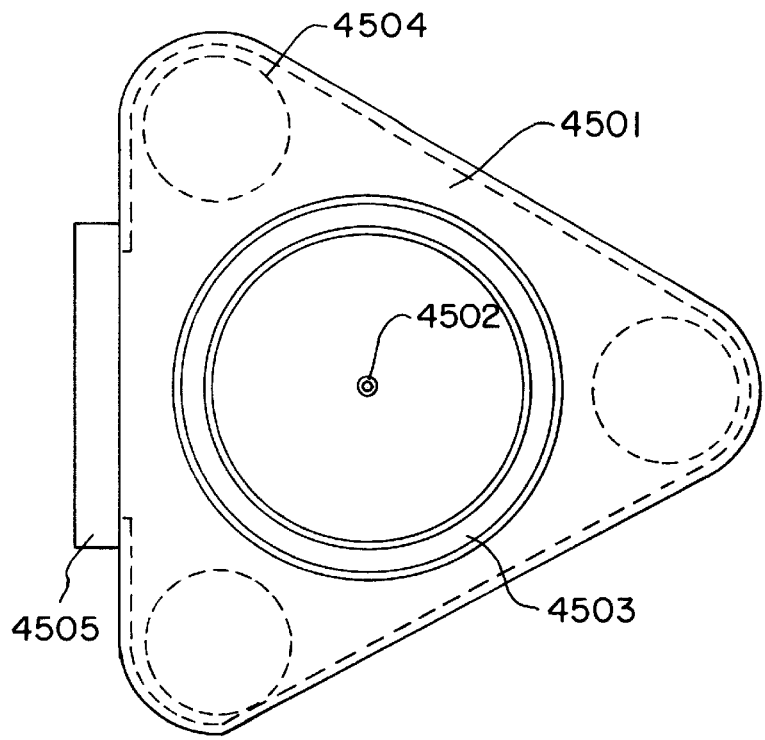
FIG. 45 is a plan view showing an example of a plasma device of the present invention.

FIG. 45 is a plan view showing an example of a plasma device of the present invention. Reference numeral 4501 is a vacuum container, reference numeral 4502 is a gas inlet, reference numeral 4503 is a magnetic field applying means, reference numeral 4504 is a gas outlet, and reference numeral 4505 is a gate valve. A surface of the vacuum container 4501 projecting from an upper part is approximately triangular in shape, and three vacuum pumps are placed in the corner sections. Other aspects of the plasma device are the same as the at described for FIG. 44. With the plasma device of FIG. 45, a distance between a gate valve 4505 and the substrate is smaller than in the plasma device shown in FIG. 44. This is suitable for the case when the stroke of a substrate conveyance arm is restricted.

Figure 46:
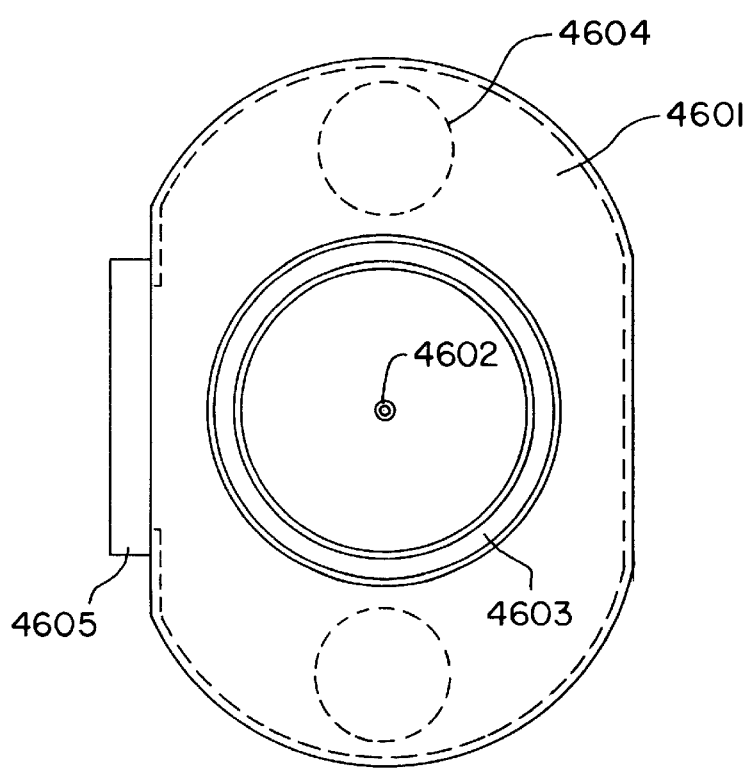
FIG. 46 is a plan view showing an example of a plasma device of the present invention.

FIG. 46 is a plan view showing an example of a plasma device of the present invention. Reference numeral 4601 is a vacuum container, reference numeral 4602 is a gas inlet, reference numeral 4603 is magnetic field applying means, reference numeral 4604 is a gas outlet, and reference numeral 4605 is a gate valve. Two vacuum pumps are placed in the vacuum container 4602. Apart from this, the plasma device is the same as that described in FIG. 44. With the plasma device of FIG. 46, similarly to the device of FIG. 45, a distance between a gate valve 4505 and the substrate is smaller than in the plasma device shown in FIG. 44. This is suitable for the case when the stroke of a substrate conveyance arm is restricted and when there is a margin in the expel capacity of the vacuum pump.

Figure 47:
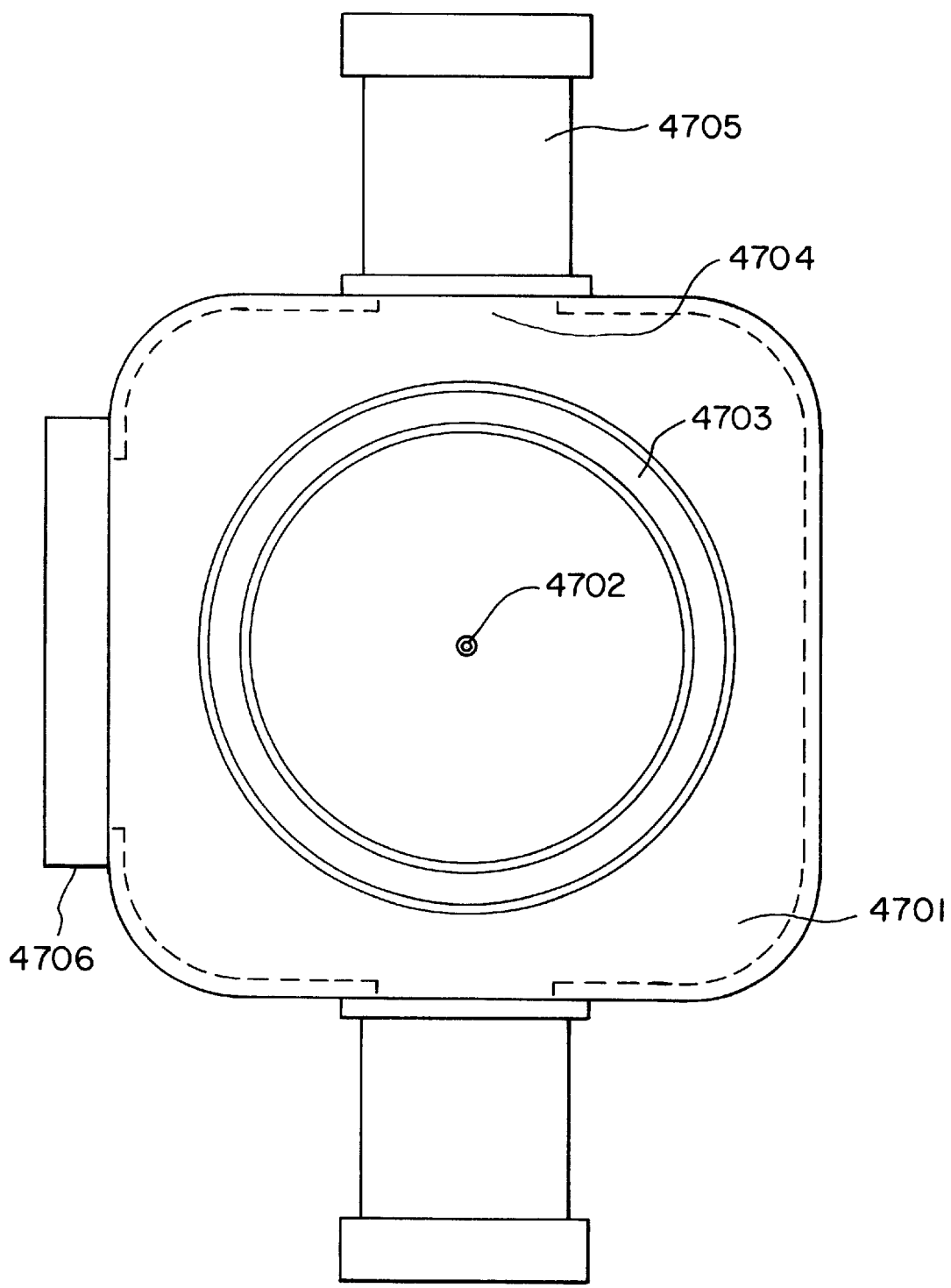
FIG. 47 is a plan view showing an example of a plasma device of the present invention.

FIG. 47 is a plan view showing an example of a plasma device of the present invention. Reference numeral 4701 is a vacuum container, reference numeral 4702 is a gas inlet, reference numeral 4703 is magnetic field applying means, reference numeral 4704 is a gas outlet, reference numeral 4705 is a vacuum pump, and reference numeral 4706 is a gate valve. Two vacuum pumps are placed sideways in the vacuum container 4702. Apart from this, the plasma device is the same as that described in FIG. 44. The footprint of the plasma device including the vacuum container 4701 and the vacuum pump 4705 is larger, but the size of the vacuum container 4701 becomes a minimum. This is suitable for the case when the stroke of a substrate conveyance arm is restricted and when there are restrictions on the size of the vacuum container.

Figure 48:
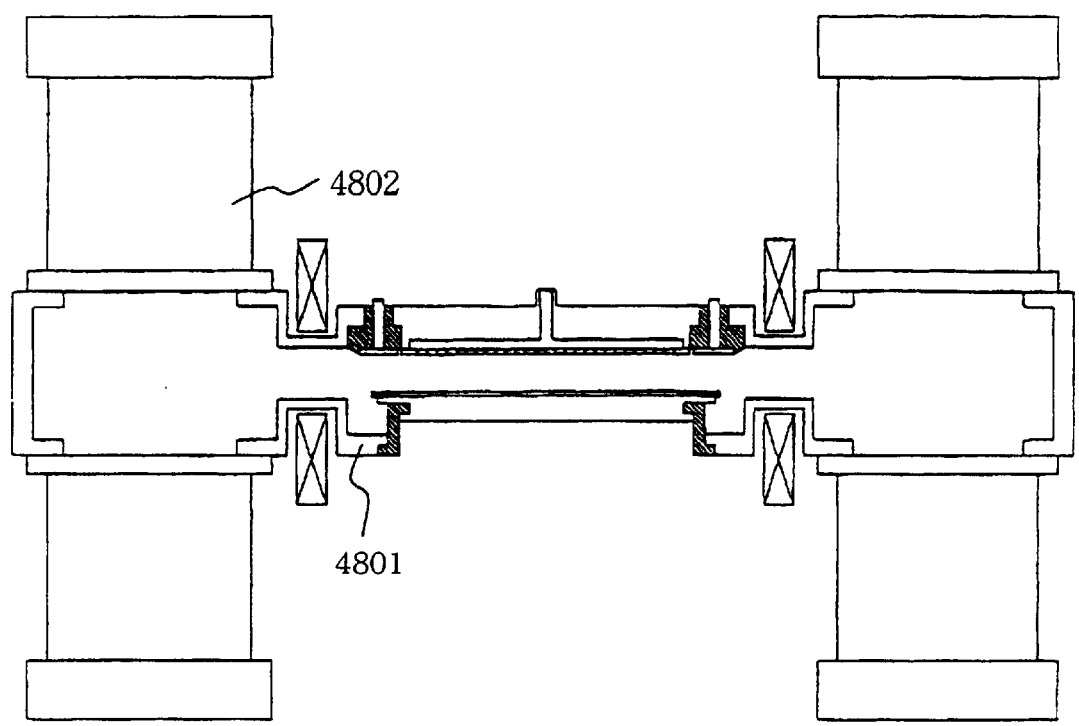
FIG. 48 is a plan view showing an example of a plasma device of the present invention.

In the plasma device of FIG. 48, a four vacuum pumps 4802 are respectively provided in each of upper and lower sections of the vacuum container 4801, making eight vacuum pumps in total. In this way, if the number of vacuum pumps is increased, the load imposed on each vacuum pump is reduced and the vacuum pumps can be made smaller, which means that it is possible to make the footprint of the plasma device smaller. Remaining sections are the same as in the description for FIG. 44.

Figure 49:
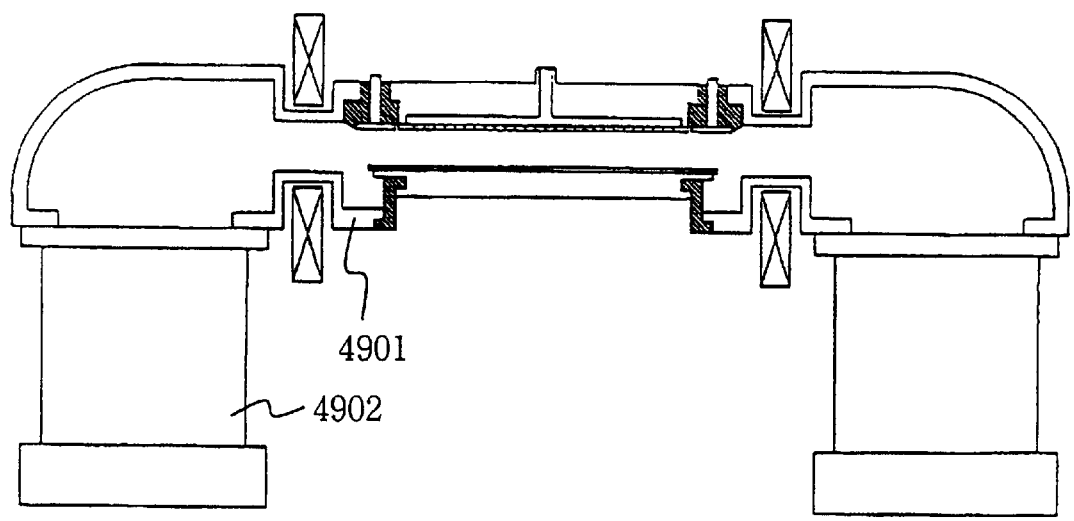
FIG. 49 is a plan view showing an example of a plasma device of the present invention.

The plasma device of FIG. 49 has corners of the upper section of the vacuum container 4901 rounded off. Within a space inside a vacuum container 4901 above the vacuum pump 4902, unnecessary portions where gas flow is slow are reduced in size, which means that the atmosphere within the vacuum container 4901 is further purified.

Figure 50:
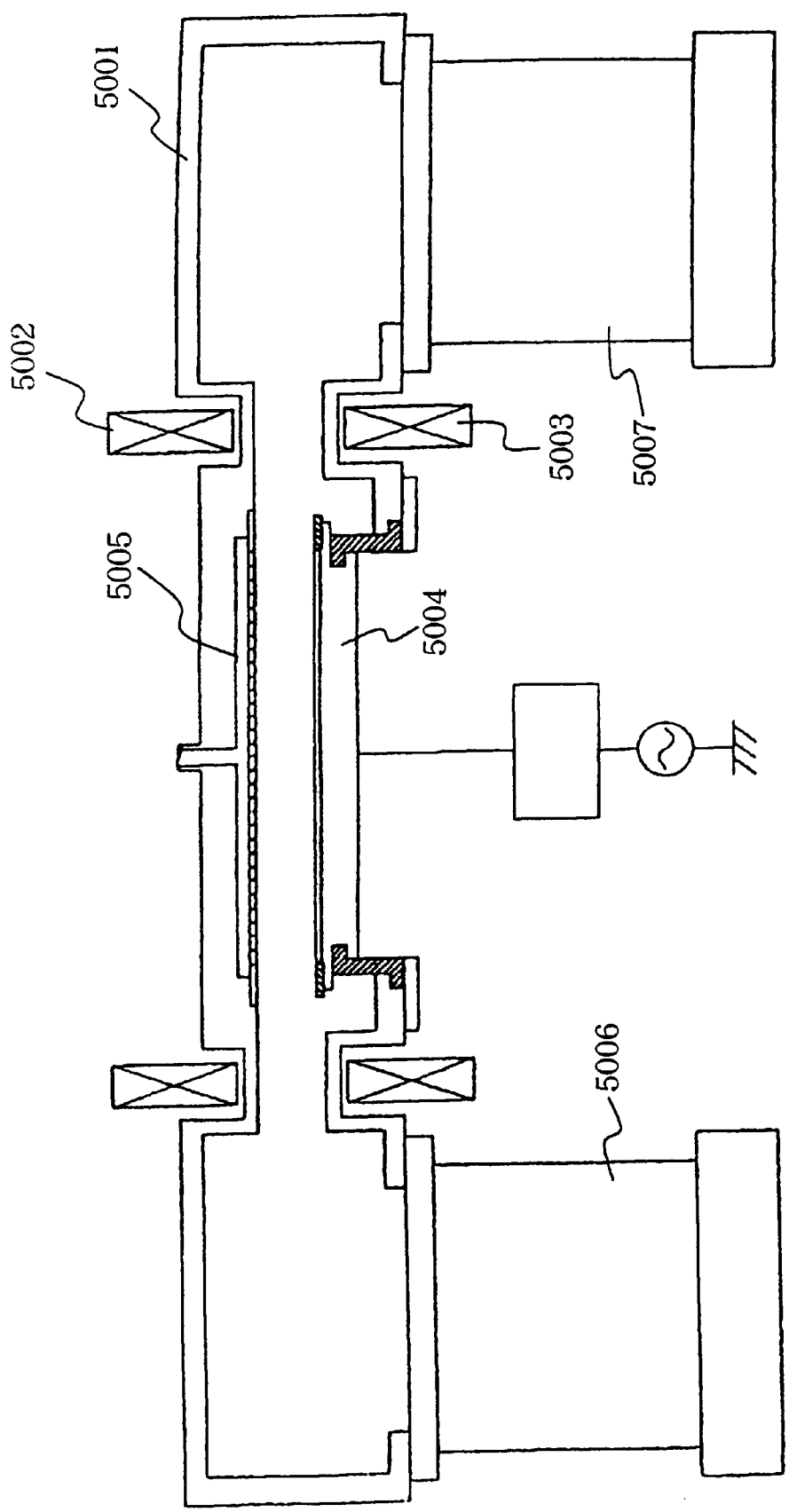
FIG. 50 is a plan view showing an example of a plasma treatment device of the present invention.

FIG. 50 is a plan view showing an example of a plasma processing device of the present invention. Means for applying a magnetic field inside a container 5002 and 5004 are provided outside a vacuum container 5001. Since the means 5002 and 5003 are divided top and bottom, the substrate can be conveyed without having to move an electrode I 5004 for mounting the substrate to be processed up and down. The plate type electrode I 5004 is parallel to a plate type electrode II 5005, which is electrically grounded, and provided with a shower plate as means for introducing source material gas. Reference numerals 5006 and 5007 are means for expelling reaction product gas, and are configured so that the gas is discharged to the outside through a space formed between the magnetic field applying means 5002 and 5003.

Figure 51:
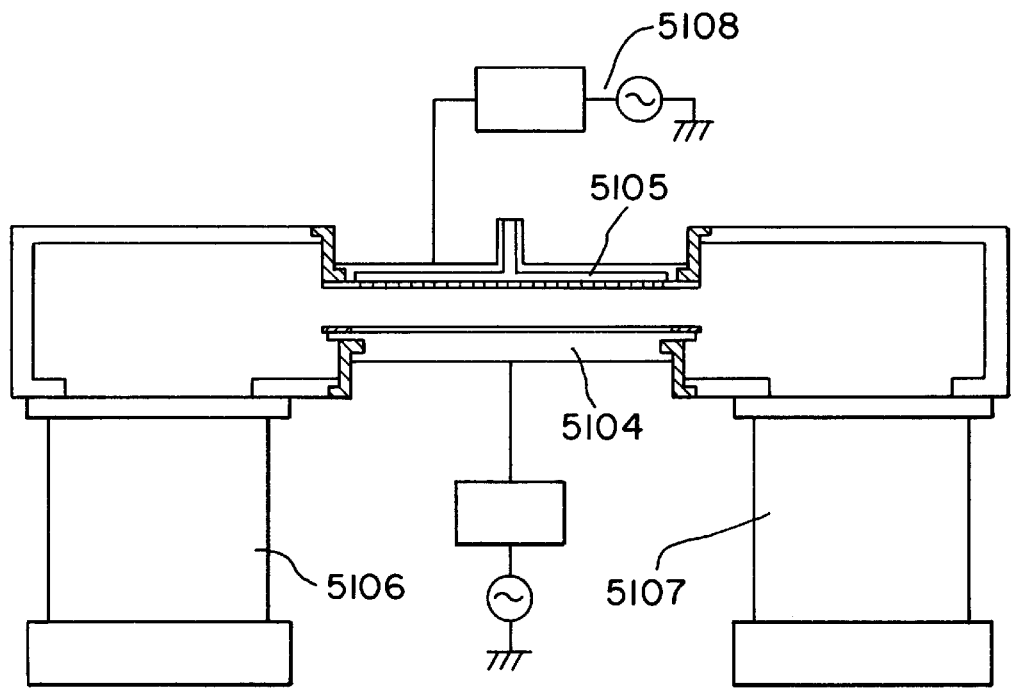
FIG. 51 is a plan view showing an example of a plasma treatment device of the present invention.

FIG. 51 is a plan view showing an example of a plasma processing device of the present invention. A plate type electrode I 5104 is parallel to a plate type electrode II 5105 which is connected to means 5108 for applying a high frequency independently of electrode I, and has a shower plate as means for introducing source material gas. Reference numeral 5106 and 5107 are means for expelling source material gas and reaction product gas to the outside.

Figure 52:
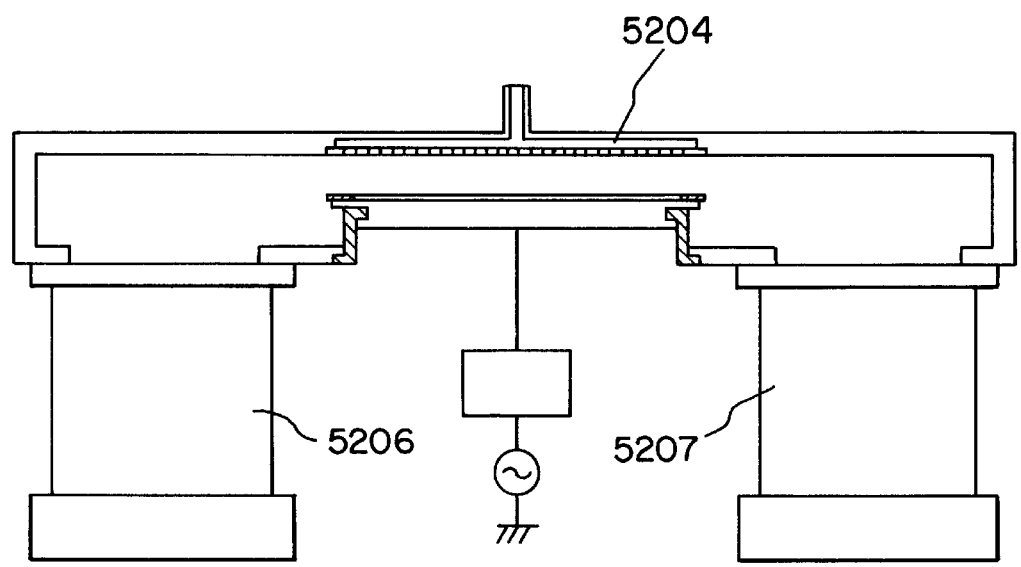
FIG. 52 is a plan view showing an example of a plasma treatment device of the present invention.

FIG. 52 is a plan view showing an example of a plasma processing device of the present invention. An electrode I 5204 is provided, and there is a shower plate as means for introducing source material gas. Reference numerals 5206 and 5207 are means for expelling source material gas and reaction product gas, and are constructed to discharge gas to the outside.

Figure 53:
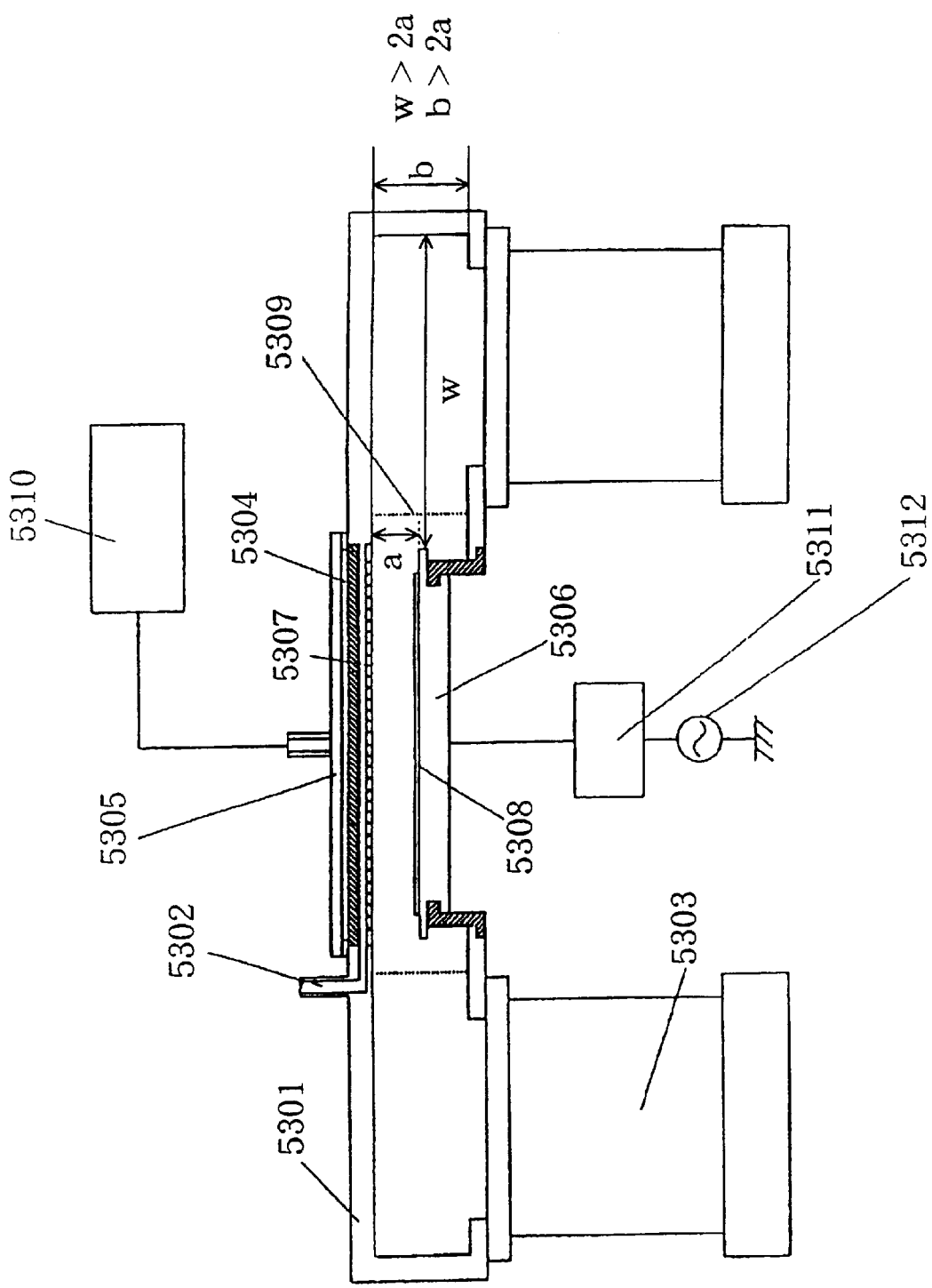
FIG. 53 is a plan view showing an example of a plasma device of the present invention.

The plasma device of FIG. 53 has a vacuum container 5301, a source material gas inlet 5302 required to generate plasma inside the container, and a vacuum pump 5303 for expelling source material gas that has been introduced into the container. Part of a wall section constituting the container is a dielectric plate I 5304 formed of a material capable of transmitting microwaves with substantially no loss, and an antenna 5305 for radiating microwaves and an electrode I 5306 for mounting a substrate 5308 to be processed inside the container are provided outside the container, sandwiching the dielectric plate I. The microwave radiating surface of the antenna and a surface of the substrate that is to be plasma treated are arranged opposite each other and substantially parallel. Here, conveying of radiated microwaves to the outlet side is prevented, and a reflector 5309 is preferably provided only above the substrate, for the purpose of causing uniform plasma generation.

Also, the electrode I for mounting the substrate can be grounded, or it is also possible to provide means for applying a d.c. bias or an a.c. bias. Further, in order to make introduction of source material gas uniform and to swiftly remove reaction product gas, the source material gas of this device is introduced from a plurality of small holes through a shower plate 5307 to a process space. This source material gas and reaction product gas are expelled to the outside by a plurality of vacuum pumps 5303. A comparatively wide space is provided in an upper section of each vacuum pump so as not to cause lowering of the gas conductance. In this way, if gas is expelled from a plurality of vacuum pumps aligned substantially equal distances apart to the side of the substrate, it is possible to realize gas flow above the substrate uniform in a rotational direction without lowering the gas conductance hardly at all. That is, it becomes possible to cause a large amount of gas to flow close to the capacity of the vacuum pump, and it is possible to handle ultra high speed processing of large diameter substrates.

Figure 54:
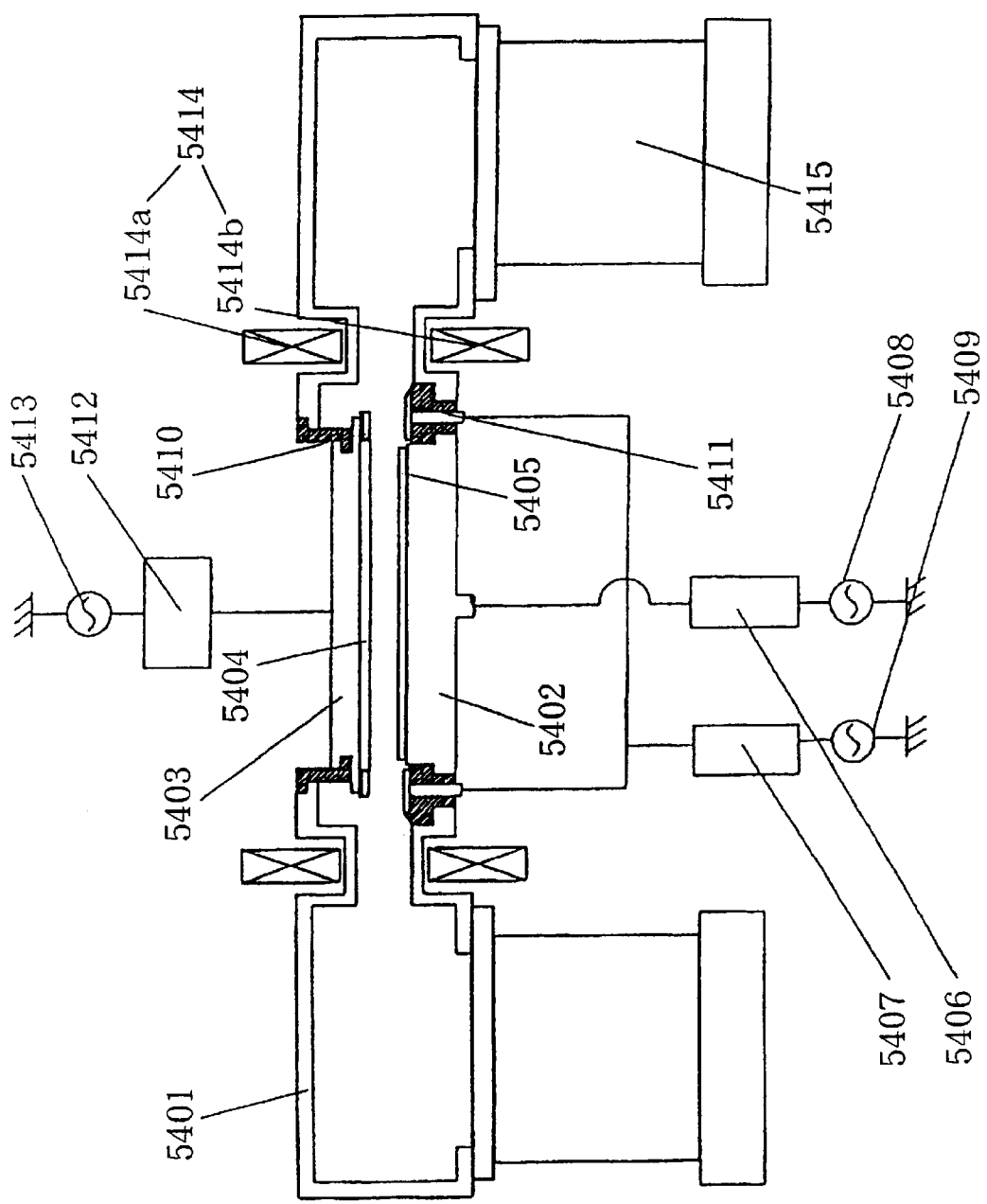
FIG. 54 is a plan view showing an example of a plasma device of the present invention.

The plasma device of FIG. 54 is provided with two parallel plate type electrodes electrode I 5402 and electrode II 5403 inside the vacuum container 5401. A gate valve 5404 and a substrate 5405 on which a film is to be deposited are respectively mounted on the electrode II and the electrode I. Source material gas is then introduced into the container, and matching circuit I 5406, matching circuit II 5412, high frequency power supply I 5408 and high frequency power supply II 5413 are connected for the purpose of applying high voltage to the electrode I and the electrode II. Means 5414 for applying a magnetic field to at least a target surface is provided outside the container. An auxiliary electrode A 5410 is provided at a region further out than the outer edge of the target for the purpose of making the density of plasma generated close to the surface of the target uniform. Means for adjusting a junction impedance provided at a portion electrically connected to the electrode II is attached to the auxiliary electrode A 5410. At the region further out than the outer edge of the target, an auxiliary electrode B 5411 for applying a high frequency power separately and independently of a high frequency applied to the electrodes I and II is provided at a position separated from the substrate and electrode II, also for the purpose of making the density of plasma generated close to the surface of the target uniform. However, as an alternative to providing the auxiliary electrode B it is possible to employ a method for relieving plasma deviation caused by the magnetic field, by making the pressure inside the container at the time of plasma generation a high pressure (1—several tens of Torr). Further, even if the auxiliary electrode A or auxiliary electrode B is not provided, there is no need to specially provide the auxiliary electrode A and B in cases such as when in-plane uniformity of plasma close to the surface of the substrate is satisfactory, or where no problem occurs even with non-uniformity. The gas that has been introduced into the container passes through means 5414a and 5414B for applying a magnetic field to the side of a substrate and is discharged to the outside from a plurality of vacuum pumps 5415. At an upper portion of the vacuum pumps, there is provided a comparatively wide space so as to prevent lowering of the gas conductance. Also, it does not matter if the arrangement of the vacuum pumps is the same as that shown in FIG. 45–FIG. 49. It is also permissible to use another magnetic field applying means for applying the magnetic field. In this plasma device, plasma density is raised using a magnetic field, but there is no problem in using other means, and it is permissible to not use anything when there is no need to raise plasma density.

Still further, the electrode II being the electrode for holding the target can be divided into two equal halves, with a high frequency being respectively applied to the divided halves. However, the phases of the two high frequencies at this time are 180° out of phase with each other and it is necessary to provide means so that discharge does not occur between electrode Ia and electrode IIb. However this method is restricted to when the target is an insulating material, and when the target is conductive the substrate itself must be divided to match up with the electrode II. By using this method, since it becomes possible to keep the plasma potential low, the ion collision energy to the target can be reduced and it is confirmed that better quality films can be formed. It is also possible to use either of the following two methods as means of applying to the electrode II.

Figure 55:
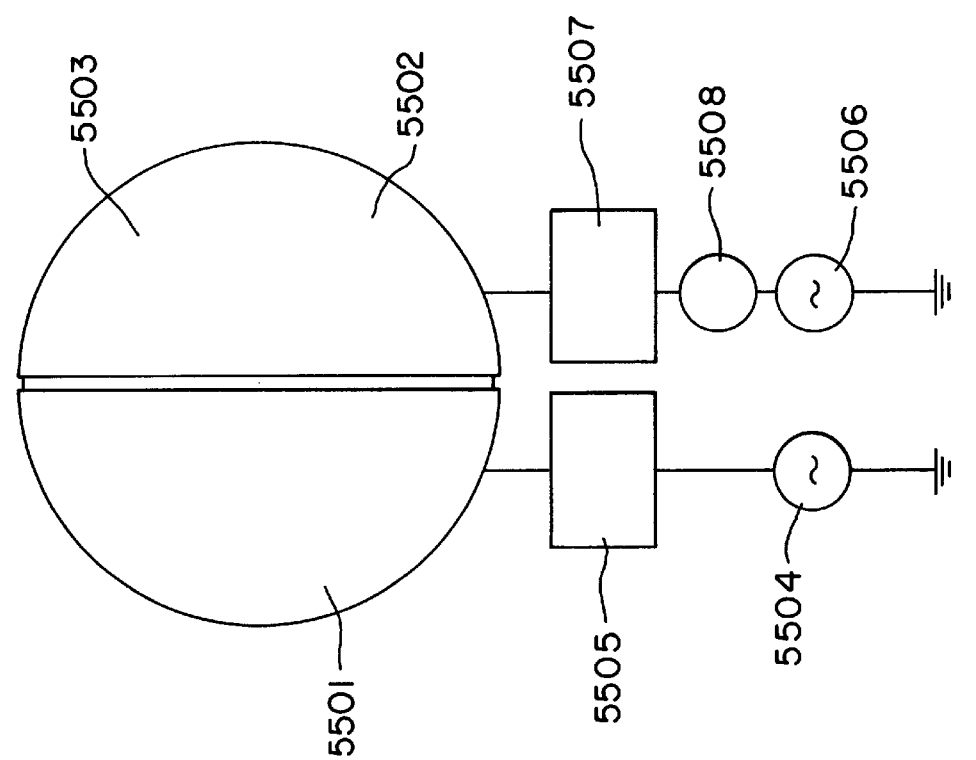
FIG. 55 is a drawing showing an example of means for applying a high frequency to electrode II.

(a) FIG. 55 shows a first method. A high frequency power supply I 5504, matching circuit I 5505, high frequency power supply II 5506 and matching circuit II 5507 are connected to divided electrodes IIa 5501, electrode IIb 5502, for respectively applying a high frequency to the target 5503, electrode IIa and electrode IIb, and the phases of the two high frequencies are made opposite and introduced by connecting a phase adjustment circuit 5508 to the electrode IIb side.

Figure 56:
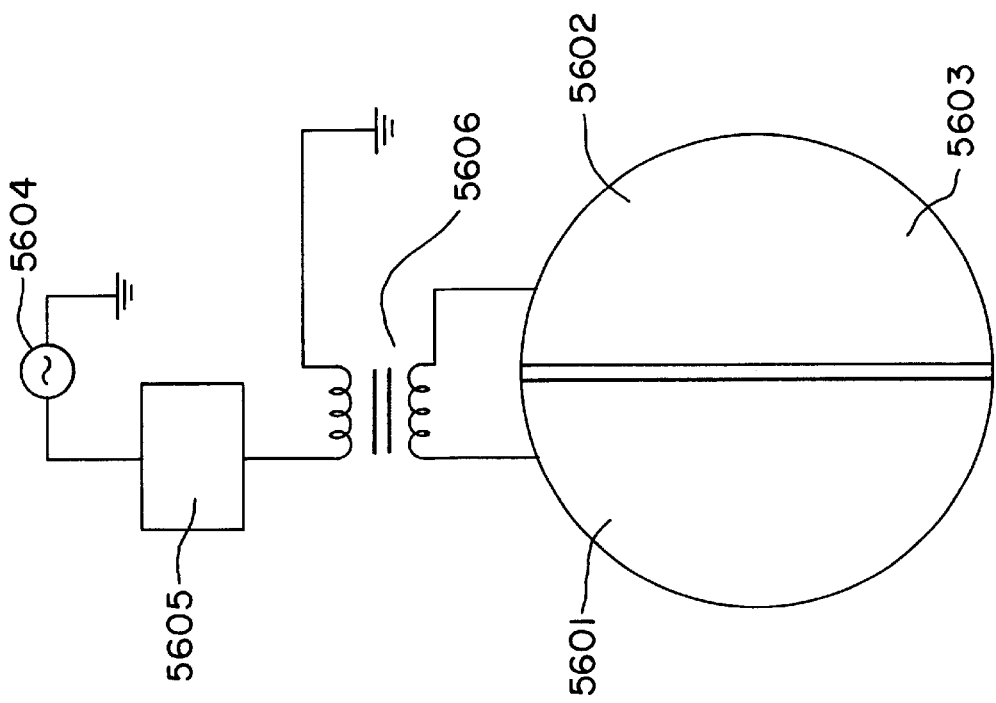
FIG. 56 is a drawing showing an example of means for applying a high frequency to electrode II.

(b) FIG. 56 shows a second method. Reference numeral 5601 represents a divided electrode IIa. Reference numeral 5602 represents electrode IIb and reference numeral 5603 represents a target. High frequency oscillations from the high frequency power supply 5604 propagate to the matching circuit 5605 and are grounded through a balanced/non-equilibrium circuit (balance). Using this circuit, high frequency having mutually reversed phase is introduced.

(3) Taking FIG. 53 as an example, the plasma device of the present invention is provided with the exhaust space 5315 formed directly contacting the intake port 5314 of the vacuum port 5303, to the side of the film forming space 5313 above a substrate 5308.

By providing the exhaust space 5315, being a comparatively wide space, to the side of the film forming space 5313, source material gas that has been introduced from outside, or reaction product gas, is expelled without lowering the gas conductance, and it is possible to make a large amount of gas flow, close to the capacity of the vacuum pump.

This exhaust space 5315 is preferably provided at a number of places, and in this case the spaces are preferably arranged at positions symmetrical around the substantial center of the substrate 5308. If a plurality of such spaces are symmetrically provided, the above described effects are even more remarkable.

The height b of the exhaust space 5315 is preferably as large as is practicable.

The width L of the exhaust space 5315 is preferably at least two times the height a of the film formation space 5313. The uniformity of the gas flow is dramatically improved by the fact that the width L is two times the height a.

Embodiments

A plasma device of the present invention will be described in the following, with reference to the drawings, but the present invention is not limited to these embodiments.
(Embodiment 1)

In this embodiment, when plasma is generated by introducing microwaves into a container using the plasma device shown in FIG. 1, the plasma stability is examined by varying the material of a member constituting an inner surface of the container, and the width of the member.

In FIG. 1, reference numeral 100 is a container capable of having its internal pressure reduced, reference numeral 101 is a chamber, reference numeral 102 is a first dielectric plate, reference numeral 103 is a waveguide dielectric plate, reference numeral 104 is an object to be treated, reference numeral 105 is plasma, reference numeral 106 is an antenna slot plate, reference numeral 107 is a coaxial tube, reference numeral 108 is an antenna guide, reference numeral 109 is an electrode, reference numeral 110 is a slot, reference numeral 201 is a radial line slot antenna, reference numeral 202 is a first O ring, reference numeral 205 is a space 3, reference numeral 206 is a space 4 and reference numeral 207 is a space 5.

In FIG. 1, the container capable of having the internal pressure reduced 100 comprises a chamber 101 (material: SUS), a first dielectric plate 102 (material: quartz), a first O ring 202 functioning as a seal between the chamber 101 and the dielectric plate 102. The inside of the container 100 can be decompressed by an exhaust system, not shown, and the container 100 itself is electrically grounded.

A radial line slot antenna 201, comprising the antenna guide 108 (material: Al), the antenna slot plate 106 (material: Cu) and the waveguide dielectric plate 103 (material: quartz), is located outside the container 100. Microwaves are introduced into the antenna 201 through the coaxial tube 107 (material: Cu), conveyed in a radial direction while leaking out from each slot 110 provided in the antenna slot plate 106, and radiated to the inside of the container 100. Gas is made to flow into the container 100 from a source material gas supply system , not shown, and plasma 105 is excited. There is an electrode 109 having the function of holding an object to be treated 104 inside the container 100, and the electrode 109 is located so that it is parallel to and opposite the antenna 201 and functions to heat the object to be treated. Also, the electrode 109 is capable of being made to move upwards and downwards from outside the container 100, and the distance from the first dielectric plate 102 can be varied from approximately 10 mm to 60 mm.

Figures 2A, 2B:
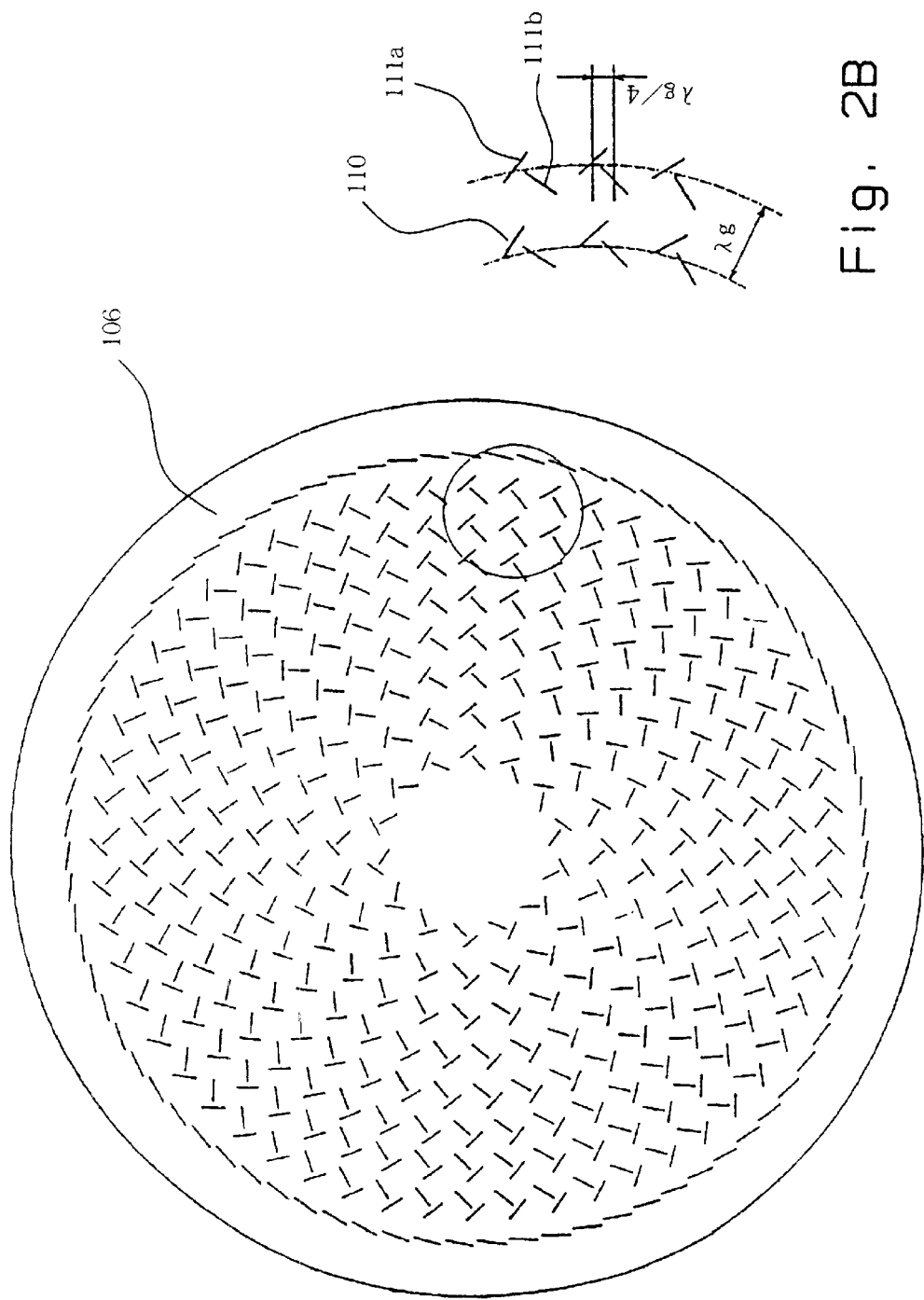
FIG. 2 is a plan view showing one example of a radial line slot antenna used in the device of FIG. 1.

FIG. 2 is a schematic plan view of the radial line slot antenna 201 shown in FIG. 1 looking from above. Hole sections (hereafter referred to as slots) 110 penetrating through antenna slot plate 106 are arranged in the slot plate, but the arrangement of the slots 110 is not limited to that shown in FIG. 2.

The slots 110 are configured having two slots 111a and 111b constituting a single pair, and the two slots in a pair are arranged at right angles to each other at a distance of a quarter of a wavelength λg of an incident wave passing through the coaxial tube 107 to the antenna 201. The pairs comprised of a slot 11a and a slot 11b, namely the slots 110, are each capable of outputting circularly polarized electromagnetic waves, and a plurality of slots 110 are numerously concentrically provided. Besides the concentric arrangement the slots 110 can also be arranged spirally. Although this embodiment is not limited to this concentric arrangement, the slots 110 are provided in this way so as to uniformly radiate electromagnetic waves within a large surface area.

The present invention is not limited to radiation of concentrically polarized electromagnetic waves, and it is possible to use linear polarization, but concentric polarization is preferred.

Reference numeral 107 is a coaxial tube for supplying microwaves to the antenna slot plate 106, and is connected to a microwave power supply through a coaxial tube—waveguide converter, not shown, a waveguide and a matching circuit.

There is also a need for means for conveying the object to be treated 104 into and out of the chamber 101, but this is omitted from FIG. 1.

In this example, microwaves (frequency=8.3 GHz) are introduced to the radial line slot antenna 201 using the coaxial tube 107, electromagnetic waves are radiated from the antenna 201 and plasma 105 is excited inside the space 5 of the chamber 100. However, There was no excitation of plasma 105 within the space 5 (207) with the SUS chamber 101.

Accordingly, plating layers (7) comprising lead, tantalum, tungsten, aluminum, gold, copper and silver are coated on an inner surface of the SUS chamber 101 and the above described plasma ignition test was carried out. At this time, as the process gas Ar gas was used, and gas pressure was 500 mTorr.

FIG. 3 shows the results of the plasma ignition test. At this time, the thickness of the plating needs to be thicker than a skin depth determined from $d=(2/\mu_0\sigma\omega)^{1/2}$ of the microwaves, which means about 10 $\mu$m. From FIG. 3, it is understood that if the specific conductivity of the material of the inner surface of the chamber 101 is made high, then it is easy for plasma excitation to take place. The results of this test show that at the instant microwaves are introduced into the container 100 the container starts to act as a resonator, and since a strong electric field is required in the plasma ignition test the q value of the resonator must be made high.

Figure 4:
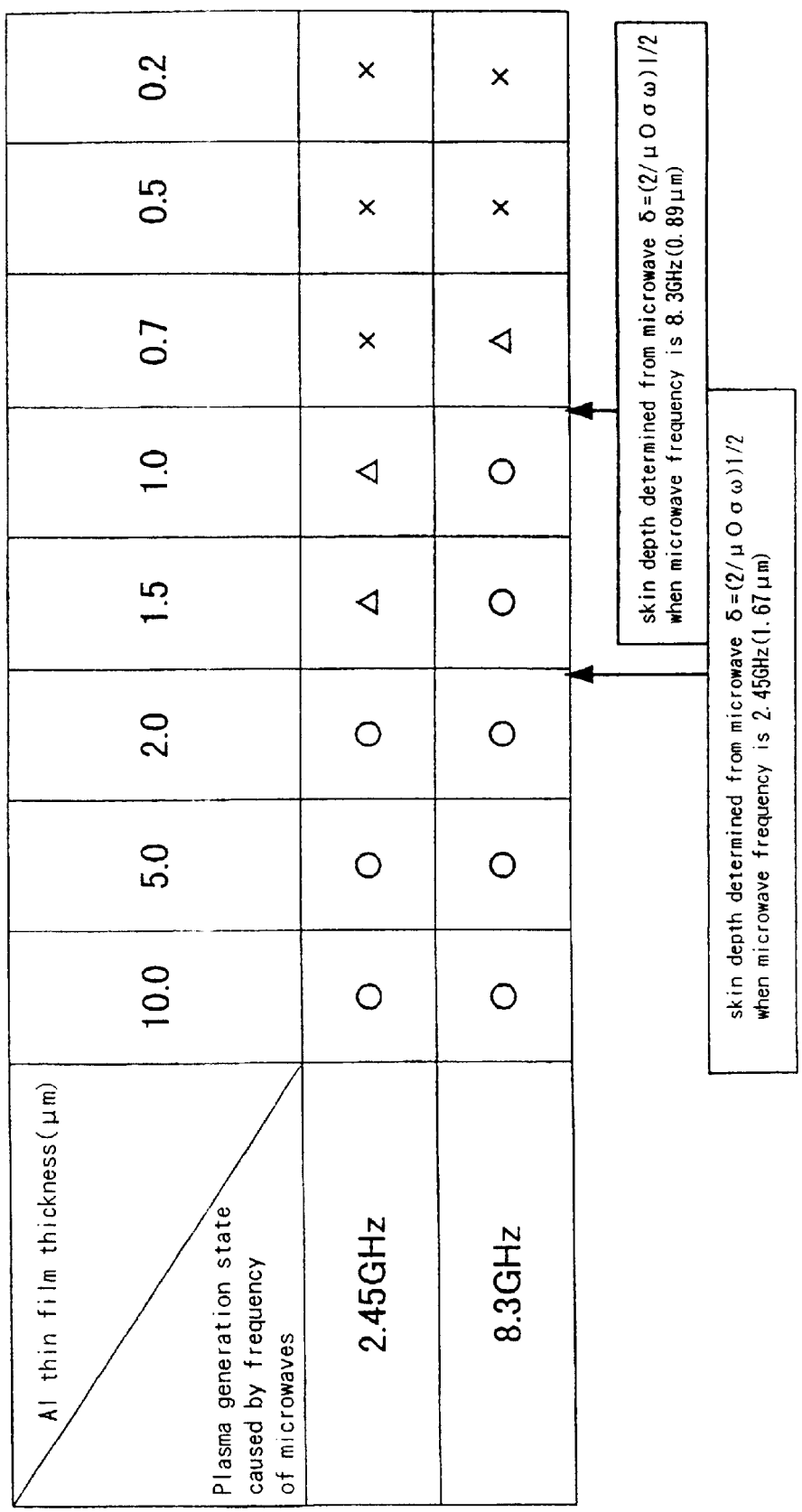
FIG. 4 is the results of a plasma ignition test relating to the first embodiment, showing interdependence between plating film thickness and microwave frequency.

FIG. 4 shows results when an aluminum plating layer is provided on the inner surface of the SUS chamber 101 and a plasma ignition test is carried out by varying the thickness of the plating layer and the wavelength of microwaves introduced to the antenna 201. From FIG. 4 it can be confirmed that at the time when the thickness of the aluminum plating layer is thicker than a skin depth of 1.67 $\mu$m determined from microwave $d=(2/\mu_0\sigma\omega)^{1/2}$, in the case of the frequency of the microwaves being 2.45 MHz, and that at the time when the thickness of the aluminum plating layer is thicker than a skin depth of 0.89 $\mu$m determined from microwave $d=(2/\mu_0\sigma\omega)^{1/2}$, in the case of the frequency of the microwaves being 8.3 MHz, plasma is stable.

Here, $\mu_0$ is permeability of vacuum, $\sigma$ is conductivity of the material in question, and $\omega$ is the angular frequency of the microwaves.

From the results described above, the following points become clear.

1) When the material of the member constituting the inner surface of the container is SUS, conductor loss is large and ignition is difficult.

2) By replacing the material of the member constituting the inner surface of the container for high conductivity material, the Q value of the resonator becomes comparatively high and the problem of difficult ignition does not arise.

3) When a material having conductivity of at least the conductivity of aluminum ($3.7\times10^7$ [$\Omega^{-1}\cdot m^{-1}$]) is used as for the inner surface of the chamber 101, the plasma becomes stable, and copper, gold, silver etc. are suitable as such as material.

Figure 5:
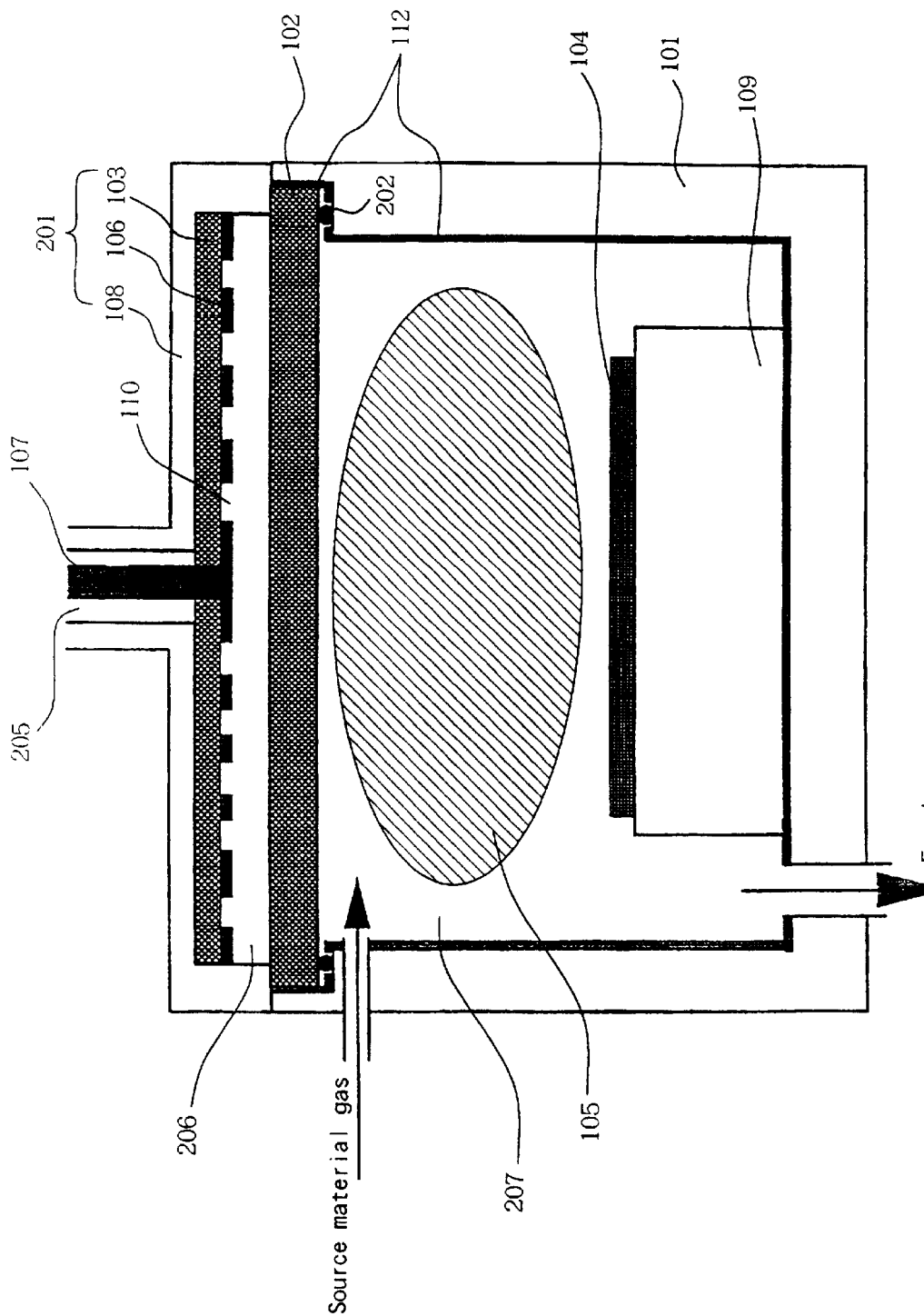
FIG. 5 is a cross section of a device relating to embodiment 1 showing the case where a plating layer is provided on an inner surface of the chamber.
Figure 6:
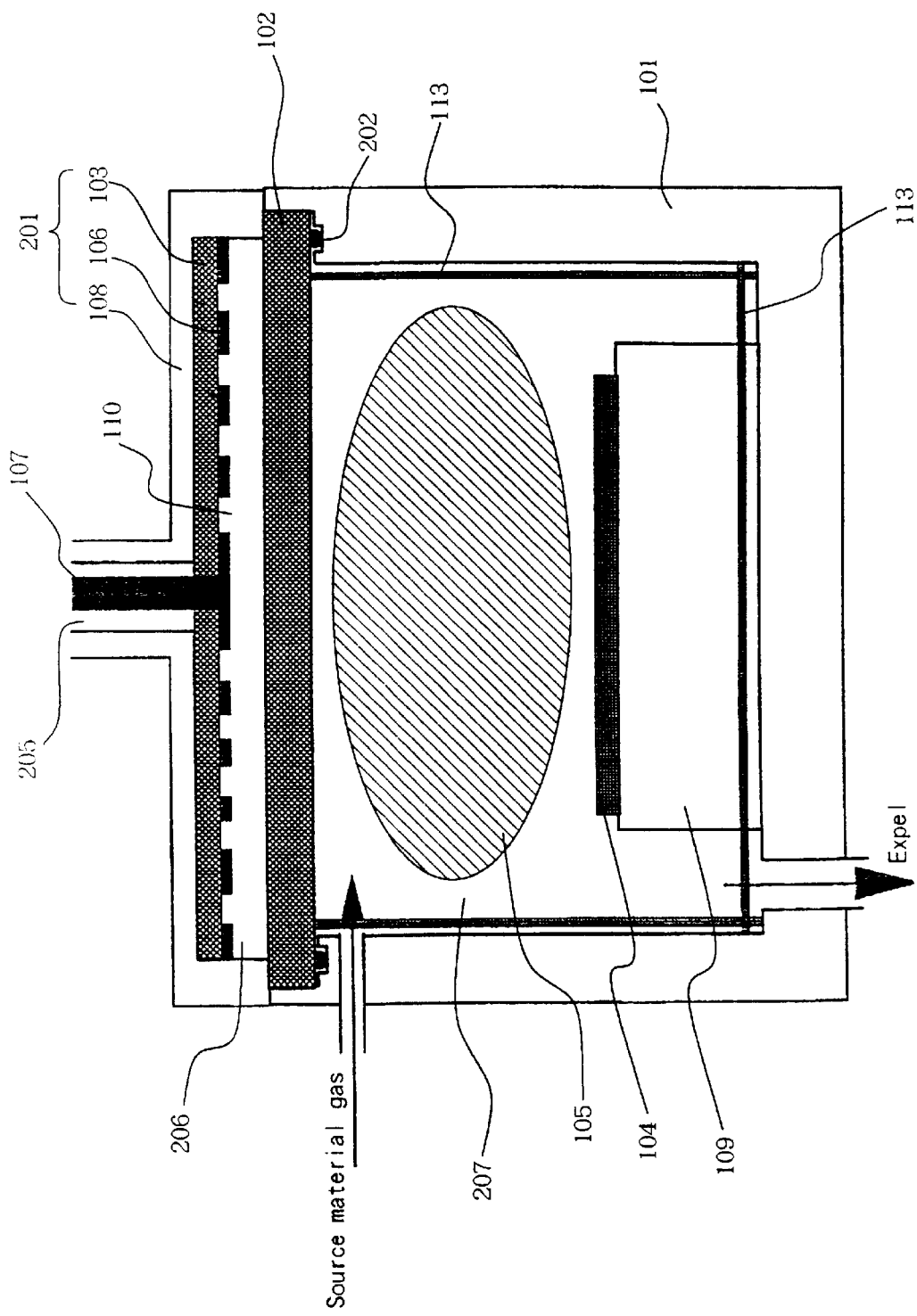
FIG. 6 is a cross section of a device relating to embodiment 1 showing the case where the inner surface of the chamber is covered with a plate member comprising a prescribed material.

A device incorporating the above results can be as shown in FIG. 5 and FIG. 6. The device of FIG. 5 differs from the device in FIG. 1 in that an aluminium plating film 112 is coated to a thickness of 10 $\mu$m on the inner surface of the SUS chamber 101. The device of FIG. 6 is different from the device of FIG. 1 in that it uses a plate member 113 comprised of the above described material (having a thickness greater than the skin depth determined from the microwaves) and the inner surface of the chamber is covered. It can be confirmed that the devices of FIG. 5 and FIG. 6 are the same with respect to plasma stability.

(Embodiment 2)

Figure 7:
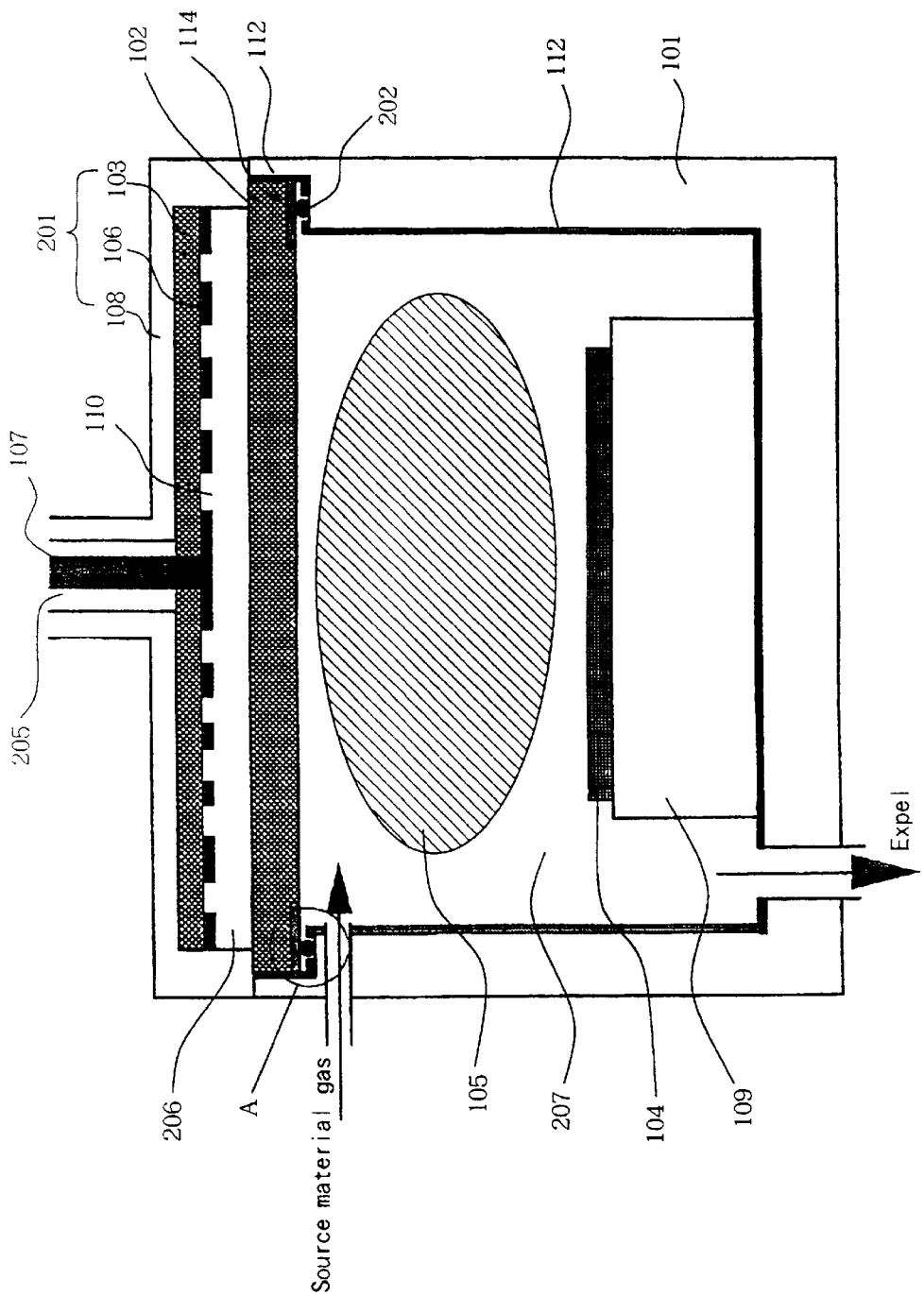
FIG. 7 is a cross section of a device relating to embodiment 2.

In this embodiment, the device of FIG. 5 is different from embodiment 1 in that a metallic thin film 114 is provided at a vacuum seal region where the first dielectric plate 102 (material: quartz) contacts a first O ring 202, as shown in FIG. 7, and the first O ring is not exposed to electromagnetic waves radiated from the antenna slot plate 106. Fluorine type resin is used as the material for the first O ring.

Figure 8:
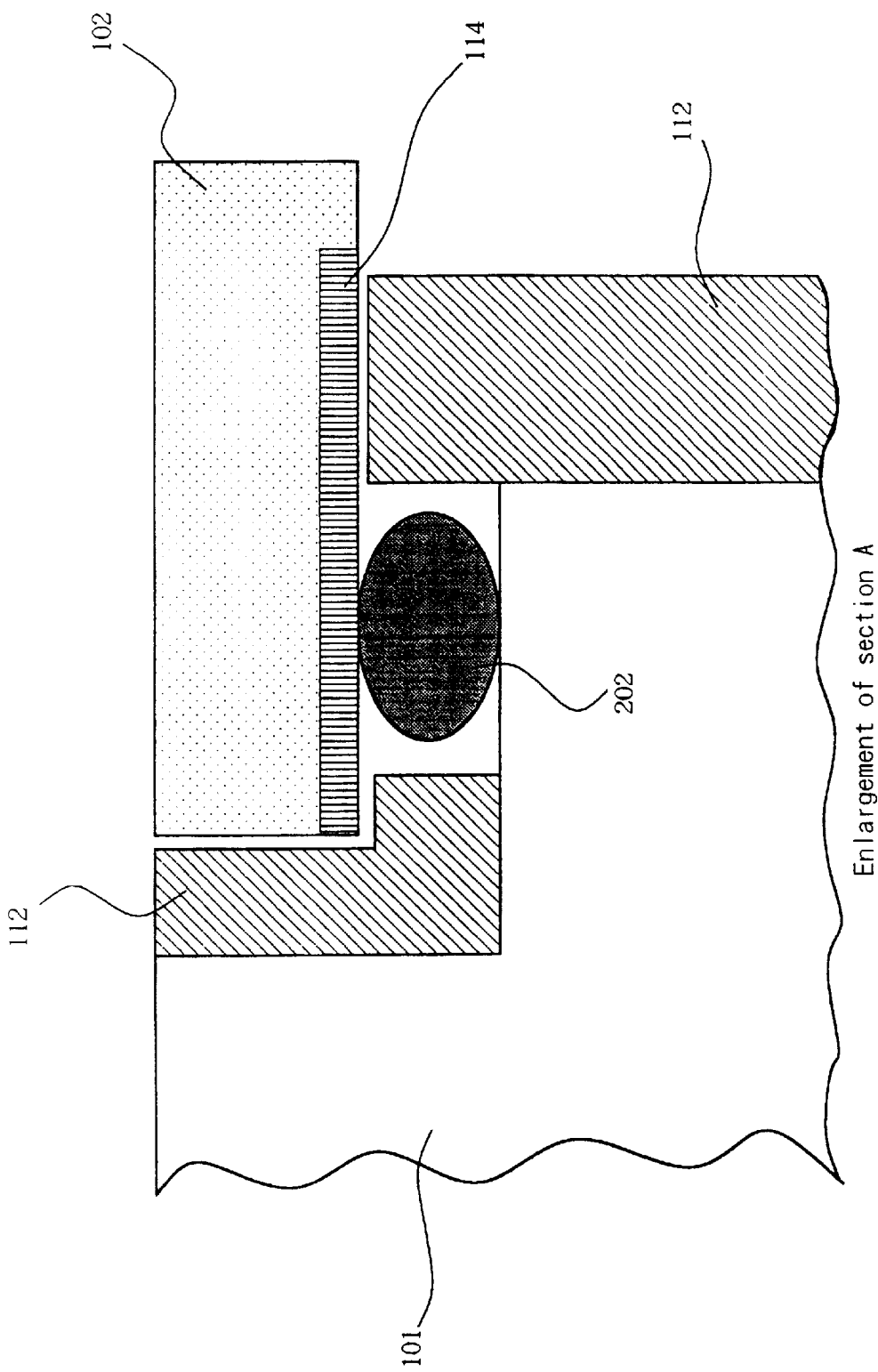
FIG. 8 is an enlarged view of region A in FIG. 7, and shows a case where a first dielectric plate comes into contact with a first O ring and a metallic thin film 114 is provided on a vacuum sealing region.

FIG. 8 is an enlarged view of region A in FIG. 7, and shows the case where the metallic thin film 114 is provided at a vacuum seal region where the first dielectric plate 102 (material: quartz) contacts a first O ring 202.

When the first O ring is made of a material such as resin that absorbs microwaves, it is directly heated by electromagnetic waves radiated from the antenna slot plate 106m as a result of discharge over a long time and it will be understood that damage will occur.

Therefore, metallic thin films each having a thickness of 10 $\mu$m and respectively being aluminium, nickel, and copper are provided at the vacuum seal region where the first dielectric plate 102 contacts the first O ring 202, as the metallic thin film 114. This thickness of 10 $\mu$m was validated in embodiment 1, and is a thickness value larger than the skin depth determined from microwave $d=(2/\mu O\sigma\omega)^{1/2}$ that can sufficiently reflect microwaves. A durability test of the first O ring 202 was carried out using a device provided with this type of metallic thin film 114. The results showed that when nickel (conductivity: $1.4\times10^6$ [$\Omega^{-1}\cdot m^{-1}$]) was used, conductivity was low so microwaves were not sufficiently reflected, the power of the microwaves was subject to heat loss and the first O ring was excessively heated and damaged after a discharge time of 2–3 hours. On the other hand, in the case where a comparatively high conductivity material such as aluminum (conductivity: $3.7\times10^7$ [$\Omega^{-1}\cdot m^{-1}$]) or copper (conductivity: $6.0\times10^6$ [$\Omega^{-7}\cdot m^{-1}$]) was used, damage to the first O ring could not be confirmed even after a discharge time of 100 hours.

Consequently, it has been found that the metallic film 114 should have high conductivity and high adhesion to the first dielectric plate 102. It also goes without saying that it is necessary for the thickness of the metallic thin film 114 to be thicker than the skin depth determined from microwave $d=(2/\mu_0\sigma\omega)^{1/2}$.

Figure 9:
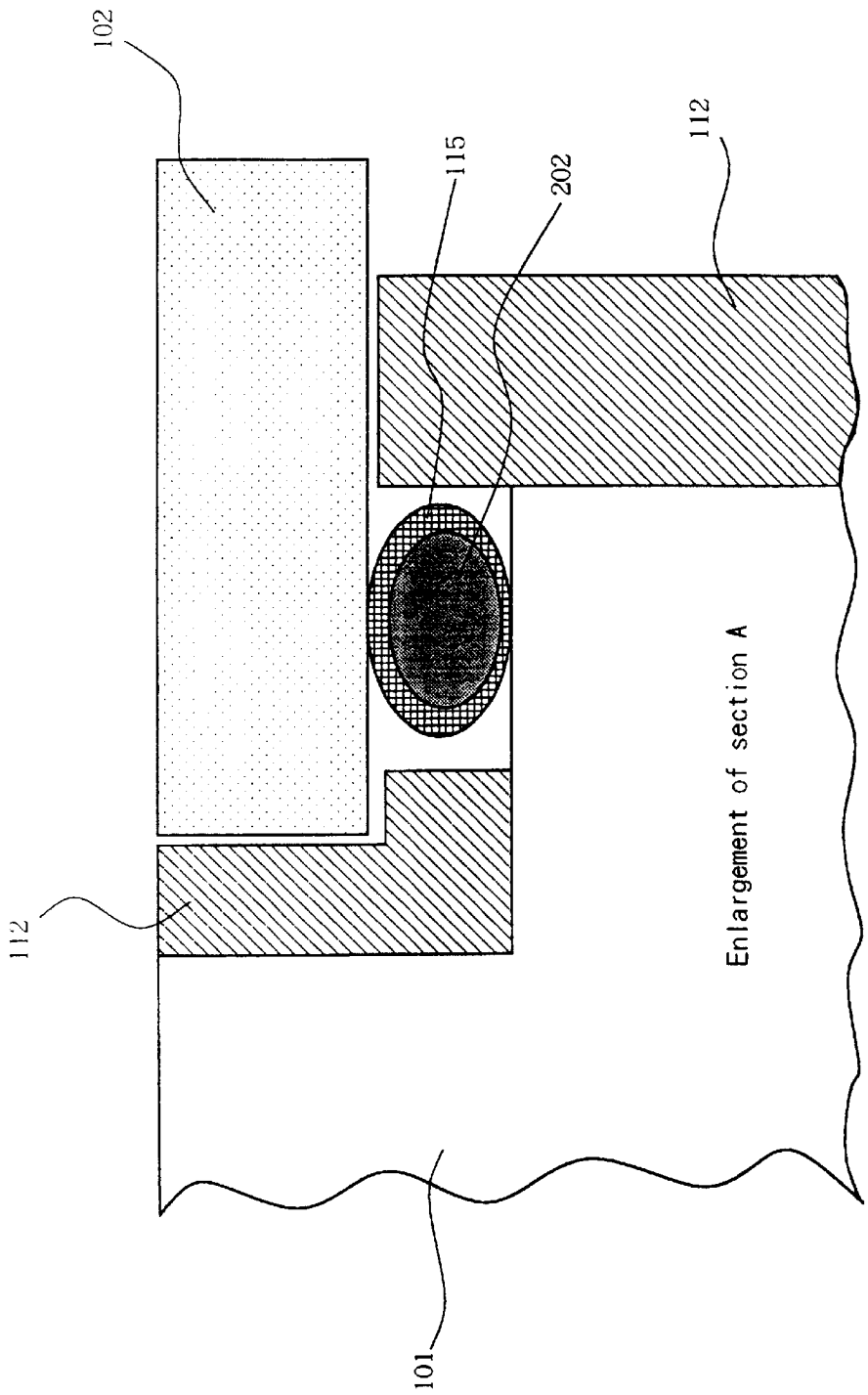
FIG. 9 is an enlarged view of region A in FIG. 7, and shows a case where the first O ring is enveloped by a metallic thin film 5.

FIG. 9 is an enlarged view of region A in FIG. 7 and shows the case where in place of the metallic thin film 114 the first O ring 202 itself is coated with a metallic thin film 115 having the same function as the metallic thin film 114 provided in the first dielectric plate 102. In this way, by also coating the first O ring 202 itself with the metallic thin film 115 the same effects as for the device of FIG. 8 can be obtained. Also in the case where the first O ring 202 is made of metal, the above problem is solved.

(Embodiment 3)

Figure 10:
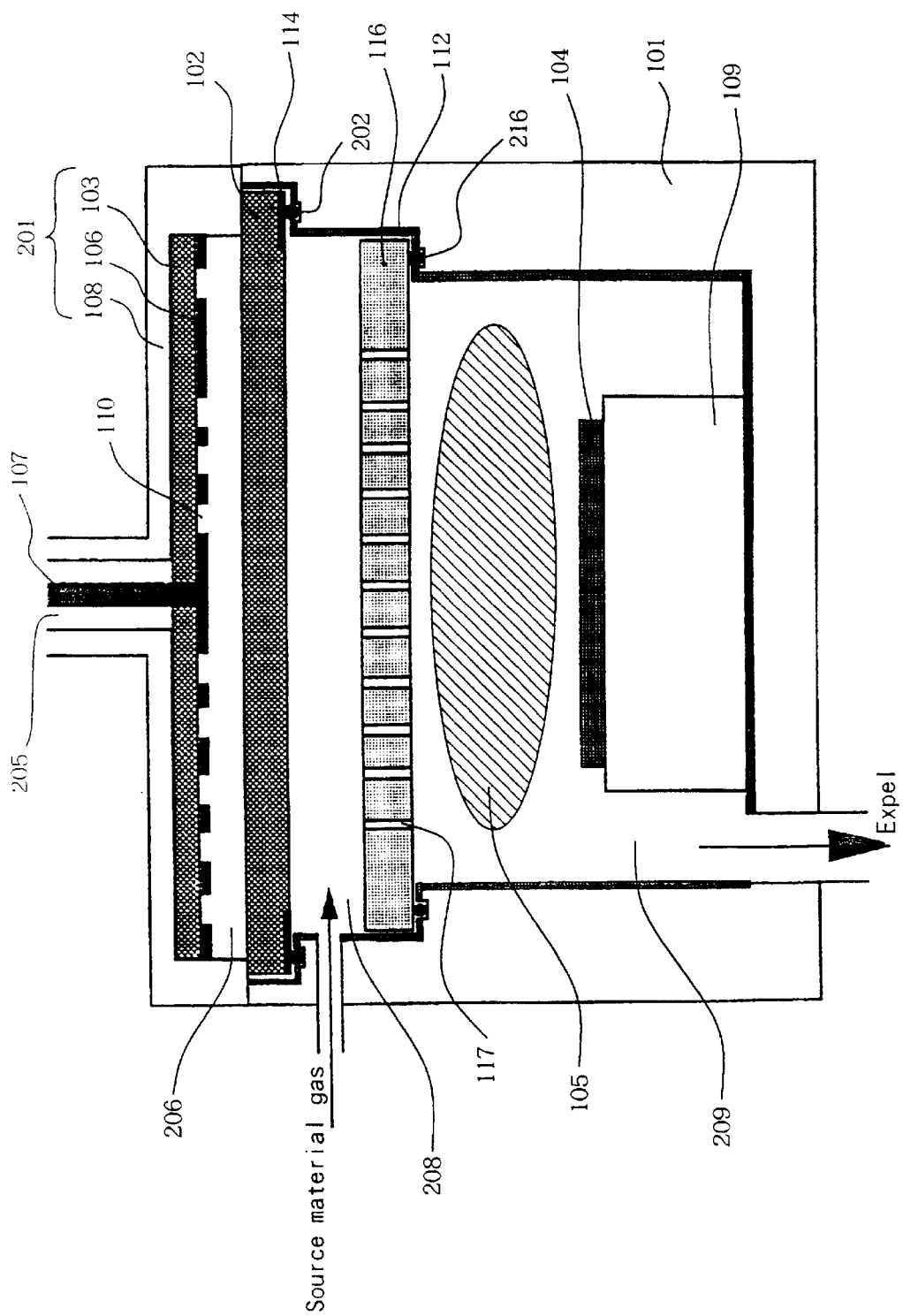
FIG. 10 is a cross section of a device relating to embodiment 3.

In this embodiment, as shown in FIG. 10, a device provided with a second dielectric plate 116, having a gas inlet 117 for supplying desired gas in a substantially uniform manner provided between the first dielectric plate 102 and the electrode 109 for holding the object to be treated 104, was used, and the uniformity of plasma 105 generated in the space 2 (109) was examined.

FIG. 10 shows the device incorporating the results of the second embodiment, and aluminum (Al) was coated to a thickness of 10 $\mu$m as a metallic thin film 114, at a region for vacuum sealing where the first dielectric plate 102 comes into contact with the first O ring 202. AlN (aluminium nitride) was used as the second dielectric plate 116 shown in FIG. 10. Since aluminium nitride contains nitrogen, it is characterized by the fact that there is less discharge gas compared to quartz.

In the device of FIG. 10, Ar gas was introduced into space 1 (208) as a plasma gas, and uniformity of plasma 105 generated in the space 2 (209) as a result of introducing microwaves to the antenna 201 was evaluated in order to study the ion saturation current density. At this time, the gas pressure of the space 2 (209) was 50 mTorr, and the power of microwaves input to the antenna 201 was 1600 W.

Figure 11:
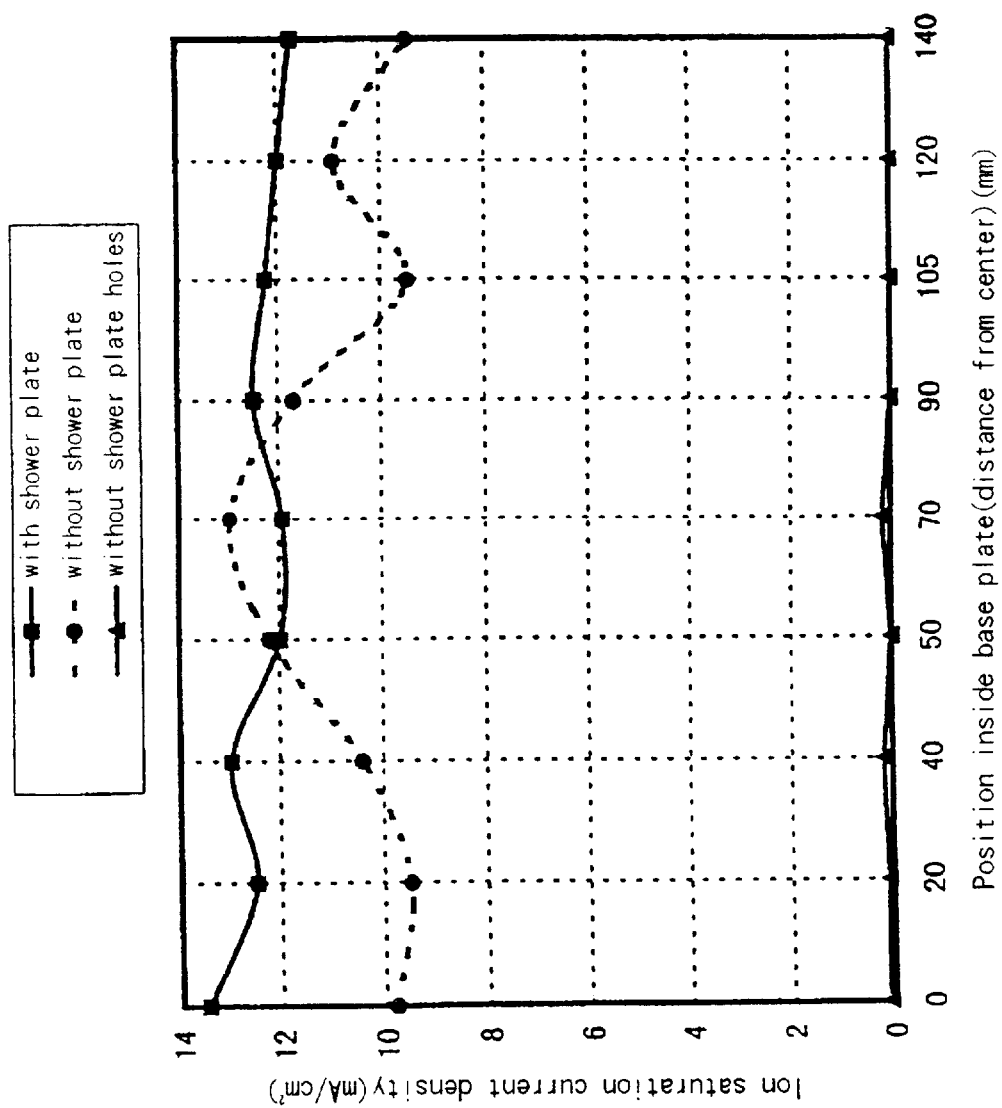
FIG. 11 is a graph showing the ion saturation current density in embodiment 3.

FIG. 11 is a graph showing the results of studying saturated electron current density. In FIG. 11, the mark ■ represents the case when the second dielectric plate 116 having the gas inlet 117 is provided, the mark ● represents the case where the second dielectric plate 116 is not provided, and the mark ▲ represents the case where the second dielectric plate 116 is provided without the gas inlet 117.

From FIG. 11 is will be understood that by providing the second dielectric plate 116 having the gas inlet 117 the plasma is made uniform. In the case where the gas inlet 117 is not provided (mark ▲) there is no reaction accelerator for causing plasma excitation inside the container [namely the space 2 (209)), which obviously means that there will be no plasma excitation.

By providing this type of second dielectric plate 116 it is possible to supply source material gas uniformly onto a surface of an object to be treated 104 having a diameter greater than 300 mm which was impossible in the related art, and it is also possible to uniformly remove generated reaction by-product gas from the object to be treated 104.

With the above described second dielectric plate 11 6, gas inlets 117 are arranged so that there are an equal number per unit surface area, but this arrangement is not limiting and it is possible to arrange them as conditions demand.

(Embodiment 4)

In this embodiment, the plasma device of FIG. 10 is provided with a metallic thin film 214 at a region for vacuum sealing where the second dielectric plate 116 (material: aluminium nitride) comes into contact with the second O ring 216, and the effect of preventing the second O ring 216 being exposed to electromagnetic waves radiated from the antenna slot plate 106 was evaluated. Aluminium (Al) having a thickness of 10 $\mu$m was used as the metallic thin film 214, and fluorine type resin was used as the second O ring 216.

Figure 12:
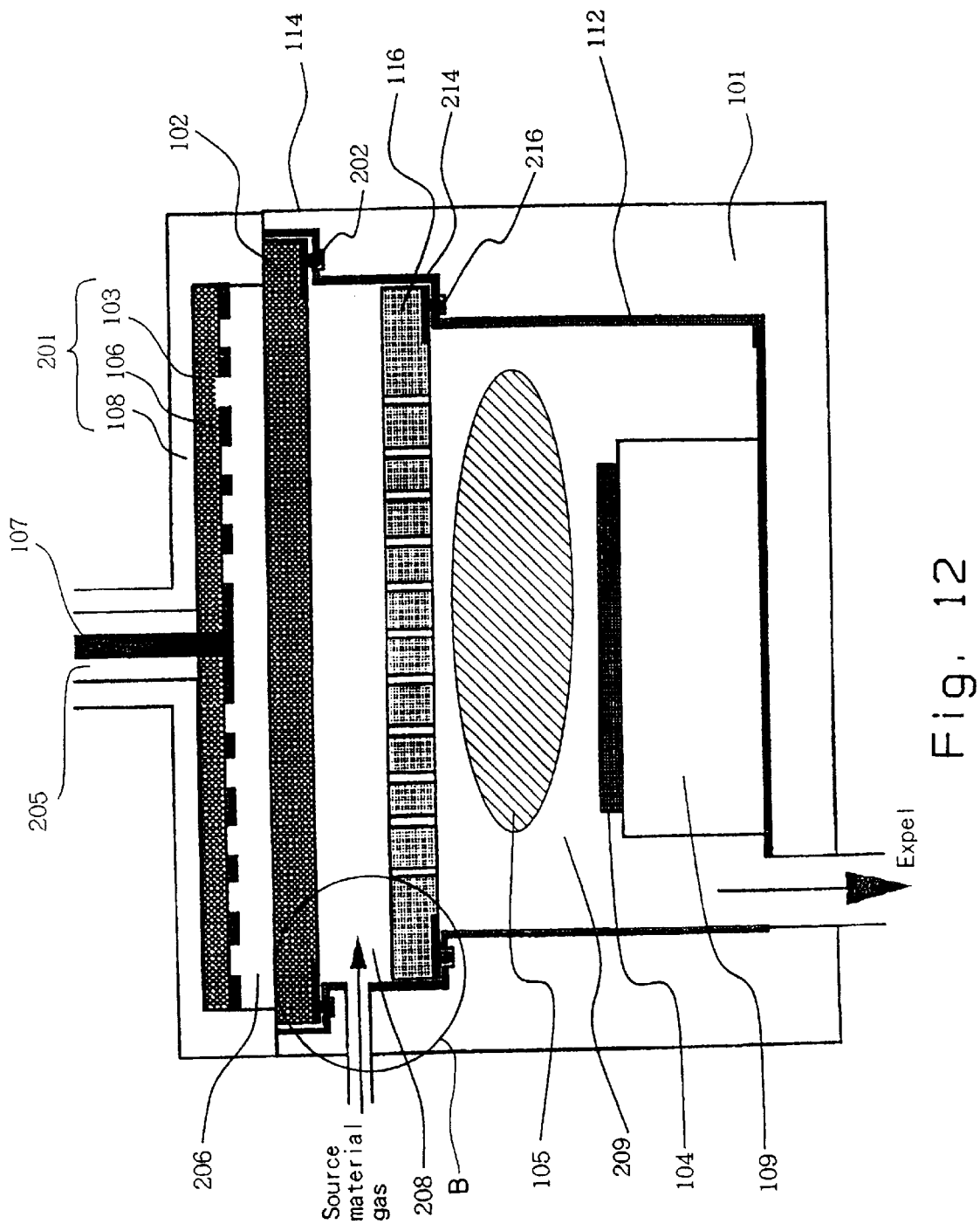
FIG. 12 is a cross section of a device relating to embodiment 4.
Figure 13:
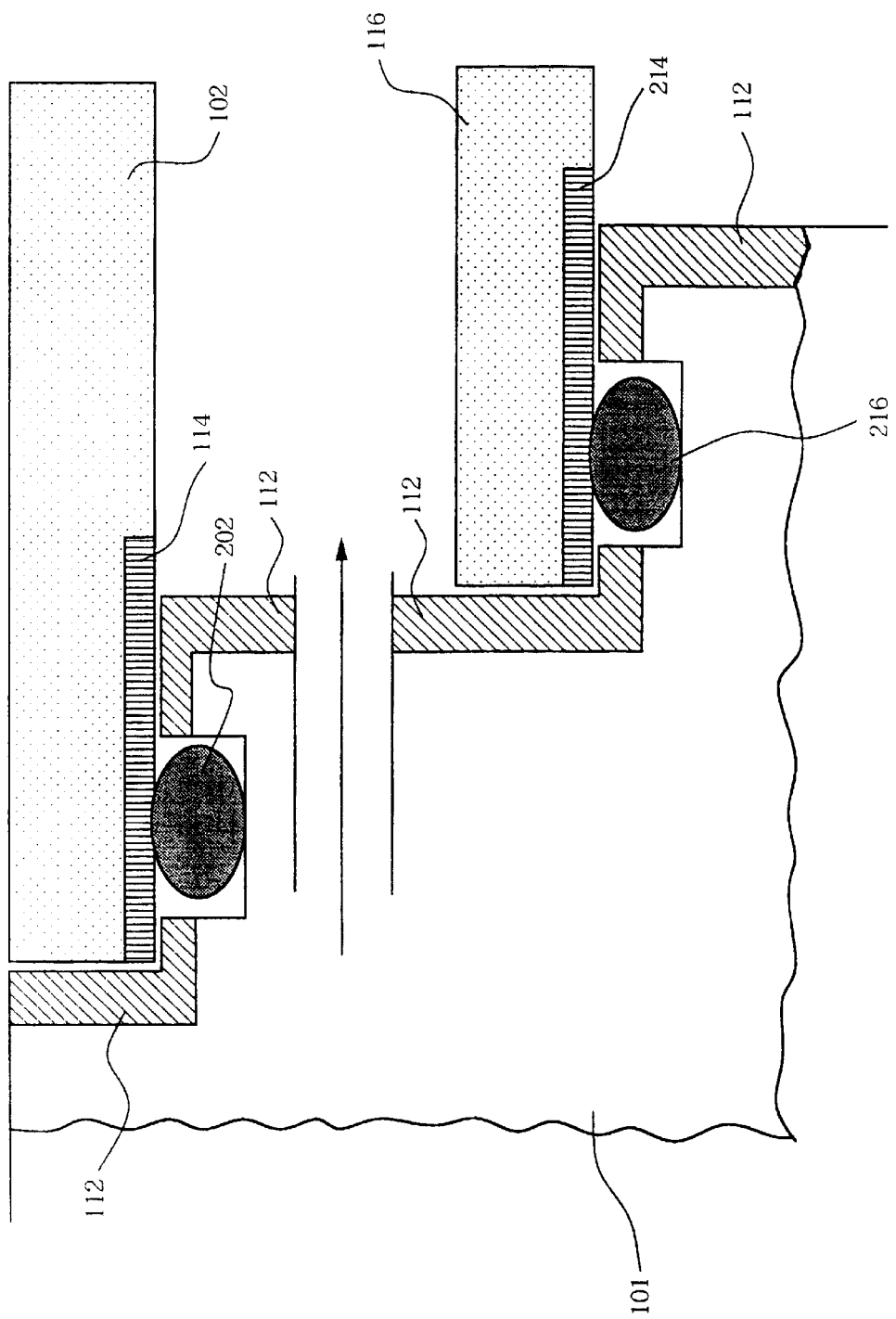
FIG. 13 is an enlarged view of region B in FIG. 12.

FIG. 13 is an enlarged view of region B in FIG. 12.

Apart from this point, embodiment 4 is the same as embodiment 2.

Similarly to embodiment 2, the extent of damage to the second O ring 216 was evaluated. These results show that in the case where the metallic thin film 214 is provided, similarly to the case where the metallic thin film 114 of embodiment 2 is provided, there was no damage to the second O ring 216 even after a discharge time of 100 hours.

Also, similarly to the first O ring 202 shown in FIG. 9, the second O ring 216 shown in FIG. 10 can be itself covered with a metallic thin film 115 having a similar function to the 114 provided on the second dielectric plate 116, and it was confirmed that this had the same effect as when the above described metallic thin film 214 was provided.

(Embodiment 5)

With this embodiment, in the plasma device of FIG. 12 materials having a different dielectric loss angle are used as the first dielectric plate 102, and the density (ion saturation current) of plasma generated in the space 2 (209) was evaluated.

As materials having a different dielectric loss angle for constituting the first dielectric plate 102, Bakelite (BM-120, dielectric loss aangle=0.044), glass (corning #0010 dielectric loss aangle=0.006), AlN (dielectric loss aangle=0.001), and $SiO_2$ (dielectric loss aangle=0.0001) were used. At this time, the material constituting the second dielectric plate 116 was AlN.

Apart from this point, embodiment 5 was the same as embodiment 2.

Figure 14:
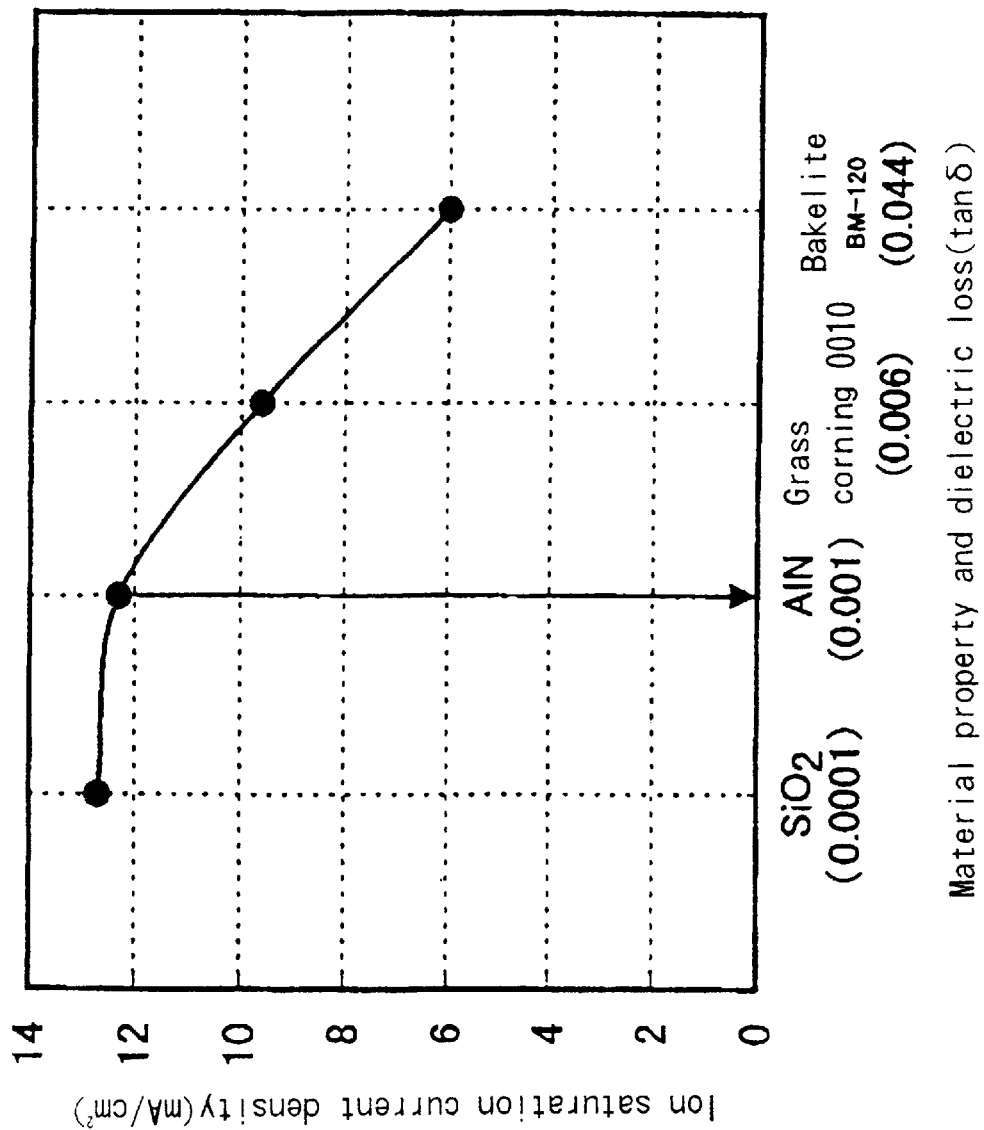
FIG. 14 is a graph showing the ion saturation current density in embodiment 5.

FIG. 14 is a graph showing results of measuring the ion saturation current. It will be understood from FIG. 14 that since electrical loss becomes small and microwave power is supplied to the container without loss with decrease in the dielectric loss angle tan δ, the plasma density(ion saturation current) increases. Particularly, it will be understood that when a material having dielectric loss angle tan δ of less than $10^{-3}$ is used as the first dielectric plate 102, it is possible to obtain plasma having a high ion saturation current of 12 $mA/cm^2$. This means that it is preferable to have a material with a lower dielectric loss angle tans as the material for the first dielectric plate 102, for example, quartz ($SiO_2$) or aluminium nitride (AlN) having tan δ of less than $10^{-3}$.

(Embodiment 6)

With this embodiment, in the plasma device of FIG. 12 materials having a different dielectric loss angle are used as the second dielectric plate 116, and the density (ion saturation current) of plasma generated in the space 2 (209) was evaluated.

As materials having a different dielectric loss angle for constituting the second dielectric plate 116, Bakelite (BM-120, dielectric loss angle=0.044), glass (corning #0010 dielectric loss angle=0.006), AlN (dielectric loss angle= 0.001), and $SiO_2$ (dielectric loss angle=0.0001) were used. At this time, the material constituting the second dielectric plate 116 was quartz.

Apart from this point, embodiment 6 was the same as embodiment 5.

Substantially the same effects as in FIG. 14 are also obtained with this embodiment. That is, it can be understood that when a material having a dielectric loss angle tan δ of less than $10^{-3}$ is used for the second dielectric plate 116, plasma having a high ion saturation current of greater than 12 $mA/cm^2$ can be obtained.

However, there is a need to provide gas inlets 117 in the second dielectric plate 116, and a requirement to use a material with satisfactory manufacturing precision. Accordingly, it is possible to use quartz (SiO2) or aluminium nitride (AlN) having tan δ of less than 10–3 as the material of the second dielectric plate 116, but it is preferable to use aluminium nitride (AlN) from the point of view of manufacturing precision.

(Embodiment 7)

Figure 15:
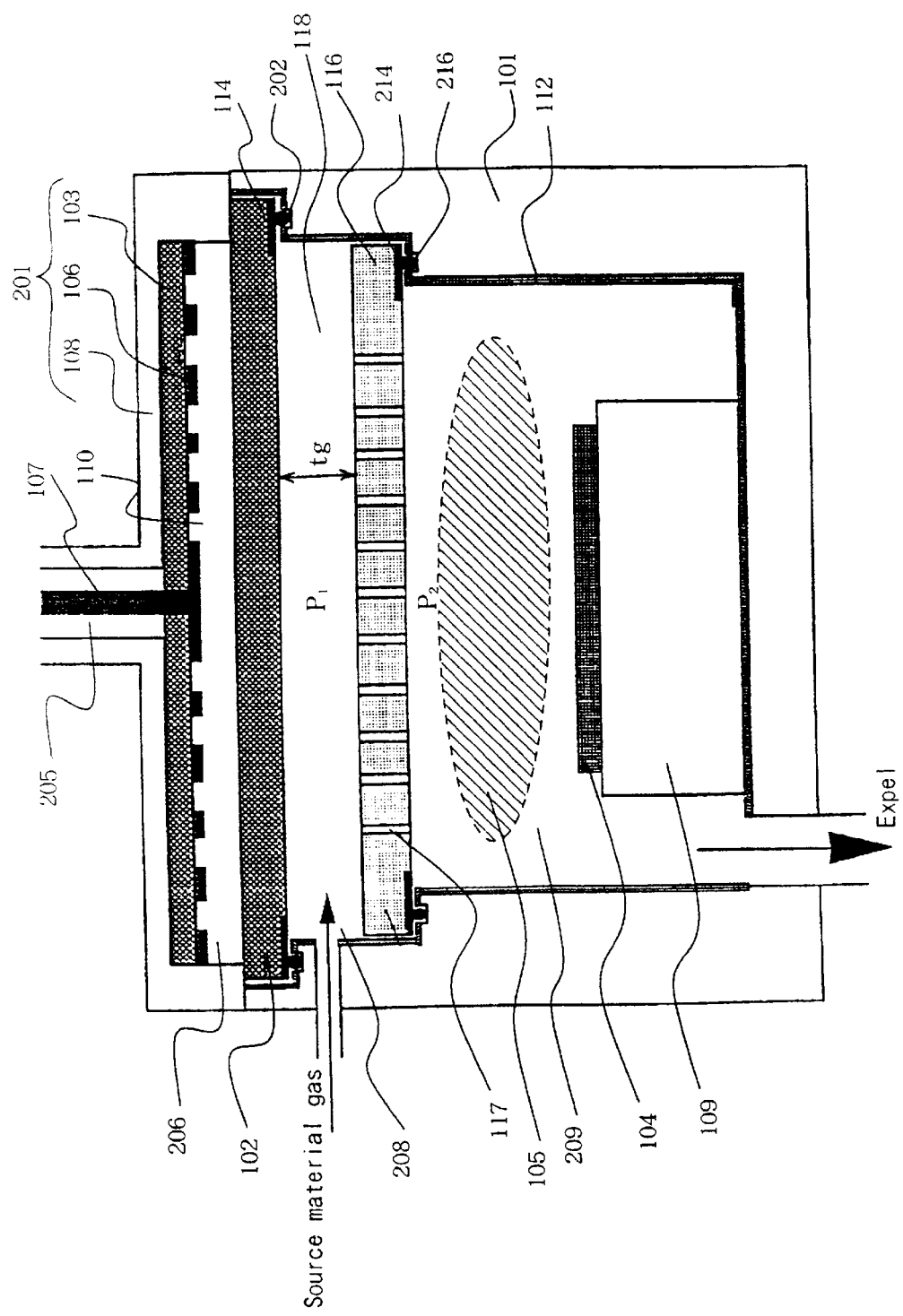
FIG. 15 is a cross section of a device relating to embodiment 7.

With this embodiment, in the plasma device shown in FIG. 15, in order to study conditions where plasma excitation does not take place in the space 1 (208) between the first dielectric plate 102 and the second dielectric plate 116, the following experiment was carried out.

FIG. 15 is a drawing in which pressure P1 of the space 1 (208), pressure P2 of the space 2 (209) and the distance tg between the first dielectric plate 102 and the second dielectric plate 116 have been added to the drawing showing the device of FIG. 12.

Figure 16:
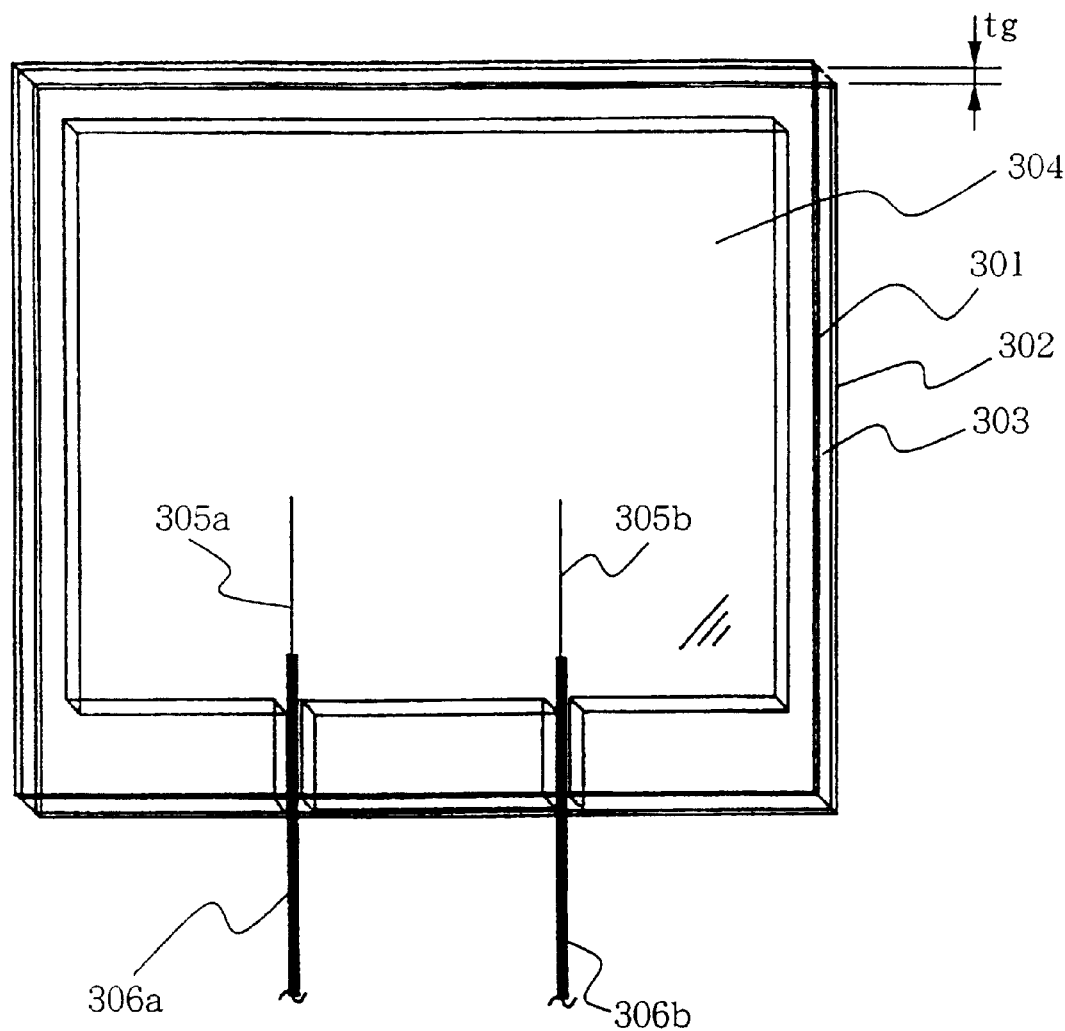
FIG. 16 is a schematic diagram of a tool for confirming the presence or absence of plasma excitation in embodiment 7.

FIG. 16 is a schematic drawing of a jig used to observe whether or not there is plasma excitation in the space 1 (208). The jig of FIG. 16 is located directly below the first dielectric plate 102 (material: quartz) being part of the container 100 of the plasma device in FIG. 1. In FIG. 16, reference numeral 301 is an upper glass plate, reference numeral 302 is a lower glass plate, reference numeral 303 is a middle glass plate, reference numeral 304 is a space 6, reference numeral 305 is a tungsten wire, and reference numeral 306 is an aluminium wire coated with ceramics.

The jig of FIG. 16 has two glass plates (301 and 302) of 2 mm in thickness fixed a distance tg apart. A side section of the space 6 (304) formed by the two glass plates (301 and 302) is covered by a separate glass (303) so that plasma does not penetrate inside the space 5 of width tg. Since the inside of the space 6 (304) is not airtight, gas penetrates and the pressure inside the space 6 (304) becomes almost the same as the pressure inside the container.

In order to confirm whether or not plasma is generated inside the space 6 (304), two probes (305a and 305b) are inserted into the gap. The probes (305a and 305b) are tungsten of diameter 0.1 mmφ and length 8 mm. The probes (305a and 305b) are heated if they are irradiated with microwaves, so the outer surface of glass at the edges of the probes (305a and 305b) was sealed with copper plate (not shown in the drawing). A variable voltage was applied between the two probes (305a and 305b) in an electrically floating state, and the current flowing was measured using a multimeter.

Figure 17:
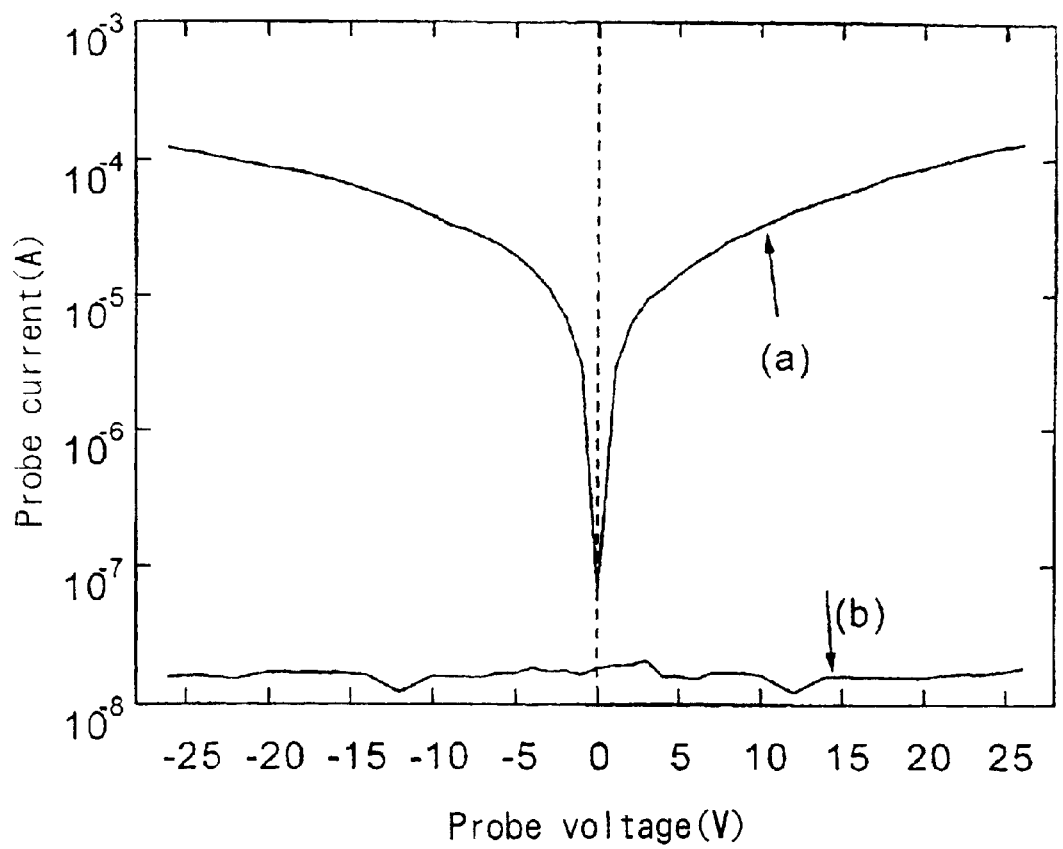
FIG. 17 is a graph showing a relationship between probe voltage and probe current for embodiment 7.

FIG. 17 is a graph showing a relationship between probe voltage and probe current observed when the variable was applied between the two probes (305a and 305b). The curve (a) of FIG. 17 shows the a current voltage characteristic that is symmetrical to the left and right in the case where plasma was generated inside the space 6 (304). On the other hand, the curve (b) of FIG. 17 indicates only a noise component in the case where plasma is not generated in the space 6 (304). However, since they are many cases where plasma generated inside the space 6 (304) is unstable, it is not always possible to obtain the current voltage characteristic having good symmetry as shown in FIG. 17. Therefore, in a case where the current value is observed to exceed $10^{-7}$ A, even only slightly, it is generally judged that plasma has been generated in the space 6 (304).

In this embodiment, plasma ignition tests were carried out for 6 different conditions by combining the cases where the distance tg between the two glass plates (301 and 302) was 0.7 mm and 4 mm, and where the microwave frequency was 2,45 GHz, 5.0 GHz and 8.3 GHz. At this time, Ar gas was introduced so that the pressure inside the space 6 (304) was 0.1–10 Torr. Also, the microwave power was supplied up to a maximum of 1600 W.

Table 1 shows the results of the plasma ignition tests for the above described 6 conditions. In the table, the mark O indicates that plasma was not generated inside the space 6 (304) and the mark x indicates that plasma was generated inside the space 6 (304).

TABLE 1

| | Microwave frequency [GHz] | | |
|---|---|---|---|
| Tg [mm] | 2.45 | 5.0 | 8.3 |
| 0.7 | X | O | O |
| 1.4 | X | X | X |

As shown in table 1, in the set of cases where the distance between the two glass plates (301 and 302) [namely the width of the space 6 (304)] tg is 0.7 mm and the microwave frequency is 5.0 GHz or 8.3 GHz, even if microwave power was delivered up to 1600 W (power density 1.27 W/cm$^2$) there was no plasma excitation inside the space 6 (304). On the other hand, in the other cases it was confirmed that there was plasma excitation.

Figure 18:
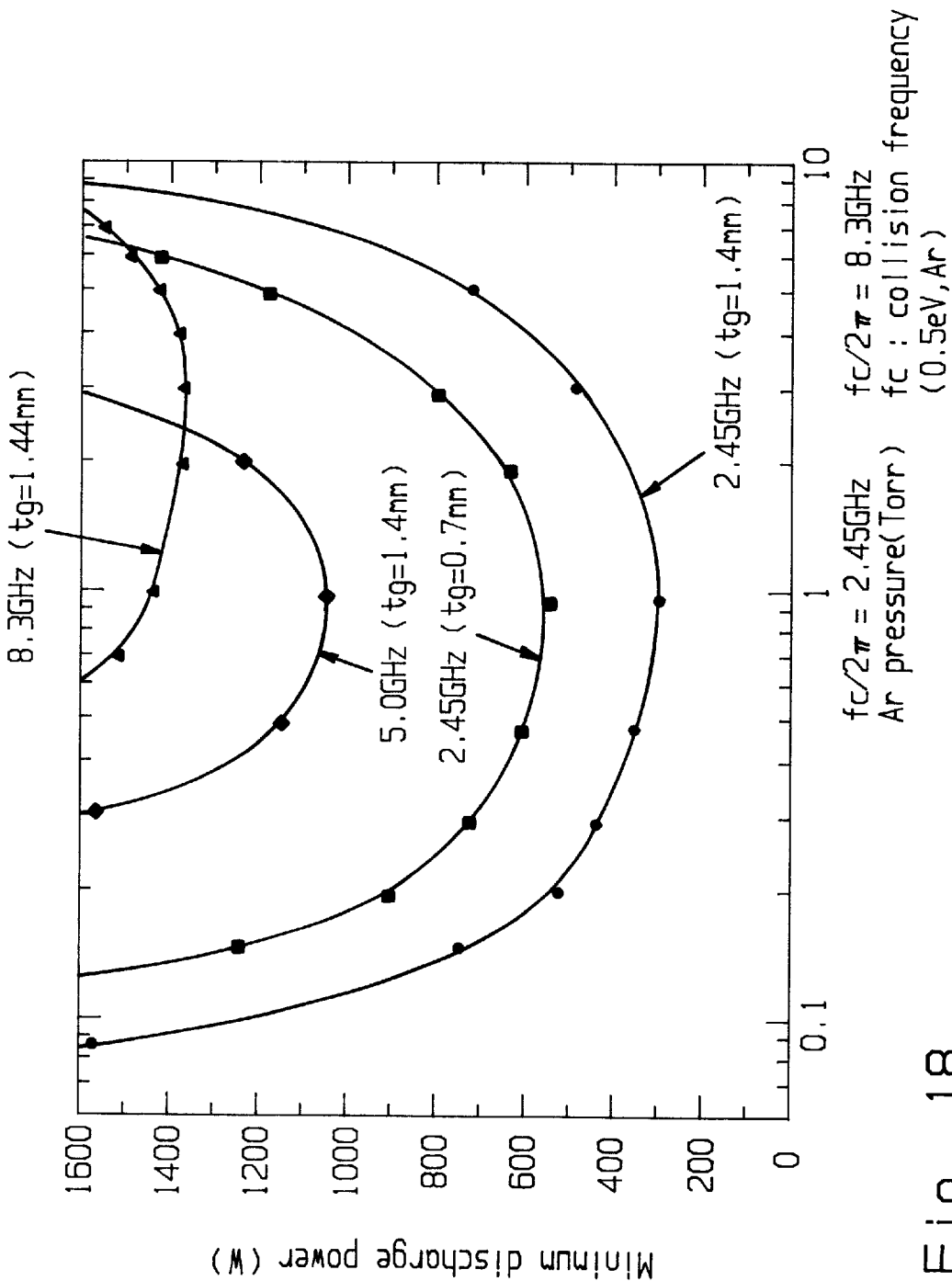
FIG. 18 is a graph showing a relationship between minimum discharge power and Ar pressure for embodiment 7.

FIG. 18 shows results of studying the relationship between minimum discharge power and Ar pressure for the four conditions where plasma is not generated, among the six conditions described above. From FIG. 18, it will be understood that in the case where the microwave frequency is low (for example 2.45 GHz), even if the width tg of the space 6 (304) is narrowed down to 0.7 mm, plasma excitation occurs inside the space 6 (304) at low power.

Contrary to this, by making the microwave frequency high (for example 5.0 GHz), and narrowing the width tg of the space 6 (304) to 0.7 mm or less, even if microwave power is delivered up to 1600 W (power density 1.27 W/cm$^2$) plasma is not excited inside the space 6 (304).

Accordingly, in the plasma device shown in FIG. 15, in order to stop plasma excitation in the space 1 (208) between the first dielectric plate 102 and the second dielectric plate 116, microwave frequency input to the antenna is made at least 5.0 GHz, and the width of the space 1 (208) is made 0.7 mm or less.

Also, in the plasma device shown in FIG. 15, when a pressure 1 (P1) of the space 1 (208) between the first dielectric plate 102 and the second dielectric plate 116, and a pressure 2 (P2) of space 2 (209) surrounded by the second dielectric plate 116 and wall sections (chamber) 101 of the container other than the second dielectric plate 116, and where an electrode 109 for holding the object to be treated 104 is arranged, have the relationship P1>P2, it was confirmed that plasma excitation did not occur in the space 1 (208). Particularly, it is understood that when P1 is sufficiently high compared to P2, for example when there was a pressure difference of about 10 times, these effects were more remarkable.

Accordingly, by providing means 5 for generating a pressure difference so that the pressure 1 (P1) of the space 1 becomes higher than the pressure 2 (P2) of the space 2 (209) it is possible to prevent plasma excitation in the space 1 (208).

(Embodiment 8)

With this embodiment, in the plasma device shown in FIG. 15, the effects were studied of either reducing in size, shielding, or not providing at all, those slots, among slots (hole portions penetrating the slot plate) provided in the slot plate constituting the antenna, arranged at sections where the density of plasma generated in the space 2 (209) is locally high.

Figure 19:
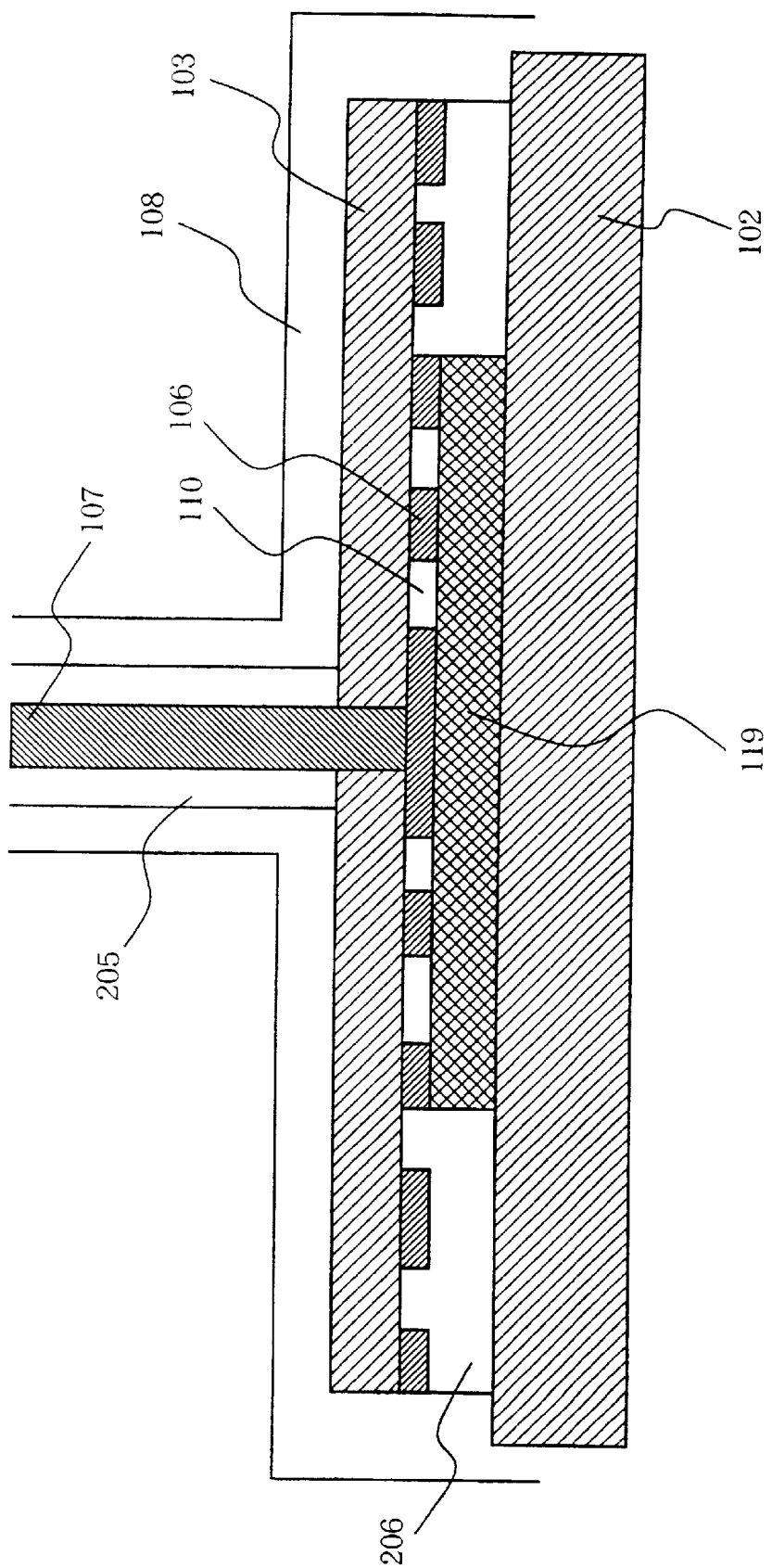
FIG. 19 is a partial cross section of a device a device relating to embodiment 8, and shows a case where a cover plate is used.
Figures 20A, 20B:
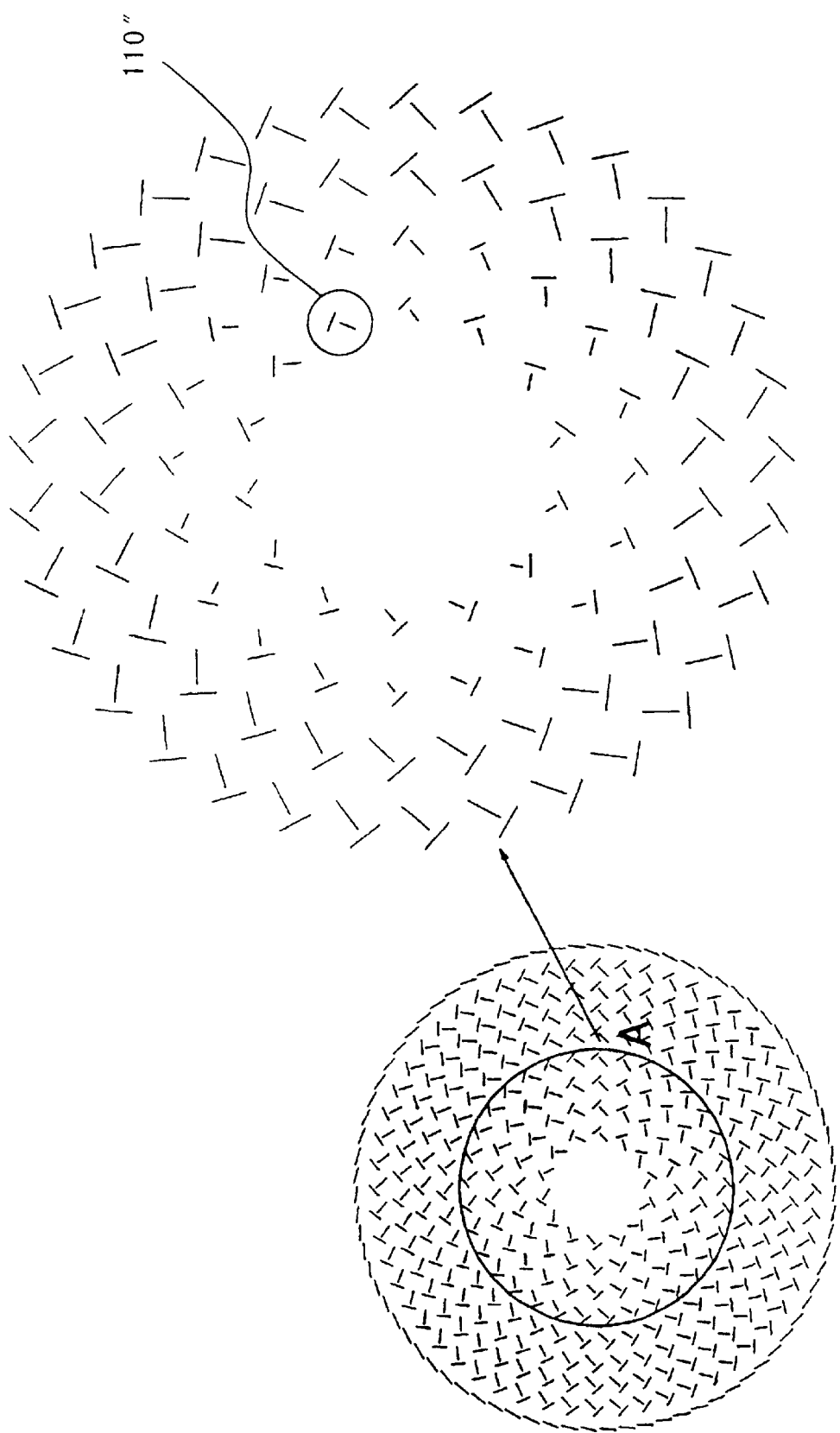
FIG. 20 is a partial cross section of the device relating to embodiment 8, and shows a case where a slot is reduced in size.

FIG. 19 is a schematic cross sectional drawing showing the slot plate when a shielding plate 119 is provided on the slots 110' positioned close to the center of the slot plate. FIG. 20 is a schematic plan view showing the slot plate when the size of the slots 110' positioned close to the center of the slot plate is reduced. FIG. 20(b) is an enlarged view of region A of FIG. 20(a).

In FIG. 20, the case is shown where the length is shortened for only two rings of slots from the center of the slot plate, but reduction in size of the lots can be realized by, for example, shortening the slot length.

Figure 21:
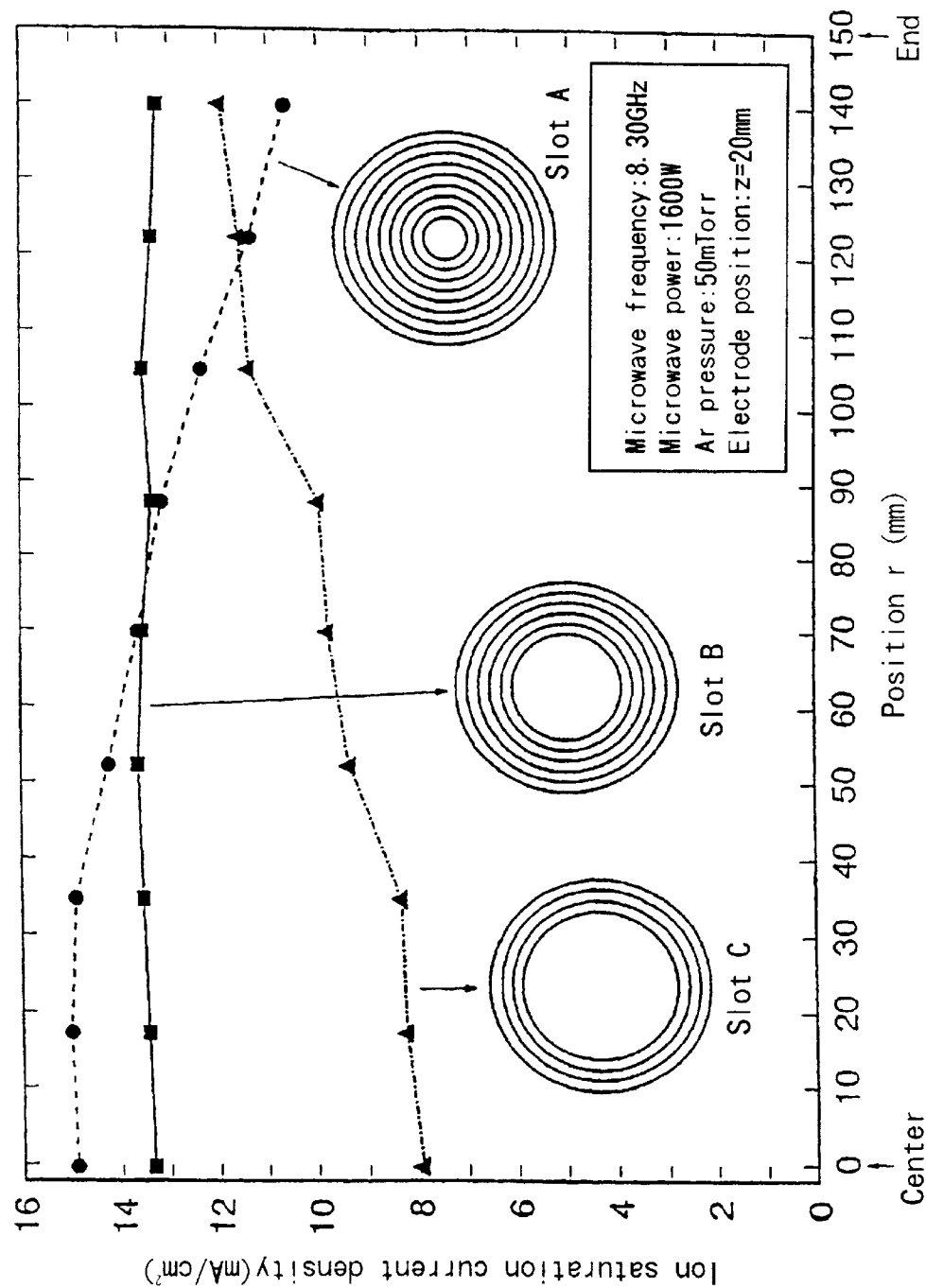
FIG. 21 is a graph showing the ion saturation current density in embodiment 8.

FIG. 21 shows results of studying the density of plasma generated at the space 2 (209), using the slot plate shown in FIG. 19. In FIG. 21, slot A, slot B and slot C are the names respectively given to the slot distributions for the case when the shielding region is small, the case where the shielding region is intermediate in size, and the case where the shielding region is large. From FIG. 21 it will be understood that with slot A, the density of plasma at the center of a measuring electrode is raised. By arranging the shielding plate 119 at this portion so that slot distribution is slot B, it can be expected to make the plasma density uniform. However, if the shielding region is made wider, as in slot C, conversely to slot A the plasma density rises at the outer edge of the electrode.

Accordingly, by providing a shielding plate 119 having an appropriate shielding region, the output of electromagnetic waves radiated from the slots is reduced, and the density of excited plasma can be made even more uniform.

A shielding plate 119 that can hope to achieve the above describe operation and effect preferably has a shape and size so as to shield the slots of the slot plate. Namely, it goes without saying that either by reducing the slot size or even using a method of not providing any slots, the same effects can be anticipated as in the case where the slots are shielded.

(Embodiment 9)

With this embodiment, in the plasma device shown in FIG. 15, the effects were studied of providing means 6 for maintaining the antenna at a fixed temperature close to the antenna, and means 7 for maintaining the temperature of the first dielectric plate at a fixed temperature close to the first dielectric plate.

Figure 22:
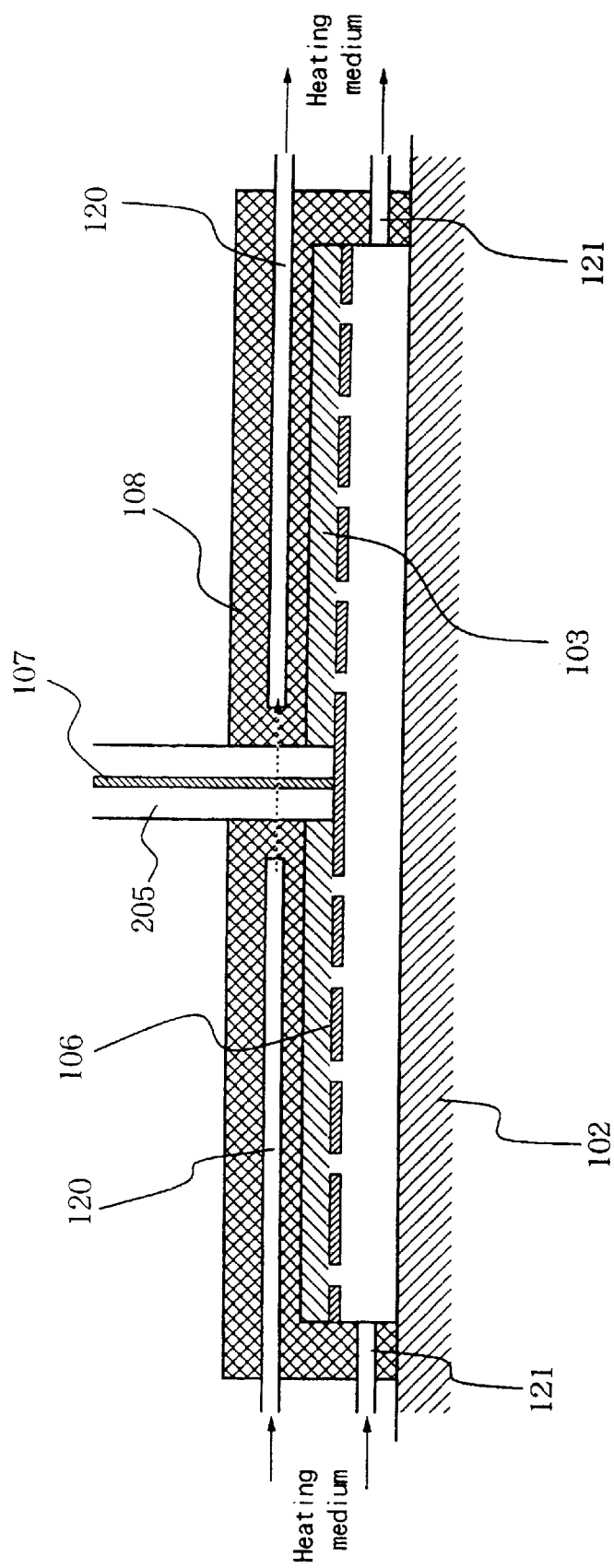
FIG. 22 is a partial cross section of a device relating to embodiment 9.

In the plasma device shown in FIG. 15, as shown in FIG. 22, structures 120 and 121 capable of maintaining the antenna guide 108, waveguide dielectric plate 103, antenna slot plate 106, and first dielectric plate 102 at a fixed temperature are provided close to the antenna guide 108. The structures 120 and 121 are equivalent to the means 6 and the means 7.

In this case, the antenna slot plate 106 is arranged so as to be completely stuck to the waveguide dielectric plate 103. By having this arrangement, if a gap exists between the antenna slot plate 106 and the waveguide dielectric plate 103, surface waves will be generated at that part, and it is possible to effectively avoid a phenomenon where it is impossible to radiate electromagnetic waves. To do this, the shape of the waveguide dielectric plate 103 must hardly be changed by forces or heat from outside, and it is necessary to use a material having high thermal conductivity and low microwave loss, for example, quartz glass (SiO$_2$), aluminium nitride (AlN) etc., but it is not limited to these materials, and any material can be used as long as it satisfies the above described conditions.

In this embodiment, in the two structures 120 and 121, a method is employed where heating medium flows and desired locations are cooled, but a material having high thermal conductivity is preferred as the heating medium. As such a heating medium, fluid, gas (helium, nitrogen, etc.) and the like can be considered, but they are not limiting.

(Embodiment 10)

Figure 23:
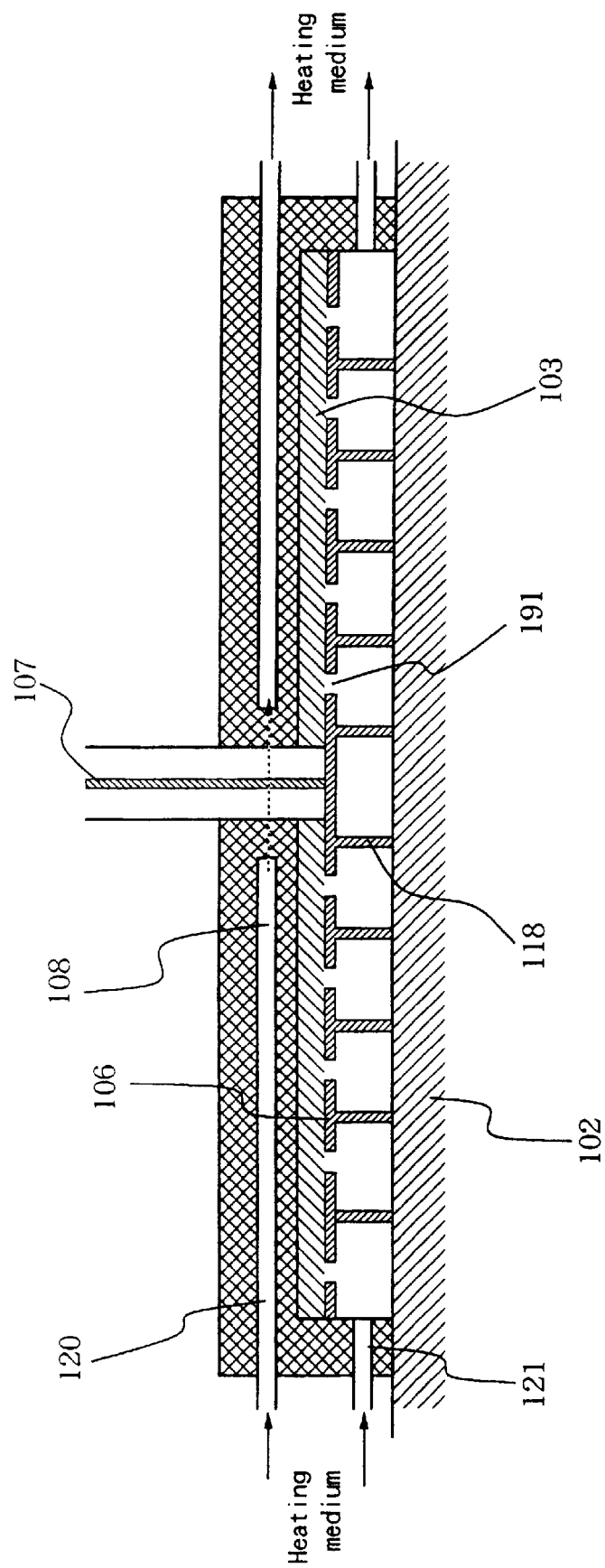
FIG. 23 is a partial cross section of a device relating to embodiment 10.

As shown in FIG. 23, this embodiment is different from embodiment 9 in that a spacer 118 is provided in a space between the antenna slot plate 106 and the first dielectric plate 102 as means for preventing warping of the slot plate. In this embodiment the spacer 118 is made of TEFLON.

In the case where it is impossible prevent warping of the slot plate in embodiment 9, by providing the spacer 118 in a space between the antenna slot plate 106 and the first dielectric plate 102 it becomes possible to prevent warping of the antenna slot plate 106.

The spacer 118 is provided at a position where the slots 119 of the slot plate 106 do not open out so as not to impede radiation of electromagnetic waves from the slot plate 106.

(Embodiment 11)

Figure 24:
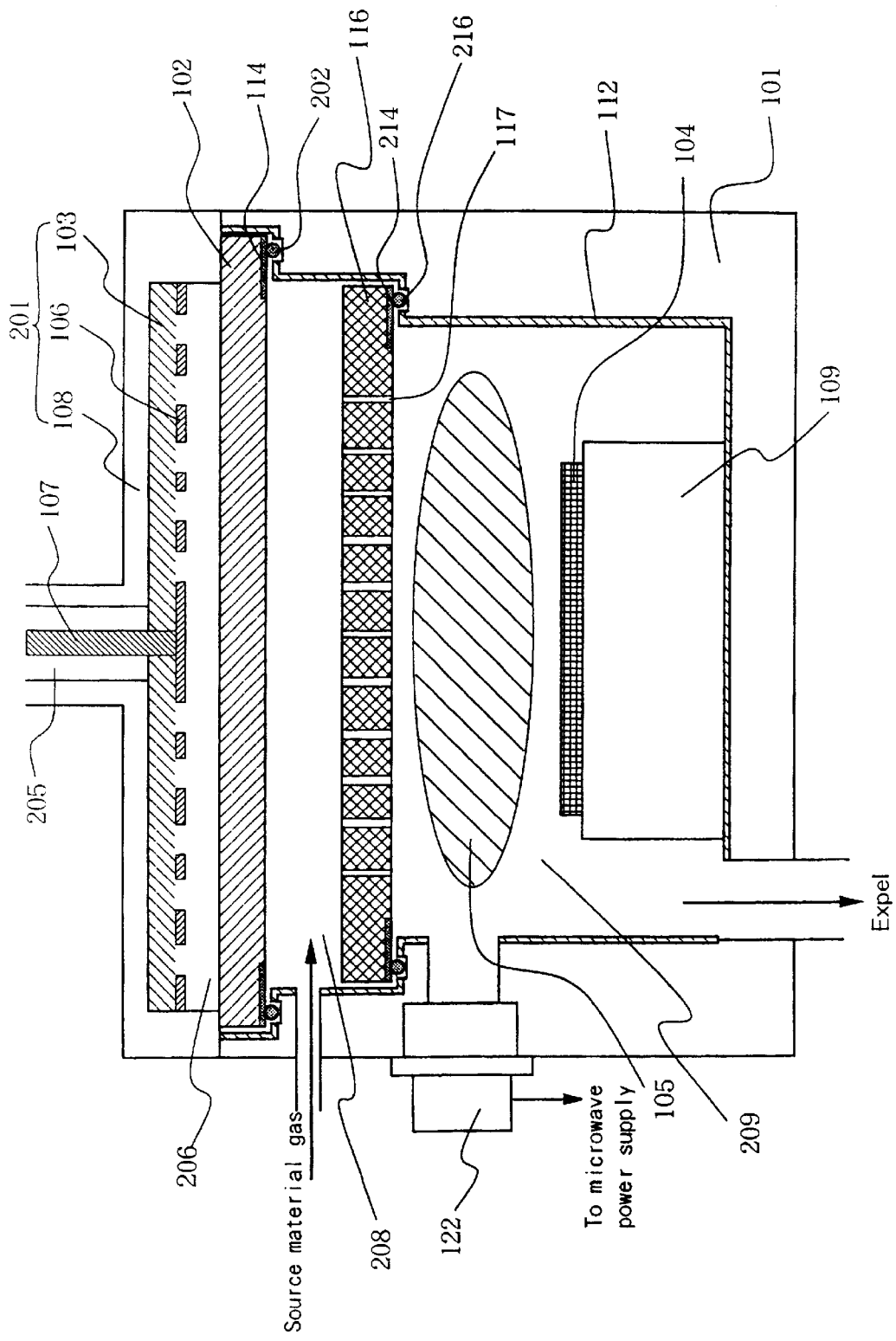
FIG. 24 is a cross section of a device relating to embodiment 11.

As shown in FIG. 24, this embodiment differs from embodiment 9 in that a sensor 122 is provided either in the container or at the edge of the container, as means 9 for detecting the presence or absence of generated plasma in the space 2.

The sensor 122 is connected to a microwave power supply, not shown in the drawing, and when plasma is being excited in the chamber 101 it detects plasma, causes the microwave power supply to provide output and plasma excitation is inhibited, while when plasma is disappearing the sensor 122 immediately suspends output from the microwave power supply. In this embodiment, a photo transistor is used as the sensor 122, and detects plasma light emission, but it is perfectly acceptable to use alternate means.

Accordingly, by adopting the sensor 122 it is possible to prevent careless heating and damage of the inside of the chamber 101 and the object to be treated 104 etc due to magnetic waves radiated from the antenna 201 when plasma activation suddenly stops.

(Embodiment 12)

In this embodiment, the effects of having a structure for causing the temperature of the container wall surface and parts other than the object to be treated inside the container to be raised to 150° C., and/or a structure for causing the temperature inside all the units constituting the exhaust system to be raised to 150° C.

Figure 25:
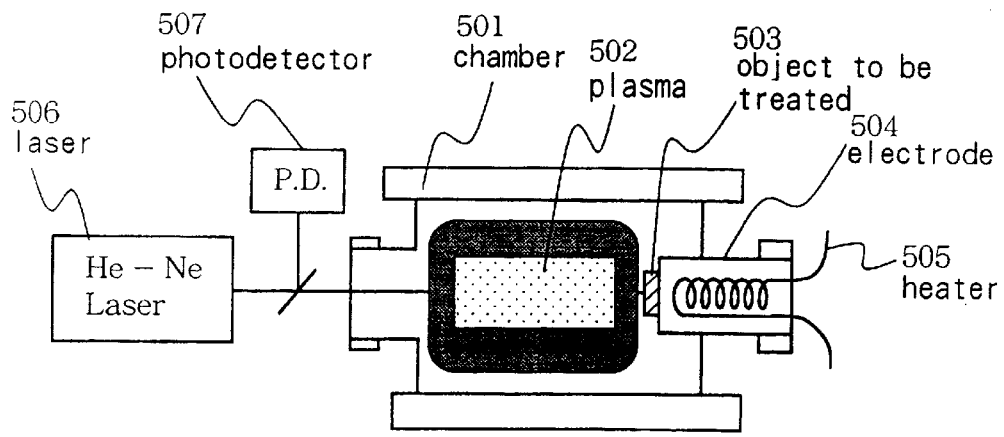
FIG. 25 is a cross section of a device relating to embodiment 12.

The above described effects were studying a relationship between container inner wall temperature and reaction by-product (polymerization film) deposition, namely, dependence of deposited film thickness on inner wall temperature using the vacuum device shown in FIG. 25 in a range of 50–150° C.

In FIG. 25, reference numeral 501 is a chamber, reference numeral 502 is plasma, reference numeral 503 is an object to be treated, reference numeral 504 is an electrode, reference numeral 505 is a heater, reference numeral 506 is a laser, and reference numeral 507 is a photodetector. In this case, gas used was a mixture of $C_4F_8$ and $H_2O$, [$C_4F_8:H_2O$= 7:3, total gas flow amount:40 (sccm)], pressure was 10 mTorr, and discharge power was 1000 W. With the vacuum device of FIG. 25, an Si wafer was used attached to a flat tip of a copper rod, as the object to be treated 503, and heating of the object to be treated was carried out using a sheath heater provided inside the rod.

Figure 26:
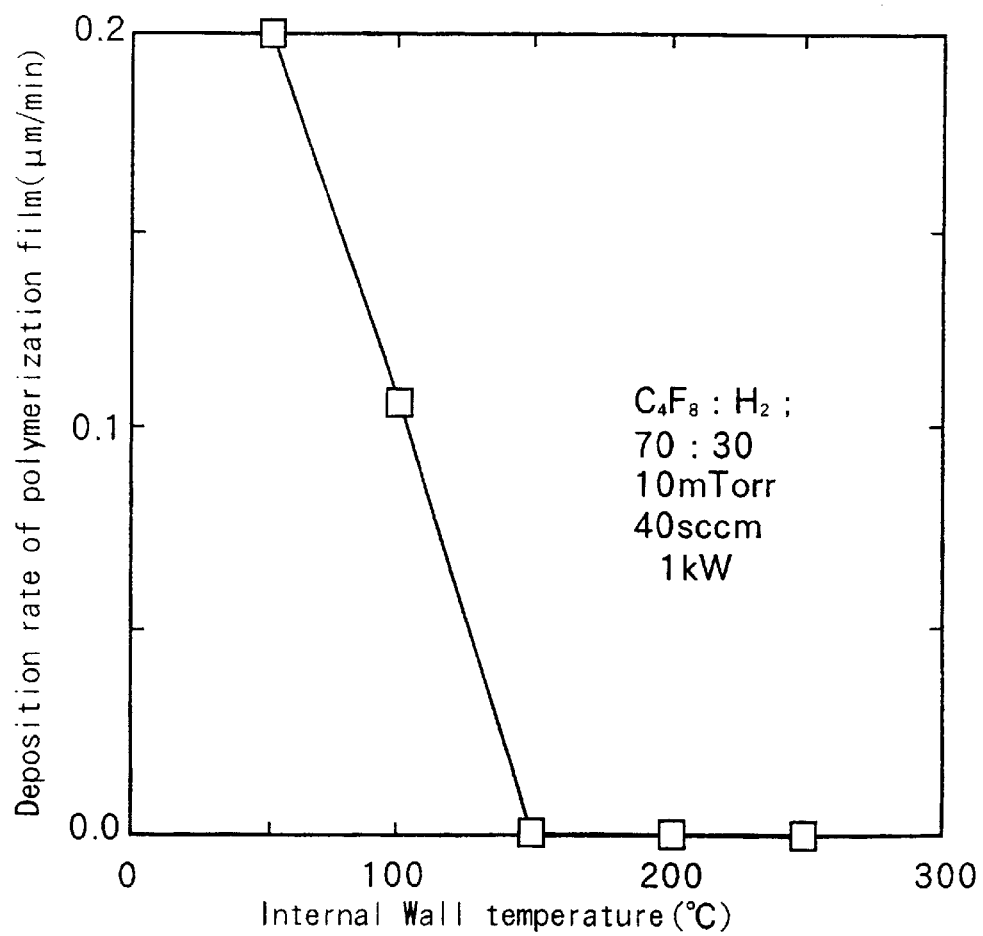
FIG. 26 is a graph showing a relationship between deposition rate of polymer film and chamber internal wall temperature.

FIG. 26 shows the results of studying the relationship between the deposition rate of the polymerization film and the temperature of the inner wall of the chamber. From FIG. 26 it will be understood that the polymerization film deposition rate is rapidly decreased accompanying increase in wafer temperature and that at around 150° C. deposition of the polymerization film could not be observed.

Accordingly, it was determined that by providing either a structure for causing the temperature of the container wall surface and parts other than the object to be treated inside the container to be raised to 150° C., and/or a structure for causing the temperature inside all the units constituting the exhaust system to be raised to 150° C., it was possible to prevent the build up of a polymerization film composed of moisture and reaction by-products.

(Embodiment 13)

Figure 27:
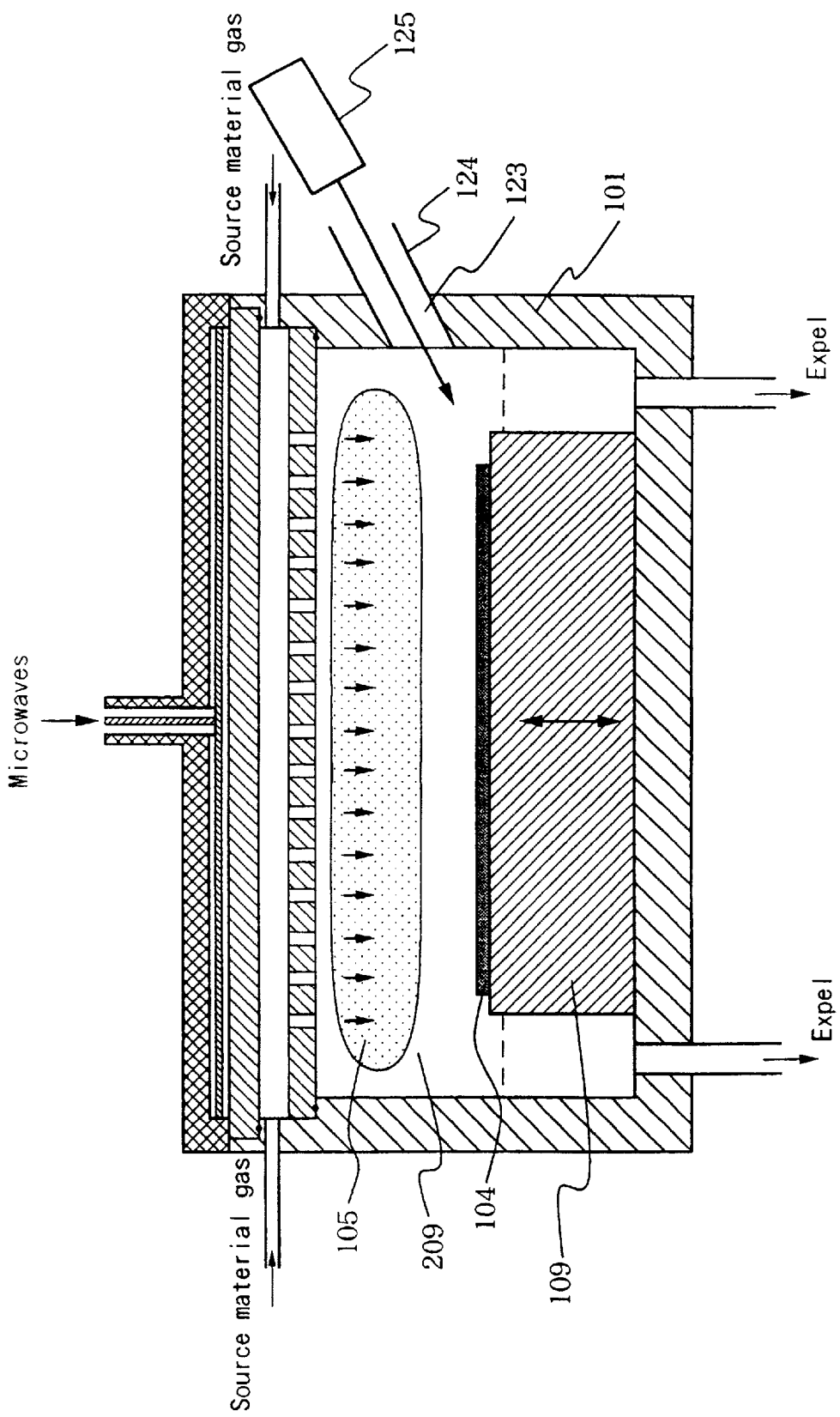
FIG. 27 is a cross section of a device relating to embodiment 13.

As shown in FIG. 27, this embodiment differs from embodiment 9 in that a Xenon (Xe) lamp is used as means for heating the object to be treated 104.

The Xe lamp 125 can effectively heat only the surface of the object to be treated 104 by irradiating light to the object to be treated 104 through a light inlet 124 and a window 123 made of a material that passes light.

In this embodiment a Xe lamp is used as means for heating the object to be treated 104, but another light source can be used, or the electrode 109 holding the object to be treated 104 can be heated by a direct electrothermal line etc., but heating using Xe lamp irradiation is preferred.

Also, in FIG. 27 the Xenon lamp inlet 124 is provided on part of the outside of the chamber 101, but it is more preferable to uniformly provide a plurality of such inlets on the outside of the chamber 101.

(Embodiment 14)

Figure 28:
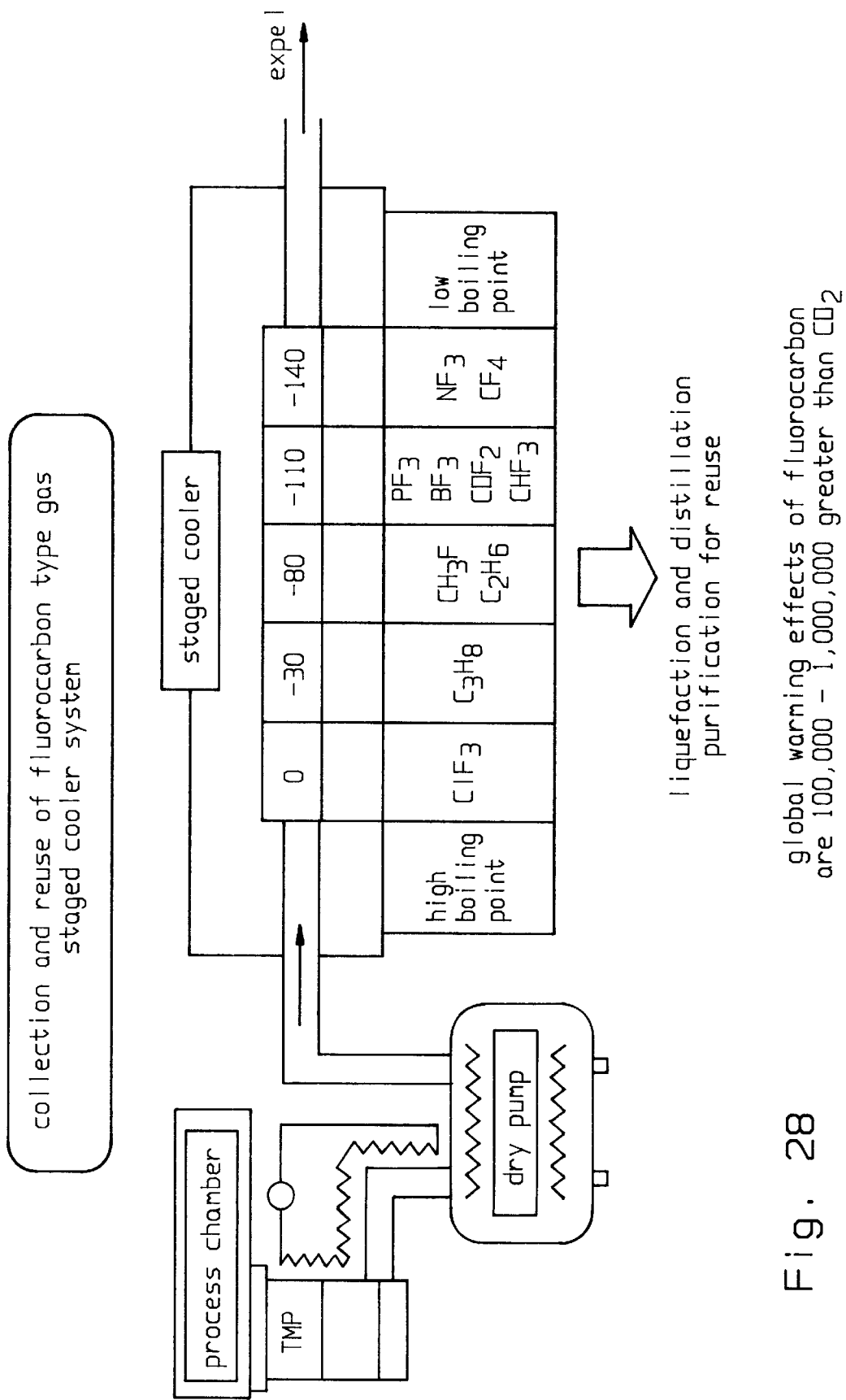
FIG. 28 is a schematic diagram showing a system when a staged cooler method is adopted in collection and reuse of fluorocarbon type gas in embodiment 14.

A simple schematic drawing of the situation when adopting a staged cooler method in the collection and recycling of fluorocarbon gas is shown in FIG. 28. It is possible to carry out recycling of the gas expelled from inside the container as a liquid by gradually cooling from a high boiling point gas and performing liquefaction and distillation purification. Fluorocarbon gas contributes to global warming 100,000–1,000,000 times more than $CO_2$, which means that the effects of collecting and recycling the fluorocarbon gas is immense.

(Embodiment 15)

A self cleaning gas plasma has to satisfy the following two requirements in order to rapidly remove reaction gas products adhered to the chamber without inflicting damage on the inner wall of the chamber.

① high ion density and radical density

② low plasma potential (small energy of ions incident to the chamber wall)

Also, at the same time as these two requirements, there is also a demand for material of the inside of the chamber to have strong ion radiation and extremely good plasma resistance.

Figure 29:
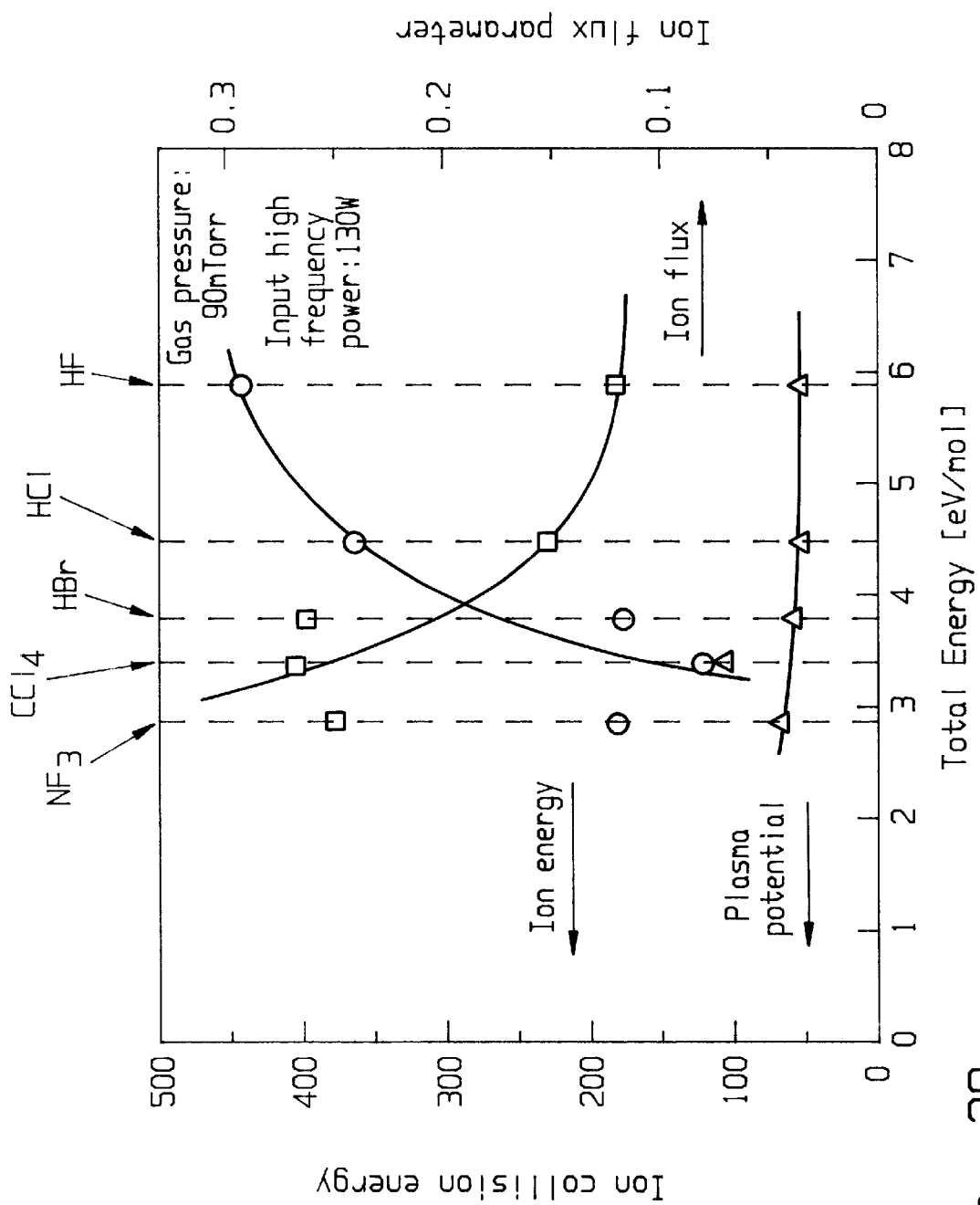
FIG. 29 is a graph showing a relationship between average binding energy of fluorine gas and the plasma parameter of the fluorine gas for embodiment 15.

FIG. 29 shows the relationship between average binding energies of various fluorine type gases and their plasma parameter. From this drawing, it will be more clearly understood that there is an intimate relationship between binding energy and plasma parameter. Namely, ion irradiation energy becomes small and ion density becomes high as binding energy falls. Plasma energy does not depend largely on binding energy of gas molecules. From this it will be understood that $NF_3$ is an extremely suitable gas for self cleaning. Accordingly, when a self cleaning structure is required the inner walls of the container must have excellent plasma resistance and it is best to use an alloy such as $AlF_3/MgF_2$.

Figure 30A:
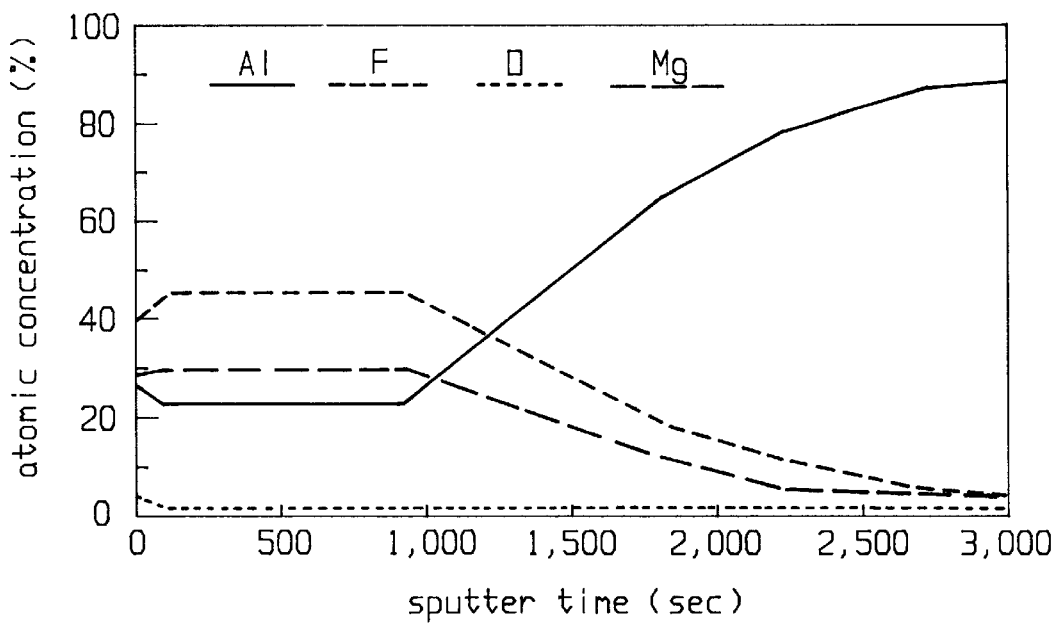
FIG. 30 is a graph showing evaluation results of damage caused by plasma irradiation of $AlF_3/MgF_2$ alloy, FIG. 30($a$) showing before $NF_3$ plasma irradiation and FIG. 30($b$) showing after 2 hours of $NF_3$ plasma irradiation.
Figure 30B:
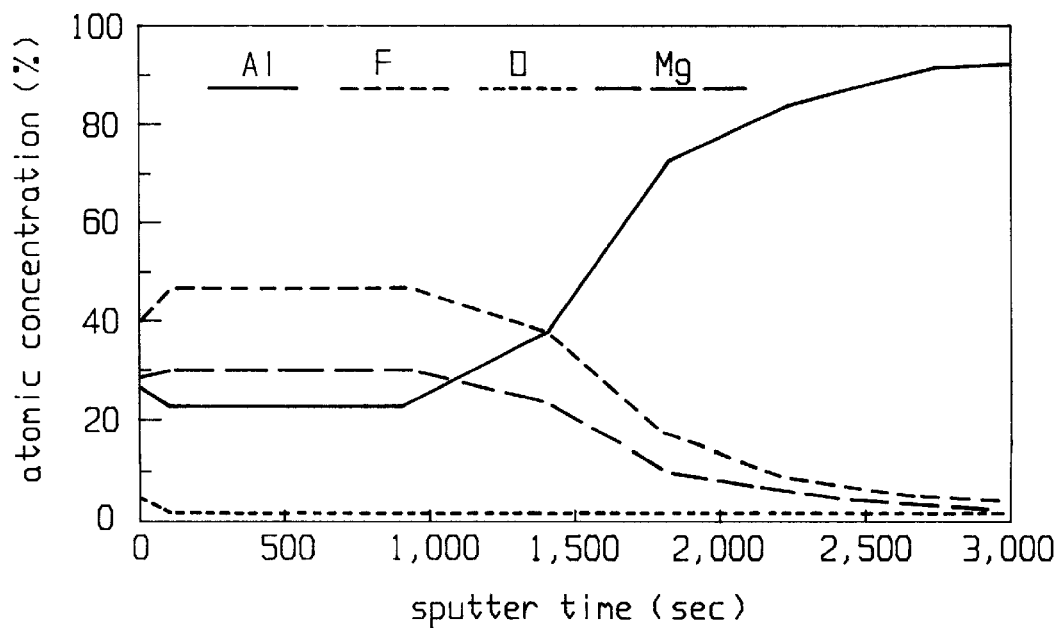

FIG. 30 shows the results of evaluating damage caused by plasma irradiation of $AlF_3/MgF_2$ alloy when is used as the chamber inner wall material of the device of FIG. 15, and gas having a small gas molecule binding energy (such as NF3) is used as cleaning gas. FIG. 30(a) is a profile of the $AlF_3/MgF_2$ alloy in a depth direction using XPS (X ray photoelectron spectroscopy) before $NF_3$ plasma irradiation, and FIG. 30(b) is a profile after two hours of $NF_3$ plasma irradiation. From the results shown in FIG. 30, it will be understood that there is hardly any damage attributable to plasma irradiation.

Accordingly, when there is a need to have a self cleaning structure in the device the container inner walls must have excellent plasma resistance and it is best to use $AlF_3/MgF_2$ alloy.

(Embodiment 16)

With this embodiment, in the plasma device of FIG. 15 an antenna 201 is located outside the container 101 via the first dielectric plate 102, and plasma excitation is caused by introducing microwaves through a coaxial tube 107 and radiating electromagnetic waves inside the container 101.

Figure 31:
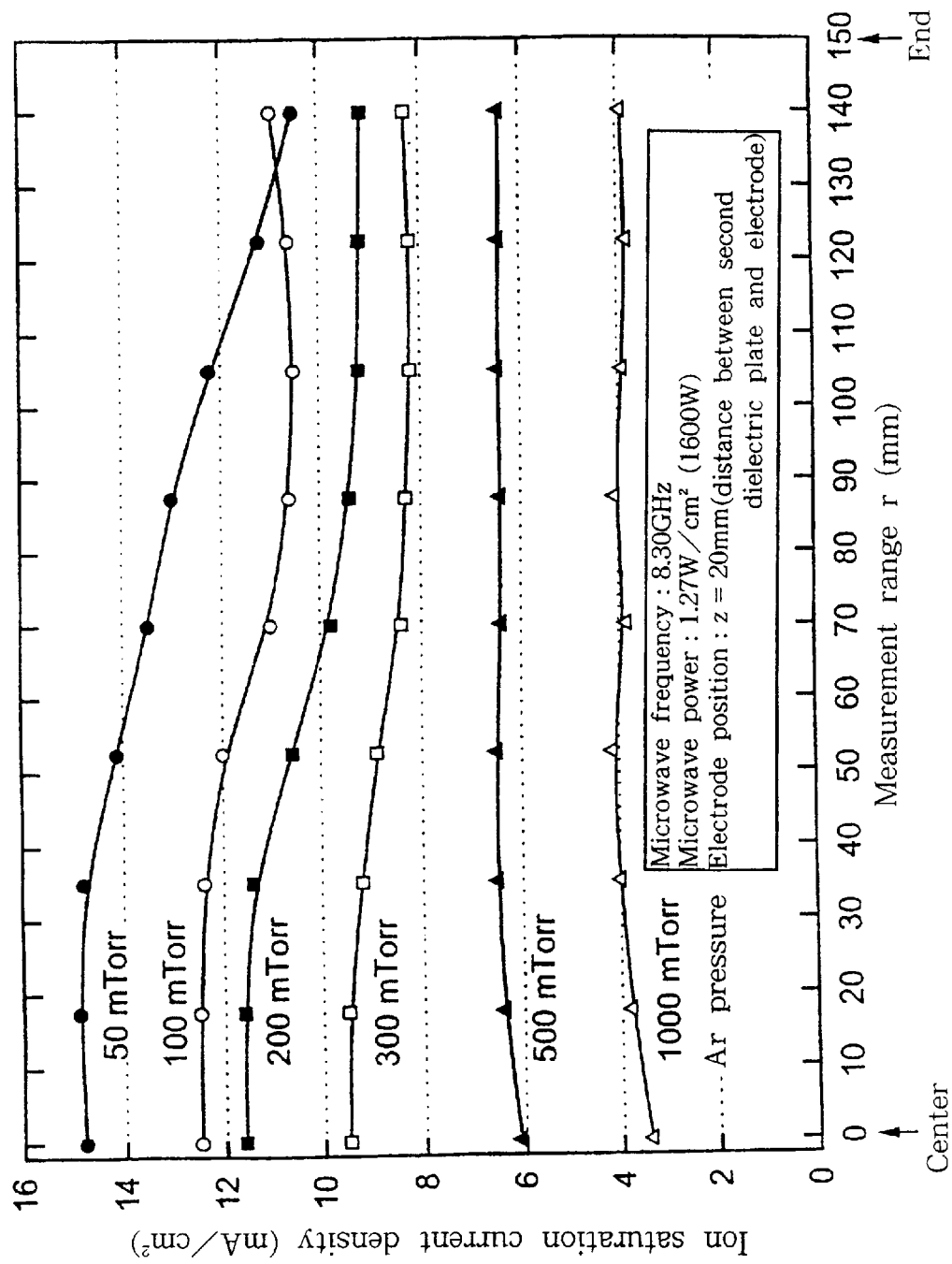
FIG. 31 is a graph showing distribution of ion saturation current density for embodiment 16.
Figure 32:
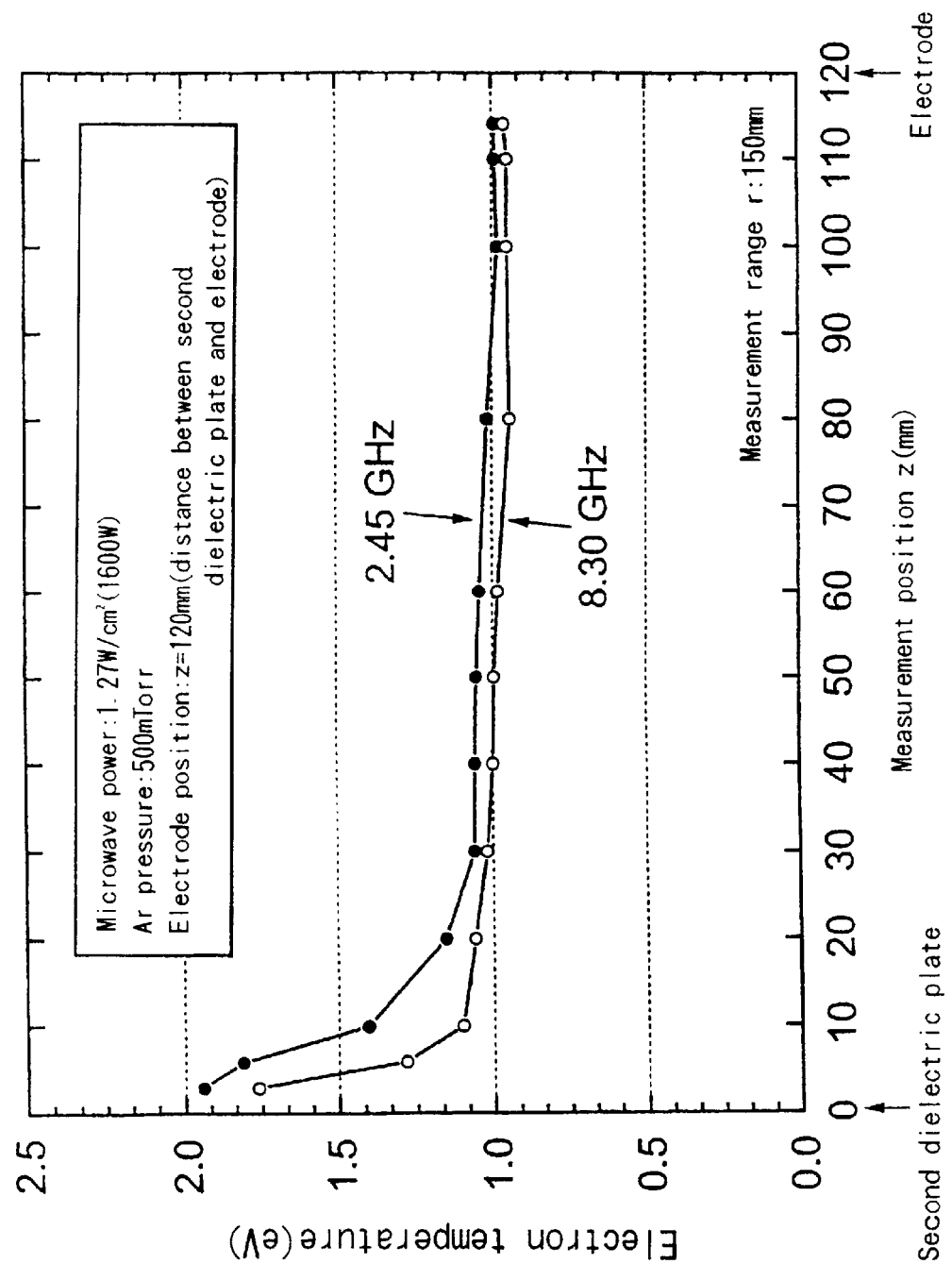
FIG. 32 is a graph showing distribution of electron temperature for embodiment 16.
Figure 33:
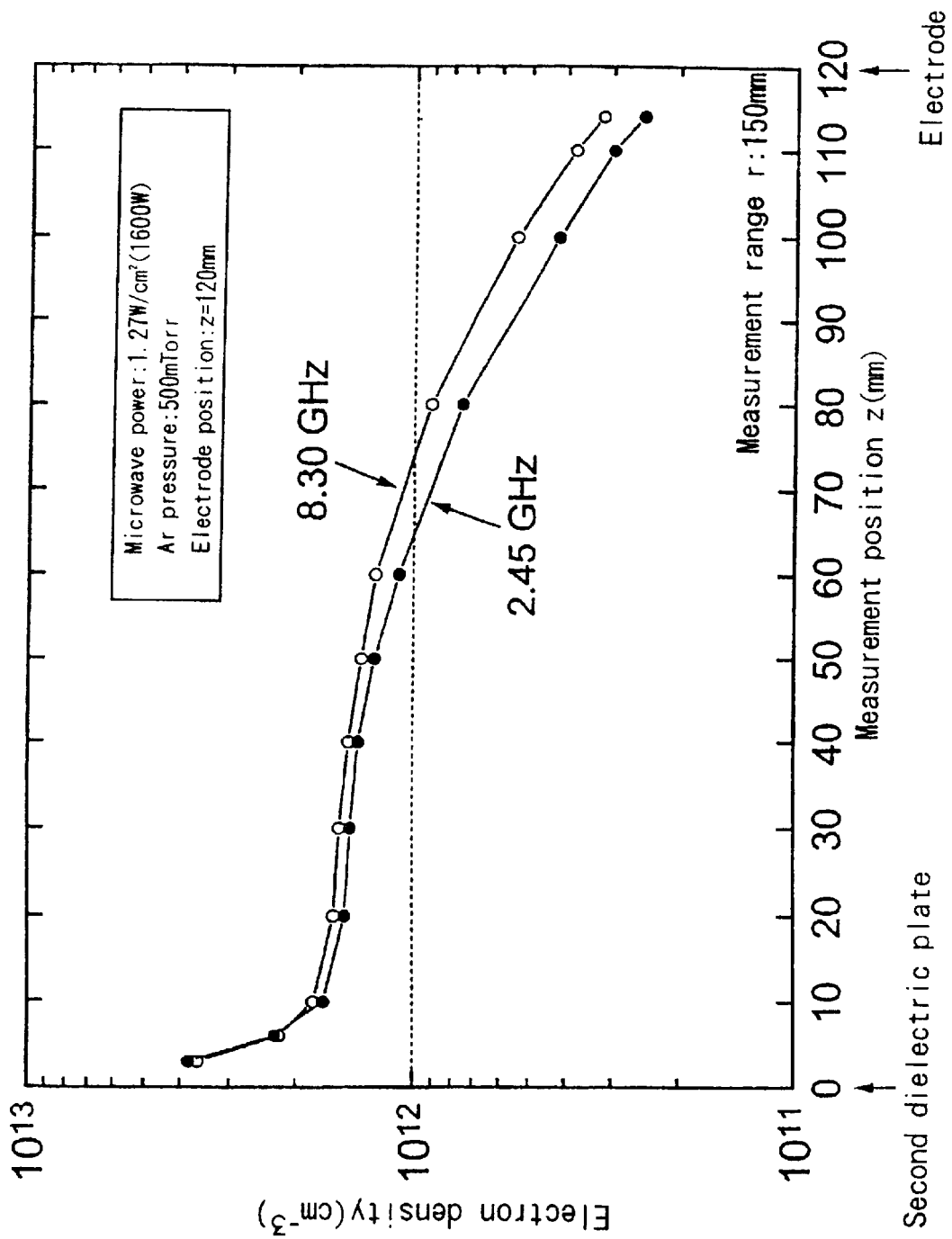
FIG. 33 is a graph showing distribution of electron temperature for embodiment 16.

FIG. 31 is a graph showing the results of measuring distribution of ion saturation current, FIG. 32 is a graph showing the results of measuring distribution of electron temperature, and FIG. 33 is a graph showing the results of measuring distribution of electron density.

From FIG. 31 to FIG. 33 it will be understood that with the plasma device of the present invention, uniform plasma excitation can be caused by covering high density plasma having a ion saturation current of at least 14 mA/cm$^2$, electron density in the region of 1 .eV (15000 K) and electron density of at least $10^{12}$ over a large surface area of diameter 300 mm or more inside the container 101.

Figure 34:
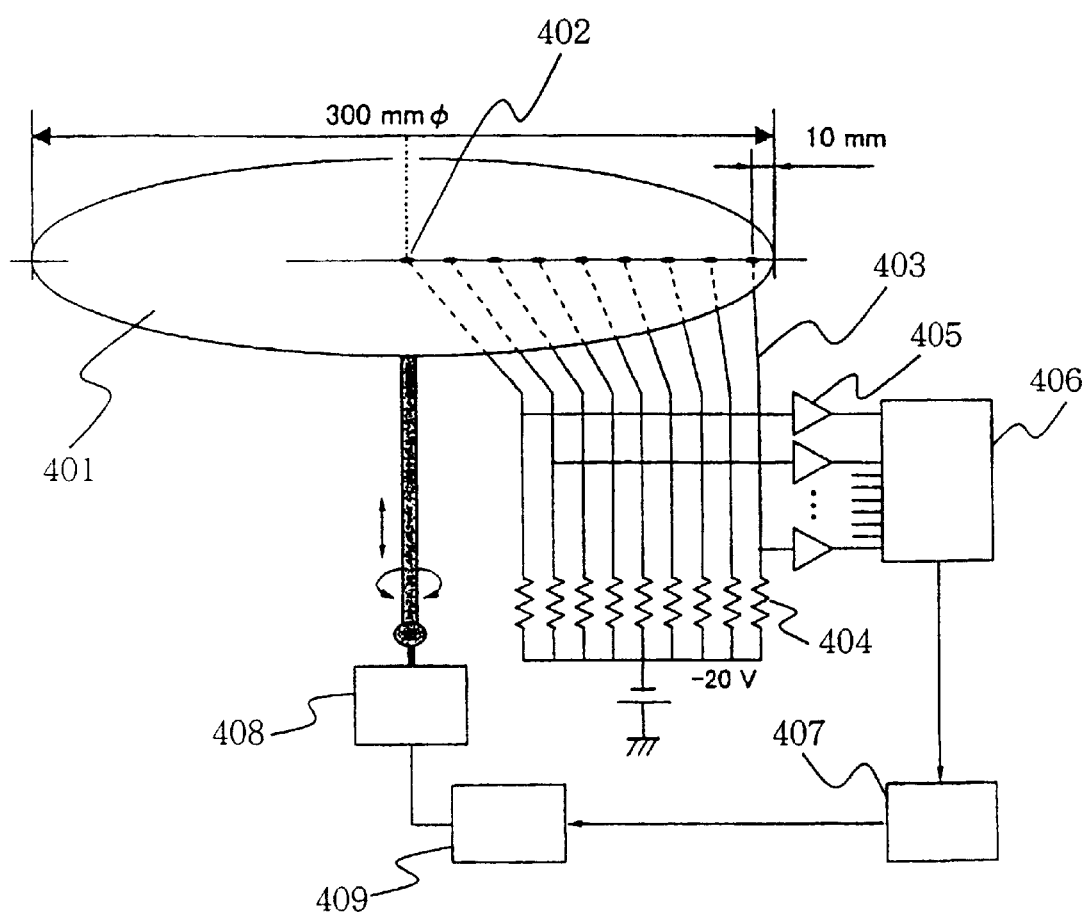
FIG. 34 is a schematic diagram of a system for measuring ion current distribution for embodiment 16.

FIG. 34 is a schematic drawing of a system for measuring the ion current distribution. This is measurement of ion current distribution using a disk-shaped electrode 401. The disk-shaped electrode 401 was used in place of the object to be treated 104 and electrode 109 in the plasma device shown in FIG. 15.

In FIG. 34, reference numeral 401 is the disk-shaped plate, reference numeral 402 is a pin, reference numeral 403 is an aluminium wire, reference numeral 404 is a resistor, reference numeral 405 is an operational amplifier, reference numeral 406 is an A-D converter, reference numeral 407 is a computer, reference numeral 408 is a stepping motor and reference numeral is a power supply.

The disk-shaped electrode 401 in FIG. 34 is a piece of disk-shaped aluminium having a diameter of 300 mmφ and nine pins 402 are embedded in the top of the disk-shaped electrode 401 an equal distance apart on a line running from the center to a point at a radius of 140 mm.

Electric current flowing from the plasma to the pins 402 is taken outside the chamber through ceramics-coated aluminium wires 403 connected to the pins 402 and current introduction terminals (not shown). A voltage of −20V relative to the potential of the chamber is applied to the pins 402, and only positive ions flow in the plasma. A potential generated by this positive ion flow is converted to a voltage signal by the resistor 404, and after being amplified by the operational amplifier 405 is converted to a digital signal by the 16 channel A-D converter 406 and transmitted to the computer 407.

The aluminium electrode 401 is covered with polyimide tape (not shown). Measurements of rotation of the electrode 401 by the stepping motor 408, and measurements of ion current by the A-D converter are synchronized using the computer 407. Measurement of ion current is carried out 200 times for each pin 402 per rotation of the electrode 401, to obtain a fine two dimensional distribution.

Figure 35A:
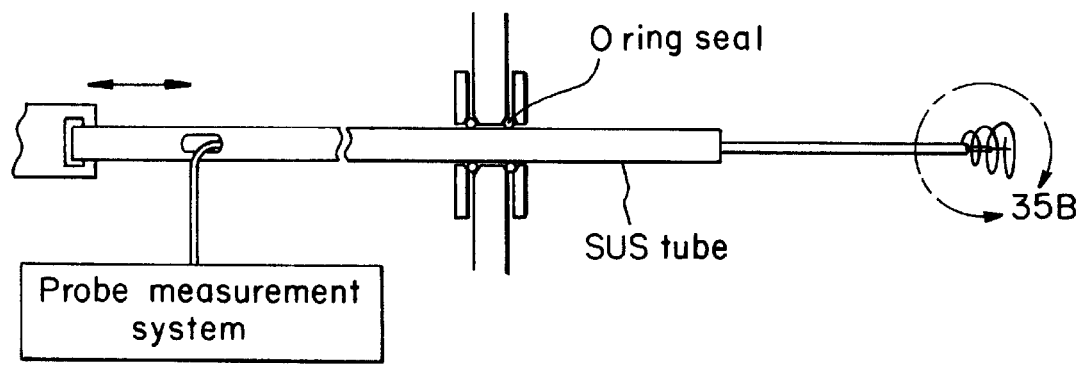
FIG. 35 is a schematic showing the structure of a single probe used in measurement of electron temperature and electron density for embodiment 16.
Figure 35B:
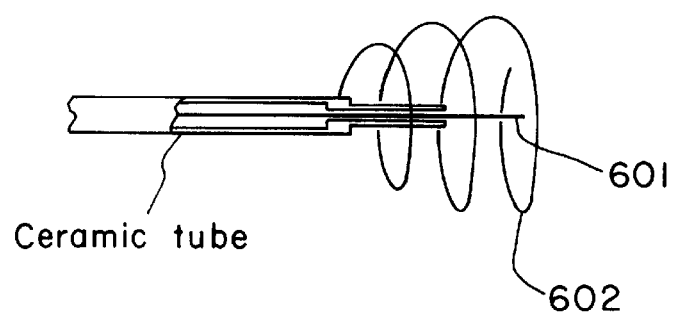

FIG. 35 is a schematic diagram showing a single probe system used in measurement of electron temperature and electron density in this example.

If the probe is inserted into a section where the microwave power density is large, as shown in FIG. 35, the probe tip (tungsten wire, 0.1 mmφ) 601 is heated by the microwaves, and there is a possibility that thermoelectrons will be discharged. There is also a possibility that ionization will occur frequently inside the probe seal. In either case it becomes impossible to obtain a voltage current characteristic of an ordinary single probe.

Therefore, 0.5 mm diameter silver wire 602 wound in a spiral manner is arranged clearing a gap at the edge of the probe tip 601 for the purpose of shielding microwaves. The silver wire has low resistance and is not heated by the. Also, the use of comparatively fine wire for shielding is so that the effect on the plasma can be kept to a minimum.

A comparison was carried out for the case where the silver wire was provided in a spiral manner, and the case where it was not. At a section where the microwave power density was small, hardly any difference could be seen between the two characteristics. At a section where the microwave power density was large, in the case where the silver wire was not arranged in a spiral manner, when a negative potential was applied to the probe the current value was noticeably increased, but in the case where the silver wire was arranged in a spiral manner a normal characteristic was obtained. In this way, in the case where microwave power density inside the plasma is large, it is effective to shield the edge of the probe tip 601 from microwaves using a metallic wire etc.

In order to obtain a z direction [in the device of FIG. 15 a direction from the second dielectric plate 116 facing the electrode 401] distribution for each plasma parameter, a structure was made that could move the probe in the z direction using the stepping motor 408. The maximum speed of movement of the probe was 300 mm/sec and the positional resolution was 0.02 mm. control of probe position using the stepping motor 408 and measurement of the current voltage characteristic was synchronized using the computer 497. In order to prevent heating of the probe, experimentation was carried out restricting the time of reciprocation in the z direction to less than 5 seconds.

(Embodiment 17)

With this embodiment, plasma etching was carried out for the object to be treated 104 by applying a high frequency to the electrode 109 having the function of holding the object to be treated 104, in the plasma device shown in FIG. 15. An Si wafer formed in the surface of a Poly-Si film mainly used as a gate electrode material for a MOS transistor was used as the object to be treated 104, and this Poly-Si film was etched.

Figure 36:
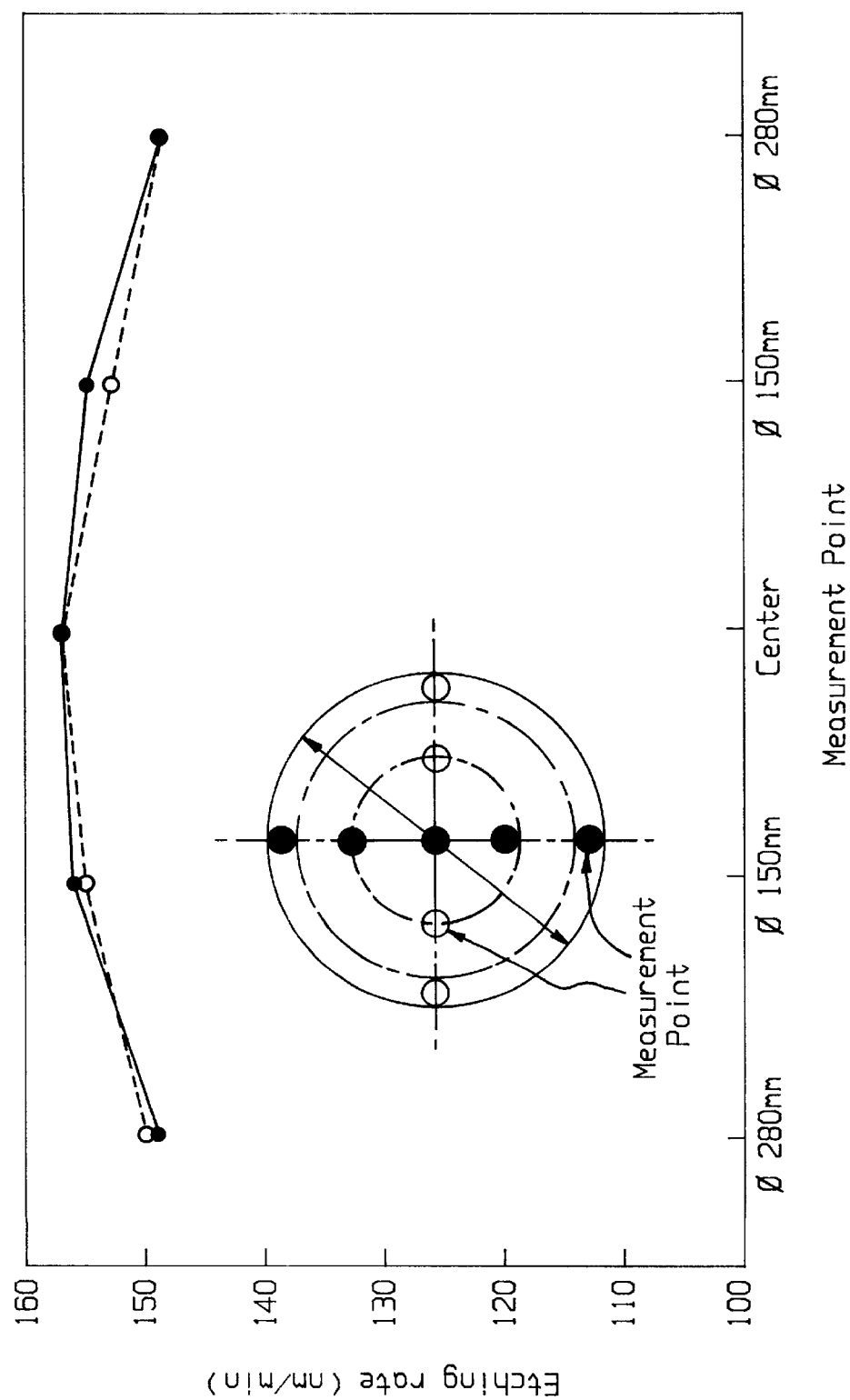
FIG. 36 is a graph showing results of plasma etching in embodiment 17.

A high frequency was applied to the electrode 109 having the function of holding the object to be treated 104 from means (not shown) capable of applying a high frequency bias. Gas such as $Cl_2$, $O_2$, HBr etc was used as the source material gas, but this is not limiting. FIG. 36 is a graph showing results of the plasma etching. From FIG. 36, for a total of nine measurement points (the center point and 8 points spaced equally apart in two rings of four 150 mm and 280 mm from the center) on the object to be processed (size 300 mmφ), with an etching rate uniformity of the Poly-Si film of about 5% per unit time, it was confirmed that extremely uniform etching was possible on a large diameter (300 mmφ) object to be treated.

(Embodiment 18)

In this embodiment the case where the device of the present invention is applied to a plasma oxidation device for oxidizing the surface of an object to be treated at low temperature is illustrated. Here, description will be given for the case where an Si substrate was used as the object to be processed, the and a gate oxidation film was formed on the surface of the object to be treated using direct oxidation with $O_2$.

Ar and $O_2$ were used as source material gases. It is also possible to use Xe in place of Ar as a carrier gas. It is also possible to add He etc. to a mixed gas comprising Ar and $O_2$.

Figure 37:
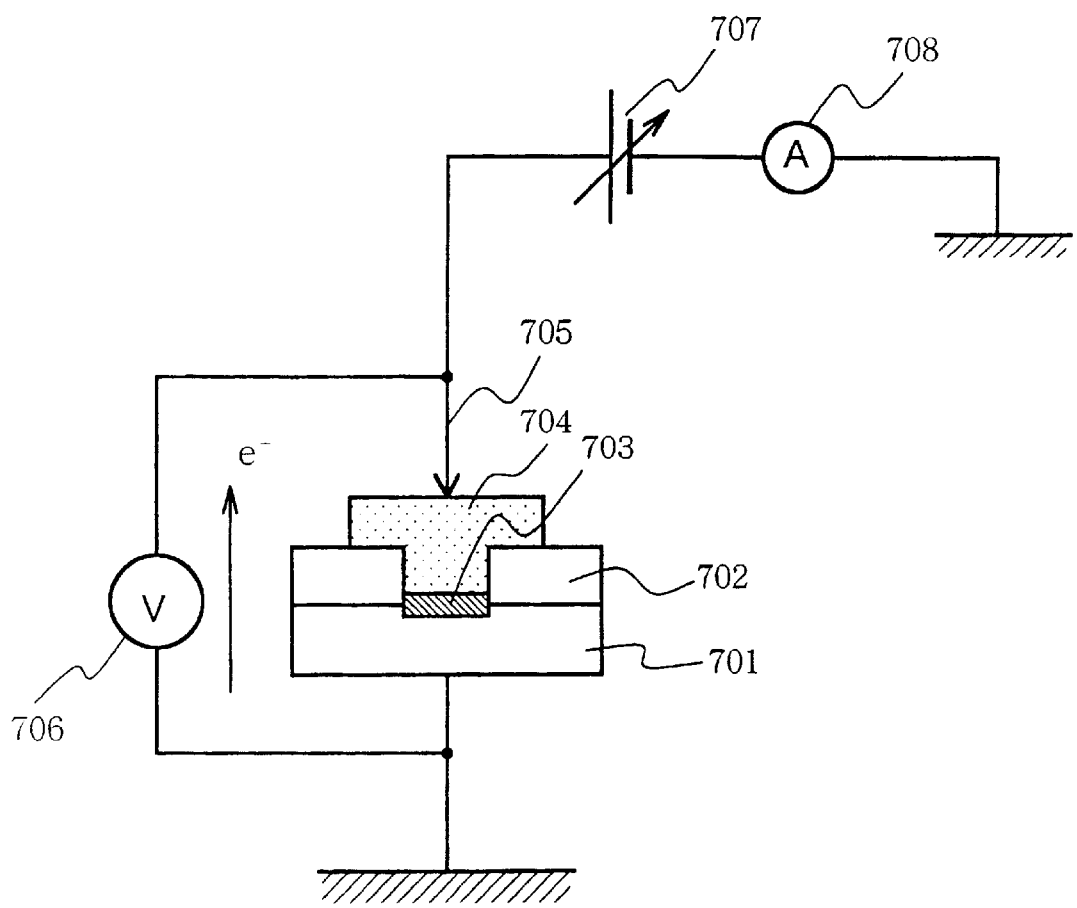
FIG. 37 is a schematic diagram showing a combination of a cross section of elements of embodiment 18 and a element withstand voltage measurement system.

FIG. 37 is a schematic diagram showing a combination of a cross section of elements constituting this example, and a system for measurement of element withstand voltage.

In FIG. 37, the element whose withstand voltage has been measured comprises an object to be treated 701 constituted by an n type Si wafer, a field oxidation film 702, a gate oxidation film 703, and a gate electrode 704. Also, reference numeral 705 is a probe used in measurement of withstand voltage, reference numeral 706 is a voltmeter, reference numeral 707 is voltage applying means and reference numeral 708 is an ammeter.

Formation of the element shown in FIG. 37 and measurement of the withstand voltage are carried in the following order.

(1) After a field oxidation film 702 (thickness: 800 nm) formed of $SiO_2$ has been formed on the n type Si wafer using a thermo oxidation method [($H_2+O_2$ gas), $H_2$=1 l/min, $O_2$=1 l/min, temperature of object to be treated=1000° C.], part of the field oxidation film 702 was subject to etching processing and the surface of the n type Si wafer was exposed.

(2) Only the exposed surface of the field oxidation film 702 was directly oxidized using the plasma device of the present invention, and the $SiO_2$ gate oxidation film 703 (surface area $1.0 \times 10^{-4}$ cm$^2$, thickness 7.6 nm) was formed. The film forming conditions at this time were film forming gas (Ar+$O_2$), gas pressure 30 mTorr, partial pressure ratio Ar:$O_2$=98:2, microwave power 700 W, oxidation processing time 20 min, the object to be treated was held in an electrically floating state, and the temperature of the object to be treated was 430° C.

(3) A gate electrode 704 of Al (thickness 1000 nm) was formed on the field oxidation film 702 and the gate oxidation film 703 by a vapor deposition method.

(4) The probe 705 was brought into contact with the gate electrode 704, a d.c voltage was applied to the object to be treated 701 formed of the n type Si wafer via the gate electrode 704, and the voltage at which the gate oxidation film 703 suffered dielectric breakdown (namely the withstand voltage) was measured using the voltmeter 706.

Figure 38B:
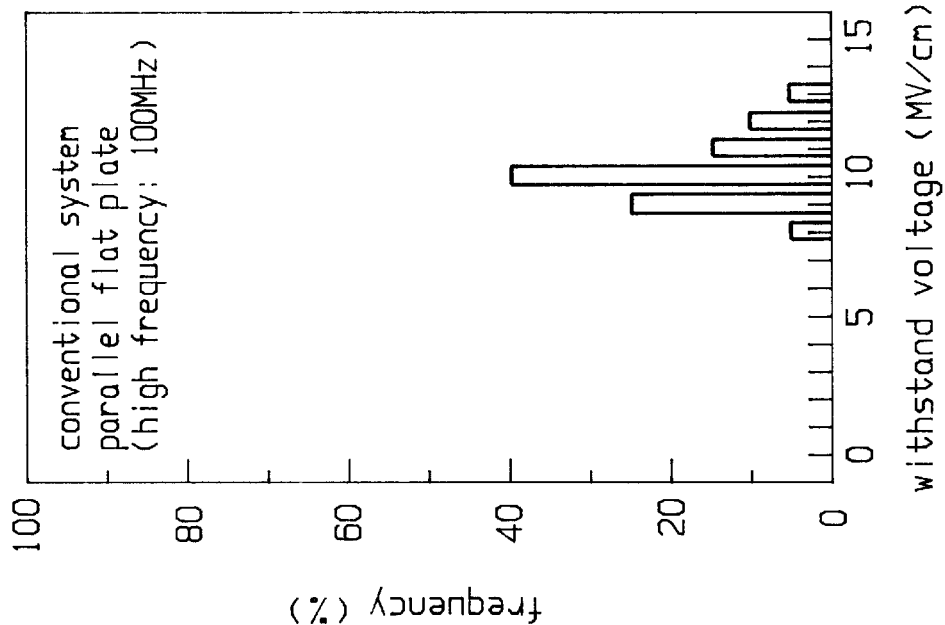
FIG. 38 is a graph showing results of withstand voltage for embodiment 18.
Figure 38A:
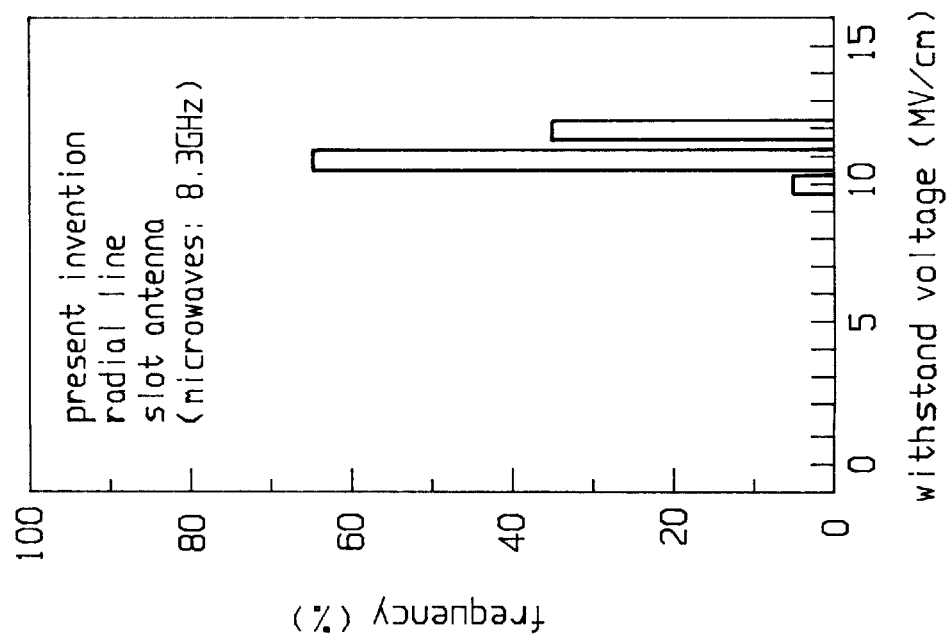

FIG. 38 is a graph showing the results of measuring withstand voltage. FIG. 38(*a*) shows the case when the gate oxidation film is manufactured using the device of the present invention. On the other hand, FIG. 38(*b*) shows the case when. the gate oxidation film is manufactured using a device of the related art. With a conventional device, plasma is generated by applying a high frequency of 100 MHz to parallel plate type electrodes, and the gate oxidation film is formed.

In FIG. 38, the horizontal axes represent withstand voltage and the vertical axes represent the frequency with which elements were obtained for each withstand voltage. For example, the bar graph at the 10 MV/cm part of the horizontal axis is the frequency of occurrence of elements having withstand voltage in the range 9.5–10.4 MV/cm. The number of elements measured was 30 for each of FIG. 38(*a*) and FIG. 38(*b*).

The following points become clear from FIG. 38.

① Elements manufactured using the device of the related art have a wide withstand voltage distribution (that is, uniformity is bad) and average withstand voltage is 10.2 MV/cm [FIG. 38(*b*)].

② Elements manufactured using the device of the present invention have a narrow withstand voltage distribution (that is, uniformity is good) and a high average withstand voltage of 11.9 MV/cm can be obtained, so it is understood that the film quality of the gate oxidation film has been improved [FIG. 38(*a*)].

Accordingly, by carrying out direct oxidation using the plasma device provided with the radial line slot antenna of the present invention, it is possible to form an oxidation film having high uniformity and high withstand voltage, which means that it was confirmed that elements having excellent withstand voltage could be manufactured stably.

In this example, the device of the present invention has been applied to a plasma oxidation device for oxidizing the surface of an object to be treated at a low temperature, but it was also confirmed that it was possible to obtain high uniformity oxidation films by applying it to a plasma nitriding device for nitriding the surface of an object to be treated.

(Embodiment 19)

This example shows an embodiment for the case where the present invention is applied to a plasma CVD device for film formation of a thin film on the surface of a substrate. Description will be given for the case where single crystalline Si is formed as a film on an amorphous Si substrate.

In the example, film formation of single crystalline Si is carried out on an amorphous Si substrate, but it is also possible to form polycrystalline Si as a thin film on amorphous Si. The material of the substrate on which film formation is carried out is not limited to Si and can be a glass or quartz substrate, etc.

$SiH_4$, $H_2$, and Ar are used as the source material gas, but the source material gas is not limited to this combination and it is possible to use Xe in place of Ar, although Xe is preferred.

The proportion of Ar must be maintained at at least half of the total amount. In this example, Ar is provided in a proportion of 50%, but this is not limiting. The reason for this is that on a plasma excitation method using microwaves, since it is necessary to have a quite high electron density within the plasma in order to maintain excitation of the plasma, it is necessary to increase the proportion of Ar that can obtain a higher electron density.

Also, the amorphous Si substrate surface is heated up to a temperature of 500° C. by irradiation by a xenon lamp and an insufficient energy is compensated for by plasma ion irradiation. It is also possible to use other temperature raising methods, but the method using a xenon lamp is preferred.

In order to form a film of single crystalline Si on the amorphous Si substrate, it is necessary for the kernel of crystal Si grown on the substrate surface during film formation to have the same in-plane orientation as the substrate. This means that if differences exist in the film in-plane formation conditions, film formation will be carried out with unequal orientation of the crystal kernel, so there is a necessity to make in-plane film formation conditions exactly uniform.

By using the plasma device of the present invention, it is possible to provide uniform film formation conditions over a large surface area, and for the first time it becomes possible to form a film of single crystalline Si on an amorphous substrate at low temperature, which was impossible in the related art.

As a result, it was possible to form a single crystalline Si film on a Si substrate of 300 mm in diameter at a temperature of 500° C. and a film formation rate of 0.1 μm every minute.

Results of forming a film of Poly-Si on a glass substrate also show that it is possible to obtain a high quality thin film with a mobility (carrier transfer rate) of 300 or greater.

(Embodiment 20)

This example is different from embodiment 19 in that a film of $SiO_2$ is formed on the Si substrate, and the remaining aspects are the same and will be omitted.

In this example, $SiH_4$, $O_2$ and Ar are used as the source material gas, but this combination of gases is not limiting and it is possible to use Xe in place of Sr as a carrier gas, and $N_2O$ can be used instead of $O_2$. It is also possible to add He etc, to the mixed gas comprising $SiH_4$, $O_2$ and Ar.

As a result, it was possible to form a film on an Si substrate of 300 mm in diameter at a temperature of 350° C. and a film formation rate of 0.1 μm every minute and in-plane uniformity was less than ±5%.

(Embodiment 21)

This example is different from embodiment 19 in that a film of $Si_3N_4$ is formed on the Si substrate, and the remaining aspects are the same and will be omitted.

In this example, $SiH_4$ and $NH_3$ are used as the source material gas, but this combination of gases is not limiting and it is possible to use Xe in place of Ar, and $N_2$ can be used instead of $NH_3$.

As a result, it was possible to form a film on a Si substrate of 300 mm in diameter uniformly at room temperature and with a film formation rate of 0.1 μm every minute, and in-plane uniformity was less than ±5%.

(Embodiment 22)

This example is different from embodiment 19 in that a BST thin film [(Ba, Sr) $TiO_3$], being a ferroelectric thin film, is formed on a Pt thin film that has been formed on the Si substrate. The remaining aspects are the same as embodiment 19 and will be omitted.

In this example, $Ba(DPM)_2$, $Se(DPM)_2$, and $TiO(O-iC_3H_7)_2$ and Ar are used as the source material gas, but this combination of gases is not limiting and it is possible to use Xe in place of Sr, although it is preferable to use Xe rather than Ar.

The Pt thin film is formed on the Si substrate beforehand using a sputtering method, and also serves as barrier metal to prevent the electrode and the Si substrate against reaction with a foundation of Ba, Sr, Ti. This embodiment is not limited to the Pt thin film, and it is also possible to use Ru or $RuO_2$ etc.

As a result, it was possible to achieve a film formation rate of 0.5mm every minute uniformly on a Si substrate of 300 mm in diameter at a temperature of 450° C., and the relative permittivity of the thin film was approximately 160.

(Embodiment 23)

This example is different from embodiment 19 in that a SBT thin film [$SrBi_2Ta_2O_9$] is formed on a Pt thin film that has been formed on the Si substrate. The remaining aspects are the same as embodiment and will be omitted.

In this example, $Sr(DPM)_2$, $Bi(C_6H_5)_3$, $TiO(O-iC_3H_7)_2$ and Ar are used as the source material gas, but this combination of gases is not limiting and it is possible to use Xe in place of Sr, although it is preferable to use Xe rather than Ar.

As a result, a ferroelectric thin film having a remanence of about 30 μm/cm$^2$ was obtained.

(Embodiment 24)

This example shows the case where the present invention is applied to a plasma CVD device for formation of a diamond thin film on the surface of a substrate. Description will be given for the case where Si is used as a substrate and film formation is carried out on this substrate.

In this example CO, $H_2$, $O_2$ and Ar are used as the source material gas, but this combination is not limiting.

The substrate temperature was set to 500° C. Also, the diamond thin film was formed by simultaneously proceeding with the elementary reactions of decomposition and deposition of carbon gas, diamond nucleation, generation of $sp^3$ carbon, and removal of by-products (graphite type carbon, polymer). In the formation of the diamond thin film, ion energy must be low, and compared to a plasma device of the related art the device of the present invention enables plasma generation over a large surface area at high density and low energy, which means that film formation rate can be increased and high quality thin film formation is possible.

(Embodiment 25)

This example is different from embodiment 19 in that a P-SiN film is formed on the Si substrate, and the remaining aspects are the same as embodiment 19 and will be omitted.

In this example, the substrate temperature was 300° C. and $SiH_4$, $NH_3$ and Ar were used as the source material gas, but this combination of gases is not limiting and it is possible to use Xe in place of Sr, and to replace $NH_3$ with $N_2$.

As a result, it was possible to form a film on a Si substrate of 300 mm in diameter at a film formation rate of 0.1 μm every minute and in-plane uniformity was less than ±5%.

(Embodiment 26)

This example is different from embodiment 19 in that a P-SiO film is formed on the Si substrate, and the remaining aspects are the same as embodiment and will be omitted.

In this example, the substrate temperature was 300° C. and $SiH_4$, $N_2O$ and Ar were used as the source material gas, but this combination of gases is not limiting and it is possible to use Xe in place of Sr.

As a result, it was possible to form a film on a Si substrate of 300 mm in diameter at a film formation rate of 0.1 μm every minute and in-plane uniformity was less than ±5%.

(Embodiment 27)

This example is different from embodiment 19 in that a BPSG film is formed on the Si substrate, and the remaining aspects are the same as embodiment 19 and will be omitted.

In this example, the substrate temperature was 450° C. and $SiH_4$, $PH_3$, $B_2H_6$, $O_2$ and Ar were used as the source material gas, but this combination of gases is not limiting and it is possible to use Xe in place of Sr.

As a result, it was possible to form a film on a Si substrate of 300 mm in diameter at a film formation rate of 0.1 μm every minute and in-plane uniformity was less than ±5%.

(Embodiment 28)

This example shows the case where the device of the present invention is applied to a plasma nitriding device for nitriding the surface of an object to be treated at low temperature. Description will be given for the case where an Si substrate is used as the object to be treated and direct nitriding is carried out on the surface of the Si substrate using $N_2$. The source material gas was Ar and $N_2$. It is also permissible to use He or Xe in place of Ar as a carrier gas. Also, He, Ne, Xe etc. can be added to the mixed gas comprising Ar and $N_2$. It is also possible to replace $N_2$ with $NH_3$.

Figure 39:
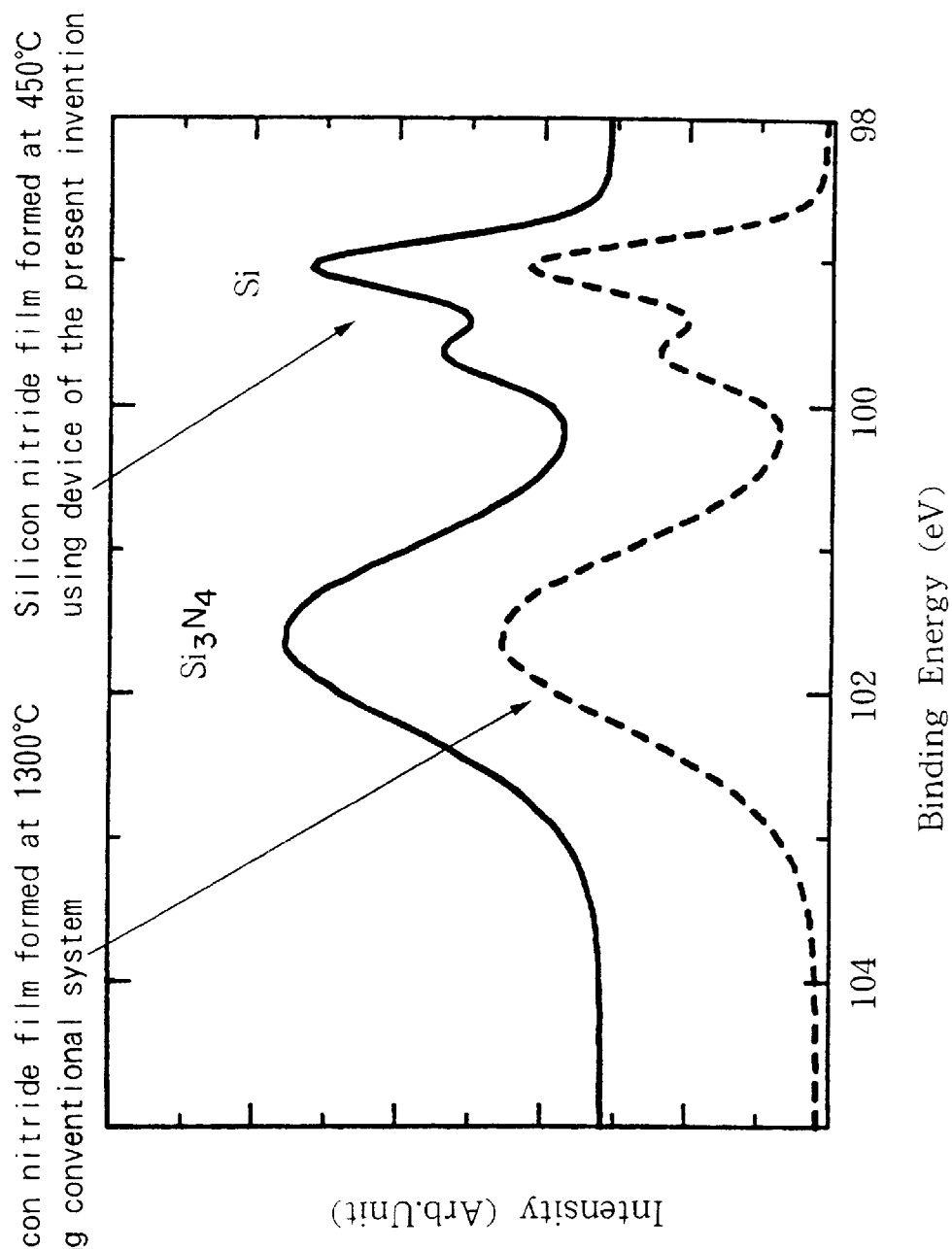
FIG. 39 is a graph showing results of analyzing chemical binding state of a Si surface, using an X-ray photoelectron spectroscope, for a silicon nitride film in embodiment 28.

FIG. 39 is a graph showing results of analyzing the chemical binding state of a Si surface, using an X-ray photoelectron spectroscope, after direct nitriding of the Si substrate surface for 30 minutes using a mixed gas of Ar/$N_2$=97%/3% and growth of a 5 nm nitride film, using the device of the present invention. The horizontal axis represents binding energy between photoelectrons and a nucleus, and the vertical axis represents the number of electrons having that binding energy. For the sake of comparison, the spectrum of the surface of 5 nm silicon nitride film grown by processing in an $N_2$ atmosphere at 1300° C. for 120 minutes is also shown.

From FIG. 39 a peak attributable to the silicon substrate and a peak of the silicon nitride film grown on the substrate were confirmed in the spectrum for the silicon nitride film grown using the device of the present invention. From the fact that the position and shape of the peak attributable to the silicon substrate were almost the same as those for the silicon nitride film formed at 1300° C., it was confirmed that the formed silicon nitride film was complete.

Figure 40:
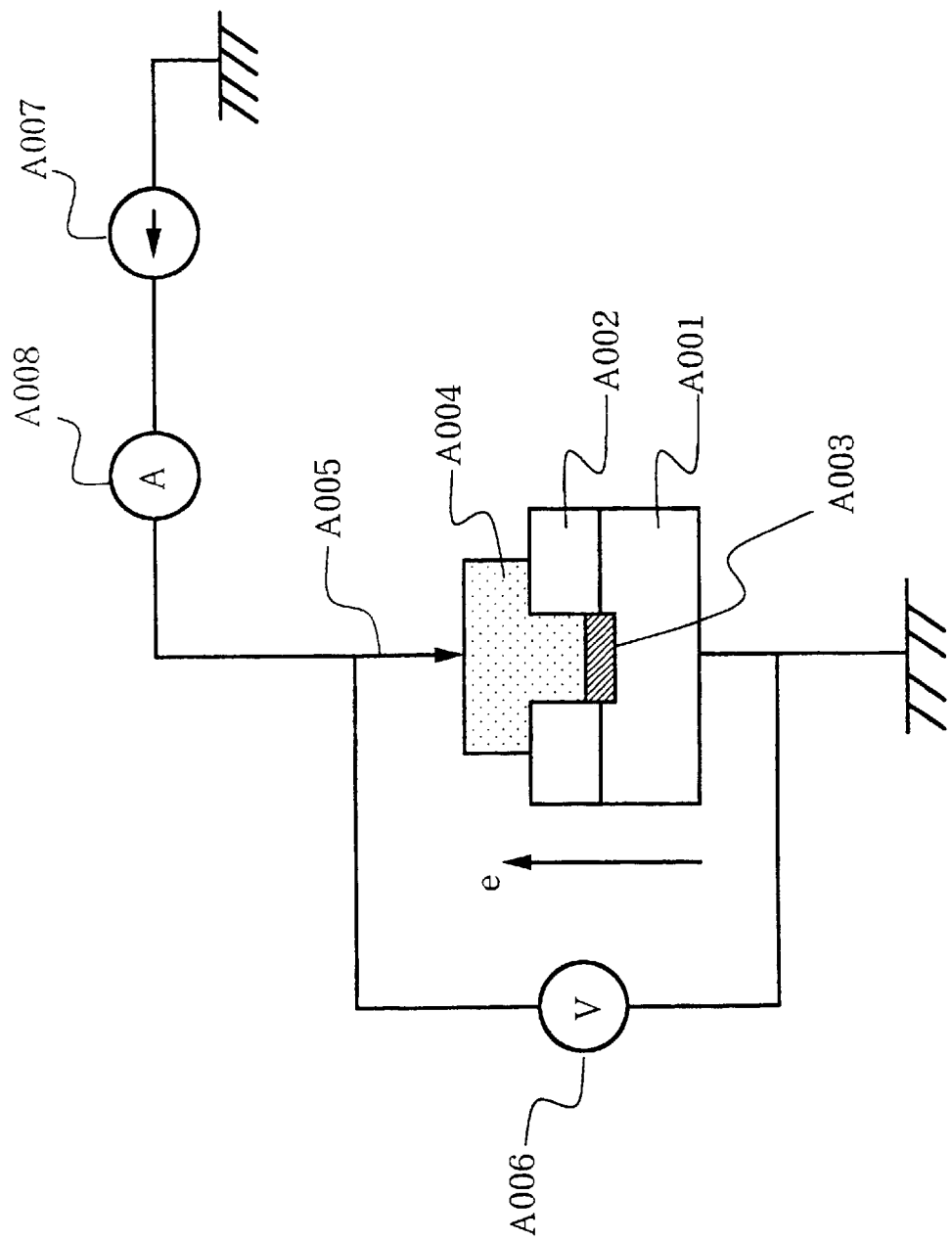
FIG. 40 is a schematic diagram showing a combination of a cross section of an element and an element dielectric breakdown injection charge amount measurement system, for embodiment 28.

FIG. 40 is a schematic drawing showing a combination of a cross section of an element formed in the present embodiment and a system for measuring dielectric breakdown injection charge amount for the element. In FIG. 40, the element that has had dielectric breakdown injection charge amount measured comprises an object to be treated 801 made of an n type Si wafer, a field oxidation film 802, a gate nitride film 803 and a gate electrode 804. Also, reference numeral 805 is a probe used in measurement of dielectric breakdown injection charge amount, reference numeral 806 is a voltmeter, reference numeral 807 is a constant current source and reference numeral 808 is an ammeter.

Figure 41:
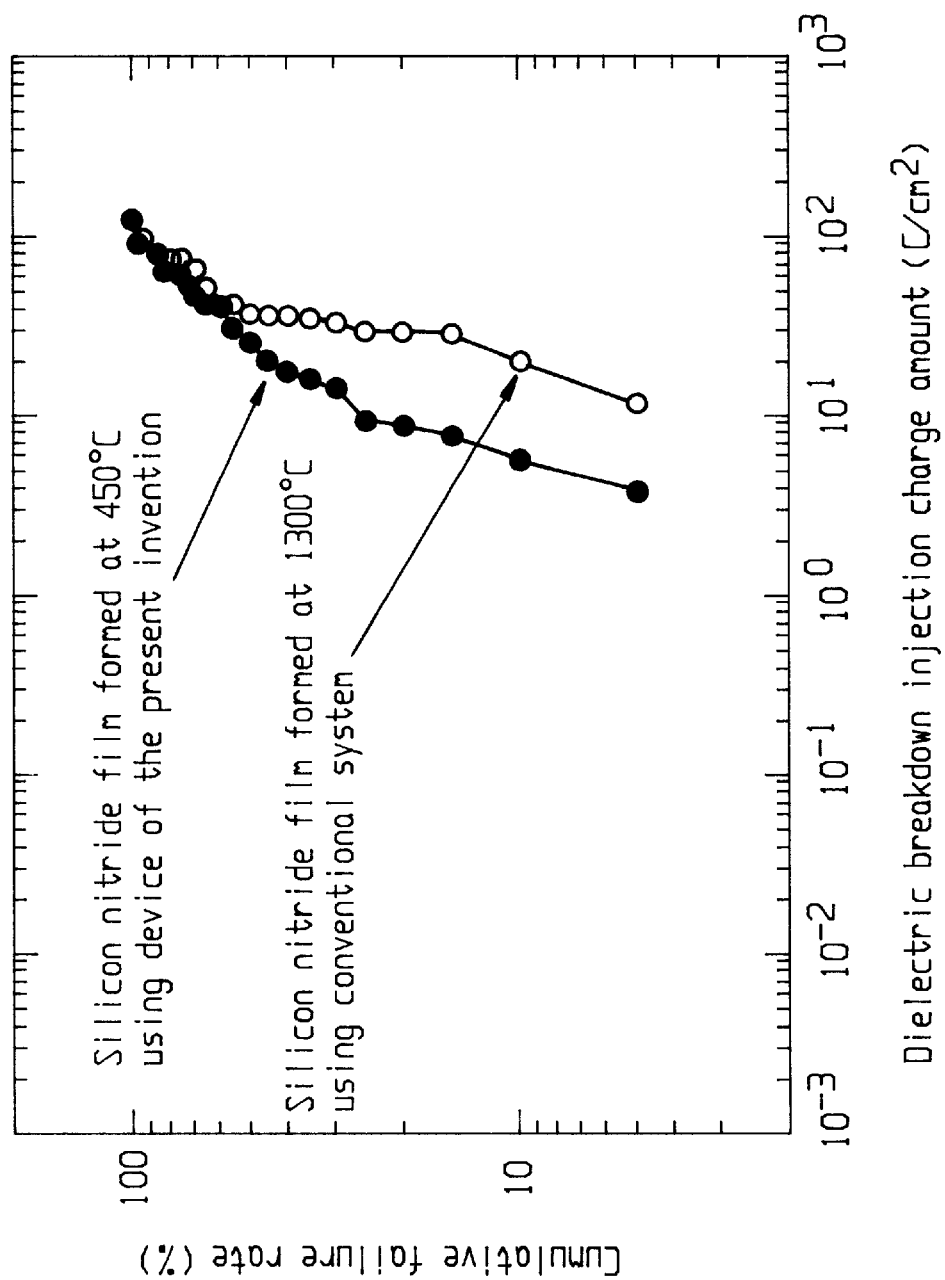
FIG. 41 is a graph showing results of dielectric breakdown injection charge amount for embodiment 28.

Element formation and dielectric breakdown injection charge amount measurement shown in FIG. 41 are carried out using the measurement meter shown in FIG. 40 and carrying out the following procedure.

(1) After a field oxidation film 802 (thickness: 800 nm) formed of $SiO_2$ has been formed on the n type Si wafer 801 using a thermo oxidation method [($H_2+O_2$ gas), $H_2$=1 l/min, $O_2$=1 l/min, temperature of object to be treated=1000° C.], part of the field oxidation film 802 was subject to etching processing and the surface of the n type Si wafer was exposed.

(2) Only the exposed surface of the field oxidation film 802 was direct nitrided using the plasma device of the present invention, and the gate nitride film 803 (surface area $1.0 \times 10^{-4}$ cm$^2$, thickness 5.6 nm) formed of $Si_3O_4$ was formed. The film forming conditions at this time were film forming gas (Ar+$N_2$), gas pressure 30 mTorr, partial pressure ratio Ar/$N_2$=99.7%–90%/0.3%–10%, microwave power 700 W, nitriding processing time 30 min, the object to be treated was held in an electrically floating state, and the temperature of the object to be treated was 430° C.

(3) A gate electrode 804 of Al (thickness 1000 nm) was formed on the field oxidation film 802 and the gate nitride film 803 by a vapor deposition method.

(4) The probe 805 was brought into contact with the gate electrode 804, a constant current was applied to the object to be treated 801 formed of the n type Si wafer via the gate electrode 804 using the constant current source 807 so the electron density became 200 mA/cm$^2$, and time taken for the gate nitride film 803 to suffer dielectric breakdown was measured. The electron density value multiplied by this time is the dielectric breakdown injection charge amount.

FIG. 41 is a graph showing results of measuring the dielectric breakdown injection charge amount of a silicon nitride film formed at 430° C. using the device of the present invention. For the sake of comparison, the dielectric breakdown injection charge amount for a silicon nitride film formed at 1300° C. in an $N_2$ atmosphere is also shown. In FIG. 41 the horizontal axis represents injection charge amount and the vertical axis represents the cumulative frequency of elements obtaining each of the charge injection amounts. Twenty elements were measured. From FIG. 41 it is understood that in the case of forming a nitride film on an Si substrate using the device of the present invention, even at a film formation temperature as low as there was no effect (With normal film formation at 430° C. it is impossible to even cause direct nitriding on the surface of a silicon substrate. In order to carry out nitriding of a silicon surface using $N_2$ gas a substrate of at least 1000° C. is required.), a maximum dielectric breakdown injection charge amount of 123 C/cm$^2$ was obtained, and the same characteristic as that for dielectric breakdown injection charge amount for a film formed at 1300° C. was exhibited.

Accordingly, by carrying out direct nitriding of a silicon surface using the device of the present invention, formation of a silicon nitride film having the same electrical characteristic as a silicon nitride film formed at 1300° C. was achieved even at a low temperature of 430° C.

In this embodiment, the device of the present invention has been applied to a plasma nitriding device for nitriding the silicon surface of an object to be treated at low temperature, this embodiment is not limited to Si and even if it was applied to nitriding of metallic surfaces such as Ta, W, Al, Ti etc it was confirmed that it was possible to obtain a high quality metallic nitride film at a low substrate temperature.

(Embodiment 29)

This embodiment shows an example where the device of the present invention is used as a plasma CVD device for forming a polycrystalline silicon thin film on the surface of a substrate, and formation of a polycrystalline silicon film on an oxidation film that has been formed on the Si substrate. The source material gas was a mixed gas of Ar and $SiH_4$. It is also permissible to add $H_2$, He, Ne, Xe etc. to the mixed Ar and $SiH_4$ gas. It is also possible to use He or Xe in place of Ar. It is also possible to use $Si_2H_6$, $SiHCl_3$, $SiH_2Cl_2$ and $SiCl_4$ instead of $SiH_4$ and obtain the same effects. An oxidation film formed on the Si substrate to a thickness of 50 nm using a thermal oxidation method [(H2+O2) gas, H2=1 l/min, O2=1 l/min, Si substrate temperature=1000° C.] is used as the substrate. In this embodiment, formation of the oxidation film is carried out using a thermal oxidation method, but the means for oxidation film formation is not thus limited and an oxidation film formed by any means is permissible. After formation of the oxidation film on the Si substrate, and after a polycrystalline silicon thin film has been deposited to a thickness of 120 nm using the device of the present invention under conditions of substrate temperature 300° C. and Ar/$SiH_4$=99.95%/0.05%, the polycrystalline silicon thin film is analyzed using an X-ray diffractometer. For the sake of comparison, after a polycrystalline silicon thin film has been deposited to a thickness of 120 nm using a parallel plate type CVD device of the related art under conditions of substrate temperature 300° C. and Ar/$SiH_4$=99.95%/0.05%, the polycrystalline silicon thin film was similarly analysed using an X-ray diffractometer.

Figure 42:
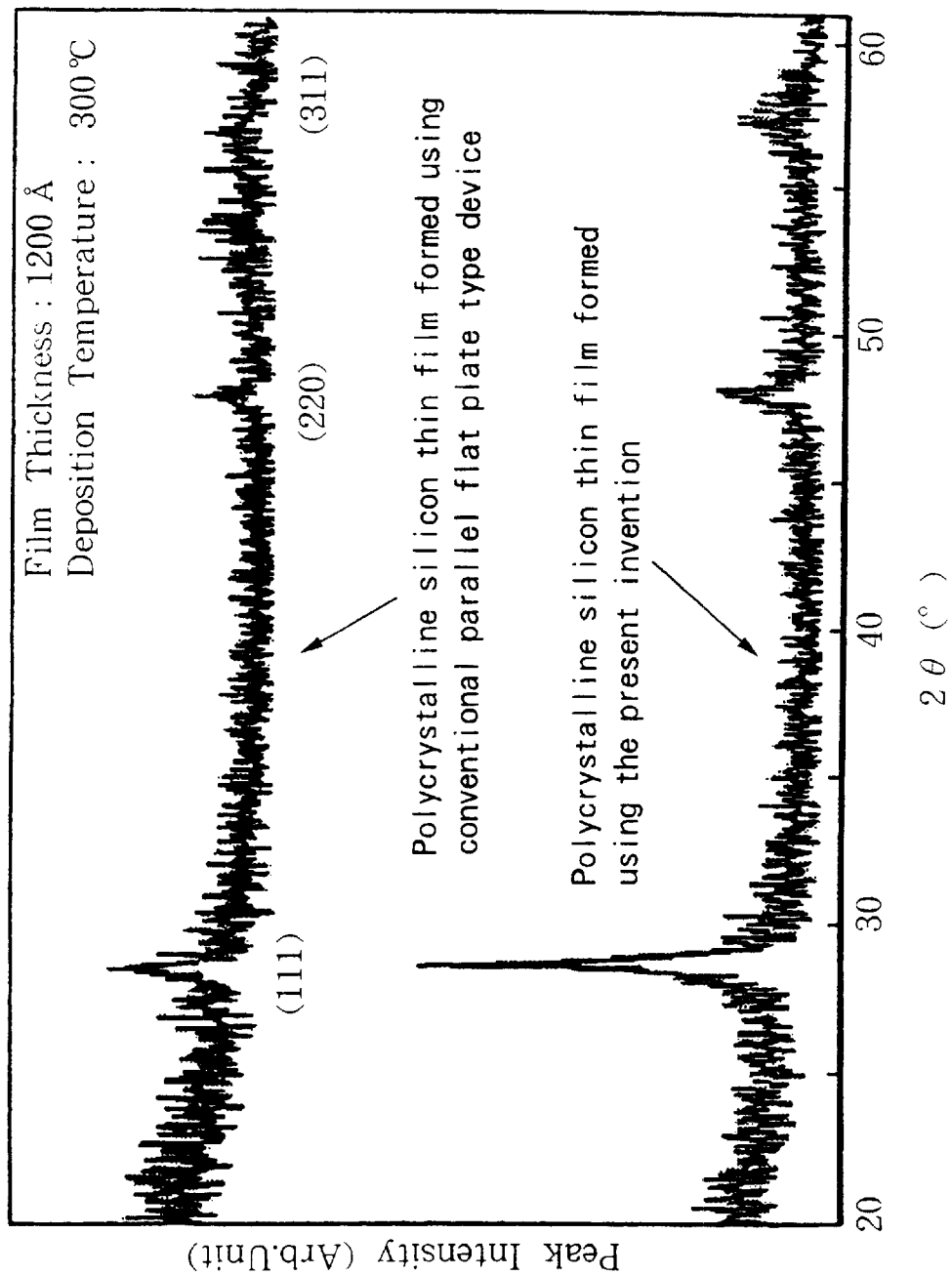
FIG. 42 is a graph showing results of an X ray diffractometer for embodiment 29.

FIG. 42 is a graph showing X-ray diffractometer measurement results of the polycrystalline silicon thin films. The horizontal axis represents an X-ray scattering angle 2θ attributable to the surface direction, and the vertical axis represents the X-ray strength at that scattering angle. A large peak strength of the X-ray diffractometer indicates a high cystallinity in the surface direction. From FIG. 42 it will be understood that the polycrystalline silicon film formed using the device of the present invention clearly has improved cystallinity compared to the film formed using the parallel plate type CVD of the related art.

(Embodiment 30)

This embodiment shows the case where the present invention is applied to a magnetron plasma etching device.

A plasma device has two plate type electrodes electrode I and electrode II which are parallel to each other. A substrate to be processed using plasma is mounted on a isurface of electrode I opposite to electrode II, and is provided with means for applying a magnetic field being horizontal and unidirectional onto the substrate. The electrode II comprises a central section electrically connected to ground, and an outer section connected to a high frequency power supply that can be controlled independently of a high frequency power supply connected to the electrode I. A focus ring is also provided at a section electrically connected to electrode I, for the purpose of making the density of plasma generated around the substrate surface uniform. The focusing ring has means for adjusting junction impedance.

A structural drawing of the etching device of the present invention is the same as FIG. 44 and so is omitted.

In this device, a dipole ring magnet (hereinafter referred to as a DRM) having a plurality of permanent magnets lined up in an annular shape is used as the magnetic field applying means. The permanent magnets constituting the DRM are aligned so that magnetization is performed in one direction as the magnet positions go halfway round.

Here, a DRM is used as the magnetic field, but other means for applying a magnetic field can also be used. Also, the plasma density is increased here using a magnetic field, but other means can also be used, and when there is no need to increase plasma density there is no need to use any means at all.

The electrode II is a ring shaped metallic plate in this case, and is provided in order to cause increased in-plane uniformity of the plasma in the vicinity of the substrate surface. High frequency power output from the high frequency power supply II is applied to the electrode II via the matching circuit II. By balancing electron drift on the surface of the electrode II, caused by application of a magnetic field using application of a suitable high frequency power to the electrode II, and electron drift on the surface of the substrate, the plasma in the vicinity of the substrate is made almost completely uniform. In a case where the in-plane uniformity of the plasma is favourable even without the application of a high frequency to the electrode II, or where there is no problem even if it is not uniform, there is no need to specially provide the electrode II. Similarly, also with respect to the focus ring provided for the purpose of making the density of the plasma to be generated in the vicinity of the substrate surface uniform, in a case where the in-plane uniformity of the plasma is favourable even without the application of high frequency to the electrode II, or where there is no problem even if it is not uniform, it is possible to either reduce the size of the focus ring or not provide it at all.

As a material for the wall surface inside the container, a material containing as low an amount of discharge gas (such as moisture) as possible is used, in this case AlN. However, the internal wall surface is not limited to this material. The high frequency applied to the electrode I was 13.56 MHz, and the high frequency applied to the electrode II was 100 MHz. In this case, by making the frequency applied to the electrode II higher than the frequency applied to the electrode I, a self bias voltage for the electrode II becomes small which means that the problem of the electrode II being sputtered by the plasma and the inside of the container suffering from metallic contamination are solved. The high frequencies applied to the electrodes I and II are not limited to those in this example.

Figure 57:
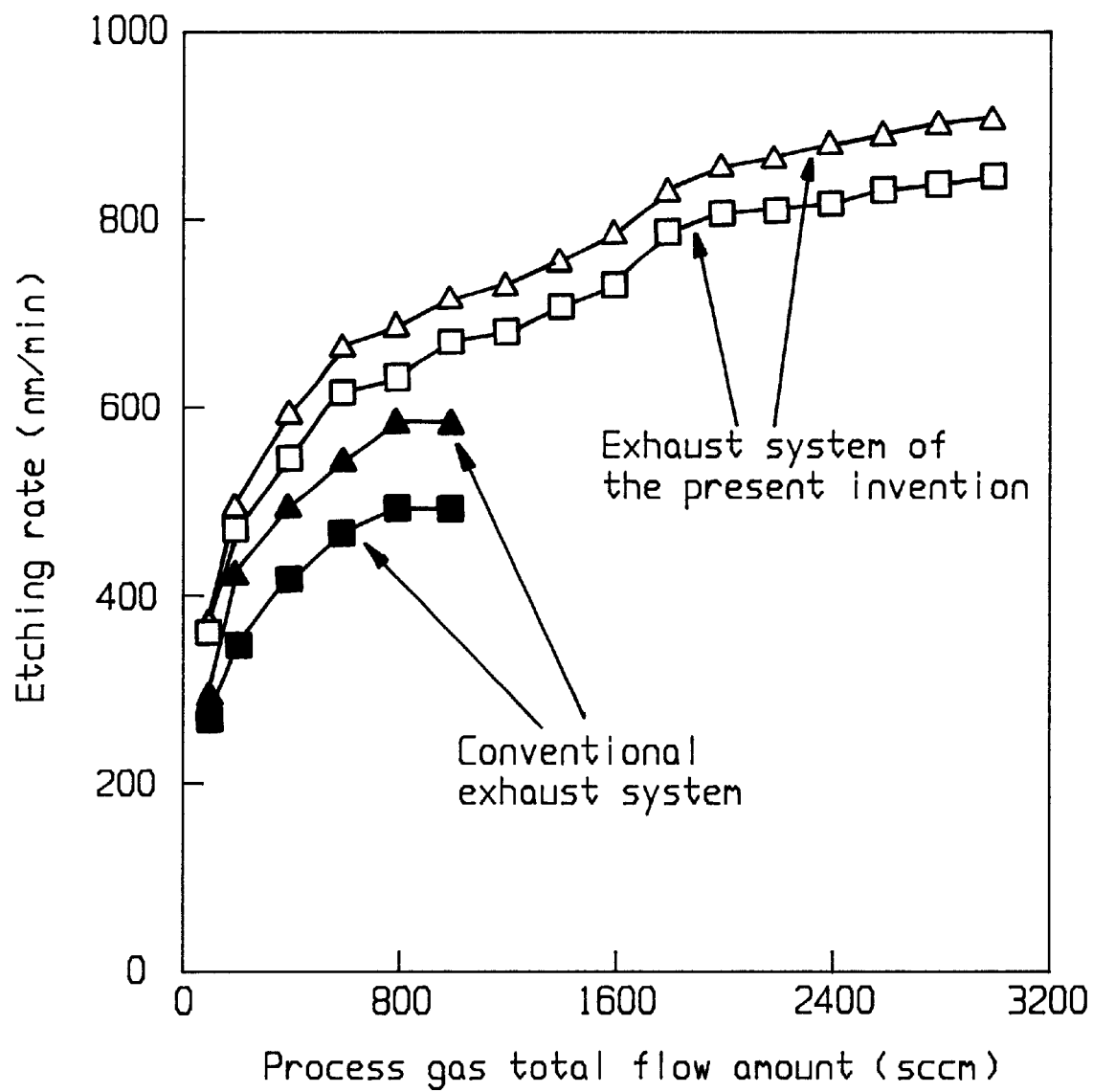
FIG. 57 is a graph comparing displacement in the related art and this embodiment.

Only the exhaust system of the above described device was modified and the major difference of the exhaust system of the present invention was evaluated in comparison to the exhaust system of the related art (i.e., the method disclosed in FIG. 43(a)). The evaluation method was to prepare an insulation film BPSG to a thickness of 1.5 μm on an Si wafer 200 mm in diameter as the substrate to be plasma processed, mount the substrate on electrode I and carry out etching while increasing a total gas flow amount with a fixed process gas ratio, and measuring the etching rate using disparity between the exhaust systems. The conditions for etching the substrate were power of a high frequency (13.56 MHz) applied to the electrode I 1700 W, power of a high frequency (100 MHz) applied to the electrode II 400 W, process pressure 40 mTorr, electrode spacing 10 mm, and process gas ratio of $C_4F_8$:5%, CO:15%, Ar 78%, and $O_2$:2%, but these conditions are not limiting. The results of the evaluation are shown in FIG. 57. (The marks ▲and Δrepresent etching rate at the center of the wafer, while the marks ■ and □ represent etching rate at the end of the wafer.) From these results the following point becomes clear.

(1) In the case of adopting the exhaust system of the present invention, it is understood that it is possible to obtain a higher etching rate and uniformity than with the exhaust system of the related art.

Also, BPSG is formed on a Si wafer of 200 nm in diameter to a thickness of 1.5 μm as the substrate, 0.7 μm of mask material referred to as resist was coated on this substrate, and after carrying out exposure and developing processing a hole pattern of diameter 0.1 μm was formed on the mask material. This substrate was etched under the same conditions as the above described experiment, and after etching hole formation was observed. As a result, the following point becomes clear.

Figure 58:
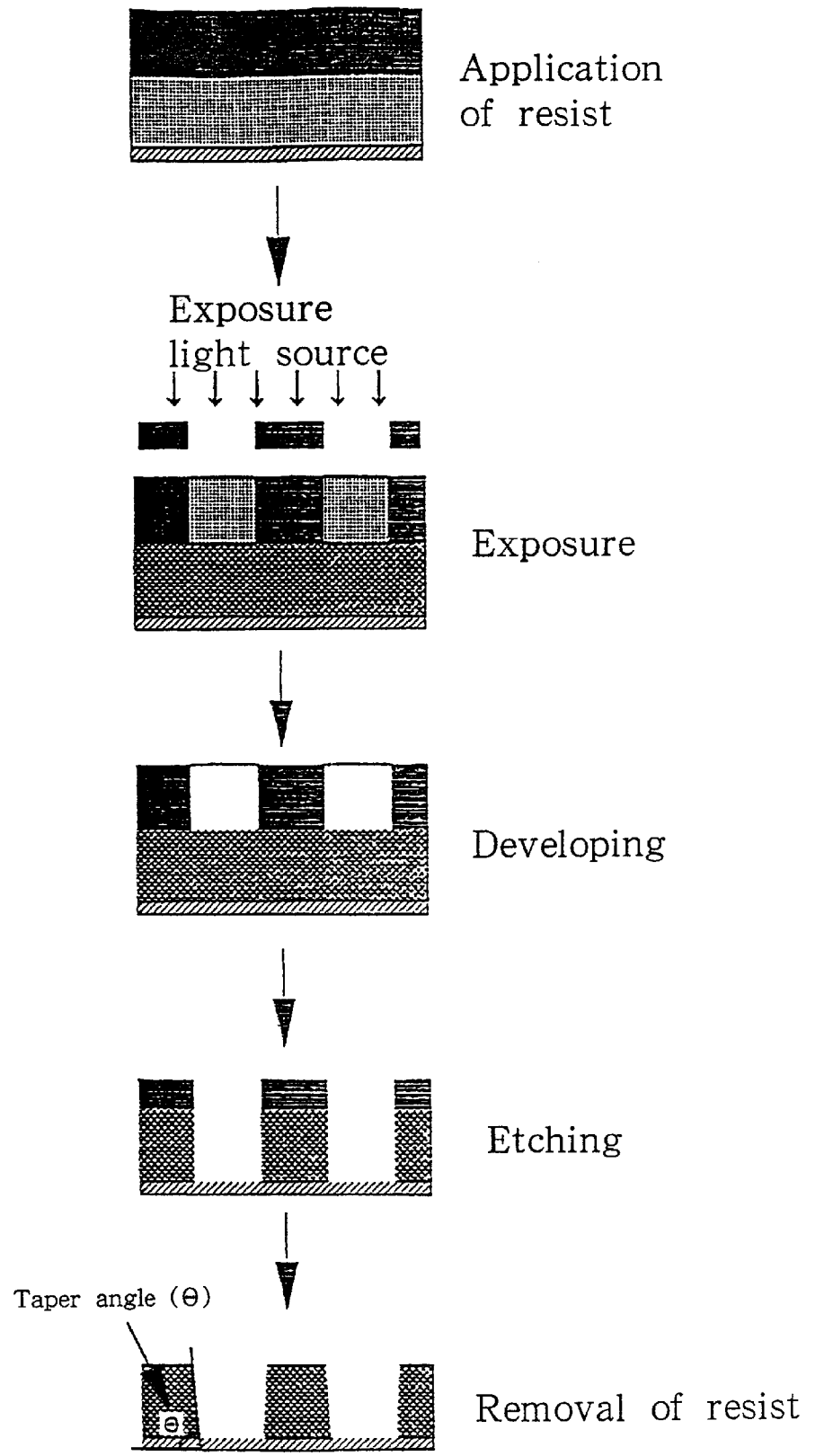
FIG. 58 is a drawing showing the manufacturing flow when producing a pattern with this embodiment.

(2) Reaction by-products clogging up the holes are effectively expelled due to improved exhaust rate and increased process gas flow amount, which makes it possible to obtain favourable hole formation. Compared to a taper angle of 86° for an exhaust system of the related art, a taper angle of 89° and ideal formation are possible with the exhaust system of the present invention. Here, taper angle means the angle formed by the Si wafer and the side wall of the hole (refer to FIG. 58).

(Embodiment 31)

This embodiment shows the case where the present invention is applied to a magnetron sputtering device.

The structure of this device is the same a FIG. 54, so a further drawing is omitted. Here, a target is the substrate 5404 to be plasma processed mentioned in FIG. 54. A dipole ring magnet having a plurality of permanent magnets aligned in a ring shape is used as magnetic field applying means, but this is not limiting. Material of the inner walls of the container are a material discharges a little discharge gas (such as moisture) as possible, so it is AlN in this case. However, high frequency power applied to the electrode I was 43.0 MHz, the frequency applied to the electrode II was 13.56 MHz, and the frequency applied to the auxiliary electrode B was 100 MHz. The high frequencies applied to the respective electrodes are not limited to those described above, but the frequency applied to the auxiliary electrode B is preferably set high so that the self bias potential for electrode B is low and sputtering of the auxiliary electrode B itself can be avoided.

Only the exhaust system of the above described device was modified and the major difference of the exhaust system of the present invention was evaluated in comparison to the exhaust system of the related art (exhaust system in one direction only, i.e., the method disclosed in FIG. 43(a)). Evaluation was carried out by generating plasma using Ar as carrier gas under a pressure of 10 mTorr, carrying out sputtering, measuring the distribution of cut away amount of the Al target, and comparing the state of plasma generated in the vicinity of the target. A single crystalline Si wafer (6 inches) was used as the substrate to be subjected to film formation.

Figure 59:
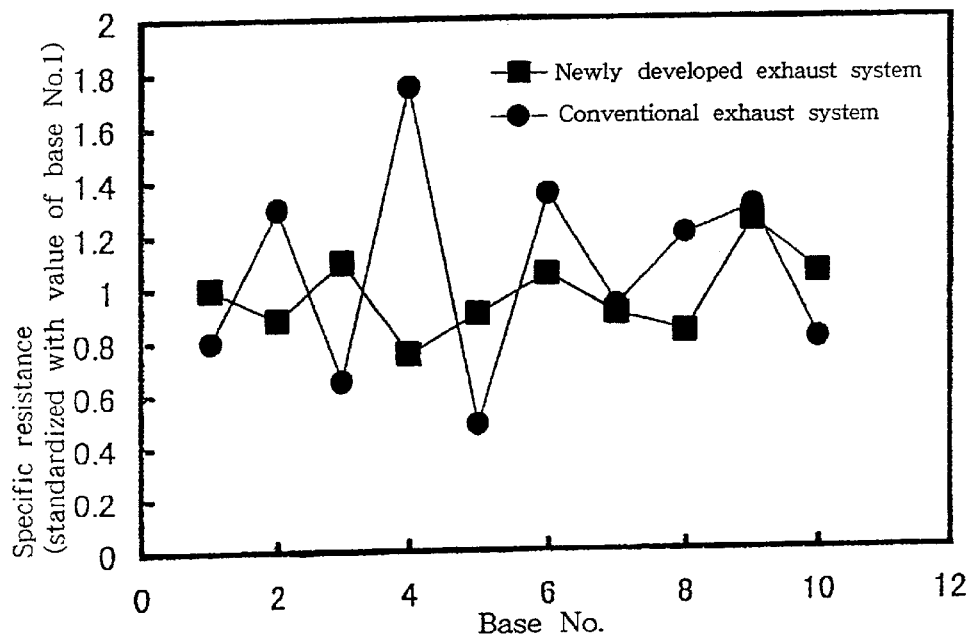
FIG. 59 is a graph comparing specific resistance in the related art and this embodiment.

The results of this evaluation are shown in FIG. 59. From these results the following point becomes clear.

(1) In this embodiment, by increasing the gas flow amount when the pressure inside the container is 10 mTorr to 1.5 sccm, the in-plane uniformity of the cut away amount is improved. This is considered to be due to the fact that a uniform exhaust rate and gas flow are realized in the vicinity of the target.

Al was used as the target, but the same results were also confirmed with Cu.

(Embodiment 32)

This embodiment shows the case where the present invention is applied to a plasma oxidation device for oxidizing the surface of a substrate at low temperature in a plasma device using a radial line slot antenna capable of uniformly supplying gas in a large flow amount.

The structure of this device is the same as FIG. 53, and so a further drawing will be omitted.

Description will be given for the case where an Si wafer is used as the substrate and a gate oxidation film is formed by direct oxidation of the Si wafer surface using $O_2$, Ar and $O_2$ are used as the source material gas. It is also possible to use Xe instead of Ar as a carrier gas. It is also possible to add He etc. to the mixed gas comprising Ar and $O_2$.

Figure 60:
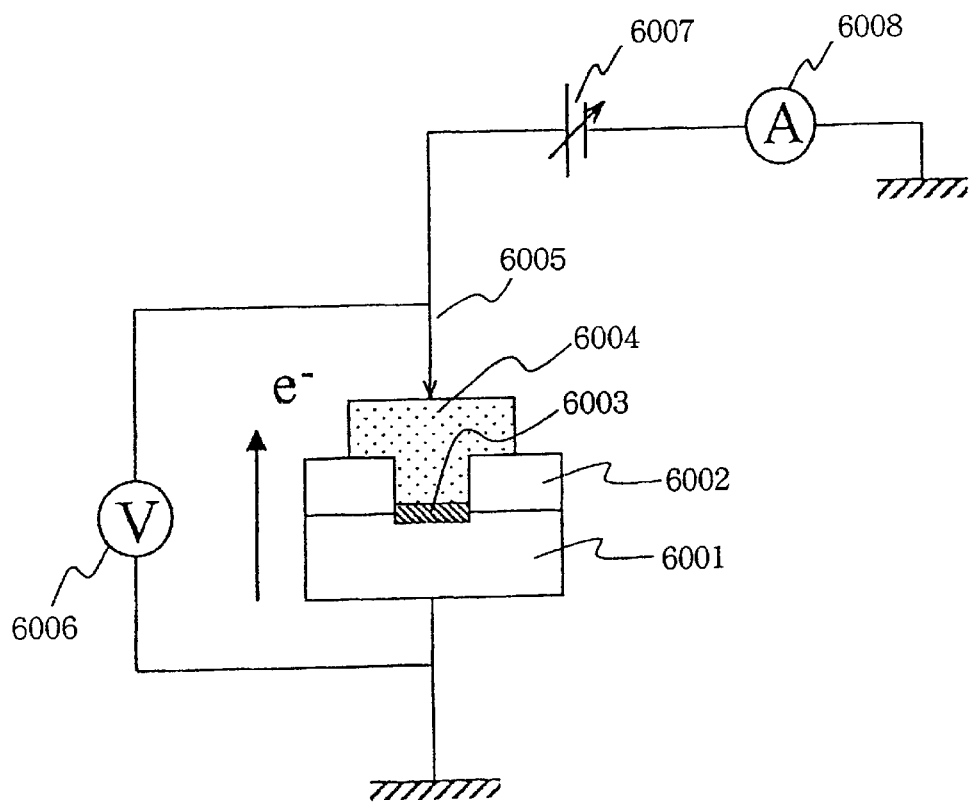
FIG. 60 is a schematic diagram showing a combination of a cross section of elements of this embodiment and a withstand voltage measuring system.

FIG. 60 is a schematic diagram showing a combination of a cross section of an element formed with this embodiment, and a system for measuring withstand voltage of the element. In FIG. 60, the element whose withstand voltage was measured comprises a substrate 4001 formed of an n-type Si wafer, a field oxidation film 4002, a gate oxidation film 4003, and a gate electrode 4004. Also, reference numeral 4005 is a probe used in measurement of the withstand voltage, reference numeral 4006 is a voltmeter, reference numeral 4007 is voltage applying means, and reference numeral 4008 is an ammeter.

The formation and withstand voltage measurement of the element shown in FIG. 60 was carried out through the following sequence of events. After a field oxidation film 4002 (thickness: 800 nm) comprising $SiO_2$ has been has been formed on the n-type Si wafer using a thermal oxidation method [($H_2+O_2$) gas, $H_2$=1 l/min, $O_2$=1 l/min, temperature of object to be processed=1000° C.] part of the field oxidation film 4002 is subjected to etching processing and the surface of the n-type Si wafer 4001 is exposed.

Only the exposed surface of the n-type Si wafer 4001 was subjected to direct nitridation using the plasma device of the present invention to form the gate oxidation film 4003 (surface area=$1.0 \times 10^{-4}$ cm$^2$) formed of $SiO_2$. The film formation conditions at this time were: film formation gas (Ar+$O_2$); gas pressure 30 mTorr; partial pressure ratio Ar:$O_2$=98%:2%; microwave power 700 W; oxidation processing time 20 minutes; the substrate was held in an electrically floating state and the temperature of the object to be processed was 430° C. However, the film formation conditions are not thus limited.

A gate electrode 4004 (thickness 1000 nm) formed of Al was formed on the field oxidation film 4002 and the gate oxidation film 4003 using a vapor deposition method.

The probe 4005 was brought into contact with the gate electrode 4004, a d.c. voltage was applied to the object to be processed 40001 formed of the n-type Si wafer, through the gate electrode 4004, and the potential at which the gate oxidation film 4003 suffered dielectric breakdown (namely, withstand voltage) was measured using the voltmeter 4006.

Figure 61B:
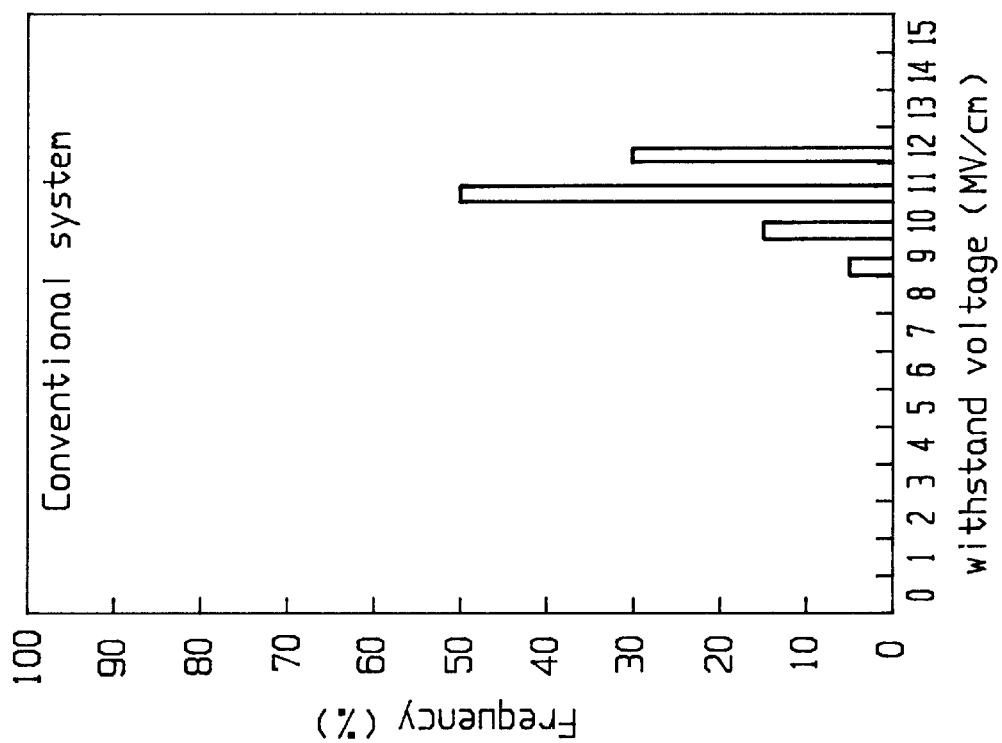
FIG. 61 is a graph showing results of measuring withstand voltage for this embodiment and the related art.
Figure 61A:
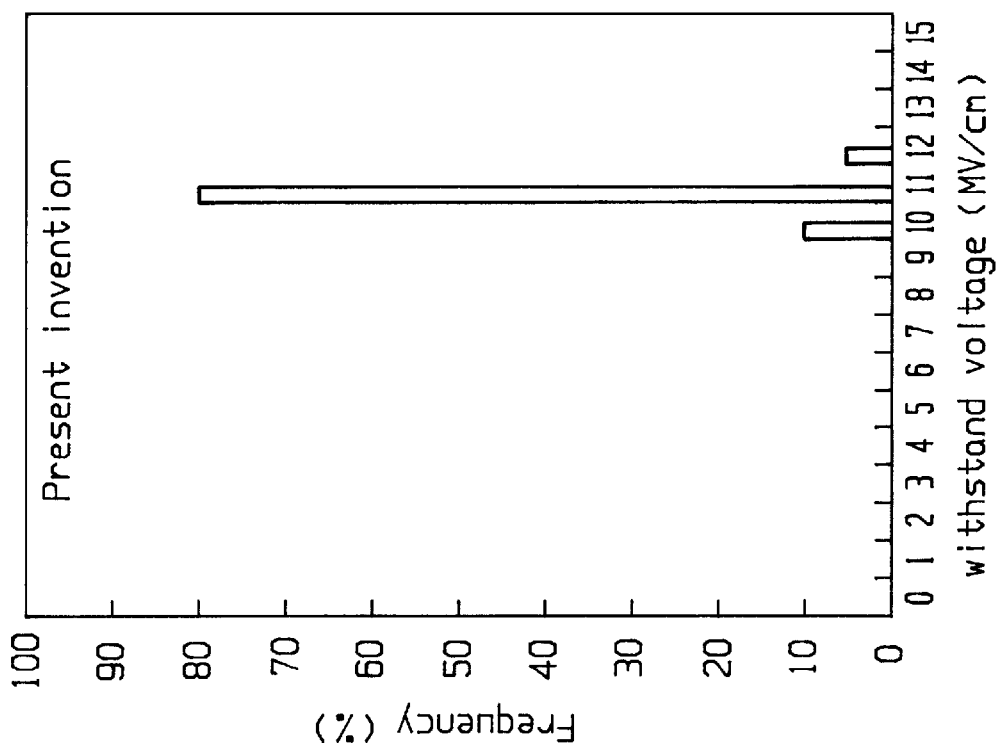

FIG. 61 is a graph showing the results of measuring withstand voltage. FIG. 61(a) shows the case of a gate insulation film formed by with the device of the present invention, while FIG. 61(b) shows the case of a gate insulation film formed by with the device of the related art.

Figure 62:
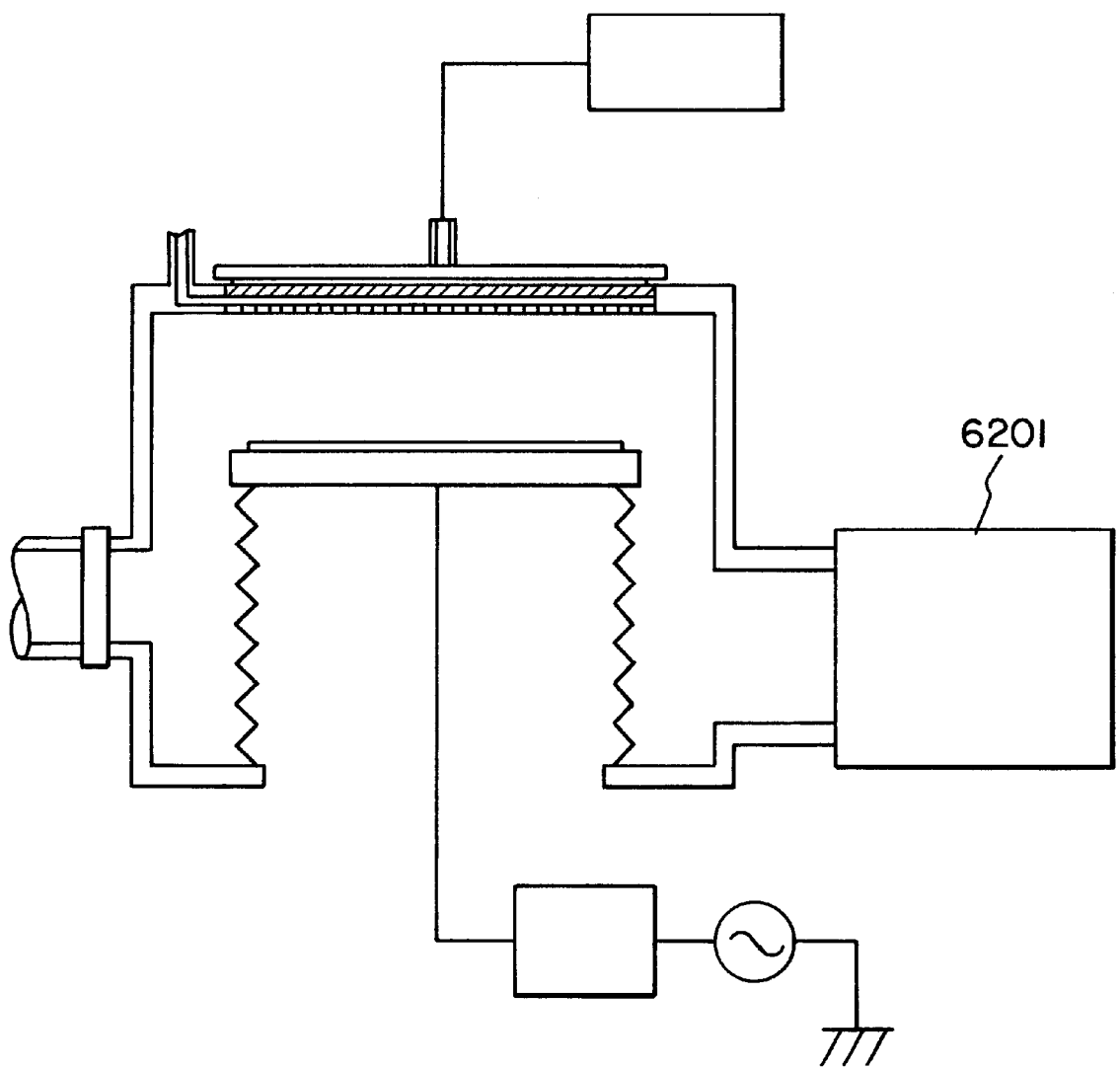
FIG. 62 is a plan view of a plasma device of the related art.

FIG. 62 shows a plan view of a plasma device using a radial line slot antenna having the exhaust system of the related art. The only difference from a device using the exhaust system of the present invention is the exhaust system. The exhaust system of the present invention has a comparatively wide space provided above the vacuum pump, and expulsion in carried out from a plurality of vacuum pumps arranged spaced substantially equal distances apart at the side of the substrate, it is possible to have a gas flow uniformly above the substrate in a rotational direction substantially without lowering the gas conductance. Specifically, it becomes possible to cause a large amount of gas to flow up to the capacity of the vacuum pump, and it is possible to handle ultra high speed processing of a large diameter substrate. Conversely, because the exhaust system of the related art uses vacuum pump expulsion in only one direction, the space above the vacuum pump is narrow and the gas conductance is lowered, it is not possible to realize uniform gas flow above the substrate. As a result, it is not possible to make a large amount of gas flow and it is impossible to handle high speed processing of a large diameter substrate.

In FIG. 61, the horizontal axis represents withstand voltage and the vertical axis represents frequency of occurrence of elements that obtained each withstand voltage. For example, the bar graph of the horizontal axis 10 MV/cm is the frequency of occurrence of elements having a withstand voltage in the range 9.5–10.4 MV/cm. The number of elements measured was 30 in each of FIGS. 61(a) and 61(b). From FIG. 61 the following point becomes clear.

Elements formed using the device provided with the exhaust system of the related art have a wide distribution of withstand voltage (namely bad film quality uniformity), and an average withstand voltage of 10.3 MV/cm [FIG. 61(b)].

Elements formed using the device of the present invention have a narrow distribution of withstand voltage (namely good film quality uniformity), and a high average withstand voltage of 11.5 MV/cm can be obtained, which means that the film quality of a gate oxidation film is improved [FIG. 61(a)].

Figure 63:
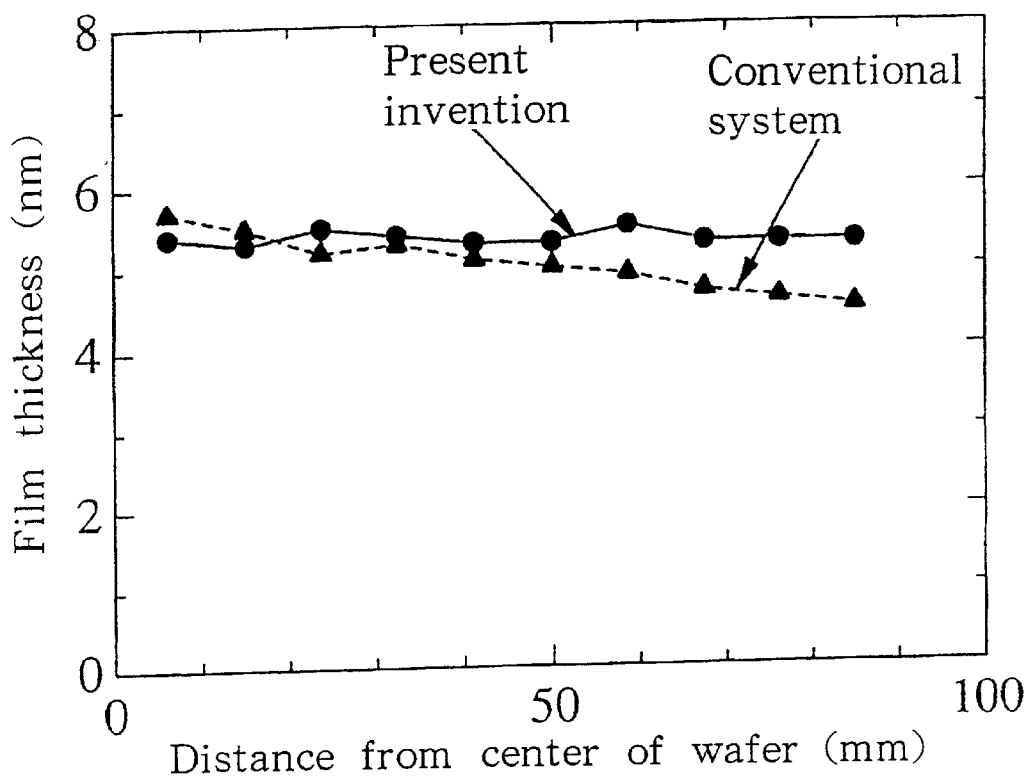
FIG. 63 is a graph showing distribution of film thickness inside the surface of a wafer of silicon oxide film.

FIG. 63 is a graph showing distribution of film thickness of the inner surface of wafer surface of the Si oxidation film. The horizontal axis represents distance from the center of the wafer and the horizontal axis represents film thickness of the direct oxidation film., The film thickness of the direct oxidation films formed with the device provided with the exhaust system of the related art has low uniformity. On the contrary, the film thickness of direct oxidation films formed with the device of the present invention are almost constant at the wafer surface, and uniformity is high. Accordingly, since it is possible to form oxidation films having high uniformity and high withstand voltage it was confirmed that it was possible to stably manufacture elements having excellent withstand voltage.

In this embodiment, the device of the present invention has been applied to a plasma oxidation device for oxidizing a Si surface of a substrate at low temperature, but it is not limited to a Si surface and it was confirmed that it was also possible to obtain oxidation films having high uniformity with metallic surfaces.

(Embodiment 33)

This embodiment shows the case where the present invention is applied to a plasma nitriding device for nitriding the surface of a substrate at low temperature in a plasma device using a radial line slot antenna capable of uniformly supplying gas in a large flow amount.

The structure of this device, as well as the plasma device using a radial line slot antenna provided with the exhaust system of the related art, are the same as embodiment 3, and so will be omitted.

Similarly to embodiment 3, a Si wafer is used at the substrate, and description will given for the case where the surface of the Si wafer is subjected to direct nitridation using $N_2$, and a gate nitridation film is formed.

Figure 64:
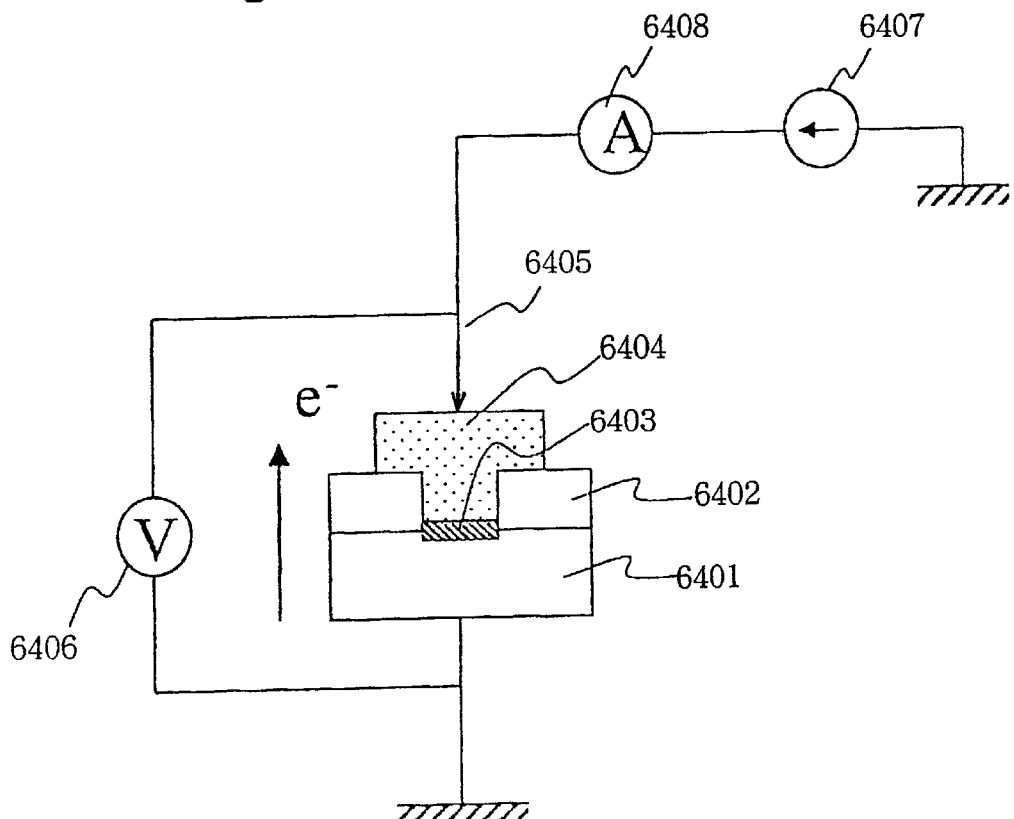
FIG. 64 is a schematic diagram showing a combination of a cross section of elements of this embodiment and a system for measuring dielectric breakdown injection charge amount.

FIG. 64 is a schematic drawing showing a combination of a cross section of an element formed in the present embodiment and a system for measuring dielectric breakdown injection charge amount for the element. In FIG. 64, the element that has had dielectric breakdown injection charge amount measured comprises an object to be treated 5001 made of an n type Si wafer, a field oxidation film 5002, a gate nitride film 5003 and a gate electrode 5004. Also, reference numeral 5005 is a probe used in measurement of dielectric breakdown injection charge amount, reference numeral 5006 is a voltmeter, reference numeral 5007 is a constant current source and reference numeral 508 is an ammeter. Element formation and dielectric breakdown injection charge amount measurements shown in FIG. 64 were carried out using the following procedure.

After a field oxidation film 5002 (thickness: 500 nm) formed of $SiO_2$ has been formed on the n type Si wafer 5001 using a thermo oxidation method [($H_2+O_2$ gas), $H_2$=1 l/min, $O_2$=1 l/min, temperature of object to be treated=1000° C.], part of the field oxidation film 5002 was subject to etching processing and the surface of the n type Si wafer was exposed.

Only the exposed surface of the field oxidation film 5002 was direct nitrided using the plasma device of the present invention, and the gate nitride film 5003 (surface area $1.0 \times 10^{-4}$ $cm^2$, thickness 5.6 nm) formed of $Si_3O_4$ was formed. The film forming conditions at this time were film forming gas (Ar+$N_2$), gas pressure 30 mTorr, partial pressure ratio Ar/$N_2$=99.7%–90%/0.3%–10%, microwave power 700 W, nitriding processing time 20 min, the object to be treated was held in an electrically floating state, and the temperature of the object to be treated was 430° C. However, the film formation conditions are not thus limited.

A gate electrode 5004 of Al (thickness 1000 nm) was formed on the field oxidation film 5002 and the gate nitride film 5003 by a vapor deposition method.

The probe 5005 was brought into contact with the gate electrode 5004, a constant current was applied to the object to be treated 5001 formed of the n type Si wafer via the gate electrode 5004 using the constant current source 5007 so the electron density became 100 mA/$cm^2$, and time taken for the gate nitride film 5003 to suffer dielectric breakdown was measured. The electron density value multiplied by this time is the dielectric breakdown injection charge amount.

Figure 65:
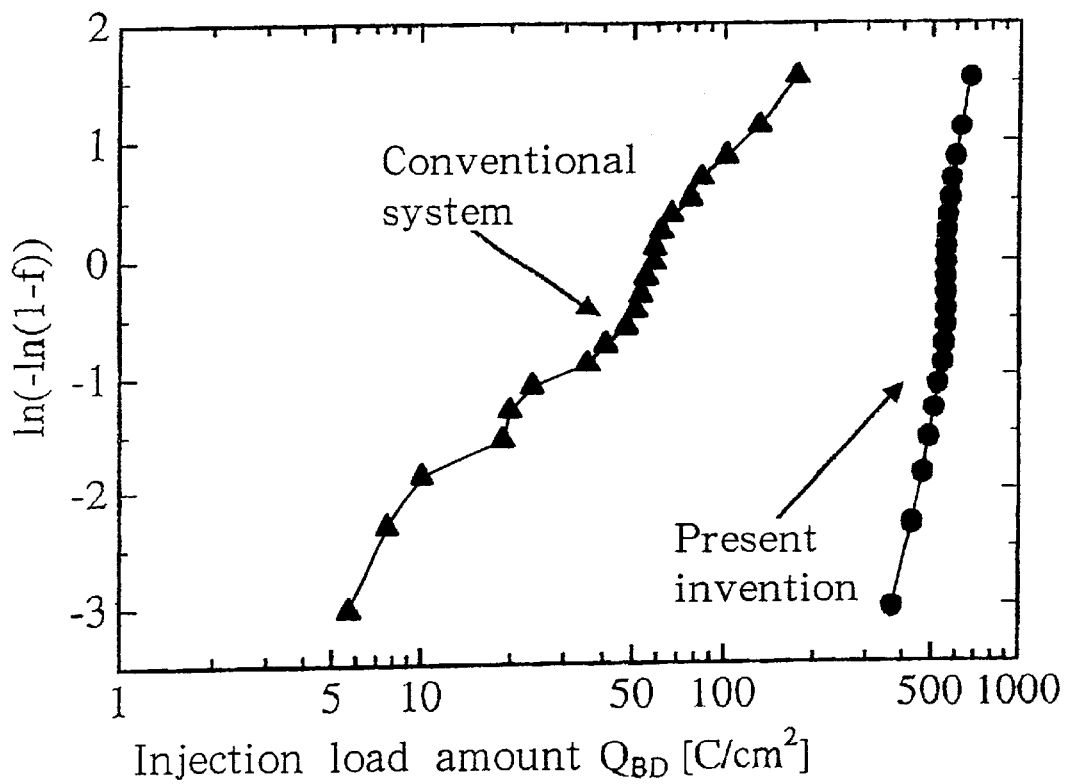
FIG. 65 is a graph showing results of measuring dielectric breakdown injection charge amount.
Figure 66:
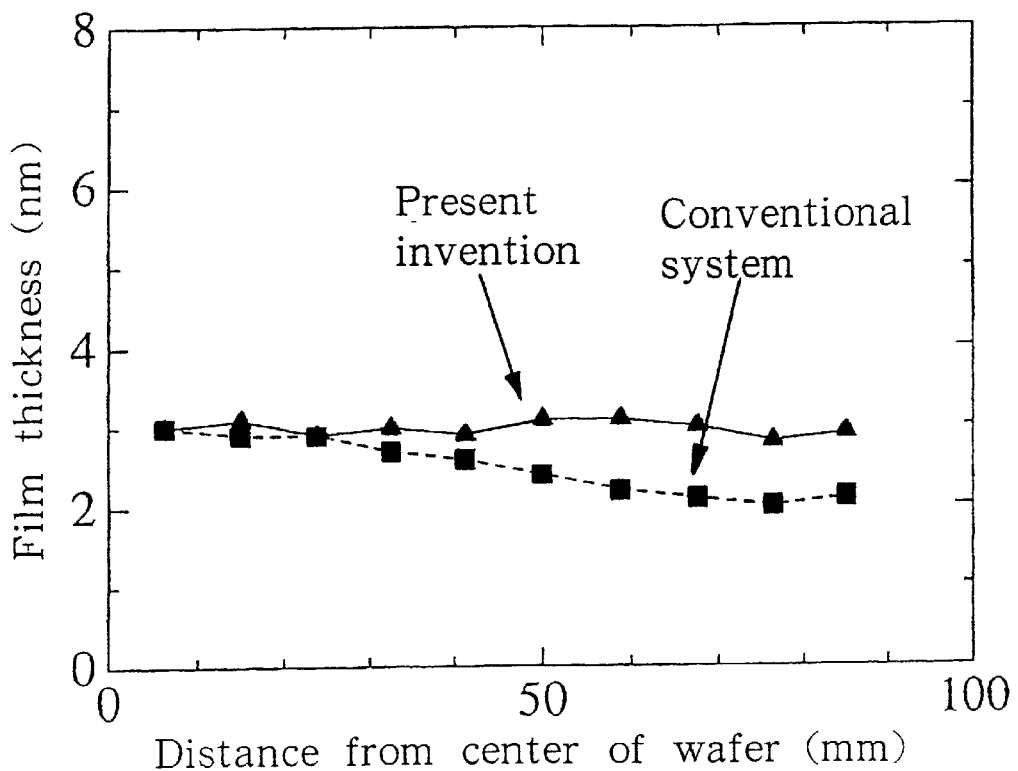
FIG. 66 is a graph showing distribution of film thickness inside the surface of a wafer of direct nitride film.

FIG. 65 is a graph showing the results of measuring the dielectric breakdown injection charge amount.

In FIG. 65, the horizontal axis represents injection charge amount, and the vertical axis represents the frequency of occurrence of elements obtaining each injection charge amount. The number of elements measured was 20 in each of the related art method and the present invention. From FIG. 65 the following point becomes clear.

In the elements manufactured using the device of the related art, distribution of injection charge amount was wide (namely film quality was bad), and average charge injection amount was 59.3 C/$cm^2$.

In the elements manufactured using the device of the present invention, the distribution of injection charge amount was narrow (namely film quality was good) and it was possible to obtain a high average load injection amount of 572 C/$cm^2$, so it will be understood that film quality of the gate oxidation film was improved.

Figure 67:
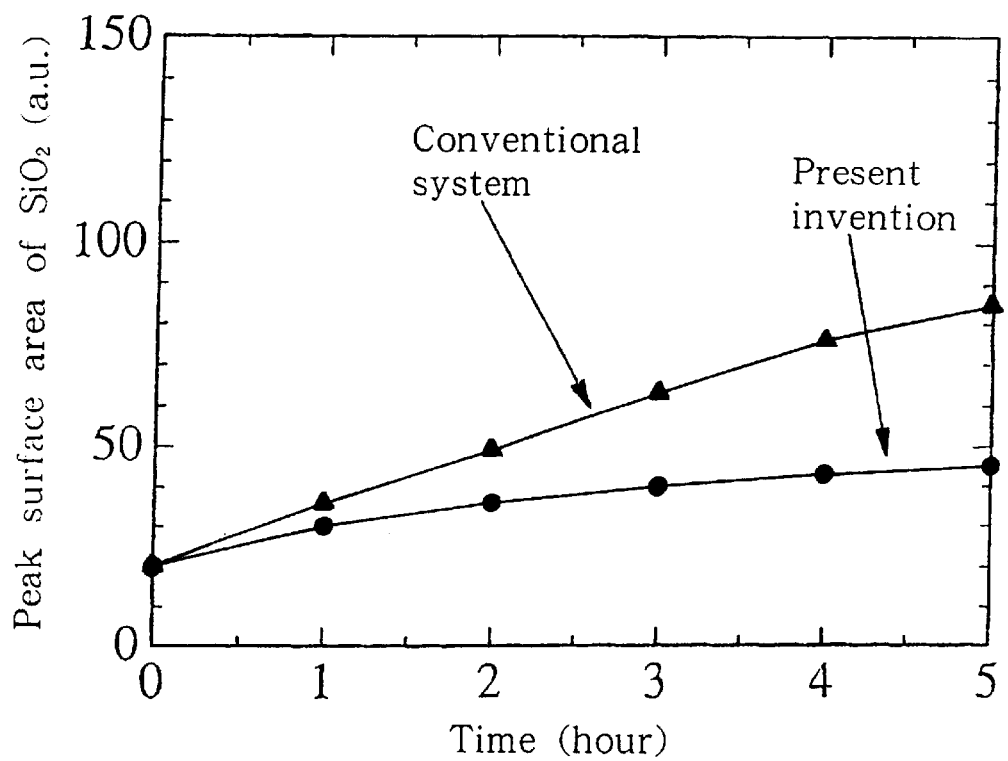
FIG. 67 is a graph showing results of a system for measuring barrier properties of a direct nitride film.

FIG. 67 is a graph showing results of measuring the barrier function of the direct oxidation film. Si wafers that have been subjected to direct oxidation using a device provided with the exhaust system of the related art and a device provided with the exhaust system of the present invention were bleached for five hours in a 100% $O_2$ atmosphere at 600° C., and then measured using an X-ray photoelectron spectroscope. In FIG. 67, the horizontal axis represents the time for which the Si wafer subjected to direct oxidation was bleached in the $O_2$ atmosphere, and the vertical axis represents the peak surface area of $SiO_2$ that has been chemically shifted by oxidation of the surface. From the drawing, the following point becomes clear.

With the surface of the Si wafer subjected to direct oxidation using the device of the related art, the peak surface area increases with time, and it is oxidized in the $O_2$ atmosphere with passage of time. From this it will be understood the direct oxidation film formed using the device of the related art has a low barrier function against oxygen.

With the surface of the Si wafer subjected to direct oxidation using the device of the present invention, there is no increase in peak surface area with time, and it is not oxidized in the $O_2$ atmosphere with passage of time. From this it will be understood the direct oxidation film formed using the device of the present invention has a high barrier function against oxygen.

Figure 68:
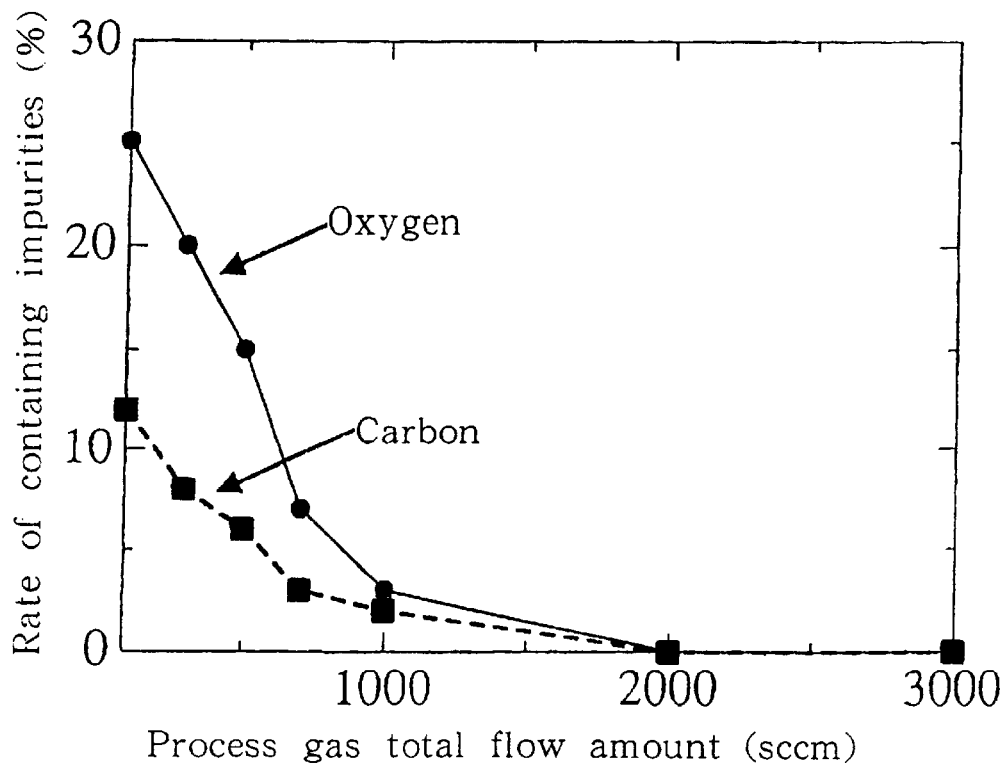
FIG. 68 is a graph showing a relationship between amounts of oxygen and carbon, and total flow amount of process gas.

FIG. 68 shows the relationship between amount of oxygen and carbon included within the direct oxidation film formed from the film formation atmosphere, and total flow amount of process gas. From the drawing the following point becomes clear.

As the total flow amount of process gas increases, the amount of oxygen and carbon included within the formed direct oxidation film decreases, and it becomes possible to form a direct oxidation film having low oxygen and carbon contamination. This means that the device of the present invention enables film formation while there is a large flow amount of gas, and so is suitable for the formation of direct oxidation films having low oxygen and carbon contamination.

Accordingly, by carrying out direct oxidation using the plasma processing device of the present invention, it is possible to suppress the concentration of impurities within a film, and to form an oxidation film having high film quality uniformity and high injection load amount, with uniform distribution of film thickness, and a high barrier properties, and so it was confirmed that it was possible to stably manufacture elements having excellent characteristics.

Also, in this embodiment, the device of the present invention has been applied to a plasma oxidation device for oxidizing the Si surface of a substrate at low temperature, but it is not limited to an Si surface and it was confirmed that it was possible to obtain metallic oxidation films with high uniformity if applied to oxidation of a metallic surface such as Ta, W, Al, Ti, etc.

(Embodiment 38)

This embodiment shows a case where the device of the present invention is applied to a plasma CVD device for forming a diamond film on a substrate, in a plasma device using a radial line slot antenna capable of uniformly supplying a large gas flow amount.

The structure of this device is the same as that of embodiment 3, and so will be omitted.

A diamond thin film has excellent mechanical, electrical thermochemical and optical characteristics, and is mostly noted for the fact that its semiconductor characteristics can be controlled by adding appropriate impurities.

In this embodiment, the case will be described where a thin diamond film is formed for the intention of application to a mask, for use in X-ray lithography anticipated as the next generation manufacturing technology for ULSI silicon.

Figure 69:
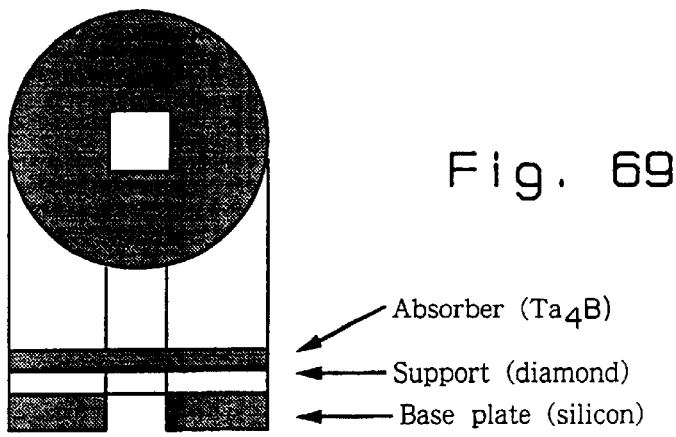
FIG. 69 is a drawing showing an example of a mask structure for X ray lithography.

FIG. 69 shows a structural example of a mask for use with an X-ray diffractometer. A circuit pattern for transcribing is formed in an absorber of a central square section of the drawing. A parallel beam X-ray is incident from a substrate side, and X rays pass through a part of the central square section where there is no absorber and are projected onto to a Si wafer to be subject to pattern formation, not shown in the drawings, located on the absorber side. The diamond thin film utilized as a support layer for the absorber must be transparent, have a smooth surface and have uniform characteristics at the inner surface.

In this embodiment, formation of a diamond thin film on a Si wafer has been illustrated. In the following, the method will be described.

An Si substrate from which surface contaminants (particles, organic matter, metal) and a natural oxidation film have been removed is introduced into a chamber. After loading, the diamond thin film is formed to a thickness of 1–2 μm using the aforementioned device. First of all, the surface of the Si substrate is subjected to carbonization processing in an $Ar/H_2/CH_4$ or $Ar/H_2/CO_2$ atmosphere, and then the Si substrate is negatively biased and a diamond crystal kernel is generated on the Si substrate. After this processing, a diamond thin film is formed to a thickness of 1–2 μm in a $Ar/H_2/CH_4/O_2$ or $Ar/H_2/CO_2/O_2$ atmosphere. It is possible to replace Ar with Xe. The chamber pressure at the time of processing is 3–500 mTorr, process gas flow amount can be made up to 3SLM, and the Si wafer is temperature controlled to 300–700° C. With the device of the present invention, it is possible to generate high density and uniform plasma over a large surface area, and by providing a shower plate the supply of source material gas is made uniform and it is possible to uniformly form a film on a large diameter substrate. Also, by narrowing the processing space and uniformly and rapidly expelling a large flow amount of process gas it is possible to rapidly remove reaction by-products, which means that reaction by-products such as non diamond components that have been uniformly etched by atomic hydrogen are rapidly expelled and a high quality diamond film can be generated.

Results of evaluating the diamond thin film formed to a thickness of 2 μm in the Si wafer are shown in Table 2.

TABLE 2

Results of Diamond Film Evaluation

| | |
|---|---|
| film thickness, inside 4 inch wafer (total ellipsometric film thickness) | 2.00 ± 0.01 μm |
| Surface roughness | 5 nm |
| permeability (measurement after removal of Si substrate) | 90% at 633 nm |

Figure 70:
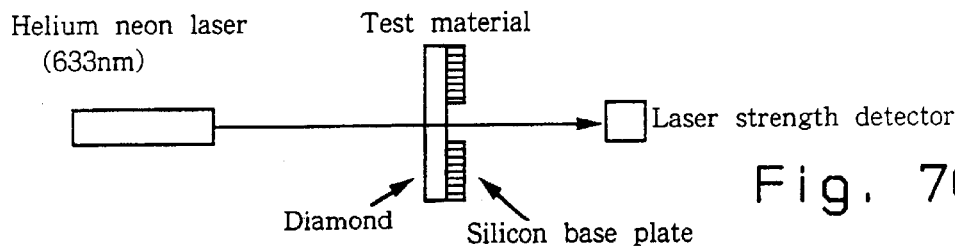
FIG. 70 is a schematic diagram showing a diamond thin film permeability measurement system.

Permeability was measured after the central section of the rear surface (the opposite side to the surface on which the thin film was formed) of the Si wafer was removed to expose the diamond thin film. The measurement system is shown in FIG. 70.

Figure 71:
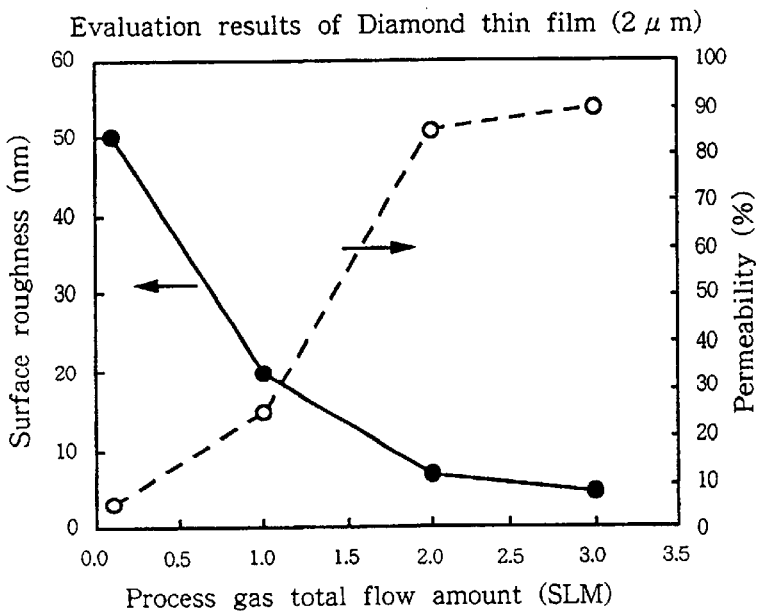
FIG. 71 is a graph showing the results of evaluating a diamond thin film.

FIG. 71 shows variation of surface roughness and permeability when the total flow amount of process gas was changed. In the related art, machine polishing was carried out after film formation. By using the plasma device of the present invention, reaction by-products such as non diamond components that have been uniformly etched by atomic hydrogen are rapidly expelled and a high quality diamond film can be generated.

(Embodiment 39)

This embodiment shows a case where the present invention is applied to a magnetron sputtering device.

A structural drawing of this embodiment is the same as that for embodiment 31 and so will be omitted. As described in embodiment 5, amorphous $Ta_4B$ can be applied as a absorber material of a mask for X-ray lithography. As described in embodiment 5, after a flat thin diamond film has been formed, a film of $Ta_4B$ is continuously formed using a cluster tool, without coming into contact with the atmosphere in a clean room at all.

A characteristic of the cluster tool is that by connecting between each process chamber using an Ar or $N_2$ tunnel, thin film formation can be carried out continuously under an extremely pure atmosphere without exposing the semiconductor, metal, or insulator on the wafer to the atmosphere at all. Also, each process chamber achieves an ultra high vacuum state of the ultimate vacuum of $10^{-10}$ Torr, but at the time of conveying the wafer, a number of mTorr to several tens of Torr is maintained using very pure Ar or $N_2$, and contamination of the wafer surface by organic matter or moisture etc. is prevented. Further, conveyance between each cluster is carried out using a port encapsulated with $N_2$ or dry air, and wafer cleansing and lithographic processing is also carried out in an $N_2$ or dry air atmosphere, so that it is possible to carry out processing that completely excludes all sorts of impurity elements from the atmosphere.

In this embodiment, formation of an amorphous $Ta_4B$ film on the Si wafer and on the diamond thin film on the Si wafer is carried out. The method of carrying out this film formation will be described below.

$Ta_4B$ is formed to a thickness of 0.5–1 μm either by film formation on a Si wafer from which surface contaminants (particles, organic matter, metal) have been removed, or by continuous formation of a diamond film. The structure of this embodiment is the same as FIG. 44 and will be omitted.

A compound of titanium and boron having a ratio of number of atoms of 4:1 is used as the sputtering target. Sputtering is carried out in an Ar or Xe atmosphere. The chamber pressure at this time is 3–500 mTorr. A process gas flow amount up to 3SLM is possible.

The results of evaluating the $Ta_4B$ film formed on the Si wafer and on the 2 μm diamond thin film on the Si wafer to a thickness of 1 μm are shown in Table 3. From these results the following becomes clear.

(1) Using the plasma device of the present invention, film formation with high in-plane uniformity can also be obtained for a large diameter substrate.

TABLE 3

Evaluation results for amorphous $Ta_4B$

| | On Si substrate | On diamond thin film |
|---|---|---|
| Film thickness, inside 4 inch substrate (Total stepped film thickness | 000 μm ± 0.008 μm | 000 μm ± 0.021 μm |
| Surface roughness (atomic force microscope) | 1 nm | 6 nm |

(Embodiment 40)

This embodiment shows a case where the present device is applied to a plasma CVD device for forming a polycrystalline silicon thin film on the substrate in a plasma device using a radial line slot antenna capable of uniformly supplying a large flow amount of gas.

The structure of this device is the same as embodiment 3, and will be omitted.

Description will be given for the case where a thin film is formed on a glass substrate. The foundation substrate is not limited to a glass substrate and the material can also be amorphous such as $SiN_x$, or $SiO_2$. As uses for the polycrystalline silicon thin film, it is possible to utilize it as an active layer of a transistor, or a gate electrode etc. $SiH_4$, Xe was used as the source material gas, but is not limited to this combination. It is also possible to replace $SiH_4$ with $Si_2H_4$, and to replace Xe with Ar or $H_2$ etc.

Evaluation was carried out with the gas flow amount ratio for Xe and $SiH_4$ set to 100:1.

Microwave power was 1600 W, and total gas flow amount of the gas introduced into the process chamber was changed from 300 sccm to 3000 sccm. The polycrystalline silicon was formed on a 300 mm glass substrate, and the surface plasma, uniformity and polycrystalline silicon crystallite size were measured. The substrate temperature was set to 300° C. This is just one example of the processing conditions for illustrating the effects of the present invention, but these conditions are not limiting.

Figure 72:
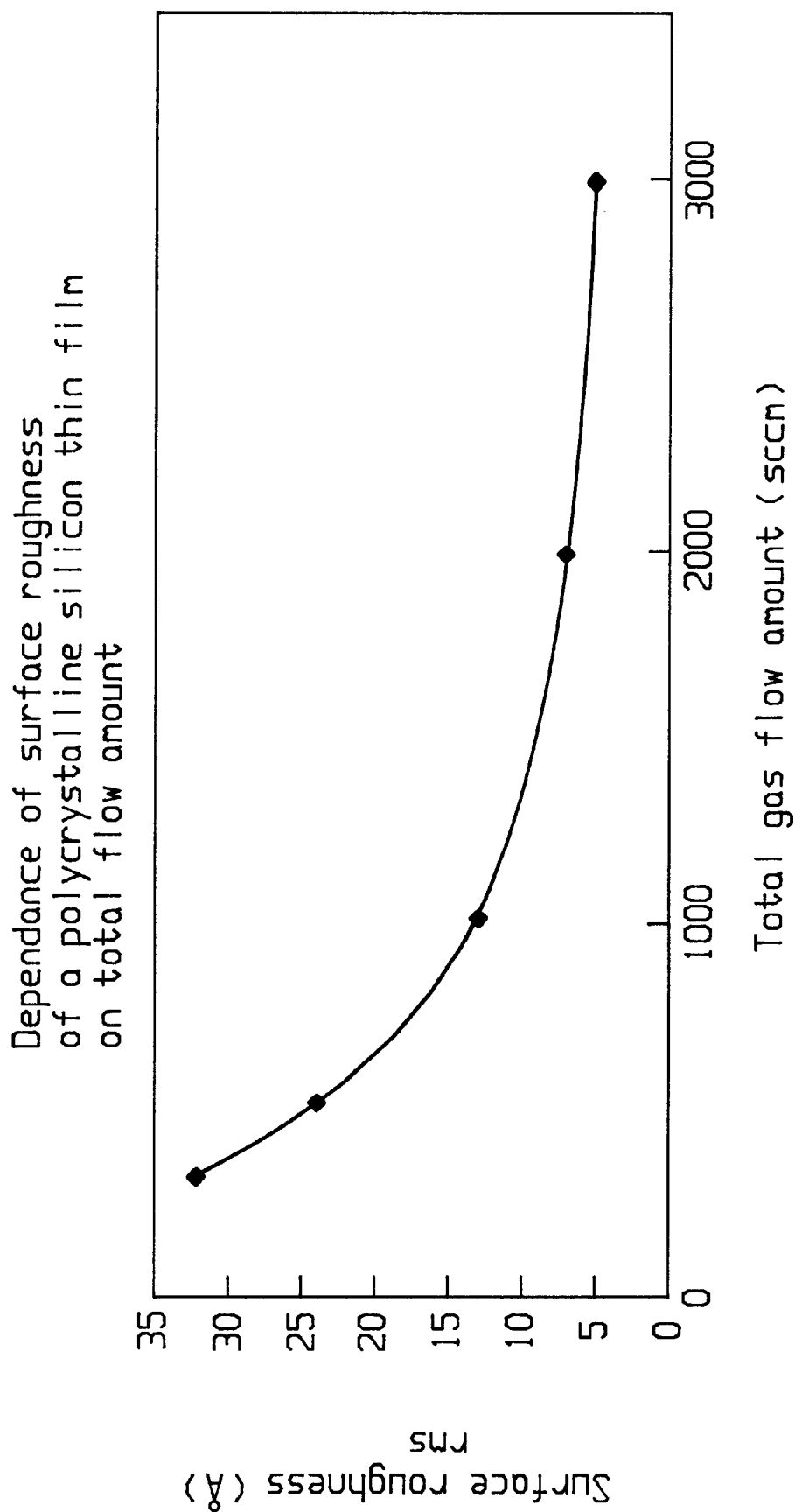
FIG. 72 is a graph showing dependence of surface roughness of a polycrystalline silicon thin film on total flow amount.

FIG. 72 shows the dependency of surface roughness of the film formed polycrystalline silicon thin film on total gas flow amount. Measurement was carried out using an atomic force microscope (AFM). It can be seen that if the total gas flow amount is increased, surface roughness is lowered.

Figure 73:
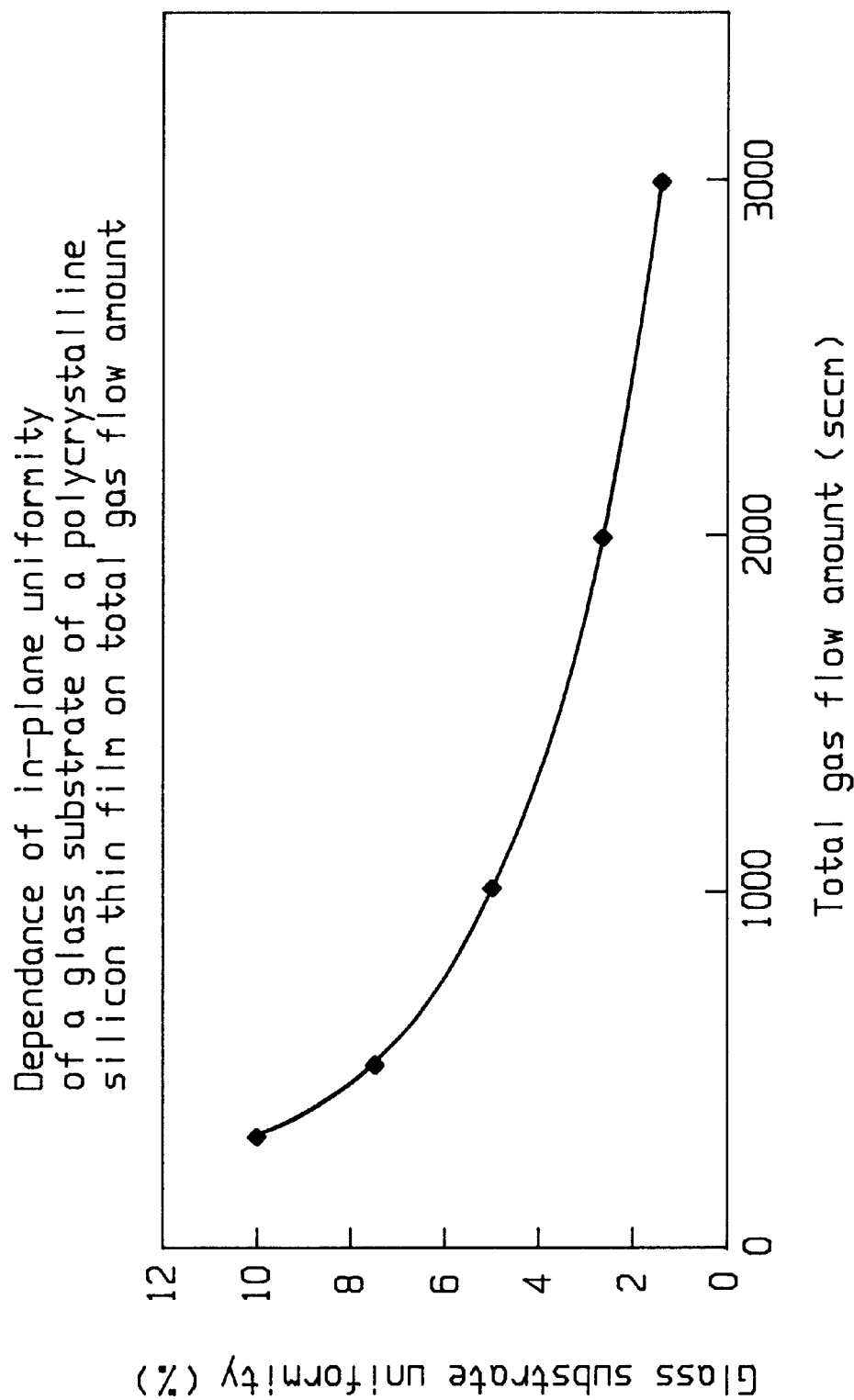
FIG. 73 is a graph showing dependence of uniformity of a glass substrate surface of a polycrystalline silicon thin film on total gas flow amount.

FIG. 73 shows the dependency of in-plane uniformity on the glass substrate of the film formed polycrystalline silicon thin film on total gas flow amount. It will be understood that the in-plane uniformity is also improved as total gas flow is increased.

Figure 74:
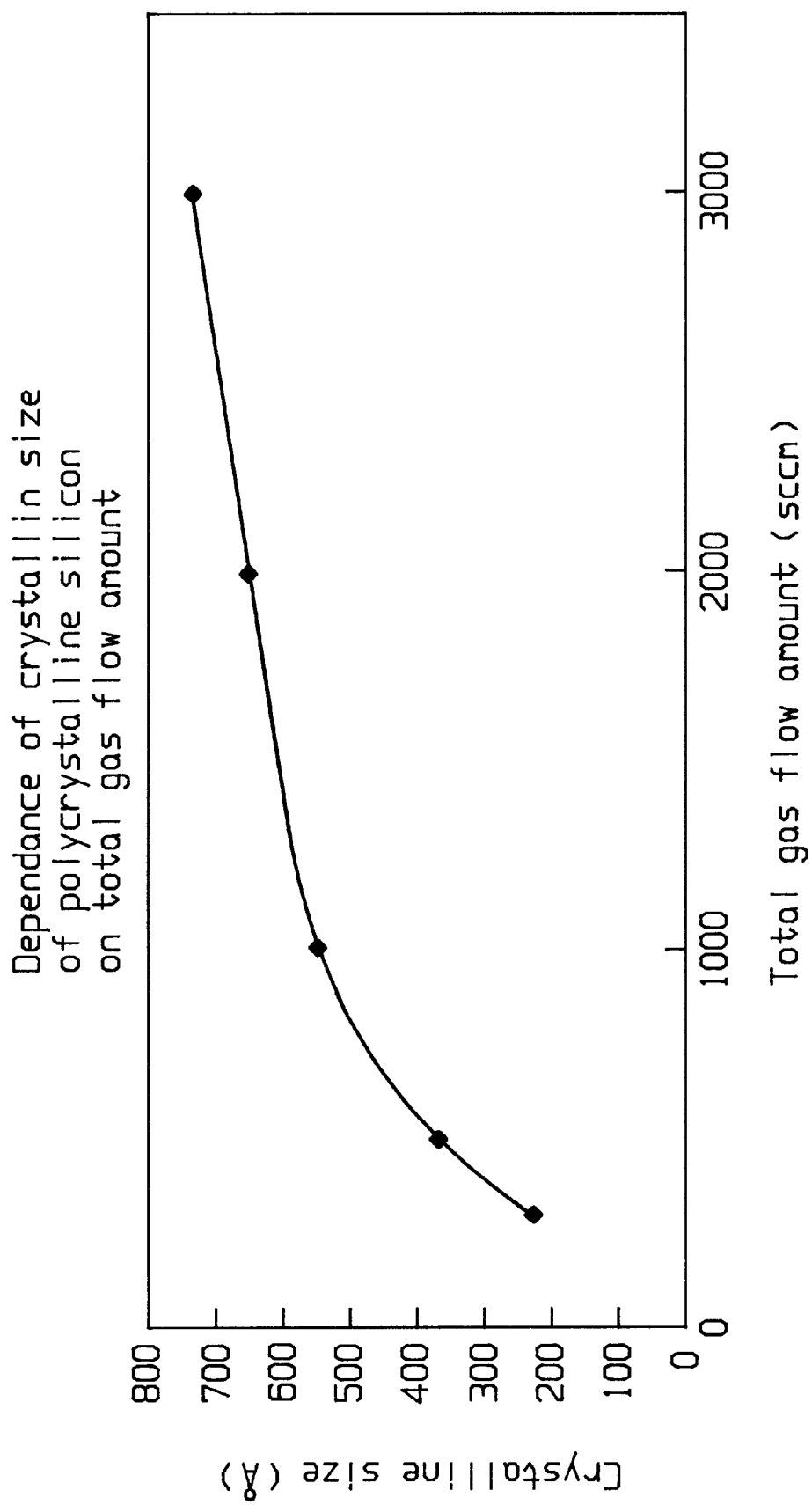
FIG. 74 is a graph showing dependence of crystallite size of polycrystalline silicon on total gas flow amount.

FIG. 74 shows the dependency of crystallite size of the film formed polycrystalline silicon film on total gas flow amount The crystallite size was calculated based on the scheller method using a Si peak width at half height obtained by an X-ray thin film method. It will be understood that crystallite size increases accompanying increase in total gas flow amount.

Figure 75:
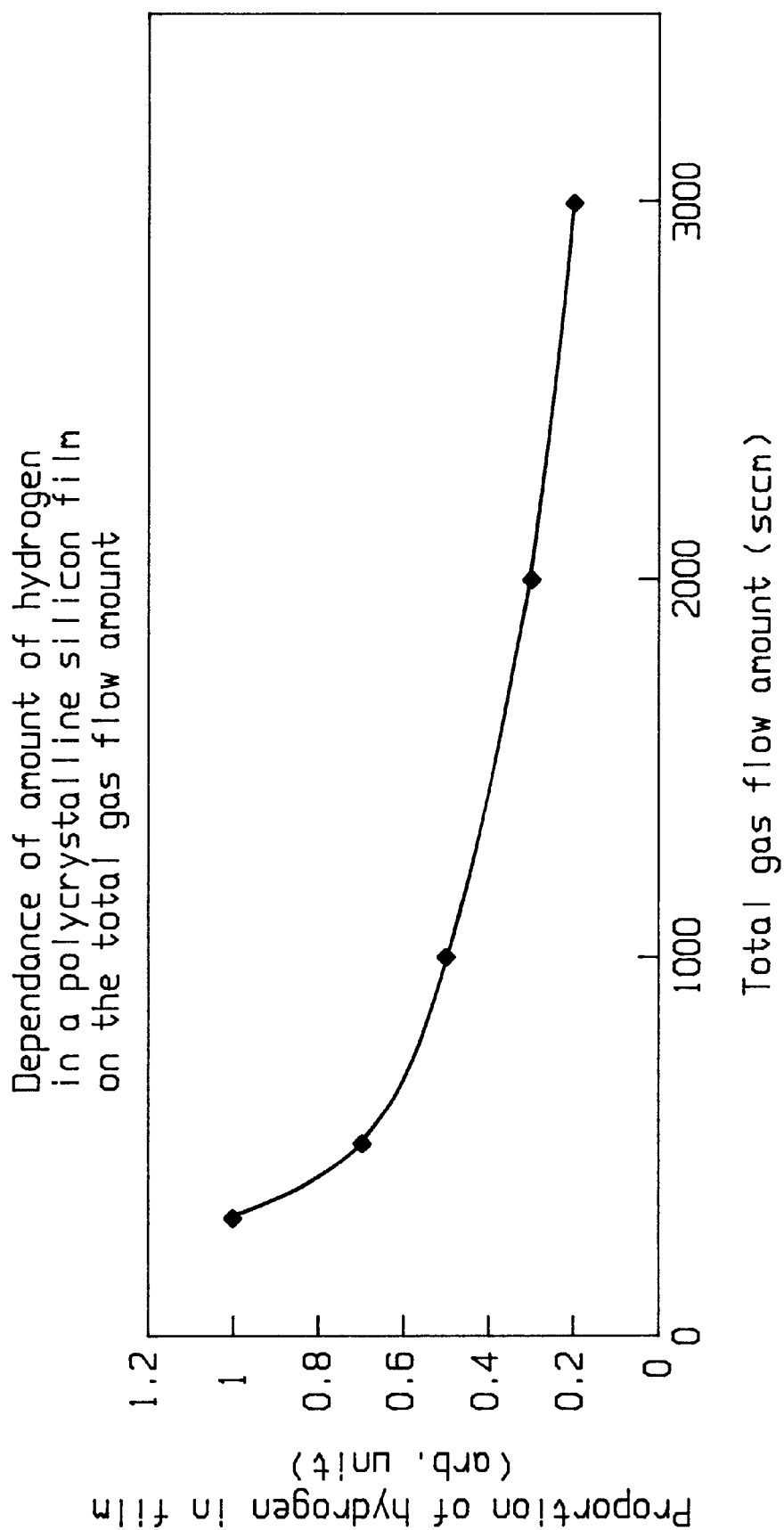
FIG. 75 is a graph showing dependence of the amount of hydrogen in a polycrystalline silicon film on total gas flow amount.

FIG. 75 shows dependency of in-film hydrogen amount of the film formed polycrystalline silicon thin film on total gas flow amount. Measurement of the in-film hydrogen amount was carried out using FT-IR, and is represented by relative values. It will be understood that accompanying increase in total gas flow amount removal of reaction by-products was promoted and in-film hydrogen amount was decreased.

Figure 76:
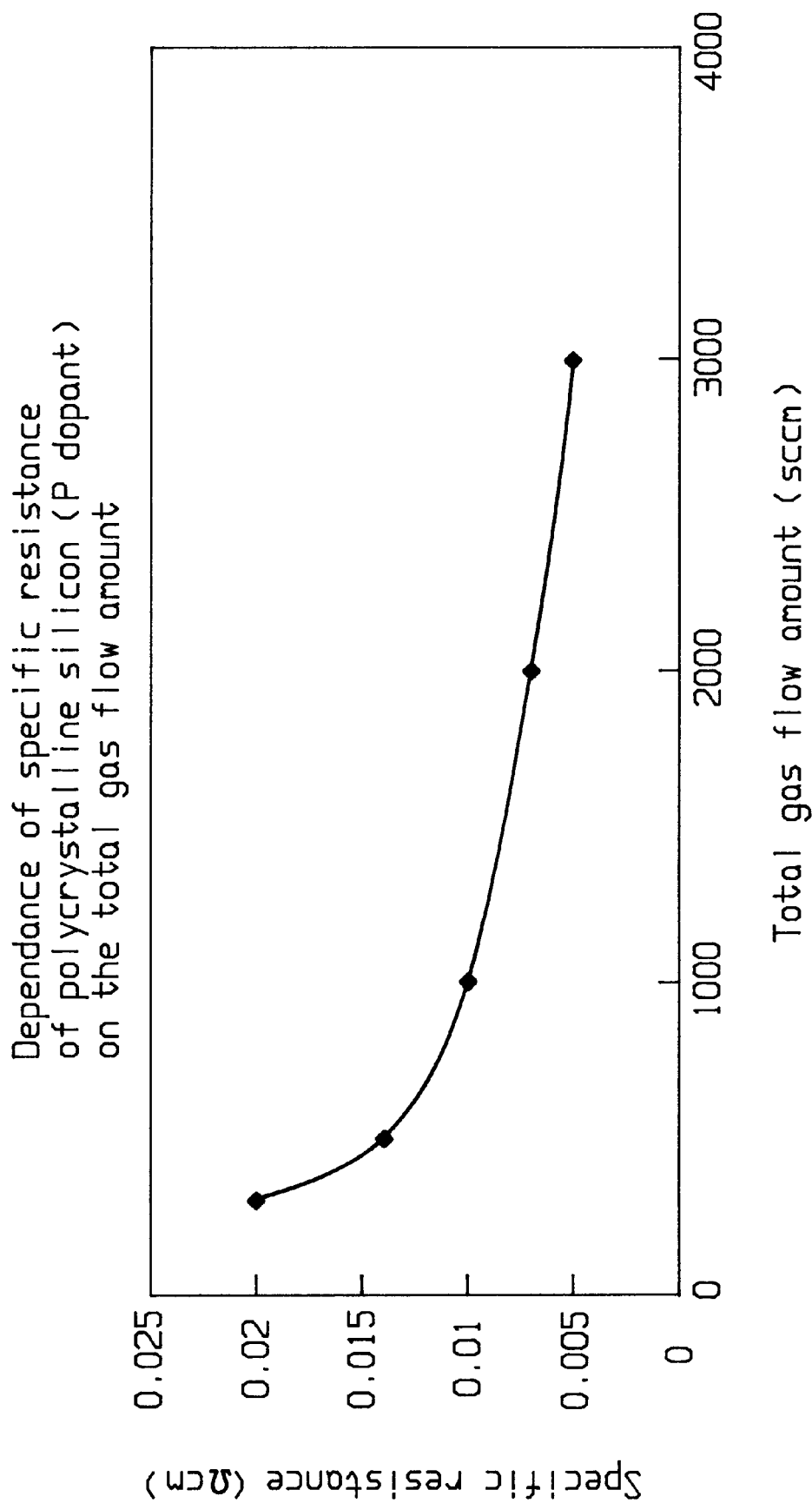
FIG. 76 is a graph showing dependence of the specific resistance of polycrystalline silicon (P dopant) on total gas flow amount.

FIG. 76 shows the dependency of specific resistance of a film on total gas flow amount, in the case of P dopant with $PH_3$ added to a process gas of Xe and $SiH_4$. Evaluation was carried out with the flow amount ratio of $Xe:SiH_4:PH_3$ fixed to 100,000:1000:1, but it is not limited to these values. It will be understood that accompanying increase in total gas flow amount the specific resistance of the film becomes smaller, and the activation rate of the dopant is increased. The above effects were also conformed in the case of dopant using addition of hydrides such as $AsH_3$ and $B_2H_6$ instead of $PH_3$.

As has been described above, using the present invention, by being able to uniformly expel a large flow amount, removal of reaction by-products is promoted and in-plane uniformity is improved, surface roughness is reduced, and it is possible to form a high quality polycrystalline silicon thin film having large crystallite size.

(Embodiment 41)

This embodiment shows a case where the present device is applied to a plasma CVD device for forming a $Si_3N_4$ thin film on the substrate in a plasma device using a radial line slot antenna capable of uniformly supplying a large flow amount of gas.

The structure of this device is the same as embodiment 32, and will be omitted.

The $Si_3N_4$ film can be used as a gate insulation film for a TFT etc, a LOCOS mask or as a passivation film, or the like. $SiH_4$, Xe and $N_2$ are used as the source material gas, but this combination is not limiting. It is possible to replace $Si_2H_4$ with $SiH_6$, to replace Xe with Ar and to replace $N_2$ with $NH_3$. The ratio of $SiH_4:Xe:N_2$ is set to 1:100:5. Microwave power was 1600 W, while pressure inside the process chamber was 300 mTorr, a total gas flow amount was changed from 300 sccm to 3000 sccm. A $SiN_x$ thin film was formed on a 300 mm glass substrate, and the uniformity and withstand voltage of the film were measured. Substrate temperature was set to 300° C.

This is just one example of the processing conditions for illustrating the effects of the present invention, but these conditions are not limiting.

Figure 77:
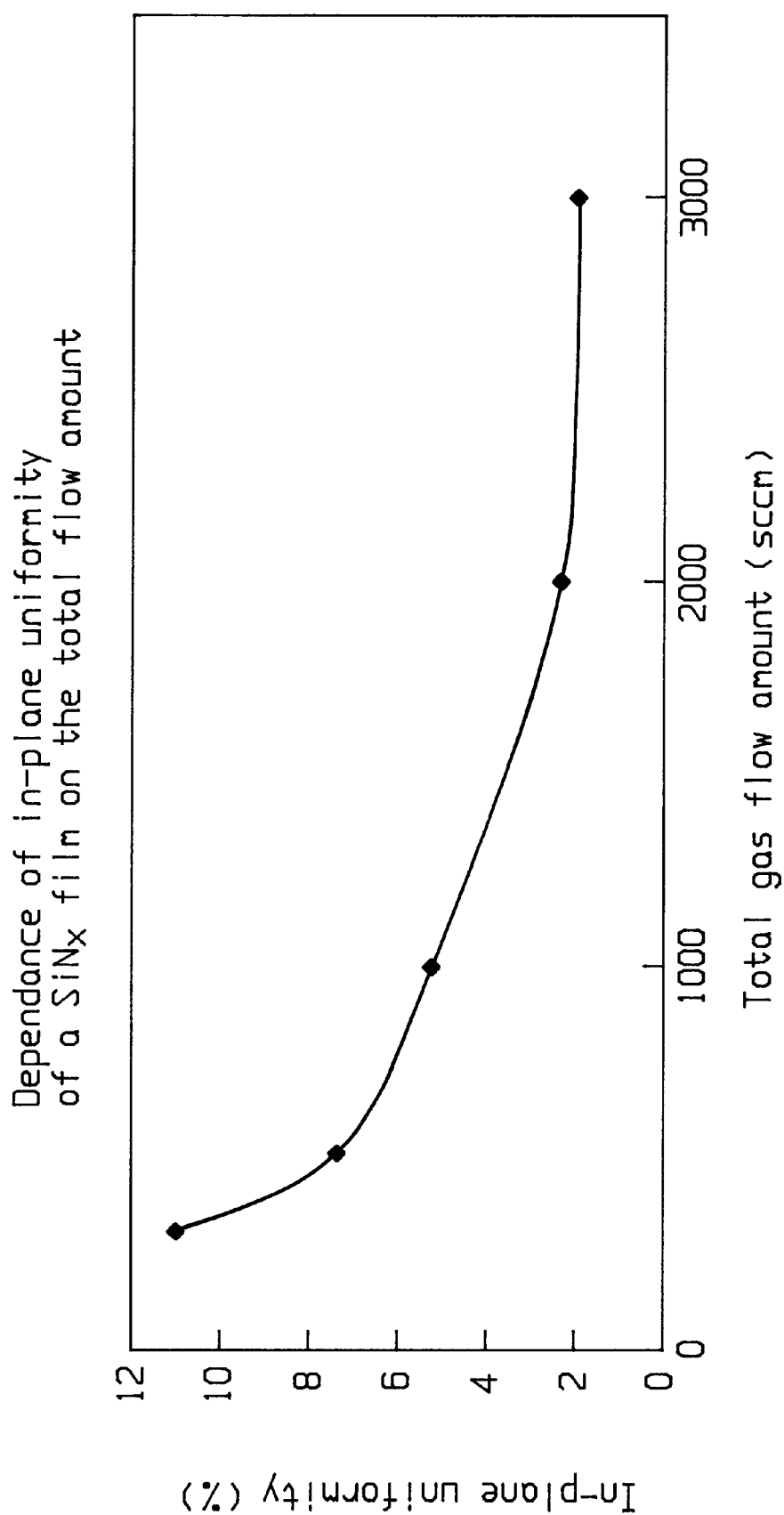
FIG. 77 is a graph showing dependence of the in-plane uniformity of a SiNx film on total gas flow amount.

FIG. 77 shows the dependency of in-plane uniformity on the glass substrate of the film formed $Si_3N_4$ thin film on total gas flow amount. It will be understood that accompanying increase in total gas flow amount, the in-plane uniformity is also improved.

Figure 78:
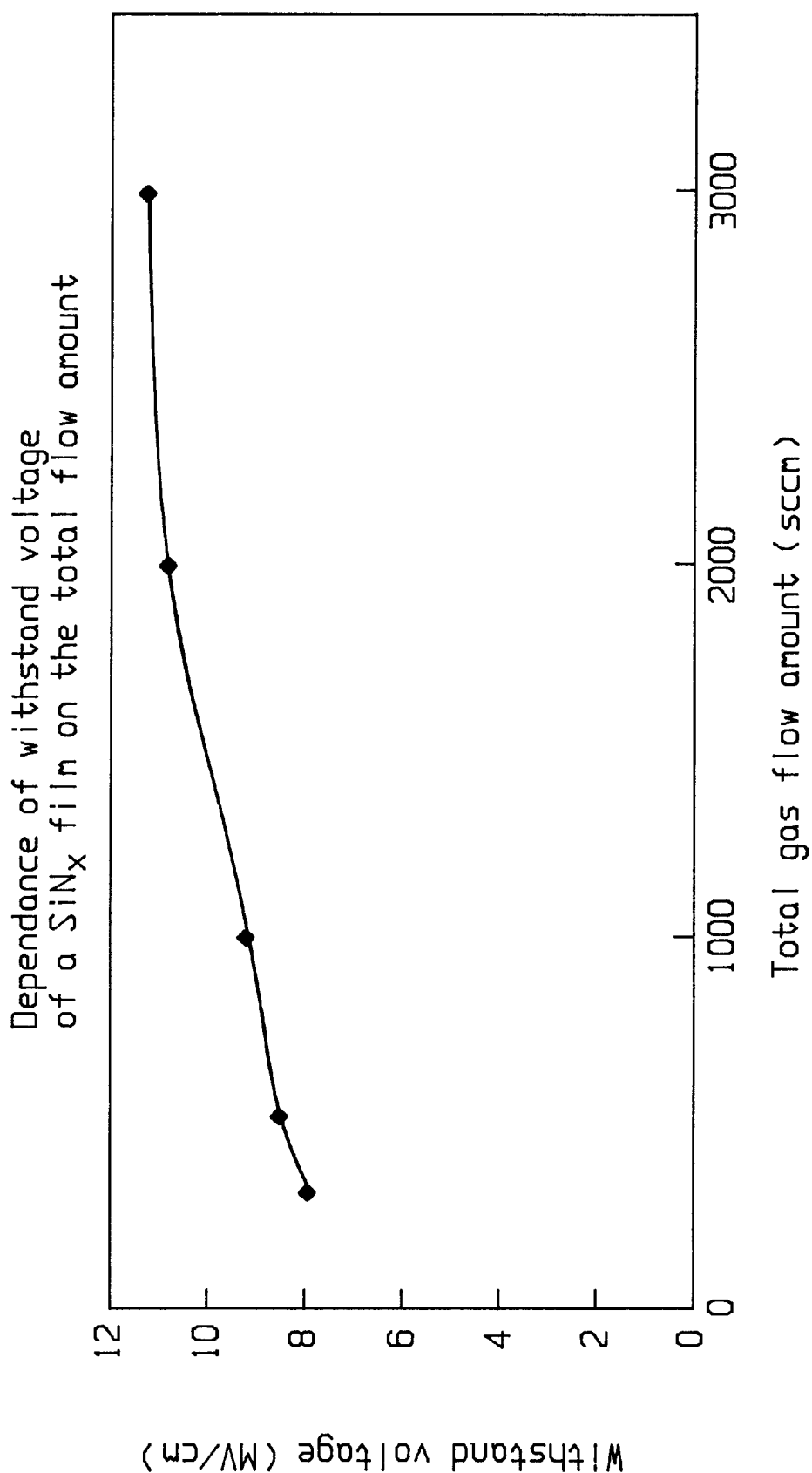
FIG. 78 is a graph showing dependence of the withstand voltage of a SiNx film on total gas flow amount.

FIG. 78 shows dependence of withstand voltage of the film formed $Si_3N_4$ film on the total gas flow amount. Withstand voltage was measured by making a dedicated TEG. It will be understood that withstand voltage increases accompanying increase in total gas flow amount.

Figure 79:
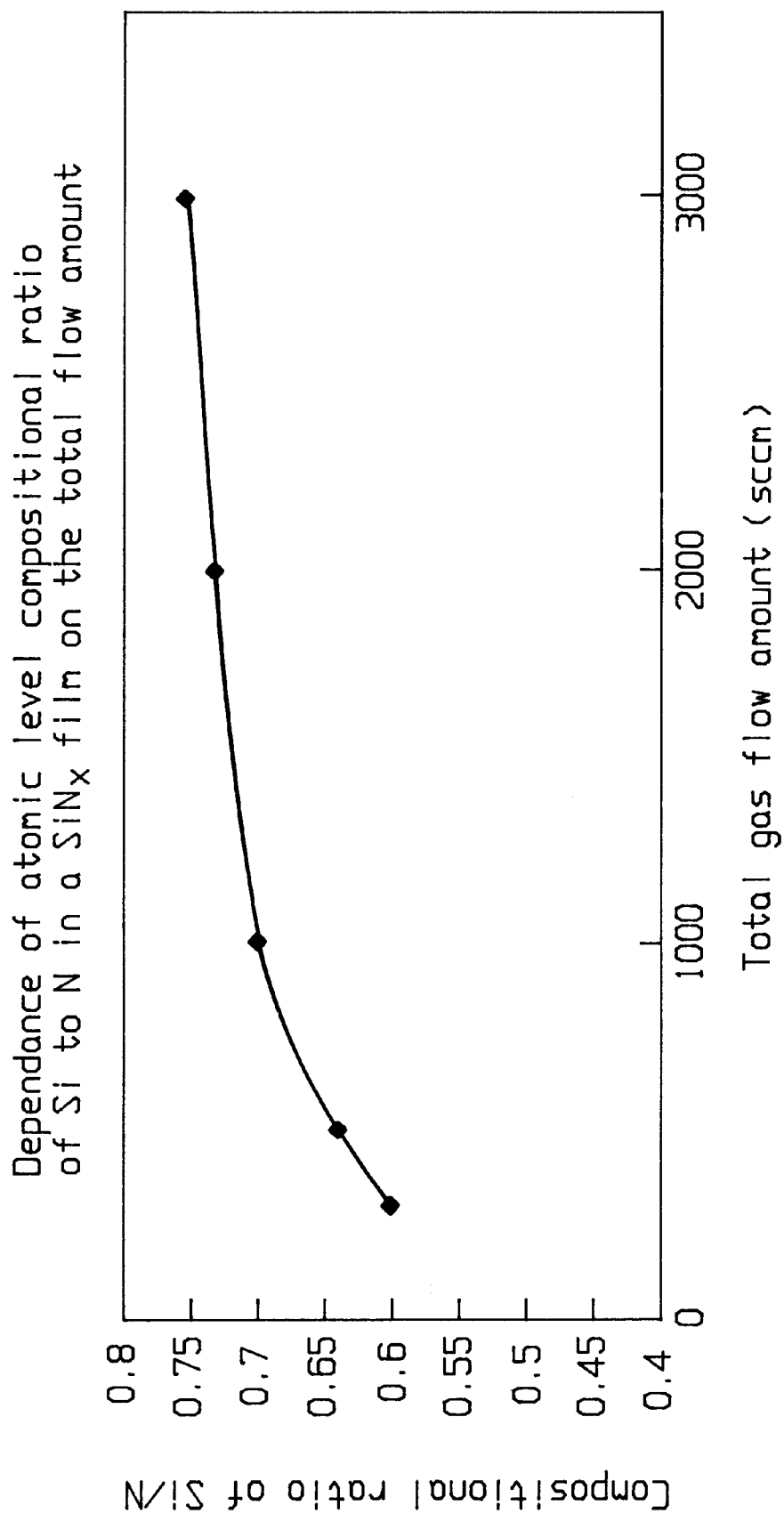
FIG. 79 is a graph showing dependence of the atomic level compositional ratio of Si to N in a SiNx film on total gas flow amount.

FIG. 79 shows dependence of atomic level compositional ratio of Si to N in the film formed $Si_3N_4$ film on the total gas flow amount. Measurement was carried out using X-ray photoelectron spectroscopy. It will be understood that accompanying increase in total gas flow amount, removal of reaction by-products was promoted and the atomic level composition of the $Si_3N_4$ approached an ideal compositional ratio for Si and N of 3:4.

As has been described above, using the present invention, by being able to uniformly expel a large flow amount, removal of reaction by-products is promoted and in-plane uniformity is improved, and it is possible to form a high quality $SiN_x$ thin film having high withstand voltage.

(Embodiment 42)

This embodiment shows a case where the present device is applied to a plasma CVD device for forming a dielectric thin film having low fluorocarbon type gas on the substrate in a plasma device using a radial line slot antenna capable of uniformly supplying a large flow amount of gas.

The structure of this device is the same as embodiment 32, and will be omitted.

Description will be given for the case where a dielectric thin film having low fluorocarbon type gas is formed as an interlayer insulation film between wiring layer of a semiconductor element.

A wafer on which first layer AlCu wiring is to be patterned is introduced into a cluster tool. In this process, all processing up to formation of a second layer AlCu film is carried out by a cluster tool. This cluster tool is the same as embodiment 6 and will be omitted.

After loading, surface processing of the first layer wiring surface is carried out using a mixed gas of Ne/F2. Ne/F2 is introduced into this microwave device, plasma is generated inside the chamber, the wafer surface is bleached with plasma for about 5 minutes and fluoriding processing is carried out. A dielectric thin film having low fluorocarbon type gas is then formed on the wafer in the same chamber without a break in the processing. $C_4F_8$, $H_2$, and Ar were used as the source material gas, but this combination is not limiting. It is possible to replace $C_4F_8$ with $CF_4$, to replace $H_2$ with $O_2$, and to replace Xe with Ar. The gas flow amount ration for $C_4F_8$, $H_2$, and Ar was set to 1:1:5. The microwave power was set to 1600 W, the pressure inside the process chamber was set to 10–200 mTorr, and the total gas flow amount was changed from 500 sccm to 3000 sccm. Film formation was carried out on the wafer and the deposition rate and uniformity (of the deposition rate) were measured. The wafer temperature was controlled to 250 degrees.

It goes without saying that the film formation conditions are not limited to those described above.

Figure 80:
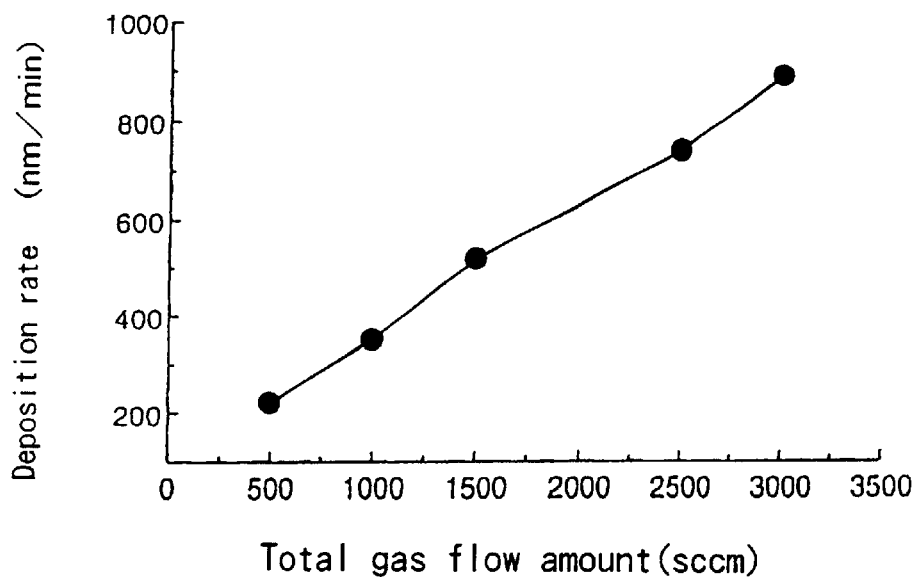
FIG. 80 is a graph showing dependence of the deposition rate of a fluorocarbon film on total gas flow amount.

FIG. 80 shows the dependency of the deposition rate of the film formed fluorocarbon film on total gas flow amount. It will be understood that if the total gas flow amount is caused to increase, the removal of reaction by-products is promoted, and deposition rate is increased, reaching 800 nm/min or more.

Figure 81:
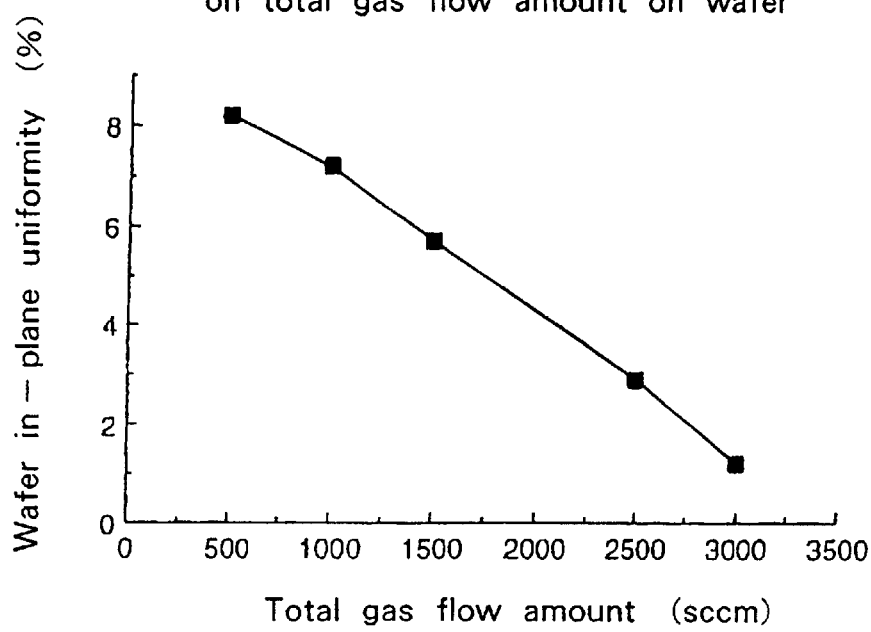
FIG. 81 is a graph showing dependence of the deposition rate of a fluorocarbon film on total gas flow amount.

Also, FIG. 81 shows the dependency of in-plane uniformity of the deposition rate on the total gas flow rate. It will be understood that by sufficiently increasing the process gas flow amount improvement can be seen in the wafer in-plane uniformity.

As has been described above, by using the plasma device of the present invention, high speed and uniform film formation is possible on a large surface area. Also, if film formation for two wiring layers is carried continuously in the cluster tool without a break in the process, it is possible to manufacture a semiconductor having multiple layer wiring.

(Embodiment 43)

This embodiment shows a case where the present device is applied to a plasma CVD device for forming a BST thin film [(Ba, Sr) TiO$_3$ thin film] on the substrate in a plasma device using a radial line slot antenna capable of uniformly supplying a large flow amount of gas.

The structure of this device is the same as embodiment 32, and will be omitted. This process uses a BST film as an insulating film of a capacitor within a semiconductor element, and within processes from formation of a lower electrode of the capacitor up to formation of an upper electrode, it carries out all processes except for lithography processing and wafer cleansing process inside a cluster tool. The features of this cluster tool are the same as embodiment 6 and will be omitted. First of all, the substrate is loaded into the cluster tool and a poly-Si lower electrode is formed. An Ru/RuO$_x$ film is also formed. A BST film is formed without a break in the process.

In this example, Ba(DPM)$_2$, Sr(DPM)$_2$, Ti(I-OC$_3$H$_7$)$_4$ O$_2$ and Ar are used as the source material gas, but this combination is not limiting and it possible to replace Ar with Xe. Process gas comprising Ba(DPM)$_2$, Sr(DPM)$_2$, Ti(I-OC$_3$H$_7$)$_4$ is introduced into the device from the gas inlet with Ar as a carrier gas. Also, Ar and O$_2$ are introduced into the process chamber at a ratio of 1:2, as additional gas. Microwave power was set to 1600 W and pressure inside the process chamber was set to 10–200 mTorr, and additional gas flow amount was changed from 500 sccm to 3000 sccm. At this time, only the flow amount of the additional gas was caused to change, and processing was carried out without changing the supply condition for the Ba(DPM)$_2$, Sr(DPM)$_2$, Ti(I-OC$_3$H$_7$)$_4$. Film formation was carried out on a 300 mm wafer, and deposition rate and uniformity of the deposition rate were measured. It goes without saying that the film formation conditions are not limited to these described above.

Figure 82:
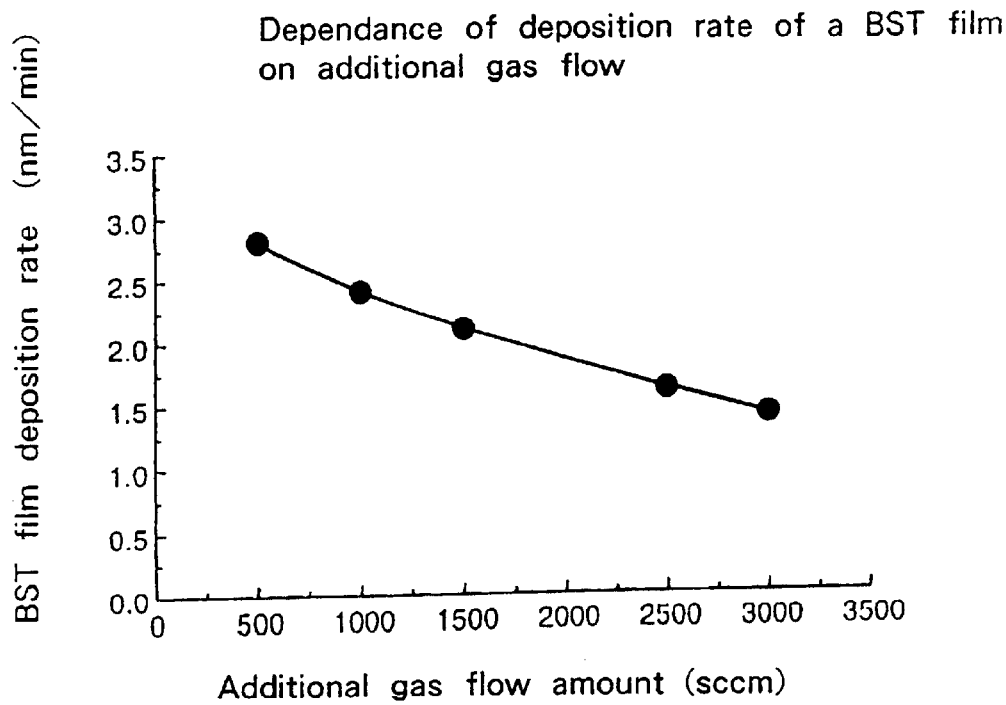
FIG. 82 is a graph showing the dependence of additional gas flow on the deposition rate of a BST film.
Figure 83:
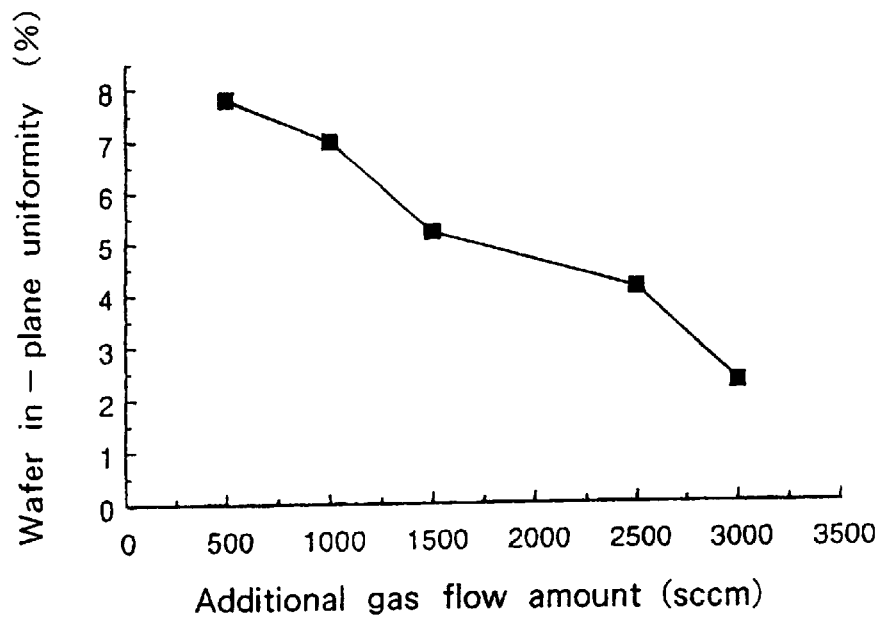
FIG. 83 is a graph showing the dependence of the in-plane uniformity of wafer of a deposition rate of a BST film on additional gas flow.

FIG. 82 shows the dependency of deposition rate of the BST film on additional gas flow amount. If additional gas flow is increased there is a tendency for the deposition rate to decrease. Also, FIG. 83 shows the dependency of in-plane uniformity of the deposition rate on the additional gas flow rate. It will be understood that by sufficiently increasing the process gas flow amount improvement can be seen in the wafer in-plane uniformity, and in-plane uniformity of less than ±2% is achieved with a 300 mm substrate.

As has been described above, by using the plasma device of the present invention formation of a uniform and high quality film is possible on a large surface area. Also, if film formation of TiN as an upper electrode is carried out after BST film formation, it is possible to manufacture a capacitor for use in semiconductor element.

In this embodiment, poly-Si, TiN and Ru/RuO$_x$ have respectively been used as lower and upper electrodes of a capacitor and a stacked electrode, but it goes without saying that the present invention can also be applied in the case where Pt, Ta, W, Mo, Rh, In, InO$_x$, TiSi$_x$ etc. are used. In this embodiment, a BST film has been used as a capacitor insulation film, but it goes without saying that the same effects as in this embodiment are also obtained in the case where PZT or SrTiO$_3$ etc. are used.

(Embodiment 44)

Figure 84:
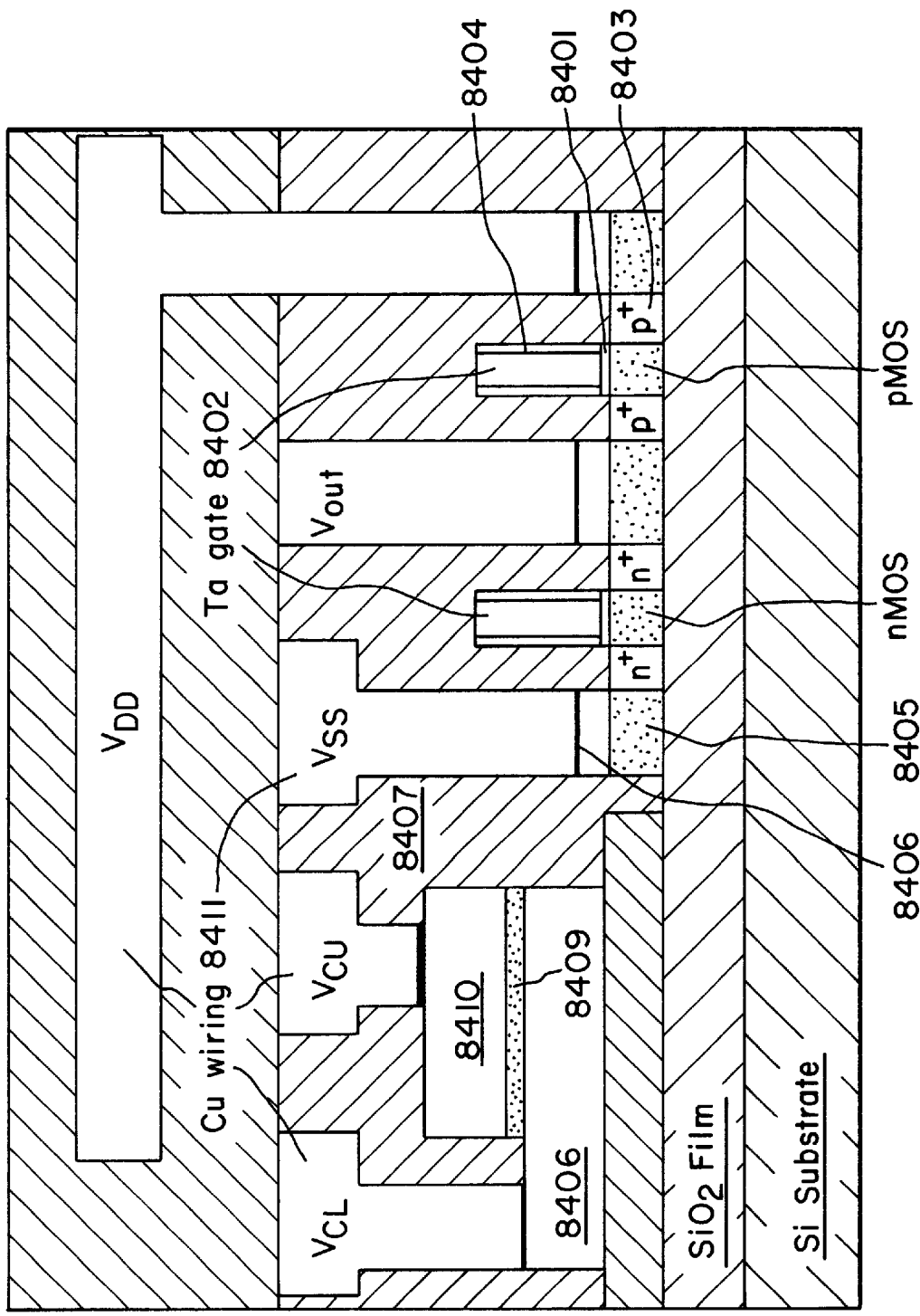
FIG. 84 is a cross section of a device manufactured using the present invention.

FIG. 84 is a cross section of a device manufactured using the present invention.

All the following processes, except for wafer cleansing and lithography processes were carried out using a cluster tool.

Part of the cluster tool is shown in FIG. 85. The characteristic of this cluster tool is that by connecting between each process chamber using an Ar or N$_2$ tunnel, thin film formation can be carried out continuously under an extremely pure atmosphere without exposing the semiconductor, metal, or insulator on the substrate to the atmosphere at all. Also, each process chamber achieves an ultra high vacuum state of the ultimate vacuum of 10$^{-10}$ Torr, but at the time of conveying the wafer, a number of mTorr to several tens of Torr is maintained using very pure Ar or N$_2$ and contamination of the wafer surface by organic matter or moisture etc. is prevented. Further, conveyance between each cluster is carried out using a port sealed encapsulated with N$_2$ or dry air, and wafer cleansing and lithographic processing is also carried out in an N$_2$ or dry air atmosphere, and it is possible to carry out processing that completely excludes all sorts of impurity elements from the atmosphere.

An SOI wafer from which an oxidation film in the vicinity of the surface has been removed is loaded into the cluster tool 6101. After loading, a Ta thin film is formed to a thickness of 1–50 nm with a plasma processing device using a uniform horizontal magnetic field of the present invention shown in FIG. 54. At this time, by controlling a high frequency applied to the entire surface of the wafer, ion irradiation energy is controlled and it is possible to obtain Ta of desirable film quality. Next, the wafer was introduced into the plasma processing device using the radial line slot antenna of the present invention shown in FIG. 53, plasma oxidation was carried out in a Ar/He/O$_2$, Xe/O$_2$ or Xe/He/O$_2$ atmosphere, only the Ta film formed in the previous process was oxidized and a tantalum oxide thin film 6001 was obtained. The pressure at the time of plasma oxidation was 3–500 mTorr and the wafer was temperature controlled to 300–500° C. A Ta thin film 6002 constituting a gate electrode was also formed to a thickness of 0–1–2 $\mu$m with the plasma processing device using the uniform horizontal magnetic field of the present invention shown in FIG. 54. Consecutively, a CVD NSG film was formed to a thickness of 1–50 nm using the plasma processing device using the radial line slot antenna of the present invention shown in FIG. 53. With this cap processing, it is possible to selectively form tantalum oxide only on the gate side surface, and it is easy to carry out etching processing at the time of forming contact holes on the gate electrode with a high selectivity.

Next, using the plasma processing device using the uniform horizontal magnetic field of the present invention shown in FIG. 44, gate etching is carried out. The process for forming the barrier metal in this step is shown in detail in FIG. 85. By using this device, in-plane uniformity is high even for a large diameter substrate, and fine processing is possible. High purity ion injection is carried out in a self aligned manner, and after activation annealing for 450–550° C. a source drain region 6003 was formed (a). Oxidation was carried out similarly to previously, as side wall 6004 processing, using the plasma processing device using the radial line slot antenna of the present invention shown in FIG. 53(*b*).

After SiO$_2$ of the Si surface has been removed by wet etching, a Ta film is formed to 2–100 nm (c). Ta and S/D section Si of the surface are made amorphous and mixed by I/I, and after that tantalum silicide 6006 is formed by annealing (d). After that, patterning is performed (e) and after Ta has been etched using the plasma processing device using the uniform horizontal magnetic field of the present invention shown in FIG. 44(f), a cap $SiO_2$ is removed by wet etching (g). After that, barrier metal formation 6006 is carried out (h). Next, the wafer was introduced into the plasma processing device using the radial line slot antenna of the present invention shown in FIG. 53, and plasma nitridation was carried out in an N2, $Ar/N_2$, or $Xe/N_2$ atmosphere. Film thickness was 10–500 nm. The pressure at the time of plasma oxidation was 3–500 mTorr and the wafer was temperature controlled to 300–550° C.

Also, a CVD NSG film 6007 is formed using the plasma processing device using the radial line slot antenna of the present invention shown in FIG. 53, flattened by CMP, and contact etching is carried out using the plasma processing device using the uniform horizontal magnetic field of the present invention shown in FIG. 44.

Capacitor formation is carried out by oxidizing a surface layer to 5–500 nm after film formation of the lower Ta electrode 6008 to a thickness of 0.1–2 $\mu$m, forming tantalum oxide 6009, and film forming the upper Ta electrode 6010 to 0.1–2 $\mu$m. These processes are also carried out with the plasma processing device using the radial slot line antenna and the plasma processing device using the uniform horizontal magnetic field of the present invention.

After formation of these elements, formation of Cu wiring 6011 is carried out and the device is completed. In the case where Ta nitride is used as barrier metal between the wiring, a process for forming barrier metal on the gate electrode is applied accordingly.

A tantalum oxide gate insulation FET or tantalum oxide capacitor formed in this way was electrically evaluated.

Figure 86B:
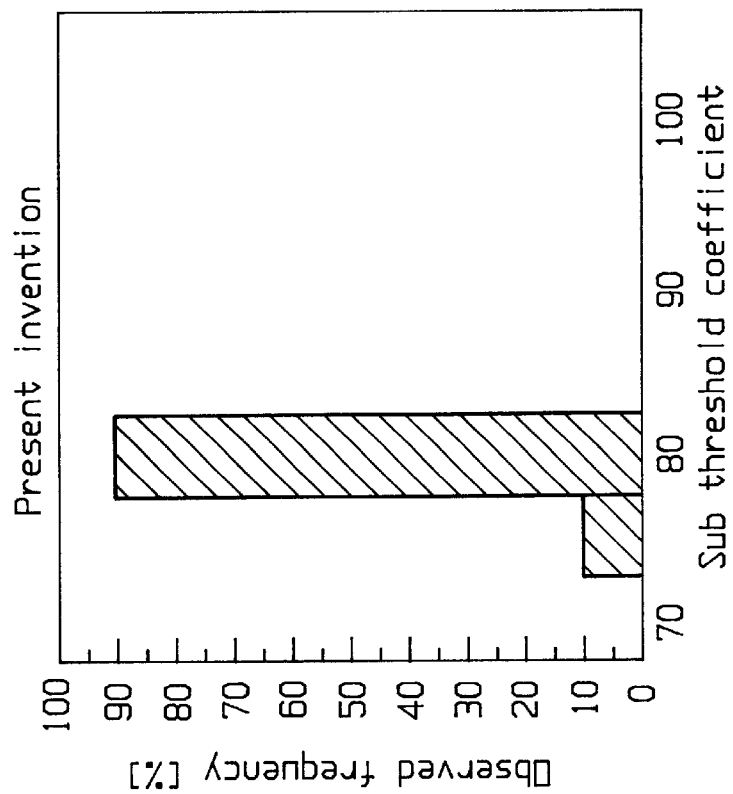
FIG. 86 is a drawing showing distribution of a subthreshold coefficient of a tantalum oxide gate insulation film MOSFET.
Figure 86A:
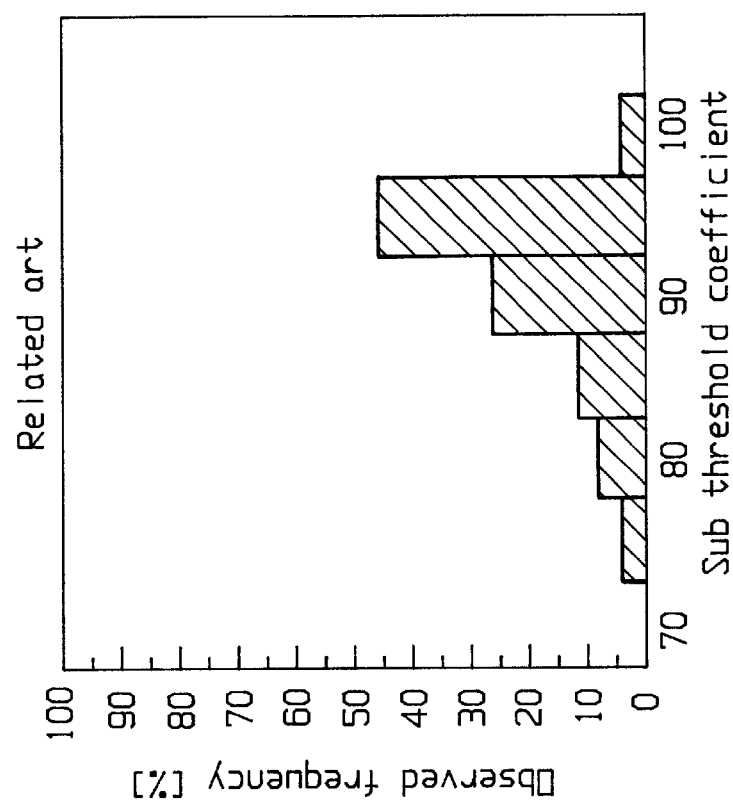

FIG. 86 shows distribution of a subthreshold coefficient of a tantalum oxide gate insulation MOSFET. A device having only the gate insulation film formation using the plasma device of the related art has a largely distributed subthreshold coefficient, but in the present invention high uniformity is realized.

Figure 87B:
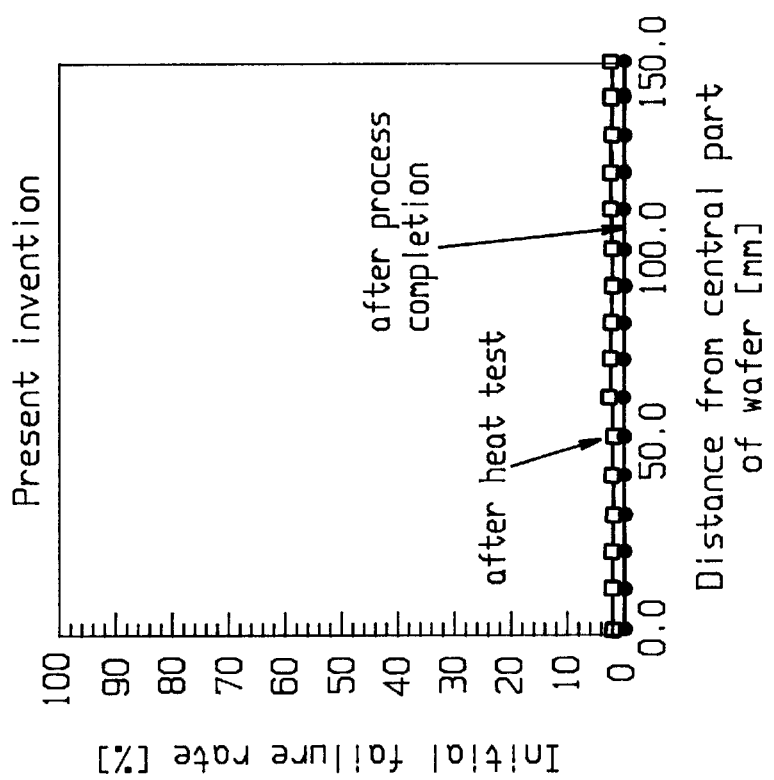
FIG. 87 is a graph showing initial damage rates of samples of the present example and the related art.
Figure 87A:
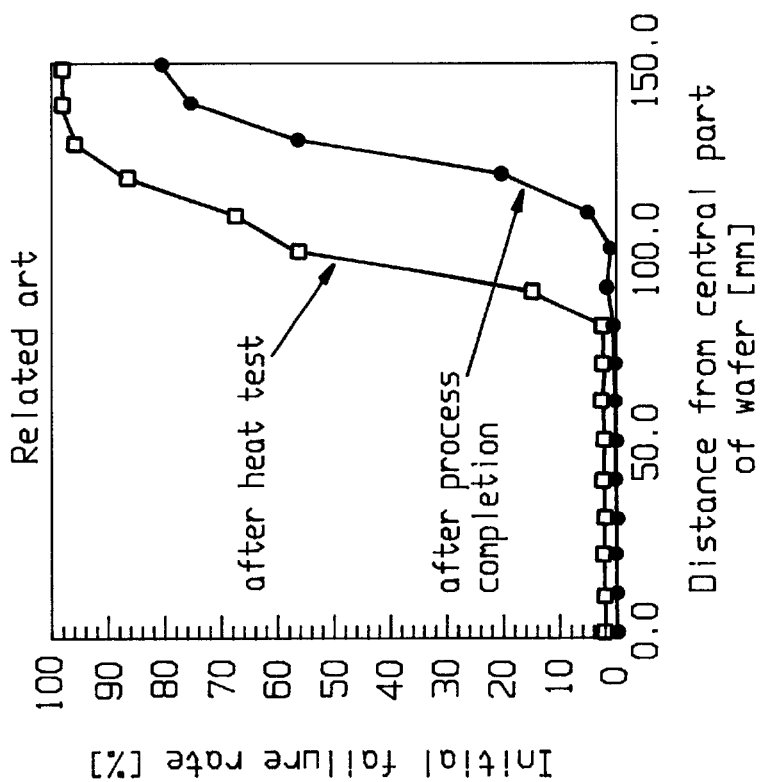

The initial failure rate of MOSFETs in the case of carrying out a process of forming titanium nitride formation, as barrier metal, using the plasma device of the present invention, and the initial failure rate of examples that used the present invention, as well as samples after carrying out heating tests for 24 hours at 700° C. in the atmosphere, are shown in FIG. 87. With the technique of the related art, initial failure rate at the wafer edge is low, but Cu used as wiring material in this case diffuses into imperfect tantalum nitride. In the present invention, the entire surface of the wafer exhibits a low failure rate.

FIG. 88 shows in-plane uniformity of the capacitance of a tantalum oxide capacitor. In the related art, there is a tendency for film thickness to increase in the radial direction, but with the present invention it is possible to obtain a uniform capacitance over the entire surface.

In this embodiment, an SOI wafer is used as the starting wafer, but it goes without saying that it is also possible to obtain the same results in this embodiment if a Si wafer, Si epitaxial wafer, metal substrate SOI wafer, GaAs wafer or diamond wafer, or a substrate having a thin film of Si, epitaxial Si, GaAs or diamond formed on the surface of quartz, glass, ceramics or plastic etc. are used.

Ta is used as a MOSFET gate electrode in this embodiment, but it goes without saying that the same effects can be obtained if n$^+$ polysilicon or p$^+$ polysilicon is used. In this embodiment a mixed gas of a carrier gas of Ar, Xe, He, etc. and $O_2$ is used as oxidation process gas, but it goes without saying that the same effects can be obtained with this embodiment if a mixed gas of another carrier gas and an oxide (for example $H_2O$, $NO_x$ etc.) is used as the mixed gas.

In this embodiment, a mixed gas of a carrier gas of Ar, Xe, etc. and $N_2$ is used as the nitridation process gas, but it goes without saying that the same effects can be obtained with this embodiment if a mixed gas of another carrier gas and a nitride(for example $NH_3$ etc.) is used as the mixed gas.

Ta is used in this embodiment in the upper and lower electrodes, but it goes without saying that the same effects can be obtained with this embodiment if Pt, Ru, Ti, W, Mo, $RuO_x$, $TiN_x$, $WN_x$, $TaSi_xN_y$, $TiSi_xN_y$, $Wsi_xN_y$ etc., or a stacked electrode comprising these materials is used.

In this embodiment only tantalum oxide has been dealt with as a MOSFET gate insulation film and capacitor insulation film, but it goes without saying that the same effects can be obtained with this embodiment if a stacked insulation film of tantalum oxide and $SiO_2$ or $Si_3N_4$, BST and PZT is used.

$SiO_2$ is used in this embodiment as a cap material for MOSFET gate processing, but it goes without saying that the same effects can be obtained with this embodiment if a material such as Si, or $Si_3N_4$ is used.

In this embodiment Ta oxidation is carried out as a MOSFET gate side wall process, but it goes without saying that the same effects can be obtained with this embodiment if a sidewall is formed by using this process as a re-oxidation process and using a new NSG etc.

In this embodiment formation of $TaN_x$, being barrier metal, is carried out using Ta, but it goes without saying that the same effects can be obtained as in this embodiment if $TaSi_xN_y$ is formed using $TaSi_x$.

$TaN_x$ is used in this embodiment as a barrier metal but it goes without saying that the same effects can be obtained with this embodiment if a material such as $TiN_x$, $WN_x$ $TaSI_xN_y$, $TiSi_xN_y$ or $Wsi_xN_y$ is used.

In this embodiment, a mixed logic type device has been manufactured, but it goes without saying that the same effects can be obtained with this embodiment if a logic LSI or DRAM etc. are used independently of each other.

(Embodiment 45)

Figure 89:
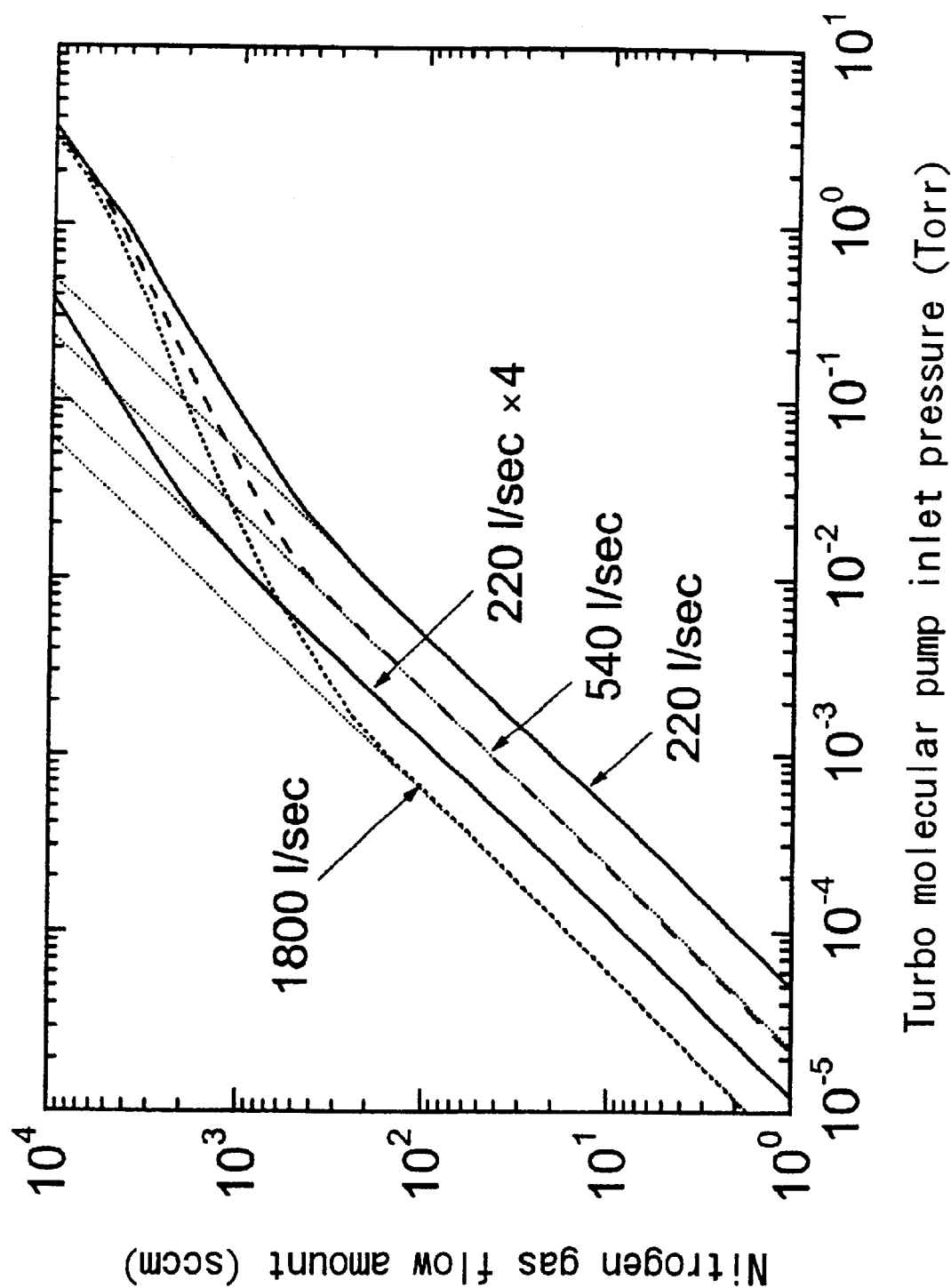
FIG. 89 is a graph showing displacement of a turbo molecular pump.

FIG. 89 shows the expel characteristics of a turbo molecular pump expulsion characteristics of pumps respectively having exhaust rates of 220, 540 and 1800 l/sec at a low pressure region, and expel characteristics in the case of expel with four pumps having an exhaust rate of 220 l/sec are shown. When the exhaust rate is not fixed by pressure, pump inlet pressure and expel gas flow amount are proportional. From the drawing it will be understood that in a high pressure region exhaust rate is decreased accompanying increased pressure. It will also be understood that compared to a pump having a small exhaust rate, a pump having a large exhaust rate has a further decrease in exhaust rate from a low pressure region. In a pump having a small exhaust rate of 220 l/sec, substantially no decrease in exhaust rate was observed at a low pressure region of 20–30 Torr for carrying out etching processing. That is, a plurality of small diameter pumps having small exhaust rate are advantageous in that they can cause a larger flow amount of gas at a low pressure region for carrying out normal semiconductor processing than a single large diameter pump having a high exhaust rate.

(Embodiment 46)

Figure 90:
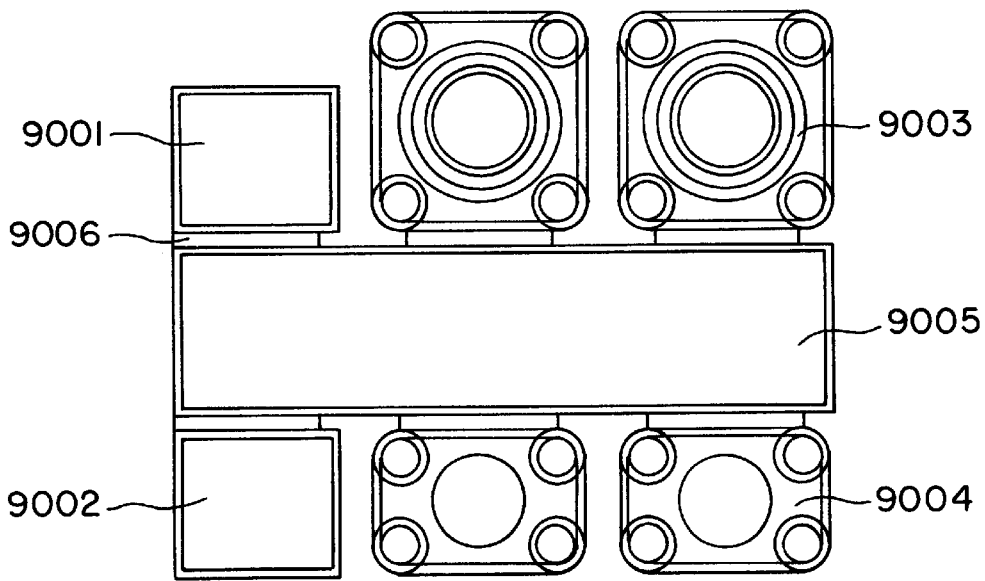
FIG. 90 is a plan view showing a practical example of a plasma device of the present invention.
Figure 91:
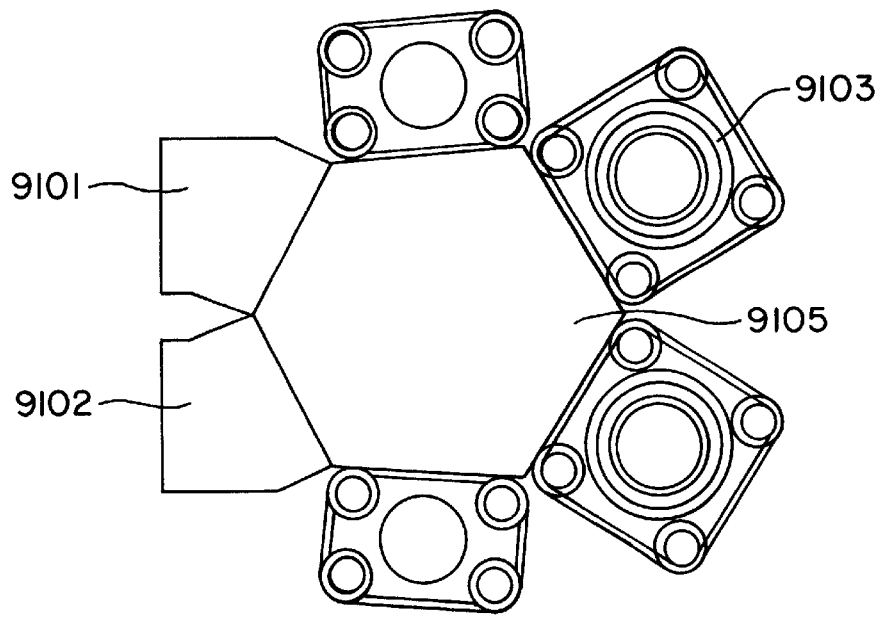
FIG. 91 is a plan view showing a practical example of a plasma device of the present invention.
Figure 92:
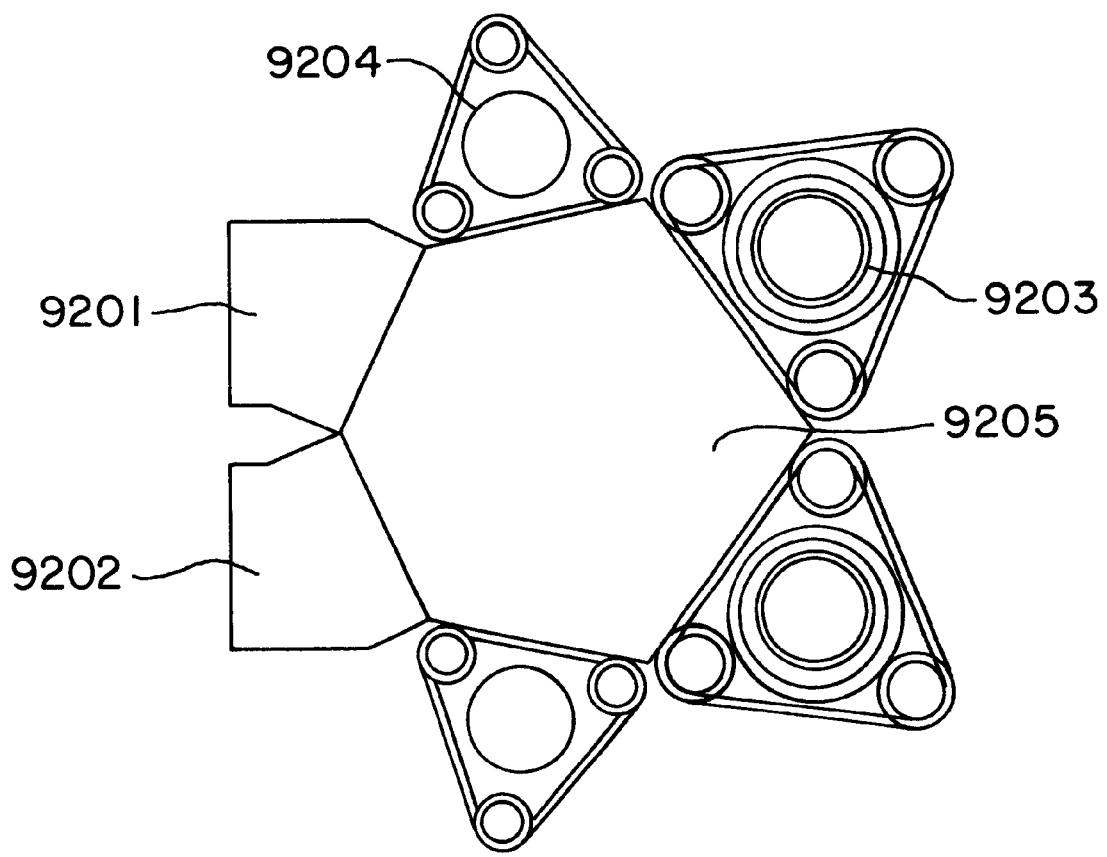
FIG. 92 is a plan view showing a practical example of a plasma device of the present invention.

FIG. 90–FIG. 92 are plan views showing examples of the plasma device of the present invention used as cluster tools for carrying out continuous processing by conveying between vacuums.

FIG. 90 is a case where rectangular process chambers and a rectangular wafer conveyance chamber are joined together. Reference numeral 9001 is a wafer take in chamber, reference numeral 9002 is a wafer take out chamber, reference numeral 9003 is a process chamber 1, reference numeral 9004 is a process chamber 2, reference numeral 9005 is a wafer conveyance chamber, and reference numeral 9006 is a gate valve. The process chambers 1 and 2 are any of the chambers disclosed in FIG. 44, or FIG. 48–FIG. 54. For example, process chamber 1 is an etching chamber and process chamber 2 is a resist ashing chamber. One or a plurality of wafer conveyance ports are provided inside the wafer conveyance chamber 9005, and wafer delivery is carried out for the process chamber and the wafer take in/take out chambers.

In the example of FIG. 90, miniature process chambers are efficiently arranged, and the area that the cluster tool occupies in the clean room is extremely small. It is possible to make the footprint of a cluster tool for a wafer having a diameter of 300 mm even smaller than the smallest footprint of a cluster tool for a wafer of 300 mm in the related art. With the structure of FIG. 90, the footprint of a cluster tool for a 300 mm diameter wafer is 3.64 mm$^2$, which is about 0.9 times the footprint of the smallest cluster tool for a 200 mm diameter wafer in the related art. The number of chambers connected to the conveyance chamber is not limited to six.

FIG. 91 is for a case where rectangular process chambers and a hexagonal wafer conveyance chamber are joined together. Reference numeral 9101 is a wafer take in chamber, reference numeral 9102 is a wafer take-out chamber, reference numeral 9103 is process chamber 1, reference numeral 9104 is process chamber 2, and reference numeral 9105 is a wafer conveyance chamber. The process chambers 1 and 2 are any of the process chambers disclosed in FIG. 44 or FIG. 46–FIG. 54. For example, process chamber 1 is an etching chamber and process chamber 2 is a resist ashing chamber.

Since it is permissible to only locate a single wafer conveyance port inside the wafer conveyance chamber, the cost is reduced compared to the case in FIG. 90. On the other hand, the footprint of the device becomes slightly larger than the case in FIG. 90. With the structure of FIG. 91, the footprint of a cluster tool for a 300mm diameter wafer becomes 4.34 mm$^2$. This is about the same as the footprint of the smallest cluster tool for a 200 mm diameter wafer in the related art. The wafer conveyance chamber is not limited in shape to a hexagon, and the number of chambers connected to the wafer conveyance chamber is not limited to six.

FIG. 92 is for a case where triangular process chambers and a hexagonal wafer conveyance chamber are joined together. Reference numeral 9201 is a wafer take in chamber, reference numeral 9202 is a wafer take-out chamber, reference numeral 9203 is process chamber 1, reference numeral 9204 is process chamber 2, and reference numeral 9205 is a wafer conveyance chamber. The process chambers 1 and 2 are any of the process chambers disclosed in FIG. 44 or FIG. 48–FIG. 54. For example, process chamber 1 is an etching chamber and process chamber 2 is a resist ashing chamber.

Since the number of vacuum pumps is low, the cost is reduced compared to the cases of FIG. 90 and FIG. 91, and it is possible to widen a maintenance space of the device. On the other hand, the footprint of the device is slightly larger than in the case of FIG. 91. With the structure of FIG. 92, the footprint of a cluster tool for a 300 mm diameter wafer becomes 4.94 mm$^2$. The wafer conveyance chamber is not limited in shape to a hexagon, and the number of chambers connected to the wafer conveyance chamber is not limited to six. FIG. 90–FIG. 92 are cases where two types of process chamber are joined together two at a time, but other combinations are also possible.

Figure 93:
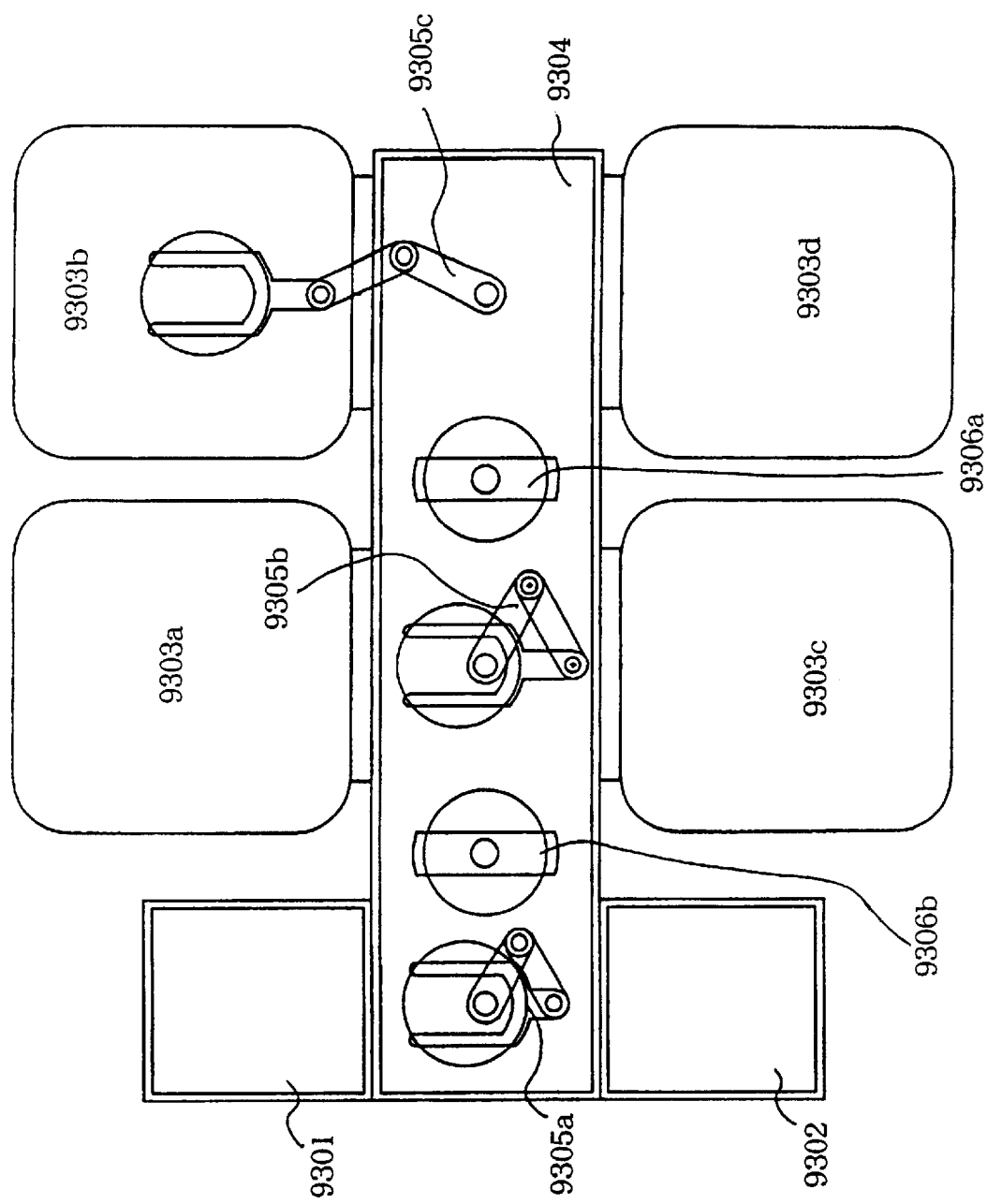
FIG. 93 is a drawing showing the layout of a wafer conveyance port inside a wafer conveyance chamber of FIG. 90.
Figure 95:
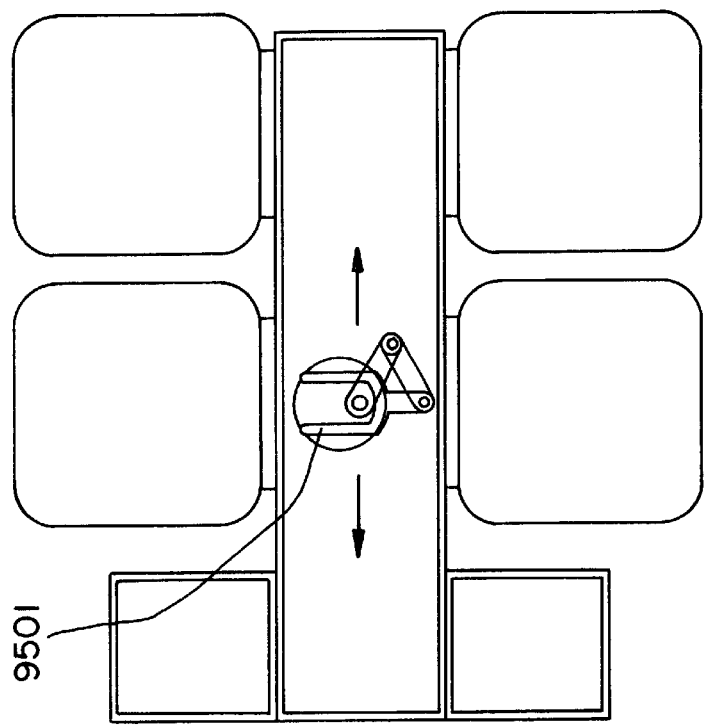
FIG. 95 is a drawing showing the layout of a wafer conveyance port inside a wafer conveyance chamber of FIG. 90.
Figure 94:
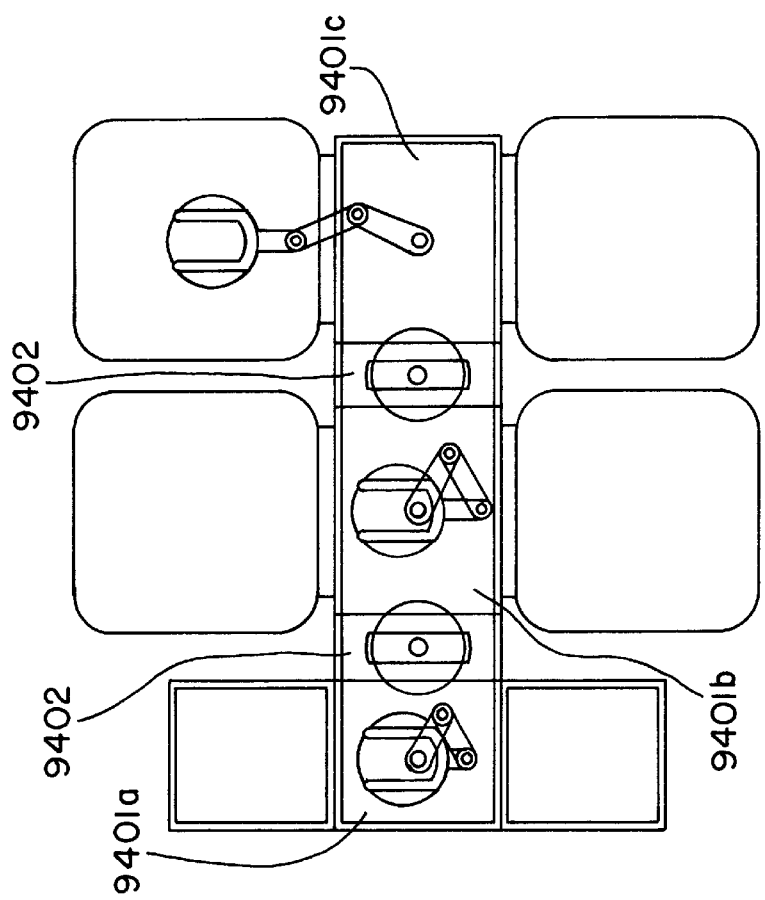
FIG. 94 is a drawing showing the layout of a wafer conveyance port inside a wafer conveyance chamber of FIG. 90.

FIG. 93–FIG. 95 show arrangements of wafer conveyance robots inside the wafer conveyance chamber of FIG. 90. In FIG. 93, reference numeral 9301 is a wafer take-in chamber, reference numeral 9302 is a wafer take-out chamber, reference numeral 9303 is a process chamber, reference numeral 6304 is a wafer conveyance chamber, reference numeral 9305 is a wafer conveyance robot, and reference numeral 9306 is a wafer withdrawal unit. The wafer conveyance robot 9305a carries out wafer delivery between the wafer take-in chamber 9301, the wafer take-out chamber 9302 and the wafer withdrawal unit 9306a. The wafer conveyance robot 9305b carries out wafer delivery between the process chambers 9303a and 9303c, and the wafer withdrawal units 9303a and b. The wafer withdrawal unit 9306 has a function of holding one or a plurality of wafers. The wafer withdrawal unit can also serve to align ?? and notch positions of the wafer, or to heat and cool the wafer.

In the example of FIG. 93, wafer delivery between wafer conveyance robots is carried out via the wafer withdrawal units, but the wafers can be delivered directly without installing the wafer withdrawal units. In the example of FIG. 93, since a plurality of wafer conveyance robots are provided, wafers can be taken into and taken out of the wafer take-in/take-out chambers and each of the processes chambers at the same time. As a result, the time needed to convey the wafers is shortened and throughput is increased.

FIG. 94 is a structure comprising a plurality of the wafer conveyance chambers of FIG. 93. Reference numeral 9401 is a wafer conveyance chamber and reference numeral 9401 is a wafer withdrawal chamber. By varying the number of connected wafer conveyance chambers 9401 and wafer withdrawal units 9402, it is possible to arbitrarily vary the number of connected process chambers. It is also possible to routinely minimize the footprint of the cluster tool for an arbitrary number of process chambers.

In FIG. 95, reference numeral 9501 is a wafer conveyance robot. The wafer conveyance robot 9501 can move in the direction of the arrows in the drawing, and a single wafer conveyance robot carries out taking in and taking out of wafers for all wafer take-in/take out chambers and process chambers. In this example, since there is only need for a single wafer conveyance robot, the cost is reduced compared to the case of FIG. 93. On the other hand, the time need to convey the wafer is lengthened and it is possible that throughput will be lowered.

Industrial Applicability.

As has been described above, according to the present invention, it is possible to realize a plasma device capable of forming a high quality and uniform thin film over a large surface area and at low temperature.

Also, the technical concept of the present invention is applicable to various plasma processes, and can realize a general purpose device, which means that it is also possible to significantly reduce maintenance costs etc.

What is claimed is:

1. A plasma device comprising:
    a container, the inside of which can be internally decompressed, and part of the inside being formed of a first dielectric plate made of material capable of transmitting microwaves with almost no loss,
    a gas supply system for supplying essential source material gas so as to cause excitation of plasma inside the container, an exhaust system for expelling said source material gas that has been supplied into the container and decompressing the inside of the container, an antenna, located facing an outer surface of the first dielectric plate and comprised of a slot plate and a waveguide dielectric, for radiating microwaves, said slot plate electrically in connection with said container and an electrode for holding an object to be treated located inside the container, a surface of the object to be treated to be subject to plasma processing and a microwave radiating surface of the antenna being arranged in parallel substantially opposite to each other, and the plasma device carrying out plasma processing for the object to be treated, wherein, a wall section of the container outside the first dielectric plate is of a material comprising matter having a conductivity of $3.7 \times 10^7$ $\Omega^{-1} \cdot m^{-1}$ or more, or the inside of the wall section is covered with this material, and where thickness of the material is d, the specific conductivity of the material is a, the magnetic permeability of vacuum is $\mu_0$, and the angular frequency of microwaves radiated from the antenna is ω, the thickness d is larger than $(2/\mu_0 \sigma \omega)^{1/2}$.

2. The plasma device as disclosed in claim 1, wherein the first dielectric plate is formed of a material having a dielectric loss angle tan δ in said microwave frequency of less than $5 \times 10^{-3}$.

3. The plasma device as disclosed in claim 1, wherein a space is formed between the antenna and the first dielectric plate.

4. The plasma device as disclosed in claim 3, wherein a line for supplying heat exchanging medium communicates with the space formed between the antenna and the first dielectric plate.

5. The plasma device as disclosed in claim 1, provided with means for cooling the antenna.

6. The plasma device as disclosed in claim 5, wherein a passageway is formed in said antenna waveguide, and a line for supplying heat exchanging medium communicates with the passageway.

7. The plasma device as disclosed in claim 1, provided with means for cooling the first dielectric plate.

8. The plasma device as disclosed in claim 1, provided with means for preventing warping of the slot plate.

9. The plasma device as disclosed in claim 8, wherein a space is provided between the antenna and the first dielectric plate, and a plate composed of a flexible member is interposed in the space as means for preventing warping of the slot plate.

10. The plasma device as disclosed in claim 1, provided with means for detecting the presence or absence of plasma generated in the space device.

11. The plasma device as disclosed in claim 1, provided with a mechanism for causing the temperature of a wall section inside the container and sections inside the container other than the object to be treated, to respectively rise to 150° C.

12. The plasma device as disclosed in claim 1, wherein the exhaust system is provided with a mechanism for causing the temperature inside all units comprising the exhaust system, to respectively to rise to 150° C.

13. The plasma device as disclosed in claim 1, wherein the electrode having the function of holding the object to be treated has a mechanism for heating the object to be treated.

14. The plasma device as disclosed in claim 13, wherein a xenon lamp is used as the mechanism for heating the object to be treated.

15. The plasma device as disclosed in claim 1, wherein a mechanism for collecting and recycling fluorocarbon type gas is provided downstream of the exhaust system.

16. The plasma device as disclosed in claim 1, wherein a film comprising $AlF_3$ and $MgF_2$ is formed on an inner wall surface of the container.

17. The plasma device as disclosed in claim 1, wherein the electrode having the function of holding the object to be treated is provided with at lease one of a dc bias and ac bias applying means.

18. The plasma device as disclosed in claim 1, wherein said plasma device is a device for carrying out etching of a surface the object to be treated.

19. The plasma device as disclosed in claim 1, wherein said plasma device is a device for causing direct oxidation of a surface of the object to be treated.

20. The plasma device as disclosed in claim 1, wherein said plasma device is a device for causing direct nitridation of a surface of the object to be treated.

21. The plasma device as disclosed in claim 1, wherein said plasma device is a device for causing a thin film to be deposited on the object to be treated.

22. A plasma device comprising:

a container, the inside of which can be internally decompressed, and part of the inside being formed of a first dielectric plate made of material capable of transmitting microwaves with almost no loss, a gas supply system for supplying essential source material gas so as to cause excitation of plasma inside the container, an exhaust system for expelling said source material gas that has been supplied into the container and decompressing the inside of the container, an antenna, located facing an outer surface of the first dielectric plate and comprised of a slot plate and a waveguide dielectric, for radiating microwaves, and an electrode for holding an object to be treated located inside the container, a surface of the object to be treated to be subject to plasma processing and a microwave radiating surface of the antenna being arranged in parallel substantially opposite to each other, and the plasma device carrying out plasma processing for the object to be treated, wherein, a wall section of the container outside the first dielectric plate is of a material comprising matter having a conductivity of $3.7 \times 10^7$ $\Omega^{-1} \cdot m^{-1}$ or more, or the inside of the wall section is covered with this material, where thickness of the material is d, the specific conductivity of the material is σ, the magnetic permeability of vacuum is $\mu_0$, and the angular frequency of microwaves radiated from the antenna is ω, the thickness d is larger than $(2/\mu_0 \sigma \omega)^{1/2}$, a first O ring is located between an inner surface of the first dielectric body and a wall section of the container; and a thin film formed of a conductive material is provided on at least a surface of the first dielectric plate coming into contact with the first O ring, as means for preventing the first O ring from being directly exposed to microwaves radiated from the antenna.

23. The plasma device as disclosed in claim 22, wherein said thin film is formed from a material having a conductivity of at least $3.7 \times 10^7$ $\Omega^{-1} \cdot m^{-1}$, and has a thickness of at least 10 μm.

24. A plasma device comprising:
a container, the inside of which can be internally decompressed, and part of the inside being formed of a first dielectric plate made of material capable of transmitting microwaves with almost no loss,
a gas supply system for supplying essential source material gas so as to cause excitation of plasma inside the container,
an exhaust system for expelling said source material gas that has been supplied into the container and decompressing the inside of the container,
an antenna, located facing an outer surface of the first dielectric plate and comprised of a slot plate and a waveguide dielectric, for radiating microwaves,
an electrode for holding an object to be treated located inside the container, a surface of the object to be treated to be subject to plasma processing and a microwave radiating surface of the antenna being arranged in parallel substantially opposite to each other, and the plasma device carrying out plasma processing for the object to be treated, wherein,
a wall section of the container outside the first dielectric plate is of a material comprising matter having a conductivity of $3.7 \times 10^7$ $\Omega^{-1} \cdot m^{-1}$ or more, or the inside of the wall section is covered with this material,
where thickness of the material is d, the specific conductivity of the material is $\sigma$, the magnetic permeability of vacuum is $\mu_0$, and the angular frequency of microwaves radiated from the antenna is $\omega$, the thickness d is larger than $(2/\mu_0 \sigma \omega)^{1/2}$,
a first O ring having a vacuum sealing function is located between an inner surface of the first dielectric body and a wall section of the container; and
a thin film formed of a conductive material is coated on the surface of the first O ring, for preventing the first O ring from being directly exposed to microwaves radiated from the antenna.

25. The plasma device as disclosed in claim 24, wherein said metallic thin film is formed from a material having a conductivity at least $3.7 \times 10^7$ $\Omega^{-1} \cdot m^{-1}$, and has a thickness of at least 10 $\mu$m.

26. A plasma device comprising:
a container, the inside of which can be internally decompressed, and part of the inside being formed of a first dielectric plate made of material capable of transmitting microwaves with almost no loss,
a gas supply system for supplying essential source material gas so as to cause excitation of plasma inside the container,
an exhaust system for expelling said source material gas that has been supplied into the container and decompressing the inside of the container,
an antenna, located facing an outer surface of the first dielectric plate and comprised of a slot plate and a waveguide dielectric, for radiating microwaves, said slot plate electrically in connection with said container and
an electrode for holding an object to be treated located inside the container, a surface of the object to be treated to be subject to plasma processing and a microwave radiating surface of the antenna being arranged in parallel substantially opposite to each other, and the plasma device carrying out plasma processing for the object to be treated;
where thickness of the material is d, the specific conductivity of the material is $\sigma$ which is more than $3.7 \times 10^7$ $\Omega^{-1} \cdot m^{-1}$, the magnetic permeability of vacuum is $\mu_0$, and the angular frequency of microwaves radiated from the antenna is $\omega$, the thickness d is larger than $(2/\mu_0 \sigma \omega)^{1/2}$,
wherein a second dielectric plate having a gas inlet for substantially uniformly supplying desired gas is provided between the first dielectric plate and the electrode for holding the object to be processed.

27. The plasma device as disclosed in claim 26, wherein:
a second O ring having a vacuum sealing function is located between an inner surface of the second dielectric body and a wall section of the container; and
a thin film formed of a conductive material is provided on at least a surface of the second dielectric plate coming into contact with the second O ring, as means for preventing the second O ring from being directly exposed to microwaves radiated from the antenna.

28. The plasma device as disclosed in claim 26, wherein:
a second O ring having a vacuum sealing function is located between an inner surface of the second dielectric body and a wall section of the container; and
a thin film formed of a conductive material is coated on the surface of the second O ring, as means for preventing the second O ring from being directly exposed to microwaves radiated from the antenna.

29. The plasma device as disclosed in claim 26, wherein the second dielectric plate is formed of material having a dielectric loss angle tan $\delta$ in said microwave frequency of less than $5 \times 10^{-3}$.

30. The plasma device as disclosed in claim 6, provided with means for generating a pressure difference so that a first pressure of the first space between the first dielectric plate and the second dielectric plate is 1000 Pa or higher than a second pressure of the second space, in which the electrode for holding the object to be treated is located, and which is surrounded by the second dielectric plate and a wall section of the container other than the second dielectric plate.

31. The plasma device of claim 30, the antenna being provided with a slot plate functioning as a microwave radiating surface, and slot sets comprising holes penetrating the slot plate at a plurality of fixed locations wherein, at portions where the density of plasma generated in the space is locally higher than other portions, the slots either have a smaller diameter than at other portions, are screened by a screen plate, or are not provided at all.

32. The plasma device as disclosed in claim 26, wherein means for introducing heat exchanging medium is connected into the space surrounded by the second dielectric plate and a wall section of the container other than the second dielectric plate.

33. A plasma device comprising:
a container, the inside of which can be internally decompressed, and part of the inside being formed of a first dielectric plate made of material capable of transmitting microwaves with almost no loss,
a gas supply system for supplying essential source material gas so as to cause excitation of plasma inside the container,
an exhaust system for expelling said source material gas that has been supplied into the container and decompressing the inside of the container, an antenna, located facing an outer surface of the first dielectric plate and comprised of a slot plate and a waveguide dielectric, for radiating microwaves, and an electrode for holding an object to be treated located inside the container, a surface of the object to be treated to be subject to plasma processing and a microwave radiating surface of the antenna being arranged in parallel substantially opposite to each other, and the plasma device carrying out plasma processing for the object to be treated, wherein, a wall section of the container outside the first dielectric plate is of a material comprising matter having a conductivity of $3.7 \times 10^7$ $\Omega^{-1} \cdot m^{-1}$ or more, or the inside of the wall section is covered with this material, and where thickness of the material is d, the specific conductivity of the material is $\sigma$, the magnetic permeability of vacuum is $\mu_0$, and the angular frequency of microwaves radiated from the antenna is $\omega$, the thickness d is larger than $(2/\mu_0 \sigma \omega)^{1/2}$, wherein a second dielectric plate having a gas inlet for substantially uniformly supplying desired gas is provided between the first dielectric plate and the electrode for holding the object to be processed, and a width of a first space between the first dielectric plate and the second dielectric plate is less than 1.0 mm and uneven thereby forming a gas passage.

* * * * *